US007564249B2

(12) United States Patent
Bauer et al.

(10) Patent No.: US 7,564,249 B2
(45) **Date of Patent: *Jul. 21, 2009**

(54) SIGNAL PROCESSING SYSTEM AND METHOD

(75) Inventors: Scott E. Bauer, Holly, MI (US); James D. Baal, Novi, MI (US)

(73) Assignee: TK Holdings, Inc., Farmington Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/930,150

(22) Filed: Oct. 31, 2007

(65) Prior Publication Data

US 2008/0106273 A1 May 8, 2008

Related U.S. Application Data

(63) Continuation-in-part of application No. PCT/US2006/062055, filed on Dec. 13, 2006, which is a continuation-in-part of application No. 11/530,492, filed on Sep. 11, 2006, and a continuation-in-part of application No. 10/946,174, filed on Sep. 20, 2004, now Pat. No. 7,209,844, said application No. 11/530,492 is a continuation-in-part of application No. 10/905,219, filed on Dec. 21, 2004, now Pat. No. 7,212,895, said application No. 11/530,492 is a continuation-in-part of application No. 11/460,982, filed on Jul. 29, 2006, now Pat. No. 7,388,370.

(60) Provisional application No. 60/750,122, filed on Dec. 13, 2005, provisional application No. 60/504,581, filed on Sep. 19, 2003, provisional application No. 60/481,821, filed on Dec. 21, 2003, provisional application No. 60/595,718, filed on Jul. 29, 2005, provisional application No. 60/892,241, filed on Feb. 28, 2007.

(51) Int. Cl.
*G01R 27/08* (2006.01)
*B60R 21/16* (2006.01)

(52) U.S. Cl. ....................... 324/713; 324/691; 340/436; 280/735; 701/45; 702/189

(58) Field of Classification Search ................ 324/713, 324/691, 656
See application file for complete search history.

(56) References Cited

U.S. PATENT DOCUMENTS 3,448,378 A 6/1969 Roveti
3,835,371 A 9/1974 Mirdadian (Continued)

OTHER PUBLICATIONS

Kitchen et al., "A Designer's Guide to Instrumentation Amplifiers, 2nd Edition," Analog Devices Inc., 2004.

(Continued)

*Primary Examiner*—Timothy J Dole
*Assistant Examiner*—John Zhu
(74) *Attorney, Agent, or Firm*—Raggio & Dinnin, P.C.

(57) ABSTRACT

First and second complementary voltage signals are operatively coupled across a series circuit comprising first and second sense resistors and a circuit element therebetween. A voltage across the circuit element is regulated in reference to a predetermined level, and an output signal responsive to the self-impedance of the circuit element is generated responsive at least one of a voltage across the first sense resistor and a voltage across the second sense resistor.

33 Claims, 54 Drawing Sheets

U.S. PATENT DOCUMENTS

| | | | |
|---|---|---|---|
| 3,848,243 A | 11/1974 | Schirmer | |
| 3,870,948 A | 3/1975 | Holt et al. | |
| 4,630,229 A | 12/1986 | D'Hondt | |
| 4,651,093 A | 3/1987 | Detriche' et al. | |
| 4,655,312 A * | 4/1987 | Frantom et al. | 180/268 |
| 5,020,541 A * | 6/1991 | Marriott | 600/536 |
| 5,182,513 A | 1/1993 | Young et al. | |
| 5,197,479 A * | 3/1993 | Hubelbank et al. | 600/508 |
| 5,629,619 A | 5/1997 | Mednikov | |
| 5,707,076 A | 1/1998 | Takahashi | |
| 5,792,956 A * | 8/1998 | Li | 73/660 |
| 5,895,071 A * | 4/1999 | Norton | 280/735 |
| 6,005,392 A | 12/1999 | Patzwaldt | |
| 6,208,534 B1 * | 3/2001 | Shteynberg et al. | 363/21.04 |
| 6,246,230 B1 | 6/2001 | Mednikov | |
| 6,252,393 B1 | 6/2001 | Hedengren | |
| 6,288,536 B1 | 9/2001 | Mandl et al. | |
| 6,317,048 B1 | 11/2001 | Bomya et al. | |
| 6,407,660 B1 | 6/2002 | Bomya | |
| 6,433,688 B1 | 8/2002 | Bomya | |
| 6,445,171 B2 | 9/2002 | Sandquist et al. | |
| 6,479,990 B2 | 11/2002 | Mednikov et al. | |
| 6,510,062 B2 | 1/2003 | Goder et al. | |
| 6,552,662 B1 | 4/2003 | Bomya et al. | |
| 6,566,856 B2 | 5/2003 | Sandquist et al. | |
| 6,583,616 B1 | 6/2003 | Bomya | |
| 6,586,926 B1 | 7/2003 | Bomya | |
| 6,587,048 B1 | 7/2003 | Bomya | |
| 6,631,776 B1 | 10/2003 | Bomya | |
| 6,746,960 B2 * | 6/2004 | Goodman | 438/689 |
| 6,777,927 B1 | 8/2004 | Bomya | |
| 7,113,874 B2 | 9/2006 | Watson et al. | |
| 7,164,349 B2 | 1/2007 | Kawaura et al. | |
| 7,190,161 B2 | 3/2007 | Bomya | |
| 7,209,844 B2 | 4/2007 | Merrick et al. | |
| 7,212,895 B2 | 5/2007 | Cech et al. | |
| 7,388,370 B2 | 6/2008 | Cech et al. | |
| 7,463,987 B2 | 12/2008 | Cech et al. | |
| 2004/0056652 A1 | 3/2004 | Bomya | |
| 2005/0093540 A1 * | 5/2005 | Merrick et al. | 324/239 |
| 2005/0096815 A1 | 5/2005 | Takafuji et al. | |
| 2005/0096881 A1 | 5/2005 | Watson et al. | |
| 2005/0099278 A1 | 5/2005 | Kawaura et al. | |
| 2005/0127908 A1 | 6/2005 | Schlicker et al. | |
| 2005/0143944 A1 | 6/2005 | Cech et al. | |
| 2005/0154530 A1 | 7/2005 | Hosokawa et al. | |
| 2007/0024277 A1 | 2/2007 | Cech et al. | |
| 2007/0188168 A1 | 8/2007 | Stanley et al. | |
| 2008/0068008 A1 | 3/2008 | Watson et al. | |
| 2008/0109177 A1 | 5/2008 | Cech et al. | |
| 2008/0109189 A1 | 5/2008 | Bauer et al. | |
| 2008/0109190 A1 | 5/2008 | Bauer et al. | |
| 2008/0211646 A1 | 9/2008 | Cech et al. | |
| 2009/0001976 A1 | 1/2009 | Cech et al. | |

OTHER PUBLICATIONS

Maxim, "Demystifying Sigma-Delta ADCs," Dallas Semiconductor, MAXIM, Application Note APP 1870, Jan. 31, 2003.

Carter, B., "A Single-Supply Op-Amp Circuit Collection," Texas Instruments, Application Report SLOA058, Nov. 2000, 27 pp.

National Semiconductor, "An Applications Guide for Op Amps," National Semiconductor Corporation, Application Note 20, Feb. 1969, 12 pp.

Widlar, R.J., "Monolithic Op Amp—The Universal Linear Component," National Semiconductor Corporation, Application Note 4, Apr. 1968, 10 pp.

NDT Resource Center, Internet web pages at http://www.ndt-ed.org/EducationResources/CommunityCollege/EddyCurrents/cc_ec_index.htm, NDT Resource Center, downloaded on Oct. 13, 2005.

Buckley, J.M., "An Introduction to Eddy Current Testing theory and technology,", technical paper eddyc.pdf available from the internet at http://joe.buckley.net/papers, downloaded on Sep. 8, 2003.

Office Action in U.S. Appl. No. 11/930,160, mailed on Sep. 5, 2008, including list of references cited by Examiner, Bibliographic Data Sheet and Search information, 12 pp.

Leonard S. Cech et al., U.S. Appl. No. 11/530,492, filed Sep. 11, 2006: Application as filed; Non-Final Rejection on Mar. 18, 2008 with List of references cited by examiner and Lists of References cited by applicant and considered by examiner; Applicant reply dated Jul. 19, 2008 with claims; Notice of Allowance mailed on Sep. 8, 2008, 156 pp.

Leonard S. Cech et al., U.S. Appl. No. 11/930,134, filed Oct. 31, 2007: Application as filed with Application Data Statement, Oath or Declaration and EFS Acknowledgement Receipt, 189 pp.

Sedra, Adel S. and Smith, Kenneth C., in Microelectronic Circuits, Third Edition, Oxford University Press, 1991, Section 11.6, pp. 792-799.

Office Action in U.S. Appl. No. 11/930,157, mailed on Jan. 5, 2009, including list of references cited by Examiner, Bibliographic Data Sheet, Issue Information, and Search information, Examiner's Search Strategy and Lists of References cited by applicant and considered by Examiner 42 pp.

Office Action in U.S. Appl. No. 11/930,160, mailed on Mar. 19, 2009, including list of references cited by Examiner, Index of Claims, Bibliographic Data Sheet, Issue Information, Search Information, Examiner's Search Strategy and Lists of References cited by applicant and considered by Examiner 29 pp.

* cited by examiner

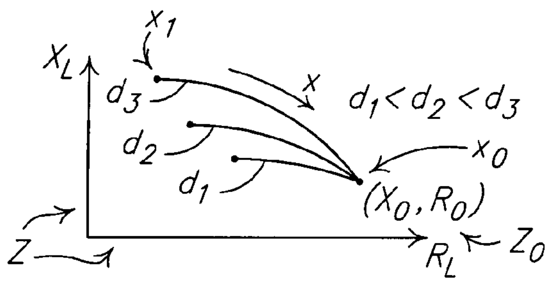
FIG. 31.
FIG. 32.
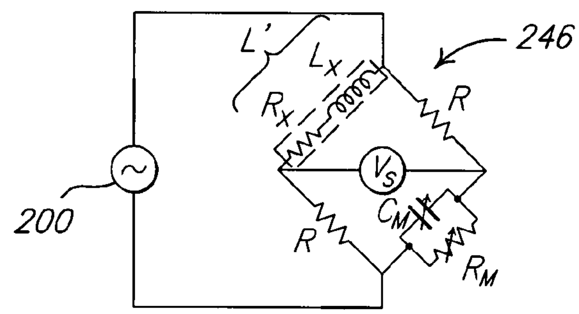
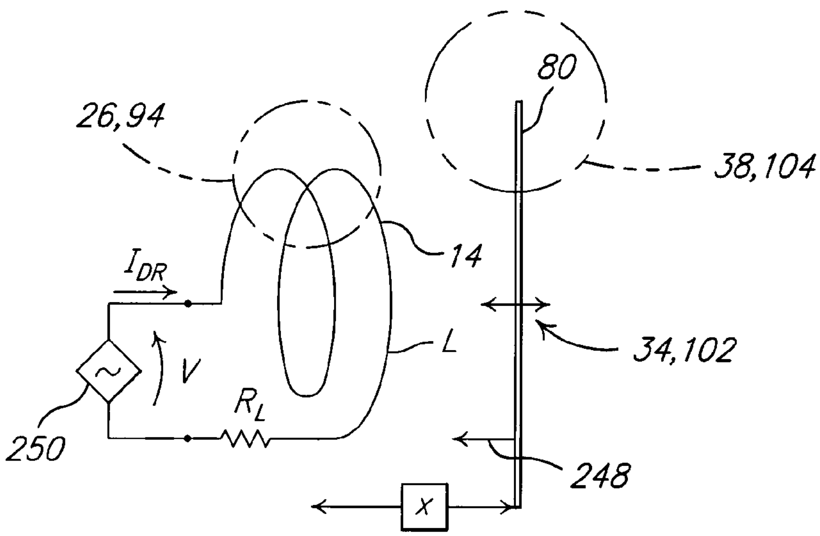
FIG. 33.
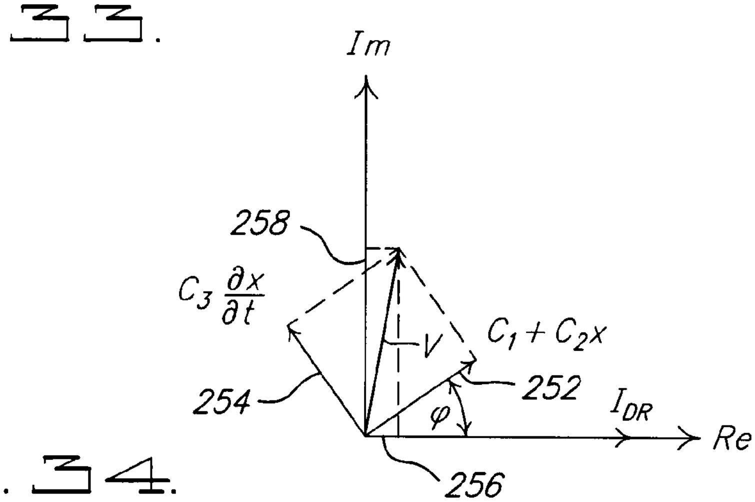
FIG. 34.

SIGNAL PROCESSING SYSTEM AND METHOD

CROSS-REFERENCE TO RELATED APPLICATIONS

The instant application is a continuation-in-part of International Application Serial No. PCT/US06/62055 filed on Dec. 13, 2006, which is a continuation-in-part of U.S. application Ser. No. 11/530,492 ("application '492") filed on Sep. 11, 2006, and which claims benefit of U.S. Provisional Application Serial Nos. 60/750,122 filed on Dec. 13, 2005. Application '492 is a continuation-in-part of U.S. application Ser. No. 10/946,174 filed on Sep. 20, 2004, now U.S. Pat. No. 7,209,844, which issued on 24 Apr. 2007, and which claims the benefit of prior U.S. Provisional Application Serial No. 60/504,581 filed on Sep. 19, 2003. Application '492 is also a continuation-in-part of U.S. application Ser. No. 10/905,219 filed on Dec. 21, 2004, now U.S. Pat. No. 7,212,895, which issued on 1 May 2007, and which claims the benefit of prior U.S. Provisional Application Serial No. 60/481,821 filed on Dec. 21, 2003. Application '492 is also a continuation-in-part of U.S. application Ser. No. 11/460,982 filed on Jul. 29, 2006, which claims the benefit of prior U.S. Provisional Application Serial No. 60/595,718 filed on Jul. 29, 2005. The instant application also claims the benefit of U.S. Provisional Application Serial No. 60/892,241 filed on Feb. 28, 2007. Each of the above-identified applications is incorporated by reference in its entirety.

BRIEF DESCRIPTION OF THE DRAWINGS

In the accompanying drawings:

FIG. 18 illustrates a schematic block diagram of a third aspect of a magnetic crash sensing system in a vehicle;

FIG. 31 illustrates a complex impedance detected using the eddy current sensor illustrated in FIG. 30 responsive to cracks of various depths;

FIG. 33 illustrates a coil of a magnetic crash sensor in proximity to a conductive element;

FIG. 34 illustrates various components of a signal from the coil illustrated in FIG. 33;

FIG. 35 illustrates a schematic block diagram of a first aspect of a signal conditioning circuit associated with a magnetic sensor;

FIG. 45 illustrates a tenth embodiment of a signal conditioning circuit that provides for generating one or more measures responsive to a self-impedance of a coil;

FIG. 46 illustrates an eleventh embodiment of a signal conditioning circuit that provides for generating one or more measures responsive to a self-impedance of a coil;

FIG. 54 illustrates a twelfth embodiment of a signal conditioning circuit that provides for generating one or more measures responsive to a self-impedance of a coil;

FIG. 55 illustrates a thirteenth embodiment of a signal conditioning circuit that provides for generating one or more measures responsive to a self-impedance of a coil;

FIG. 56 illustrates a fourteenth embodiment of a signal conditioning circuit that provides for generating one or more measures responsive to a self-impedance of a coil;

FIG. 59 illustrates a fifteenth embodiment of a signal conditioning circuit that provides for generating one or more measures responsive to a self-impedance of a coil;

FIG. 61 illustrates a sixteenth embodiment of a signal conditioning circuit that provides for generating one or more measures responsive to a self-impedance of a coil;

FIG. 63 illustrates a eighteenth embodiment of a signal conditioning circuit that provides for generating one or more measures responsive to a self-impedance of a coil;

DESCRIPTION OF EMBODIMENT(S)

Figure 1:
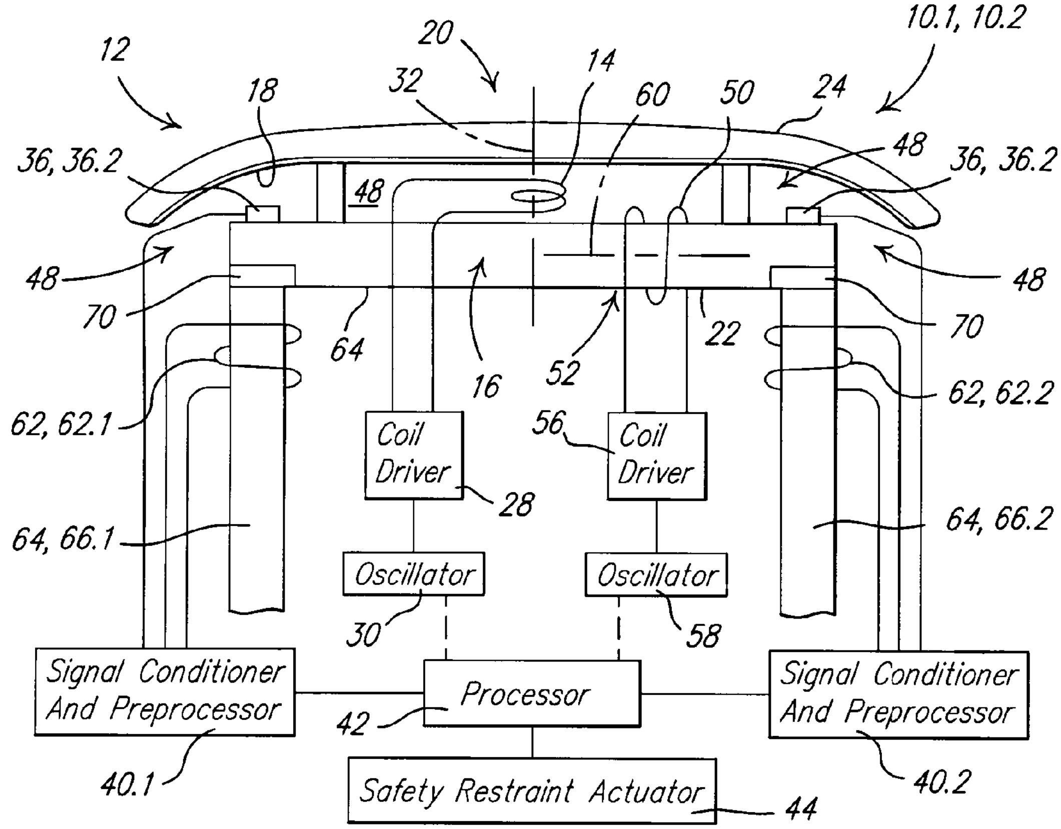
FIG. 1 illustrates a schematic block diagram of a magnetic crash sensor in a vehicle.
Figure 2:
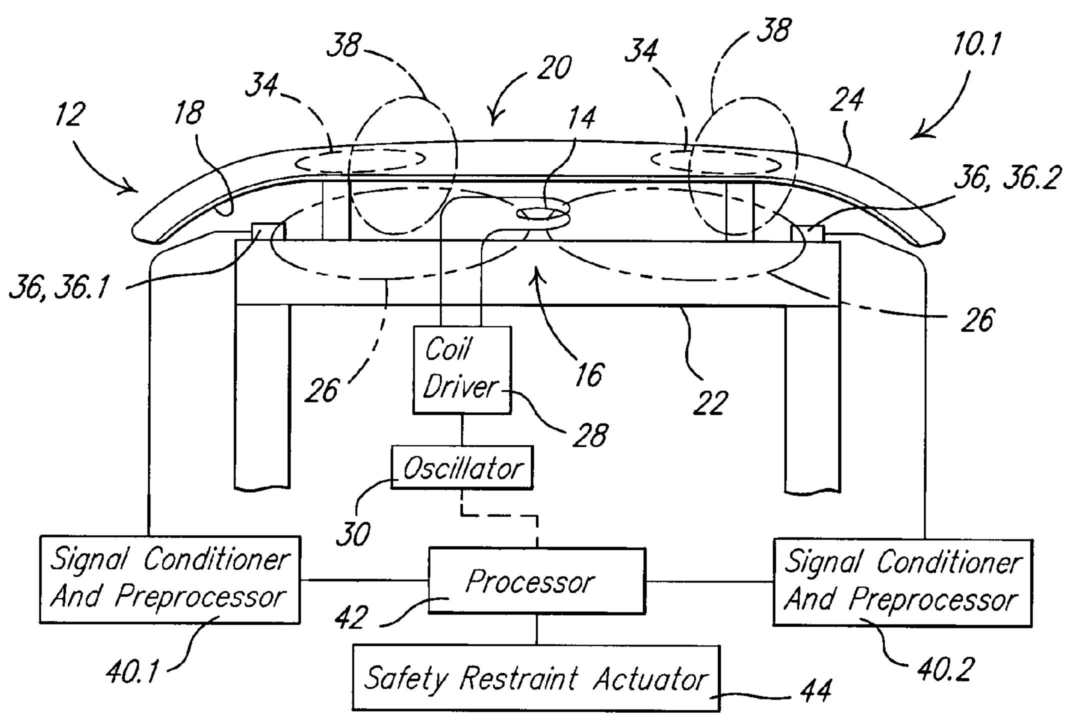
FIG. 2 illustrates a first embodiment of a first aspect of the magnetic crash sensor with the vehicle in an unperturbed state.

Referring to FIGS. 1 and 2, a first embodiment of a first aspect of a magnetic crash sensor 10.1 is incorporated in a vehicle 12 and comprises at least one first coil 14 operatively associated with a first portion 16 of the vehicle 12, and a conductive element 18 either operatively associated with, or at least a part of, a proximate second portion 20 of the vehicle 12. For example, the first embodiment of the first aspect of a magnetic crash sensor 10.1 is adapted to sense a frontal crash, wherein the first portion 16 of the vehicle 12 is illustrated as comprising a front cross beam 22—the at least one first coil 14 being located proximate to a central portion thereof, e.g. mounted thereto,—and the second portion 20 of the vehicle 12 is illustrated as comprising the front bumper 24. The at least one first coil 14 is electrically conductive and is adapted for generating a first magnetic field 26 responsive to a current applied by a first coil driver 28, e.g. responsive to a first oscillatory signal generated by a first oscillator 30. The magnetic axis 32 of the at least one first coil 14 is oriented towards the second portion 20 of the vehicle 12—e.g. substantially along the longitudinal axis of the vehicle 12 for the embodiment illustrated in FIG. 1—so that the first magnetic field 26 interacts with the conductive element 18 operatively associated therewith, thereby causing eddy currents 34 to be generated therein in accordance with Lenz's Law. The conductive element 18 comprises, for example, a thin metal sheet, film or coating, comprising either a paramagnetic or diamagnetic material that is relatively highly conductive, e.g. aluminum or copper, and which, for example, could be an integral part of the second portion 20 of the vehicle 12. For example, the conductive element 18 could be spray coated onto the rear surface of the front bumper 24. The frequency of the first oscillator 30 is adapted so that the corresponding oscillating first magnetic field 26 generated by the at least one first coil 14 both provides for generating the associated eddy currents 34 in the conductive element 18, and is magnetically conducted through the ferromagnetic elements of the vehicle 12, e.g. the front cross beam 22.

The magnetic crash sensor 10.1 further comprises at least one magnetic sensor 36 that is located separate from the at least one first coil 14, and which is adapted to be responsive to the first magnetic field 26 generated by the at least one first coil 14 and to be responsive to a second magnetic field 38 generated by the eddy currents 34 in the conductive element 18 responsive to the first magnetic field 26. For example, the sensitive axis of the at least one magnetic sensor 36 is oriented in substantially the same direction as the magnetic axis 32 of the at least one first coil 14. For example, as illustrated in FIG. 1, the at least one magnetic sensor 36 comprises first 36.1 and second 36.2 magnetic sensors located proximate to the front side of respective distal portions of the front cross beam 22, so as to be responsive to first 26 and second 38 magnetic fields. The magnetic sensor 36 generates a signal responsive to a magnetic field, and can be embodied in a variety of ways, for example, including, but not limited to, a coil, a Hall-effect sensor, or a giant magnetoresistive (GMR) sensor. The first 36.1 and second 36.2 magnetic sensors are operatively coupled to respective first 40.1 and second 40.2 signal conditioner/preprocessor circuits, which, for example, provide for preamplification, filtering, synchronous demodulation, and analog to digital conversion of the associated signals from the first 36.1 and second 36.2 magnetic sensors, e.g. as described in U.S. Pat. No. 6,777,927, which is incorporated herein by reference. The first 40.1 and second 40.2 signal conditioner/preprocessor circuits are each operatively coupled to a processor 42 which processes the signals therefrom, thereby providing for discriminating a crash, and controlling an associated safety restraint actuator 44—e.g. a frontal air bag inflator or a seat belt pretensioner—operatively coupled thereto.

Figure 3:
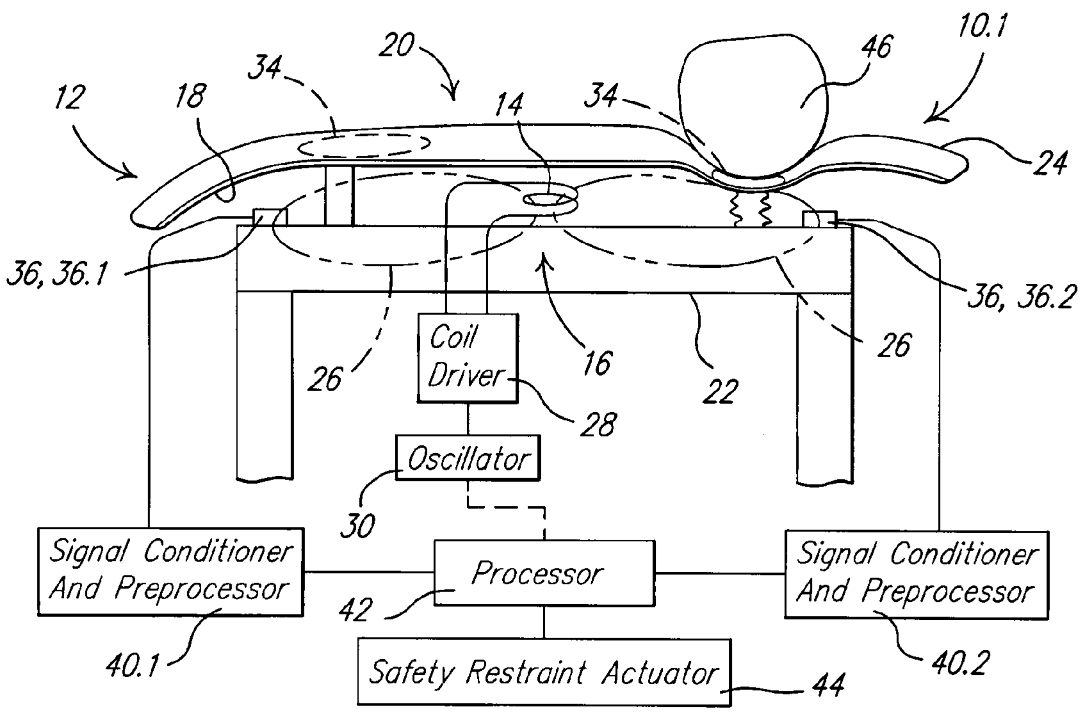
FIG. 3 illustrates the first embodiment of the first aspect of the magnetic crash sensor with the vehicle in a perturbed state responsive to a crash.

Referring to FIG. 3, responsive to a crash with an impacting object 46 of sufficient energy to deform the conductive element 18, changes to the shape or position of the conductive element 18 relative to the at least one first coil 14 and to the magnetic sensor 36 cause a change in the magnetic field received by the first 36.1 and second 36.2 magnetic sensors, which change is detected thereby, and a resulting signal is preprocessed by the signal conditioner/preprocessor circuits 40.1, 40.2. The signal therefrom is processed by a crash sensing algorithm in the processor 42—e.g. by comparison with a threshold or with a reference signal or waveform—and if a crash is detected thereby, e.g. a crash of sufficient severity, then the processor 42 provides for either activating the safety restraint actuator 44 responsive thereto, or provides for activation thereof responsive to a second confirmatory signal from a second crash sensor.

The first aspect of the magnetic crash sensor 10.1 provides for monitoring the shape and position of a front member of a vehicle, such as the bumper, so as to provide early warning for significant energy impacts. The magnetic crash sensor 10.1 could also provide a signal from which impacts with pedestrians can be identified and potentially differentiated from those with other low mass or unfixed objects. For example, a signal responsive to either the first 36.1 or second 36.2 magnetic sensors could be used to actuate pedestrian protection devices; to actuate resettable vehicle passenger restraint devices (e.g. mechanical seatbelt pretensioners); or to alert a frontal crash detection algorithm that a crash is beginning, wherein, for example, the frontal crash detection algorithm might adapt one or more thresholds responsive thereto. The dynamic magnitude of the signal from the magnetic sensor 36 provides a measure of crash severity.

The first aspect of the magnetic crash sensor 10.1 is useful for sensing impacts to elements of the vehicle 12 that are either non-structural or which are readily deformed responsive to a crash. Changes in elements of which the conductive element 18 is either operatively associated or at least a part of cause an associated influence of the associated magnetic field. This influence occurs at the speed of light. Furthermore, direct structural contact between the impacted element—i.e. the conductive element 18—and the associated sensing system—i.e. the at least one first coil 14 and magnetic sensor 36—is not required as would be the case for a crash sensing system dependent upon either an accelerometer or a magnetostrictive sensor, because the first aspect of the magnetic crash sensor 10.1 is responsive to changes in the geometry of the region covered by the magnetic fields associated therewith, which includes the space between the conductive element 18 and the associated at least one first coil 14 and magnetic sensor 36. The responsiveness of the first aspect of the magnetic crash sensor 10.1 is improved if these elements are located so that a nonmagnetic material gap in the associated magnetic circuit is either increased or decreased responsive to a crash, thereby affecting the overall reluctance of the associated magnetic circuit, and as a result, affecting the resulting signal sensed by the magnetic sensor 36.

The first aspect of the magnetic crash sensor 10.1 is well suited for detecting impacts to non-ferrous elements of the vehicle 12. For example, for elements that are poor conductors, the conductive element 18 operatively associated therewith provides for detecting deformations thereof. As another example, for elements that are good conductors, e.g. aluminum bumpers or body panels, those elements inherently comprise the conductive element 18 of the magnetic crash sensor 10.1.

A conductive element 18 could also be added to a ferrous element, e.g. a steel bumper, in accordance with the first aspect of the magnetic crash sensor 10.1, although in order for the effect of the second magnetic field 38 to dominate an effect of a magnetic field within the ferrous element, the associated conductive element 18 on the inside of the ferrous element (steel bumper) would need to be thick enough or conductive enough to prevent the original transmitted first magnetic field 26 from penetrating though to the steel on the other side of the conductive element 18, whereby eddy currents 34 in the conductive element 18 would substantially cancel the magnetic field at some depth of penetration into the conductive element 18 for a sufficiently thick, sufficiently conductive conductive element 18. For example, for a superconducting conductive element 18, there would be no penetration of the first magnetic field 26 into the conductive element 18. Although the depth of penetration of the first magnetic field 26 increases as the conductivity of the conductive element 18 decreases, an aluminum or copper conductive element 18 would not need to be very thick (e.g. 2 mm or less) in order to substantially achieve this effect. The depth of penetration of magnetic fields into conductive elements is known from the art using eddy currents for non-destructive testing, for example, as described in the technical paper eddy-c.pdf available from the internet at http://joe.buckley.net/papers, which technical paper is incorporated herein by reference. Generally, if the thickness of the conductive element 18 exceeds about three (3) standard depths of penetration at the magnetic field frequency, then substantially no magnetic field will transmit therethrough.

Alternatively, in the case of ferromagnetic element, e.g. a steel bumper, a magnetic crash sensor could be constructed as described hereinabove, except without a separate conductive element 18, i.e. separate from the ferromagnetic element which is itself conductive. Accordingly, the first magnetic field 26 would be conducted through this ferromagnetic element second portion 20 of the vehicle 12, which is part of a magnetic circuit further comprising the at least one first coil 14, the first portion 16 of the vehicle 12, and the associated air gaps 48 between the first 16 and second 20 portions of the vehicle 12. In accordance with this aspect, the magnetic sensor 36 would be responsive to changes in the reluctance of the magnetic circuit caused by deformation or translation of the ferromagnetic first portion 16 of the vehicle 12, and by resulting changes in the associated air gaps 48.

Figure 4:
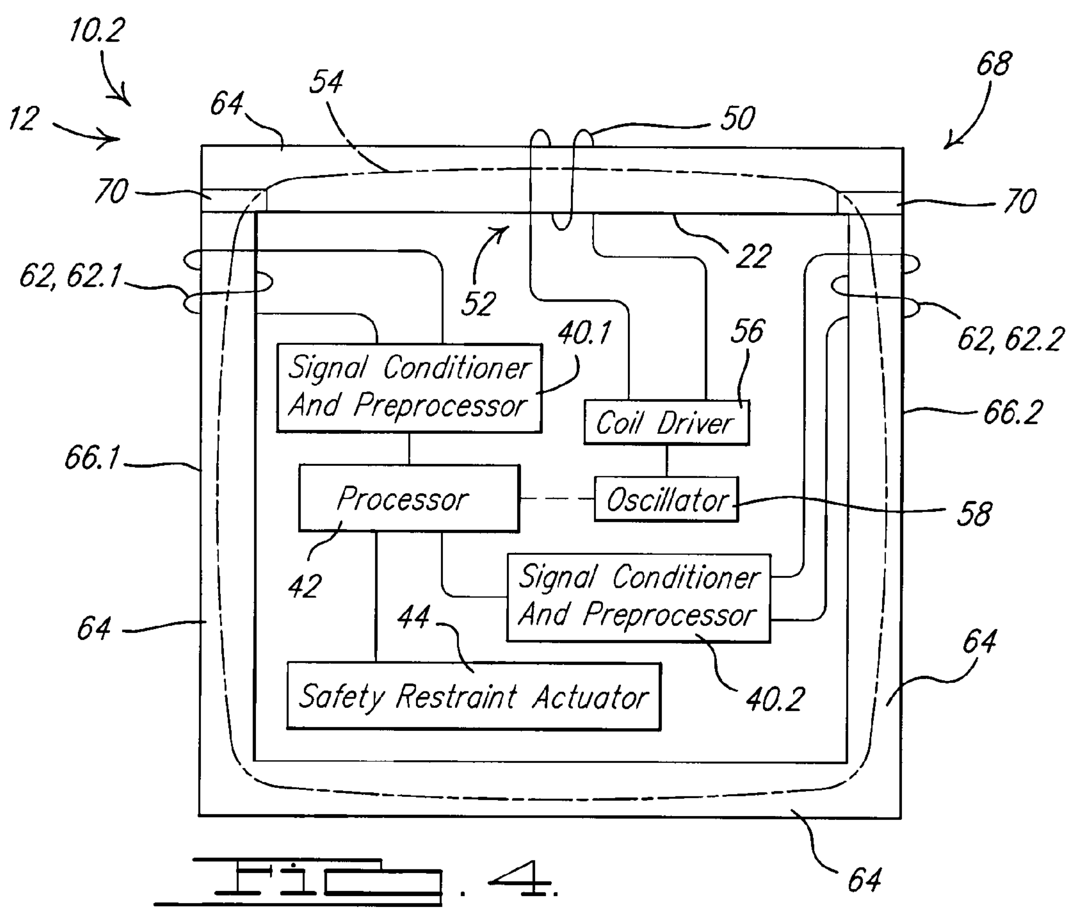
FIG. 4 illustrates a second aspect of a magnetic crash sensor with the vehicle in an unperturbed state.

Referring to FIGS. 1 and 4, a second aspect of a magnetic crash sensor 10.2 incorporated in a vehicle 12 comprises at least one second coil 50 operatively associated with a third portion 52 of the vehicle 12, wherein the third portion 52 can be either proximate to the above described first portion 16, or at another location. For example, the second aspect of a magnetic crash sensor 10.2 is also illustrated as being adapted to sense a frontal crash, wherein the third portion 52 of the vehicle 12 is illustrated as comprising the front cross beam 22, the second coil 50 being located proximate to a central portion thereof, e.g. located around the front cross beam 22. The second coil 50 is electrically conductive and is adapted for generating a third magnetic field 54 responsive to a current applied by a second coil driver 56, e.g. responsive to a second oscillatory signal generated by an second oscillator 58. For example, the second oscillator 58 could be either the same as or distinct from the first oscillator 30, and in the latter case, could operate at a different frequency or could generate either the same type or a different type of waveform as the first oscillator 30, e.g. square wave as opposed to sinusoidal. In one embodiment, the at least one second coil 50 is the same as the above-described at least one first coil 14. In another embodiment, the magnetic axis 60 of a separate at least one second coil 50 is oriented substantially along a ferromagnetic element of the third portion 52 of the vehicle 12, as illustrated in FIG. 1 so that the third magnetic field 54 is induced within the ferromagnetic element of the third portion 52 of the vehicle 12. In yet another embodiment, the at least one second coil 50 is placed rearward relative to the at least one first coil 14. The frequency of the second oscillator 58 is adapted so that the corresponding oscillating third magnetic field 54 generated by the at least one second coil 50 is magnetically conducted through the structural elements of the vehicle 12, e.g. the forward portion of steel frame of the vehicle 12.

The magnetic crash sensor 10.2 further comprises at least one magnetic sensor 62 that is located separate from the at least one second coil 50, and which is adapted to be responsive to the third magnetic field 54 generated by the at least one second coil 50 and conducted through the frame 64 of the vehicle 12 For example, as illustrated in FIG. 1, the at least one magnetic sensor 62 comprises third 62.1 and fourth 62.2 magnetic sensors located around the respective forward portions of the left 66.1 and right 66.2 frame rails. In another embodiment, the magnetic sensor 62 of the second aspect of the magnetic crash sensor 10.2 is the same as the magnetic sensor 36 of the first aspect of the magnetic crash sensor 10.1. The magnetic sensor 62 generates a signal responsive to a magnetic field, and can be embodied in a variety of ways, for example, including, but not limited to, a coil, a Hall-effect sensor, or a giant magnetoresistive (GMR) sensor. For example, a coil of the magnetic sensor 62 could be wound around portions of the frame 64, or the magnetic sensor 62 (i.e. coil, Hall-effect sensor, GMR sensor or other type of magnetic sensor) could be located within an opening of, or on, the frame 64 of the vehicle 12. The third 62.1 and fourth 62.2 magnetic sensors are operatively coupled to respective first 40.1 and second 40.2 signal conditioner/preprocessor circuits, which, for example, provide for preamplification, filtering, synchronous demodulation, and analog to digital conversion of the associated signals from the third 62.1 and fourth 62.2 magnetic sensors, e.g. as described in U.S. Pat. No. 6,777,927, which is incorporated herein by reference.

The third magnetic field 54 is conducted through a magnetic circuit 68 comprising the above described elements of the frame 64 of the vehicle 12, and which may further comprise elements of the body or powertrain, or other associated structural elements, particularly elements comprising ferromagnetic materials. The responsiveness of the second aspect of the magnetic crash sensor 10.2 can be enhanced if the associated magnetic circuit 68 comprises one or more gaps 70 comprising non-magnetic material, the separation thereof which is responsive to a crash to be sensed by the magnetic crash sensor 10.2, thereby modulating the associated reluctance of the magnetic circuit 68 responsive to the crash. For example, the one or more gaps 70 could comprise a structural nonferrous material, such as aluminum or structural plastic of the frame 64 of the vehicle 12, which is adapted to be either compressed or stretched responsive to the crash, causing the associated reluctance of the magnetic circuit 68 to either decrease or increase respectively.

Figure 5:
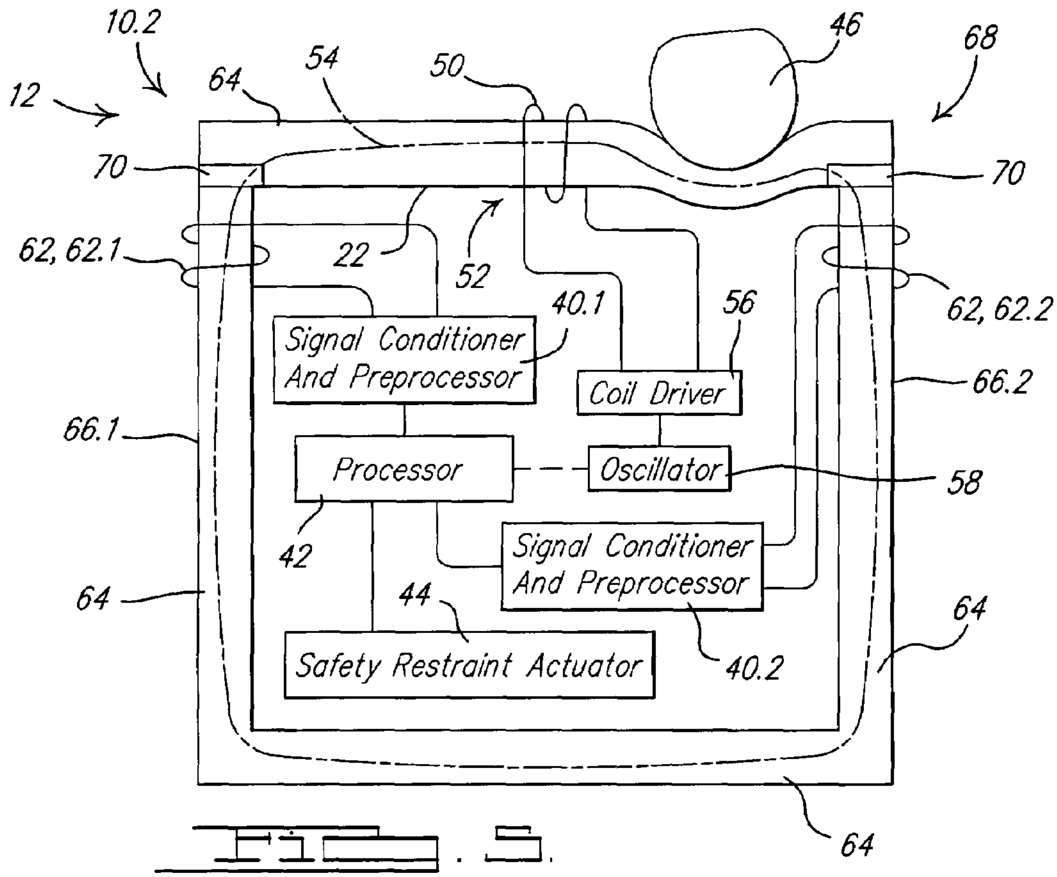
FIG. 5 illustrates the second aspect of the magnetic crash sensor with the vehicle in a perturbed state responsive to a crash.

The second aspect of the magnetic crash sensor 10.2 provides for monitoring damage to the structure of the vehicle 12 responsive to crashes involving a substantial amount of associated inelastic deformation. Referring to FIG. 5, responsive to a crash with an impacting object 46 of sufficient energy to deform the frame 64 of the vehicle 12, associated changes in the reluctance of the associated magnetic circuit 68 responsive to an associated change in the geometry of the associated elements cause an associated change in the magnetic field sensed by the third 62.1 and fourth 62.2 magnetic sensors, which change is detected thereby, and a resulting signal is preprocessed by the signal conditioner/preprocessor circuits 40.1, 40.2. The signal therefrom is processed by a crash sensing algorithm in the processor 42—e.g. by comparison with a threshold or with a reference signal or waveform—and if a crash is detected thereby, e.g. a crash of sufficient severity, then the processor 42 provides for either activating the safety restraint actuator 44 responsive thereto. The detection process of the second aspect of the magnetic crash sensor 10.2 can be made responsive to a detection of a crash in accordance with the first aspect of the magnetic crash sensor 10.1.

Generally, during major crash events where deployment of the safety restraint actuator 44 is desired, significant associated damage and associated metal bending generally occurs to vehicle structures rearward of the front bumper region. After the impacting object 46 has been detected by the first embodiment of the first aspect of the magnetic crash sensor 10.1 as described hereinabove, the vehicle crush zone and crush pattern will generally either be limited to primarily the bumper region or will extend further into the vehicle, impacting one or more major vehicle structural members. If the object intrusion is limited primarily to the bumper or hood region, then a crash would likely be detected only by the first aspect of the magnetic crash sensor 10.1. However, if the impacting object 46 intrudes on a major structural member, then a significant signal change is detected by the third 62.1 and fourth 62.2 magnetic sensors of the second embodiment of the magnetic crash sensor 10.2 responsive to a deformation of the frame 64 of the vehicle 12. The signature of the signal(s) from either of the third 62.1 and fourth 62.2 magnetic sensors, i.e. the associated magnitude and rate of change thereof, can be correlated with impact severity and can be used to actuate one or more safety restraint actuators 44 appropriate for the particular crash. Accordingly, in combination, the first 10.1 and second 10.2 aspects of the magnetic crash sensor provide for faster and better crash discrimination, so as to provide for either actuating or suppressing actuation of the associated safety restraint actuators 44. Furthermore, the affects of a crash on the magnetic circuits of either the first 10.1 or second 10.2 aspects of the magnetic crash sensor are propagated to the respective magnetic sensors 26, 62 at the speed of light, and accordingly is not limited by the speed with which shock waves propagate through the associated structural elements, as would be the case for either accelerometer or magnetostrictive sensing technologies. Furthermore, in combination, the first 10.1 and second 10.2 aspects of the magnetic crash sensor provide for detecting and differentiating various types of frontal impacts, including but not limited to, impacts with pedestrians, other vehicles, fixed objects or other objects, so as to further provide for deploying safety measures that are appropriate to the particular situation, and responsive to the predicted type of impacting object and the detected severity of the impact. Furthermore, the first 10.1 and second 10.2 aspects of the magnetic crash sensor, provide for relatively fast detection of collisions, differentiation between events requiring the actuation of a safety restraint actuator 44 from those for which the actuation thereof should be suppressed, and determination of the location, extent and energy of the collision from the information of the collision that can be detected using the signals from the associated magnetic sensors 26, 62 responsive to the associated magnetic fields 26, 38, 54 of the magnetic crash sensors 10.1, 10.2.

Figure 6:
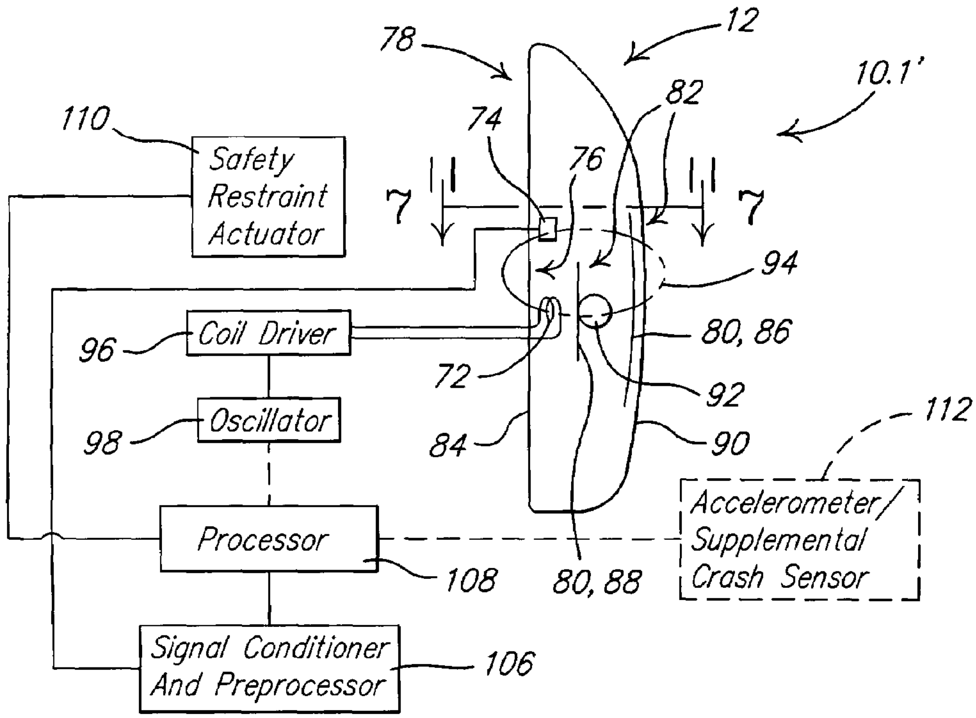
FIG. 6 illustrates a second embodiment of the first aspect of a magnetic crash sensor in a door of the vehicle, showing an end view cross-section of the door.
Figure 7:
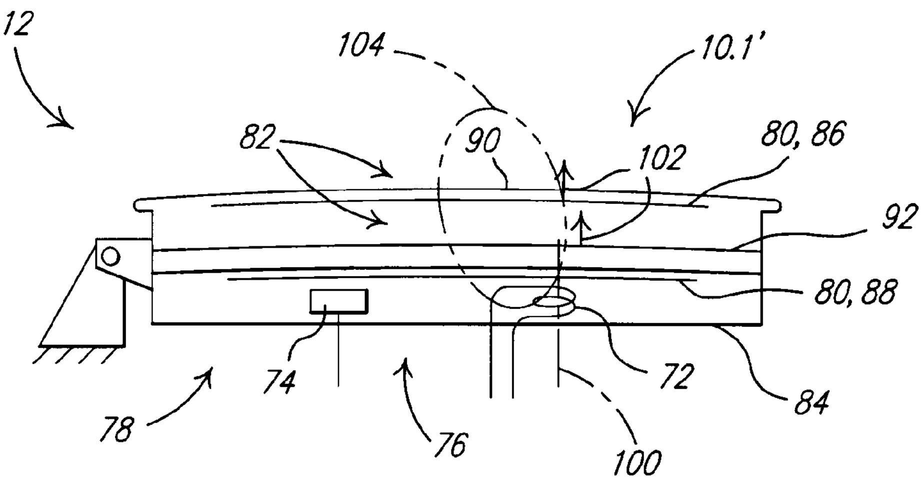
FIG. 7 illustrates the second embodiment of the first aspect of the magnetic crash sensor in the door of the vehicle, showing a top view cross-section of the door.

Referring to FIGS. 6 and 7, in accordance with a second embodiment of the first aspect of a magnetic crash sensor 10.1' adapted to sense a side impact crash, at least one coil 14, 72 and an associated at least one magnetic sensor 74 are operatively associated with a first portion 76 of a door 78 of a vehicle 12, and are adapted to cooperate with at least one conductive element 80 that is operatively associated with, or at least a part of, a proximate second portion 82 of the door 78. For example, in the embodiment illustrated in FIGS. 6 and 7, the first portion 76 of the door 78 comprises an inner panel 84, and the at least one conductive element 80 comprises first 86 and second 88 conductive elements at the outer skin 90 and the door beam 92 of the door 78 respectively, the outer skin 90 and the door beam 92 constituting respective second portions 82 of the door 78. Alternatively, either the outer skin 90 or the door beam 92, if conductive, could serve as the associated conductive element 80 without requiring separate first 86 or second 88 conductive elements that are distinct from the outer skin 90 or the door beam 92 respectively.

The at least one coil 14, 72 is electrically conductive and is adapted for generating a first magnetic field 94 responsive to a current applied by a coil driver 96, e.g. responsive to a first oscillatory signal generated by an oscillator 98. The magnetic axis 100 of the at least one coil 14, 72 is oriented towards the second portion 82 of the door 78—e.g. towards the outer skin 90 of the door 78, e.g. substantially along the lateral axis of the vehicle for the embodiment illustrated in FIGS. 6 and 7—so that the first magnetic field 94 interacts with the conductive elements 86, 88 operatively associated therewith, thereby causing eddy currents 102 to be generated therein in accordance Lenz's Law. The conductive elements 86, 88 each comprise, for example, a thin metal sheet, film or coating, comprising either a paramagnetic or diamagnetic material that is relatively highly conductive, e.g. aluminum or copper, and which, for example, could be an integral part of the second portion 82 of the door 78. For example, the conductive elements 86, 88 could be in the form of relatively thin plates, a film, or a coating that is mounted on, applied to, or integrated with existing or supplemental structures associated with the door beam 92 and the inside surface of the outer skin 90 of the door 78 respectively. The frequency of the oscillator 98 is adapted so that the corresponding oscillating magnetic field generated by the at least one coil 14, 72 both provides for generating the associated eddy currents 102 in the conductive elements 86, 88, and is magnetically conducted through the ferromagnetic elements of the door 78 and proximate structure of the vehicle 12.

The at least one magnetic sensor 74 is located separate from the at least one coil 14, 72, and is adapted to be responsive to the first magnetic field 94 generated by the at least one coil 14, 72 and to be responsive to a second magnetic field 104 generated by the eddy currents 102 in the conductive elements 86, 88 responsive to the first magnetic field 94. For example, the sensitive axis of the at least one magnetic sensor 74 is oriented in substantially the same direction as the magnetic axis 100 of the at least one coil 14, 72. The magnetic sensor 74 generates a signal responsive to a magnetic field, and can be embodied in a variety of ways, for example, including, but not limited to, a coil, a Hall-effect sensor, or a giant magnetoresistive (GMR) sensor. The number of magnetic sensors 74 and the spacing and positioning thereof on the inner panel 84 of the door 78 is dependent upon the vehicle 12, the type of performance required, and associated cost constraints. Generally, more magnetic sensors 74 would possibly provide higher resolution and faster detection speed, but at increased system cost. Increasing either the vertical or fore/aft spacing between two or more magnetic sensors 74 reduces associated coupling with the first magnetic field 94, increases coupling with the second magnetic field 104, and provides for a more general or average indication of electrically conductive element movement during a crash, potentially slowing the ultimate detection response, but increasing immunity to false positive crash detections, i.e. immunity to non-crash events. With only one coil 14, 72 and one magnetic sensor 74, it may be beneficial to provide a separation thereof of about ¼ to ⅓ the length of a major diagonal though the cavity within the door 78.

The at least one magnetic sensor 74 is operatively coupled to a respective signal conditioner/preprocessor circuit 106, which, for example, provide for preamplification, filtering, synchronous demodulation, and analog to digital conversion of the associated signals from the at least one magnetic sensor 74, e.g. as described in U.S. Pat. No. 6,777,927, which is incorporated herein by reference. The signal conditioner/preprocessor circuit 106 is operatively coupled to a processor 108 which processes the signal therefrom, thereby providing for discriminating a crash, and controlling an associated safety restraint actuator 110—e.g. a side air bag inflator—operatively coupled thereto.

In operation, the magnetic crash sensor 10.1' provides a measure of the relative motion of either the outer skin 90 or the door beam 92 relative to the inner panel 84 of the door 78, for example, as caused by a crushing or bending of the door 78 responsive to a side-impact of the vehicle 12. During non-crash conditions, an oscillating magnetic field resulting from the combination of the first 94 and second 104 magnetic fields would be sensed by the at least one magnetic sensor 74. If an object impacted the outer skin 90 of the door 78 causing a physical deflection thereof, then this oscillating magnetic field would be perturbed at least in part by changes in the second magnetic field 104 caused by movement or deformation of the associated first conductive element 86 and the associated changes in the associated eddy currents 102 therein. If the impact is of sufficient severity, then the door beam 92 and the associated second conductive element 88 would also be moved or deformed thereby, causing additional and more substantial changes in the associated eddy currents 102 in the second conductive element 88 and the corresponding second magnetic field 104. Generally, the door beam 92 and associated second conductive element 88 would either not be significantly perturbed or would only be perturbed at a reduced rate of speed during impacts that are not of sufficient severity to warrant deployment of the associated safety restraint actuator 110, notwithstanding that there may be substantial associated deformation of the outer skin 90 of the door 78. Accordingly, in a magnetic crash sensor 10.1' incorporating only a single conductive element 80, a preferred location thereof would be that of the second conductive element 88 described hereinabove.

In accordance with another embodiment, an accelerometer 112, or another crash sensor, could be used in combination with the above-described magnetic crash sensor 10.1' in order to improve reliability by providing a separate confirmation of the occurrence of an associated crash, which may be useful in crashes for which there is not a significant deflection of either the outer skin 90 of the door 78, or of the door beam 92, relatively early in the crash event—for example, as a result of a pole impact centered on the B-pillar or a broad barrier type impact that spans across and beyond the door 78—for which the magnetic crash sensor 10.1', if used alone, might otherwise experience a delay in detecting the crash event. For example, a supplemental accelerometer 112 might be located at the base of the B-pillar of the vehicle 12. As another example, an additional supplemental accelerometer 112 might be located proximate to the safety restraint actuator 110. In a system for which the magnetic crash sensor 10.1' is supplemented with a separate crash sensor, e.g. an accelerometer 112, the safety restraint actuator 110 would be deployed either if the magnetic crash sensor 10.1' detected a significant and relatively rapid change in the magnetic field in combination with the acceleration exceeding a relatively low threshold, or if the accelerometer 112 detected a significant and relatively rapid change in acceleration in combination with the magnetic crash sensor 10.1' detecting at least a relatively less significant and relatively less rapid change in the magnetic field.

It should be understood, that the performance of a coil used for either generating or sensing a magnetic field may sometimes be enhanced by the incorporation of an associated magnetic core of relatively high magnetic permeability. Furthermore, it should be understood that the signal applied to either the at least one first coil 14, second coil 50 or of coil 14, 72 could be a direct current signal so as to create a steady magnetic field. Alternatively, those coils could be replaced with corresponding permanent magnets, whereby the associated magnetic crash sensors 10.1, 10.1' or 10.2 would then be responsive to transients in the magnetic fields responsive to an associated crash. Furthermore, it should be understood that the particular oscillatory waveform of the first oscillator 30, second oscillator 58 or oscillator 98 is not limiting, and could be, for example, a sine wave, a square wave, a sawtooth wave, or some other waveform; of a single frequency, or of plural frequencies that are either stepped or continuously varied.

Figure 8:
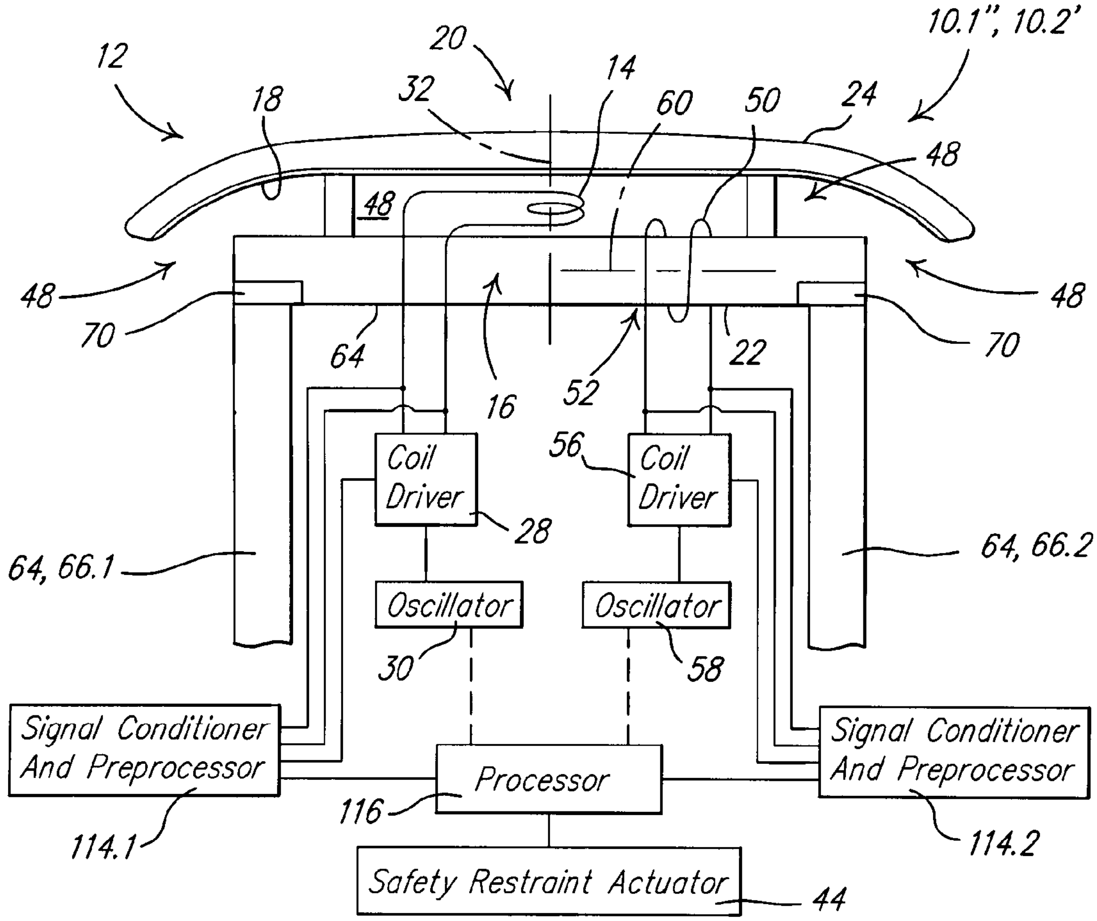
FIG. 8 illustrates a third embodiment of the first aspect of a magnetic crash sensor and a second embodiment of the second aspect of a magnetic crash sensor.

Referring to FIG. 8, a third embodiment of a first aspect of a magnetic crash sensor 10.1" is incorporated in a vehicle 12 and comprises at least one first coil 14 operatively associated with a first portion 16 of the vehicle 12, and a conductive element 18 either operatively associated with, or at least a part of, a proximate second portion 20 of the vehicle 12. For example, the third embodiment of a first aspect of a magnetic crash sensor 10.1" is adapted to sense a frontal crash, wherein the first portion 16 of the vehicle 12 is illustrated as comprising a front cross beam 22—the at least one first coil 14 being located proximate to a central portion thereof, e.g. mounted thereto,—and the second portion 20 of the vehicle 12 is illustrated as comprising the front bumper 24. The at least one first coil 14 is electrically conductive and is adapted for generating a first magnetic field 26 responsive to a current applied by a first coil driver 28, e.g. responsive to a first oscillatory signal generated by a first oscillator 30. The magnetic axis 32 of the at least one first coil 14 is oriented towards the second portion 20 of the vehicle 12—e.g. substantially along the longitudinal axis of the vehicle 12 for the embodiment illustrated in FIG. 8—so that the first magnetic field 26 interacts with the conductive element 18 operatively associated therewith, thereby causing eddy currents 34 to be generated therein in accordance with Lenz's Law. The conductive element 18 comprises, for example, a thin metal sheet, film or coating, comprising either a paramagnetic or diamagnetic material that is relatively highly conductive, e.g. aluminum or copper, and which, for example, could be an integral part of the second portion 20 of the vehicle 12. For example, the conductive element 18 could be spray coated onto the rear surface of the front bumper 24. The frequency of the first oscillator 30 is adapted so that the corresponding oscillating first magnetic field 26 generated by the at least one first coil 14 provides for generating the associated eddy currents 34 in the conductive element 18.

The at least one first coil 14 is operatively coupled to a signal conditioner/preprocessor circuit 114.1 which, for example, provides for preamplification, filtering, synchronous demodulation and analog to digital conversion of the associated signal from the at least one first coil 14. The signal conditioner/preprocessor circuit 114.1 is operatively coupled to a processor 116 which processes the signals therefrom, thereby providing for discriminating a crash, and controlling an associated safety restraint actuator 44—e.g. a frontal air bag inflator or a seat belt pretensioner—operatively coupled thereto. More particularly, the processor 116 provides for determining a measure responsive to the self-impedance of the at least one first coil 14 responsive to an analysis of the complex magnitude of the signal from the at least one first coil 14, for example, in relation to the signal applied thereto by the associated oscillator 30.

Responsive to a crash with an impacting object 46 (e.g. as illustrated in FIG. 3) of sufficient energy to deform the conductive element 18, changes to the shape or position of the conductive element 18 relative to the at least one first coil 14 affects the magnetic field affecting the at least one first coil 14. A resulting signal is preprocessed by the signal conditioner/preprocessor circuit 114.1, which provides for measuring the signal across the at least one first coil 14 and provides for measuring the signal applied thereto by the associated coil driver 28. The signal conditioner/preprocessor circuit 114.1—alone, or in combination with the processor 116, provides for decomposing the signal from the at least one first coil 14 into real and imaginary components, for example, using the signal applied by the associated coil driver 28 as a phase reference.

The decomposition of a signal into corresponding real and imaginary components is well known in the art, and may be accomplished using analog circuitry, digital circuitry or by software or a combination thereof. For example, U.S. Pat. Nos. 4,630,229, 6,005,392 and 6,288,536—all of which is incorporated by reference herein in their entirety—each disclose various systems and methods for calculating in real-time the real and imaginary components of a signal which can be used for processing the signal from the at least one first coil 14. A Maxwell-Wien bridge, e.g. incorporated in the signal conditioner/preprocessor circuit 114.1, may also be used to determine the real and imaginary components of a signal, or a phase-locked loop may be used to determine the relative phase of a signal with respect to a corresponding signal source, which then provides for determining the associated real and imaginary components. Various techniques known from the field eddy current inspection can also be used for processing the signal from the at least one first coil 14, for example, as disclosed in the Internet web pages at http:// www.ndt-ed.org/EducationResources/CommunityCollege/EddyCurrents/cc_ec_index.htm, which are incorporated herein by reference. The magnetic sensor 10 can employ various signal processing methods to improve performance, for example, multiple frequency, frequency hopping, spread spectrum, amplitude demodulation, phase demodulation, frequency demodulation, etc.

A signal responsive to the self-impedance of the at least one first coil 14—e.g. responsive to the real and imaginary components of the signal from the one first coil 14—is processed by a crash sensing algorithm in the processor 116—e.g. by comparison with a threshold or with a reference signal or waveform—and if a crash is detected thereby, e.g. a crash of sufficient severity, then the processor 42 provides for either activating the safety restraint actuator 44 responsive thereto, or provides for activation thereof responsive to a second confirmatory signal from a second crash sensor.

Referring to FIG. 8, and further to the teachings of U.S. Pat. No. 6,587,048, which is incorporated herein by reference, a second embodiment of a second aspect of a magnetic crash sensor 10.2' incorporated in a vehicle 12 comprises at least one second coil 50 operatively associated with a third portion 52 of the vehicle 12, wherein the third portion 52 can be either proximate to the above described first portion 16, or at another location. For example, the second aspect of a magnetic crash sensor 10.2 is also illustrated as being adapted to sense a frontal crash, wherein the third portion 52 of the vehicle 12 is illustrated as comprising the front cross beam 22, the second coil 50 being located proximate to a central portion thereof, e.g. located around the front cross beam 22. The second coil 50 is electrically conductive and is adapted for generating a third magnetic field 54 responsive to a current applied by a second coil driver 56, e.g. responsive to a second oscillatory signal generated by an second oscillator 58. For example, the second oscillator 58 could be either the same as or distinct from the first oscillator 30, and in the latter case, could operate at a different frequency or could generate either the same type or a different type of waveform as the first oscillator 30, e.g. square wave as opposed to sinusoidal. In one embodiment, the at least one second coil 50 is the same as the above-described at least one first coil 14. In another embodiment, the magnetic axis 60 of a separate at least one second coil 50 is oriented substantially along a ferromagnetic element of the third portion 52 of the vehicle 12, as illustrated in FIG. 8 so that the third magnetic field 54 is induced within the ferromagnetic element of the third portion 52 of the vehicle 12. In yet another embodiment, the at least one second coil 50 is placed rearward relative to the at least one first coil 14. The frequency of the second oscillator 58 is adapted so that the corresponding oscillating third magnetic field 54 generated by the at least one second coil 50 is magnetically conducted through the structural elements of the vehicle 12, e.g. the forward portion of steel frame of the vehicle 12.

The at least one second coil 50 is operatively coupled to a signal conditioner/preprocessor circuit 114.2 which, for example, provides for preamplification, filtering, synchronous demodulation and analog to digital conversion of the associated signal from the at least one second coil 50. The signal conditioner/preprocessor circuit 114.2 is operatively coupled to a processor 116 which processes the signals therefrom, thereby providing for discriminating a crash, and controlling an associated safety restraint actuator 44—e.g. a frontal air bag inflator or a seat belt pretensioner—operatively coupled thereto. More particularly, the processor 116 provides for determining a measure responsive to the self-impedance of the at least one second coil 50 responsive to an analysis of the complex magnitude of the signal from the at least one second coil 50, for example, in relation to the signal applied thereto by the associated oscillator 58.

The third magnetic field 54 is conducted through a magnetic circuit 68 comprising the above described elements of the frame 64 of the vehicle 12, and which may further comprise elements of the body or powertrain, or other associated structural elements, particularly elements comprising ferromagnetic materials. The responsiveness of the second aspect of the magnetic crash sensor 10.2' can be enhanced if the associated magnetic circuit 68 comprises one or more gaps 70 comprising non-magnetic material, the separation thereof which is responsive to a crash to be sensed by the magnetic crash sensor 10.2', thereby modulating the associated reluctance of the magnetic circuit 68 responsive to the crash. For example, the one or more gaps 70 could comprise a structural nonferrous material, such as aluminum or structural plastic of the frame 64 of the vehicle 12, which is adapted to be either compressed or stretched responsive to the crash, causing the associated reluctance of the magnetic circuit 68 to either decrease or increase respectively.

The signal conditioner/preprocessor circuit 114.2 provides for measuring the signal across the at least one second coil 50 and provides for measuring the signal applied thereto by the associated coil driver 56. The signal conditioner/preprocessor circuit 114.2—alone, or in combination with the processor 116, provides for decomposing the signal from the at least one second coil 50 into real and imaginary components, for example, using the signal applied by the associated oscillator 58 as a phase reference. A signal responsive to the self-impedance of the at least one second coil 50—e.g. responsive to the real and imaginary components of the signal from the one second coil 50—is processed by a crash sensing algorithm in the processor 116—e.g. by comparison with a threshold or with a reference signal or waveform—and if a crash is detected thereby, e.g. a crash of sufficient severity, then the processor 42 provides for either activating the safety restraint actuator 44 responsive thereto, or provides for activation thereof responsive to a second confirmatory signal from a second crash sensor.

It should be understood that the third embodiment of a first aspect of a magnetic crash sensor 10.1" and the second embodiment of a second aspect of a magnetic crash sensor 10.2' may be used either in combination—as illustrated in FIG. 8, or either of the embodiments may be used alone.

Figure 9:
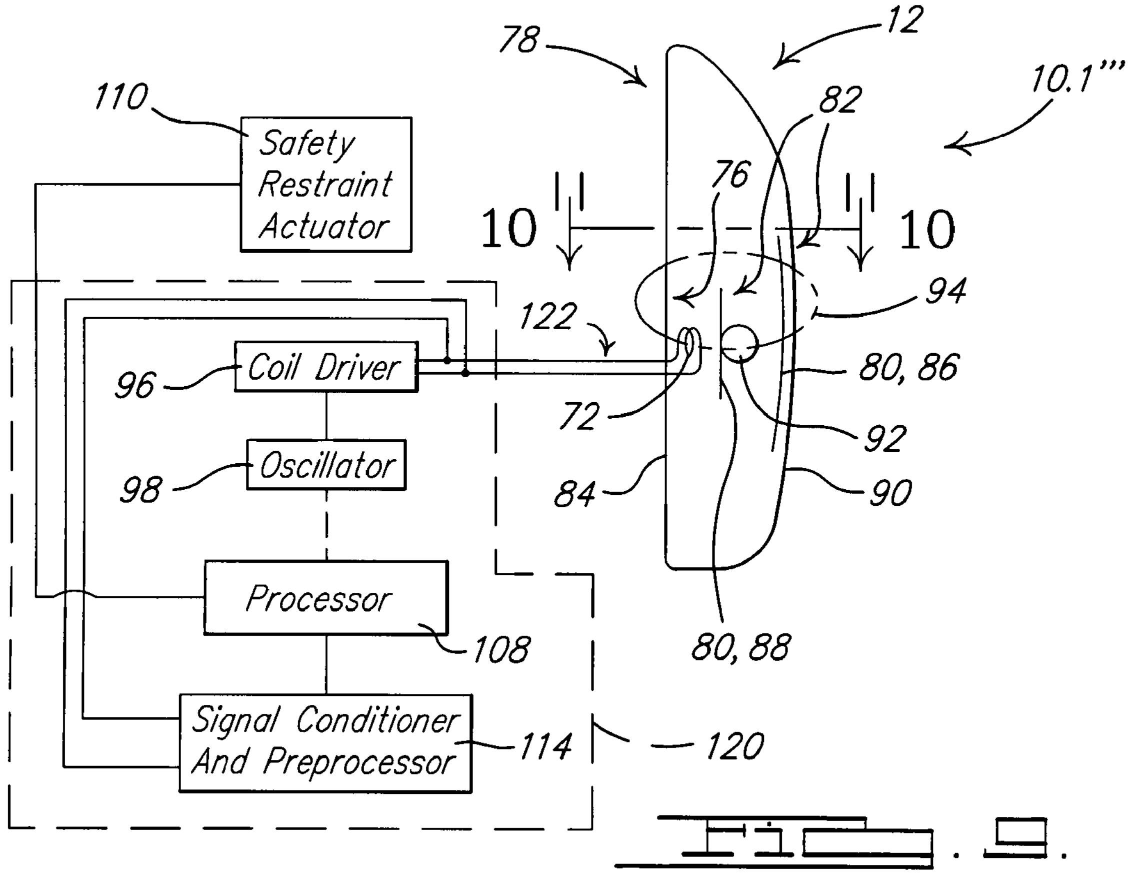
FIG. 9 illustrates a fourth embodiment of the first aspect of a magnetic crash sensor in the door of a vehicle, showing an end view cross-section of the door.
Figure 10:
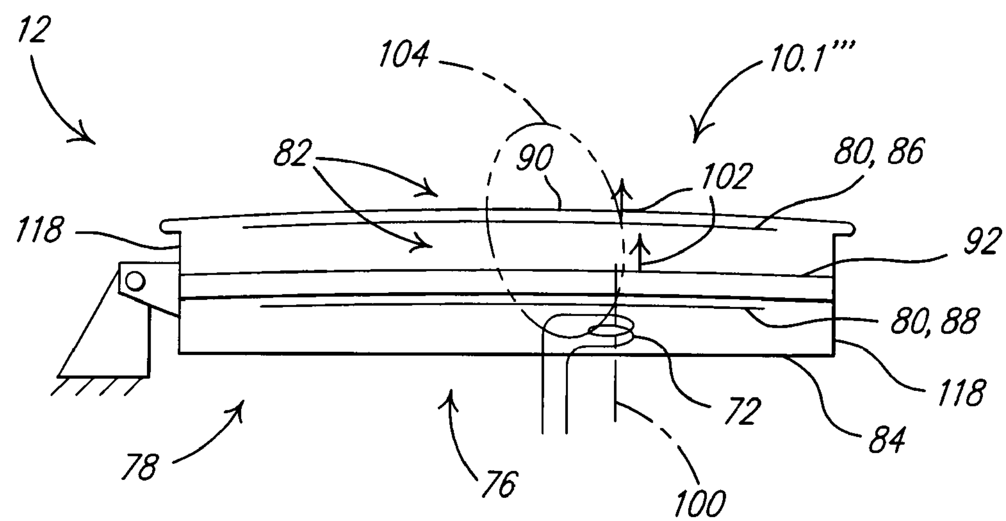
FIG. 10 illustrates the fourth embodiment of the first aspect of the magnetic crash sensor in the door of the vehicle, showing a top view cross-section of the door.

Referring to FIGS. 9 and 10, in accordance with a fourth embodiment of the first aspect of a magnetic crash sensor 10.1'" adapted to sense a side impact crash, at least one coil 14, 72 is operatively associated with a first portion 76 of a door 78 of a vehicle 12, and is adapted to cooperate with at least one conductive element 80 that is operatively associated with, or at least a part of, a proximate second portion 82 of the door 78. For example, in the embodiment illustrated in FIGS. 9 and 10, the first portion 76 of the door 78 comprises the inner panel 84, and the at least one conductive element 80 comprises first 86 and second 88 conductive elements at the outer skin 90 and the door beam 92 of the door 78 respectively, the outer skin 90 and the door beam 92 constituting respective second portions 82 of the door 78. Alternatively, either the outer skin 90 or the door beam 92, if conductive, could serve as the associated conductive element 80 without requiring separate first 86 or second 88 conductive elements that are distinct from the outer skin 90 or the door beam 92 respectively.

The at least one coil 14, 72 is electrically conductive and is adapted for generating a first magnetic field 94 responsive to a current applied by a coil driver 96, e.g. responsive to a first oscillatory signal generated by an oscillator 98. The magnetic axis 100 of the at least one coil 14, 72 is oriented towards the second portion 82 of the door 78—e.g. towards the outer skin 90 of the door 78, e.g. substantially along the lateral axis of the vehicle for the embodiment illustrated in FIGS. 9 and 10—so that the first magnetic field 94 interacts with the conductive elements 86, 88 operatively associated therewith, thereby causing eddy currents 102 to be generated therein in accordance Lenz's Law. For example, the at least one coil 14, 72 may comprise a coil of wire of one or more turns, or at least a substantial portion of a turn, wherein the shape of the coil 14, 72 is not limiting, and may for example be circular, elliptical, rectangular, polygonal, or any production intent shape. For example, the coil 14, 72 may be wound on a bobbin, and, for example, sealed or encapsulated, for example, with a plastic or elastomeric compound adapted to provide for environmental protection and structural integrity. The resulting coil assembly may further include a connector integrally assembled, e.g. molded, therewith. Alternatively, the at least one coil 14, 72 may be formed by wire bonding, wherein the associated plastic coating is applied during the associated coil winding process.

In one embodiment, the size and shape of the coil 14, 72 are adapted so that the induced first magnetic field 94 covers the widest portion of the door 78. In another embodiment, depending on door 78 structural response, this coverage area can be reduced or shaped to best respond to an intruding metal responsive to a crash. For example, a CAE (Computer Aided Engineering) analysis involving both crash structural dynamics and/or electromagnetic CAE can be utilized to determine or optimized the size, shape, thickness—i.e. geometry—of the coil 14, 72 that both satisfies associated packaging requirements within the door 78 and provides sufficient crash detection capability.

For example, in one embodiment, an assembly comprising the at least one coil 14, 72 is positioned within the door 78 of the vehicle 12 so that the magnetic axis 100 of the at least one coil 14, 72 is substantially perpendicular to the outer skin 90 of the door 78, wherein the outer skin 90 is used as an associated sensing surface. Alternatively, the mounting angle relative to the outer skin 90 may be optimized to account for the shape of the associated metal surface and the relative proximity and influence of an associated door beam 92 or other structural elements relative to the outer skin 90. The position of the coil 14, 72 may be chosen so that the coil 14, 72 is responsive to structures, structural elements or body elements that typically intrude relative to an occupant responsive to a crash, so as to provide for optimizing responsiveness to a measure of crash intrusion for ON crashes, while also providing for sufficient immunity to OFF crashes, for both regulatory and real world crash modes. For example, the coil 14, 72 within the door 78 could be adapted to be responsive to the outer skin 90, a conductive element 80, 86 operatively associated therewith, a door beam 92, a conductive element 80, 88 operatively associated therewith, or an edge wall 118 of the door 78, either individually or in combination.

The position, size, thickness of the chosen sensor coil 14, 72 are selected to fit within the mechanical constraints of and within the door 78 associated with electrical or mechanical functions such as window movement, door 78 locks, etc. For example, in accordance with one embodiment, the coil 14, 72 is affixed to an inner portion of the door 78, for example, through rigid and reliable attachment to an inner panel 84 of the door 78*b*, so as to reduce or minimize vibration of the coil 14, 72 relative to the associated conductive element 80 being sensed (e.g. a metallic outer skin 90 of the door 78). For example, in accordance with another embodiment, the sensing coil 14, 72 could molded into an inner panel 84 of the door 78 during the manufacturing of the door 78, and/or the inner panel 84 could be adapted to provide for a snap insert for the sensing coil 14, 72 therein.

For a coil 14, 72 mounted within the door 78, the position/location of the coil 14, 72 may be chosen such that any conductive and/or ferromagnetic structural or body elements proximate to the inside side of the coil 14, 72 are relatively rigidly fixed so as reduce electromagnetic influences of these elements on the coil 14, 72, thereby emphasizing an influence of a crash intrusion from the exterior side of the door 78. Accordingly, it is beneficial for the coil 14, 72 to be relatively rigidly mounted to within the vehicle 12 so that the amount of relative motion between the coil 14, 72 and any nearby conductive materials is limited when actual metal deformation/intrusion does not occur, for example, as a result of vibration, particularly for conductive materials within about one coil radius of the coil 14, 72.

The coil 14, 72 would be mounted so as to be responsive to the surface being sensed or monitored. For example, in one embodiment, the coil 14, 72 is mounted a distance within about one coil 14, 72 radius (e.g. for a circular coil 14, 72) away from the outer skin 90 or target conductive element 80, 86, 88 to be monitored. The coil 14, 72 does not require any particular shape, and regardless of the shape, the associated effective sensing distance can be measured experimentally. The particular distance of the coil 14, 72 from the element or surface being sensed will depend upon the particular application. Generally, a range of mounting distances is possible. For example, the coil 14, 72 could be placed relatively close to the element or surface being sensed provide that the coil 14, 72 is not damaged during OFF conditions. Alternatively, the coil 14, 72 could be placed more than one radius away from the element or surface being sensed in order to reduce mechanical abuse susceptibility, provided that the structure of the door 78 provided for relatively greater movement of the outer skin 90 during non-crash, abuse events. Testing has shown that using a bridge circuit in the signal conditioner/preprocessor circuit 114 to improve sensitivity, changes to signal from coil 14, 72 responsive to the element or surface being sensed can be detected even when the distance from the coil 14, 72 to the element or surface being sensed is greater than one radius, however electromagnetic interference may limit the extent to which this extended range may be utilized in some situations.

Generally the coil 14, 72 comprises an element or device that operates in accordance with Maxwell's and Faraday's Laws to generate a first magnetic field 94 responsive to the curl of an associated electric current therein, and similarly to respond to a time-varying first magnetic field 94 coupled therewith so as to generate a voltage or back-EMF thereacross responsive thereto, responsive to the reluctance of the magnetic circuit associated therewith.

The conductive elements 86, 88 each comprise, for example, a thin metal sheet, film or coating, comprising either a paramagnetic or diamagnetic material that is relatively highly conductive, e.g. aluminum or copper, and which, for example, could be an integral part of the second portion 82 of the door 78. For example, the conductive elements 86, 88 could be in the form of relatively thin plates, a film, a tape (e.g. aluminum or copper), or a coating that is mounted on, applied to, or integrated with existing or supplemental structures associated with the door beam 92 and the inside surface of the outer skin 90 of the door 78 respectively.

The frequency of the oscillator 98 is adapted so that the corresponding oscillating magnetic field generated by the at least one coil 14, 72 both provides for generating the associated eddy currents 102 in the conductive elements 86, 88, and is magnetically conducted through the ferromagnetic elements of the door 78 and proximate structure of the vehicle 12.

The at least one coil 14, 72 is responsive to both the first magnetic field 94 generated by the at least one coil 14, 72 and a second magnetic field 104 generated by the eddy currents 102 in the conductive elements 86, 88 responsive to the first magnetic field 94. The self-impedance of the coil 14, 72 is responsive to the characteristics of the associated magnetic circuit, e.g. the reluctance thereof and the affects of eddy currents in associated proximal conductive elements. Accordingly, the coil 14, 72 acts as a combination of a passive inductive element, a transmitter and a receiver. The passive inductive element exhibits self-inductance and self resistance, wherein the self-inductance is responsive to the geometry (coil shape, number of conductors, conductor size and cross-sectional shape, and number of turns) of the coil 14, 72 and the permeability of the associated magnetic circuit to which the associated magnetic flux is coupled; and the self-resistance of the coil is responsive to the resistivity, length and cross-sectional area of the conductors constituting the coil 14, 72. Acting as a transmitter, the coil 14, 72 generates and transmits a first magnetic field 94 to its surroundings, and acting as a receiver, the coil 14, 72 generates a voltage responsive to a time varying second magnetic field 104 generated by eddy currents in associated conductive elements within the surroundings, wherein the eddy currents are generated responsive to the time varying first magnetic field 94 generated and transmitted by the coil 14, 72 acting as a transmitter. The signal generated by the coil 14, 72 responsive to the second magnetic field 104 received by the coil 14, 72, in combination with the inherent self-impedance of the coil 14, 72, causes a complex current within or voltage across the coil 14, 72 responsive to an applied time varying voltage across or current through the coil 14, 72, and the ratio of the voltage across to the current through the coil 14, 72 provides an effective self-impedance of the coil 14, 72, changes of which are responsive to changes in the associated magnetic circuit, for example, resulting from the intrusion or deformation of proximal magnetic-field-influencing—e.g. metal—elements.

The at least one coil 14, 72 is operatively coupled to a signal conditioner/preprocessor circuit 114, which, for example, provides for preamplification, filtering, synchronous demodulation, and analog to digital conversion of the associated signal(s) therefrom, e.g. as described in U.S. Pat. Nos. 6,587,048 and 6,777,927, which is incorporated herein by reference. The signal conditioner/preprocessor circuit 114 is operatively coupled to a processor 116 which processes the signal therefrom, thereby providing for discriminating a crash, and controlling an associated safety restraint actuator 110—e.g. a side air bag inflator—operatively coupled thereto. More particularly, the signal conditioner/preprocessor circuit 114 provides for determining a measure responsive to the self-impedance of the at least one coil 14, 72 responsive to an analysis of the complex magnitude of the signal from the at least one coil 14, 72, for example, in relation to the signal applied thereto by the associated oscillator 98. For example, in one embodiment, the signal conditioner/preprocessor circuit 114, coil driver 96, oscillator 98 and processor 108 are incorporated in an electronic control unit 120 that is connected to the at least one coil 14, 72 with standard safety product cabling 122, which may include associated connectors.

In operation, the magnetic crash sensor 10.1''' provides a measure of the relative motion of either the outer skin 90 or the door beam 92 relative to the inner panel 84 of the door 78, for example, as caused by a crushing or bending of the door 78 responsive to a side-impact of the vehicle 12. During non-crash conditions, an oscillating magnetic field resulting from the combination of the first 94 and second 104 magnetic fields would be sensed by the at least one coil 14, 72. If an object impacted the outer skin 90 of the door 78 causing a physical deflection thereof, then this oscillating magnetic field would be perturbed at least in part by changes in the second magnetic field 104 caused by movement or deformation of the associated first conductive element 86 and the associated changes in the associated eddy currents 102 therein. If the impact is of sufficient severity, then the door beam 92 and the associated second conductive element 88 would also be moved or deformed thereby, causing additional and more substantial changes in the associated eddy currents 102 in the second conductive element 88 and the corresponding second magnetic field 104. Generally, the door beam 92 and associated second conductive element 88 would not be perturbed during impacts that are not of sufficient severity to warrant deployment of the associated safety restraint actuator 110, notwithstanding that there may be substantial associated deformation of the outer skin 90 of the door 78. Accordingly, in one embodiment, a magnetic crash sensor 10.1''' might incorporate the second conductive element 88, and not the first conductive element 86.

Responsive to a crash with an impacting object of sufficient energy to deform the at least one conductive element 80, changes to the shape or position of the at least one conductive element 80 relative to the at least one coil 14, 72 affect the magnetic field affecting the at least one coil 14, 72. A resulting signal is preprocessed by the signal conditioner/preprocessor circuit 114, which provides for measuring the signal across the at least one coil 14, 72 and provides for measuring the signal applied thereto by the associated coil driver 96. The signal conditioner/preprocessor circuit 114—alone, or in combination with another processor 116—provides for decomposing the signal from the at least one coil 14, 72 into real and imaginary components, for example, using the signal applied by the associated coil driver 96 as a phase reference.

Whereas FIGS. 9 and 10 illustrate a magnetic crash sensor 10.1''' mounted within a door 78 adapted to detect the deformation thereof responsive to an associated a side impact crash, it should be understood that the magnetic crash sensor 10.1''' may be adapted to detect the intrusion, deformation, deflection or displacement of any conductive element 80, e.g. surface, in the vehicle 12 relative to a corresponding relatively fixed at least one coil 14, 72, for example, for detection of crashes involving other panels or either of the bumpers of the vehicle 12.

Figure 11A:
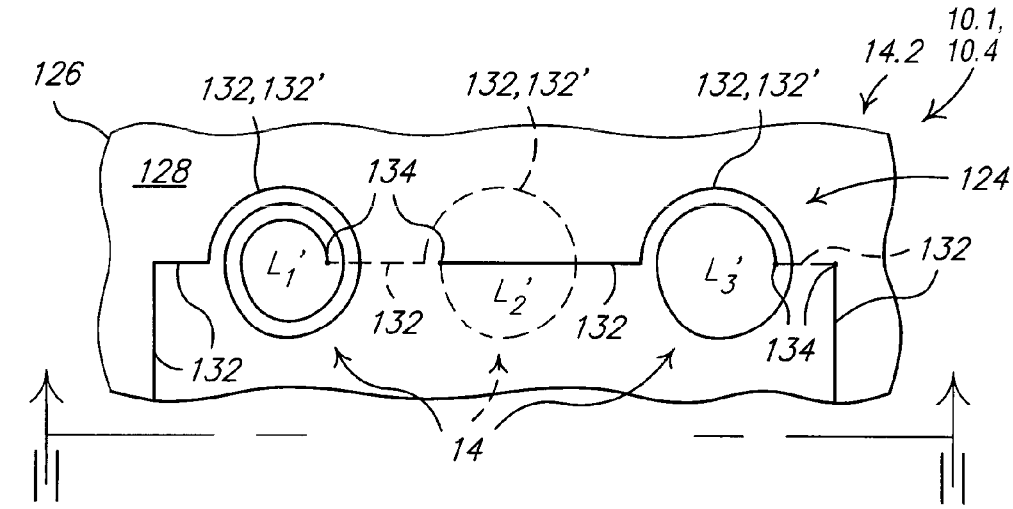
FIGS. 11*a* and 11*b* illustrate a second embodiment of a coil in accordance with the first aspect of the magnetic crash sensor.
Figure 11B:
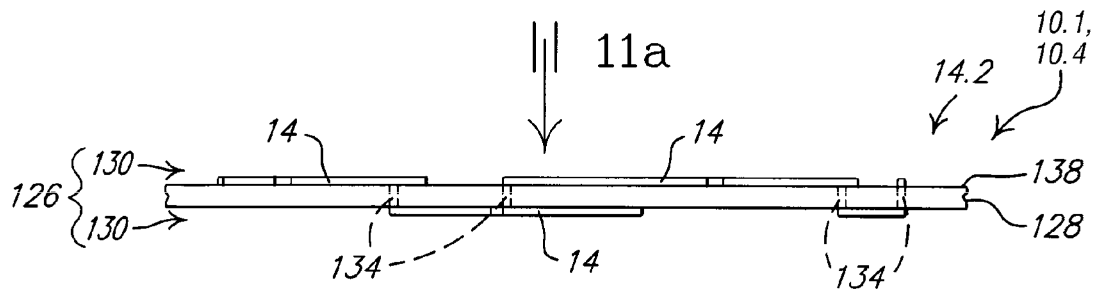

Referring to FIGS. 11*a* and 11*b*, a second embodiment of a coil 14.2 in accordance with the first aspect of the magnetic sensor 10.1 comprises a distributed coil 124 comprising a plurality of coil elements 14 formed with a printed circuit board 126 comprising a dielectric substrate 128 with a plurality of conductive layers 130 on opposing surfaces thereof, wherein each conductive layer 130 is adapted with associated planar conductive patterns 132, e.g. planar spiral conductive patterns 132', for example, defining the associated coil elements $L_1'$, $L_2'$, $L_3'$ as illustrated. For example, the planar conductive patterns 132 on an associated dielectric substrate 128 may be formed by subtractive technology, for example, chemical or ion etching, or stamping; or additive techniques, for example, deposition, bonding or lamination. Adjacent coil elements $L_1'$, $L_2'$, $L_3'$ are located on opposite sides of the dielectric substrate 128, i.e. in different conductive layers 130, and are interconnected with one another in series by associated conductive vias 134 extending through the dielectric substrate 128. The coil elements 14 may be formed in multiple conductive layers 130, for example, with multiple associated dielectric substrates 128 if there were more than two conductive layers 130. Furthermore, the dielectric substrate 128 can be either rigid or flexible, the latter providing for a set of coil elements 14 adapted to conform to various surface geometries. Notwithstanding the different associated coil elements $L_1'$, $L_2'$, $L_3'$ illustrated in FIG. 11*a* each have the same coil pitch sense, i.e. the same spiral winding sense so that each associated coil element $L_1'$, $L_2'$, $L_3'$ has the same polarity, it should be understood that the distributed coil 124 could be adapted with different coil elements $L_1'$, $L_2'$, $L_3'$ having different associated coil pitch senses.

Figure 12:
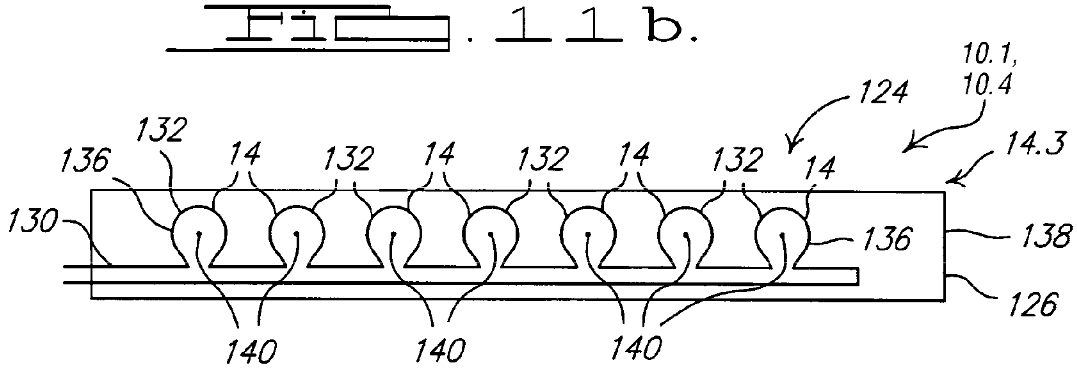
FIG. 12 illustrates a third embodiment of a coil in accordance with the first aspect of the magnetic crash sensor.

Referring to FIG. 12, a third embodiment of a coil 14.3 in accordance with the first aspect of the magnetic sensor 10.1 comprises a distributed coil 124 comprising a plurality of coil elements 14 formed with a printed circuit board 126 comprising a dielectric substrate 128 with a conductive layer 130 on a surface thereof, wherein the conductive layer 130 is adapted with associated planar conductive patterns 132 defining an associated plurality of plurality of coil elements 14, each of which comprises substantially one turn with non-overlapping conductors 136, the plurality of which are connected in series.

Alternatively, the distributed coil 124 may comprise a plurality of coil elements 14, each comprising a winding of a conductor 136, e.g. magnet wire, wound so as to form either a planar or non-planar coil, and bonded to the surface of a substrate 138, wherein the associated coil elements 14 may be either separated from, or overlapping, one another, and the associated windings of a particular coil element 14 may be either overlapping or non-overlapping. The different coil elements 14 may be formed from a single contiguous conductor, or a plurality of conductive elements joined or operative together. The associated distributed coil 124 may comprise multiple layers either spanning across different sides of the substrate 138 or on a same side of the substrate 138. If the conductor 136 so formed were insulated, e.g. as would be magnet wire, then the substrate 138 could comprise substantially any material that would provide for the associated generation of the associated magnetic field 140 by the plurality of coil elements 14. Furthermore, the substrate 138 could comprise either a rigid material, e.g. a thermoset plastic material, e.g. a glass-epoxy composite material or a phenolic material; or a flexible material, e.g. a plastic or composite membrane.

The distributed coil 124 in accordance with any of the above-described embodiments may be encapsulated so as to provide for improved reliability and reduced susceptibility to environmental affects. Furthermore, the distributed coil 124 may be combined with some or all of the associated circuitry, e.g. the oscillator 98 and associated signal conditioner/preprocessor circuit 114, or components thereof, in an associated magnetic sensor module, some or all of which may be encapsulated so as to provide for improved reliability and reduced susceptibility to environmental affects. Alternatively, the distributed coil 124 and associated signal conditioner/preprocessor circuit 114 may be packaged separately.

Figure 13:
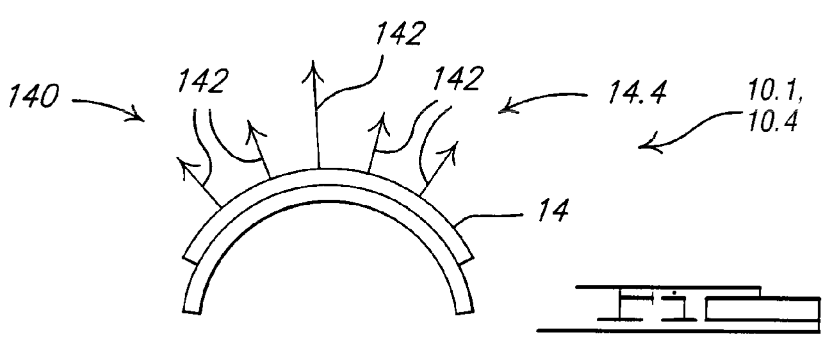
FIG. 13 illustrates an end view of a fourth embodiment of a coil in accordance with the first aspect of the magnetic crash sensor.
Figure 14A:
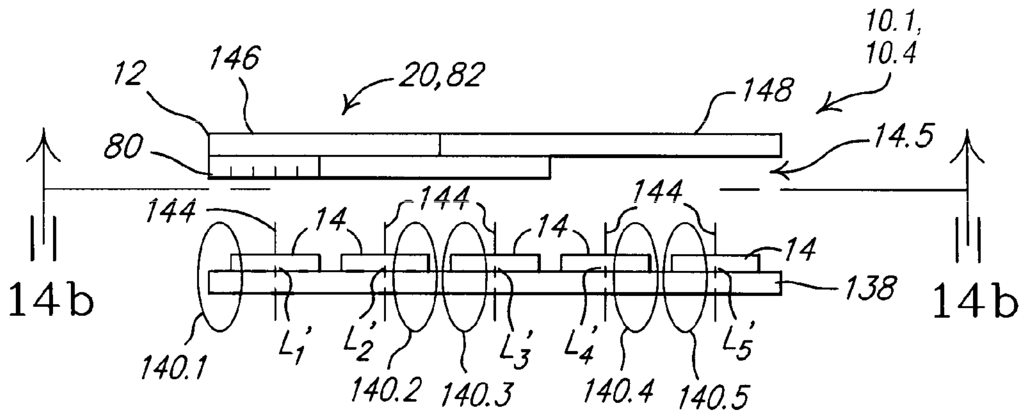
FIGS. 14*a* and 14*b* illustrate a fifth embodiment of a coil in accordance with the first aspect of the magnetic crash sensor.
Figure 14B:
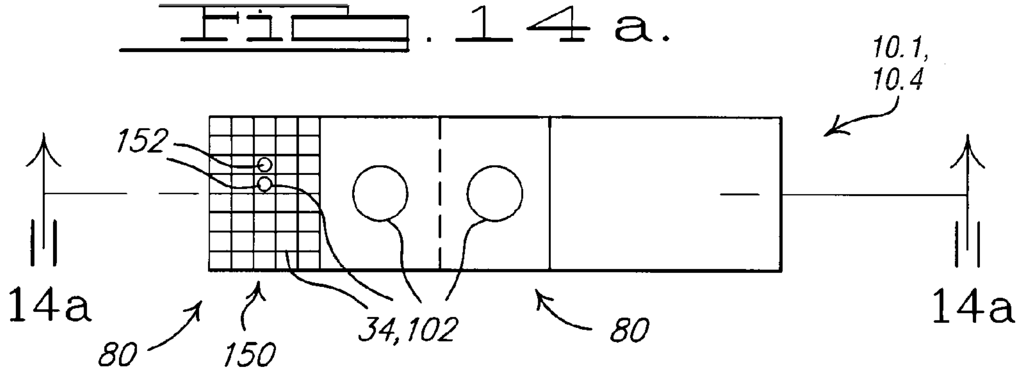

Referring to FIG. 13, in a fourth embodiment of a coil 14.4 in accordance with the first aspect of the magnetic sensor 10.1, the substrate 138 is shaped, e.g. curved, so that different coil elements 14 are aligned in different directions 142, so as to provide for different magnetic field components 140 being oriented in different directions as necessary to provide for sensing a particular second portion 20, 82 of a vehicle 12.

Referring to FIGS. 14*a*, 14*b*, 15*a* and 15*b* one or more different second portions 20, 82 of the vehicle 12 being sensed may be adapted to cooperate at least one of the plurality of coil elements 14. For example, referring to FIGS. 14*a*, 14*b*, in accordance with a fifth embodiment of a coil 14.5 in accordance with the first aspect of the magnetic sensor 10.1, a conductive element 18, 80 is operatively associated with, or a part of, at least a second portion 20, 82 of the vehicle 12 being sensed so as to cooperate at least one of the plurality of coil elements 14, for example coil elements $L_1'$, $L_2'$, $L_3'$, so as to either provide for or control associated eddy currents 34, 102 in the conductive element 18, 80 responsive to the associated magnetic field components 140.1, 140.2 and 140.3 generated by the associated coil elements $L_1'$, $L_2'$, $L_3'$ proximate thereto. The magnetic axes 144 of the coil elements $L_1'$, $L_2'$, $L_3'$ are oriented so that the associated magnetic field components 140.1, 140.2 and 140.3 interact with the conductive element 18, 80 so as to generate associated eddy currents 34, 102 therein in accordance with Lenz's Law. The conductive element 18, 80 comprises, for example, a thin metal sheet, film or coating, comprising, for example, either a paramagnetic or diamagnetic material that is relatively highly conductive, e.g. aluminum or copper, and which, for example, could be an integral part of the associated second portion 20, 82 of the vehicle 12. For example, the conductive element 18, 80 could be spray coated onto the surface of the associated second portion 20, 82 of the vehicle 12. The frequency of the associated at least one time-varying signal applied to the associated coil elements $L_1'$, $L_2'$, $L_3'$ may be adapted so that the corresponding oscillating magnetic field components 140.1, 140.2 and 140.3 generated by the coil elements $L_1'$, $L_2'$, $L_3'$ provide for generating the associated eddy currents 34, 102 in the conductive element 18, 80. For example, the conductive element 18, 80 could be added to a non-metallic portion 146 of the vehicle 12 so as to provide for magnetic visibility thereof by the associated at least one of the plurality of coil elements 14.

A conductive element 18, 80 could also be added to a ferrous element 148, although in order for the affect of the magnetic field component(s) 140 to dominate an affect of a magnetic field within the ferrous element 148, the associated conductive element 18, 80 would need to be thick enough or conductive enough to prevent the original transmitted magnetic field component(s) 140 from penetrating though to the ferrous element 148 on the other side of the conductive element 18, 80, whereby eddy currents 34, 102 in the conductive element 18, 80 would completely cancel the magnetic field at some depth of penetration into the conductive element 18, 80. For example, for a superconducting conductive element 18, 80, there would be no penetration of the magnetic field component(s) 140 into the conductive element 18, 80. Although the depth of penetration of the first magnetic field 26, 94 increases as the conductivity of the conductive element 18, 80 decreases, an aluminum or copper conductive element 18, 80 would not need to be very thick (e.g. 2.5 mm or less) in order to substantially achieve this affect. The depth of penetration of magnetic fields into conductive elements 18, 80 is known from the art using eddy currents for non-destructive testing, for example, as described in the technical paper eddyc.pdf available from the internet at http://joe.buckley.net/papers, which technical paper is incorporated herein by reference. Generally, if the thickness of the conductive element 18, 80 exceeds about three (3) standard depths of penetration at the magnetic field frequency, then substantially no magnetic field will transmit therethrough. Responsive to a crash with an impacting object of sufficient energy to deform or translate the conductive element 18, 80, changes to the shape or position thereof relative to at least one of the coil elements $L_1'$, $L_2'$, $L_3'$ affects at least one of the associated magnetic field components 140.1, 140.2 and 140.3, which affect is detected by an associated signal conditioner/preprocessor circuit 114 operatively coupled to the coil elements $L_1'$, $L_2'$, $L_3'$ as described hereinabove.

The conductive element 18, 80 may comprise a pattern 150 adapted to control associated eddy currents 34, 102 therein. For example, the conductive element 18, 80 may be adapted by either etching, forming (e.g. with a sheet metal forming tool), coating (e.g. with an E-coat process), or machining the pattern 150 in or on a surface thereof so as to control, e.g. limit, the associated eddy currents 34, 102. The format, depth, and distribution of the pattern 150 can be optimized to provide optimal sensing resolution for a given operating frequency. The conductive element 18, 80 could be designed so that the movement or deformation thereof is highly visible to at least one of the plurality of coil elements 14 so as to increase the confidence of a timely associated crash or proximity detection. Each portion of the pattern 150 extends through at least a portion of the conductive element 18, 80 so as to provide for blocking or impeding eddy currents 34, 102 thereacross, so that the associated eddy currents 34, 102 become primarily confined to the contiguous conductive portions 152 therebetween or thereunder. For example, the pattern 150 may be adapted to a frequency of the associated at least one time-varying signal.

Figure 15A:
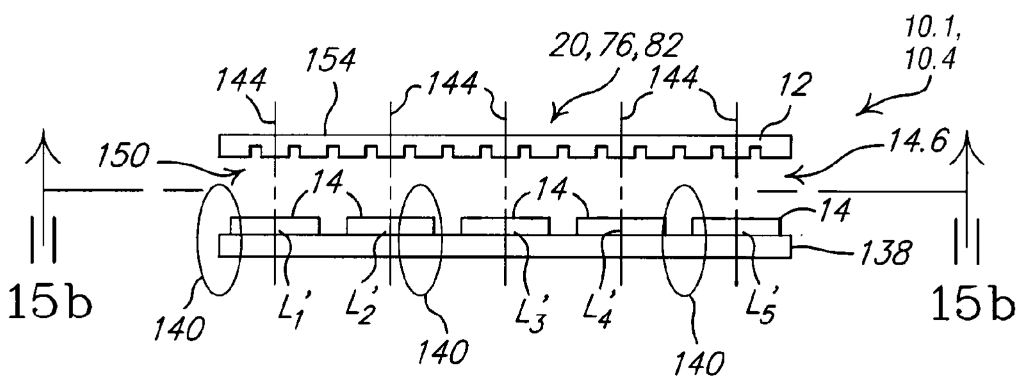
FIGS. 15*a* and 15*b* illustrate a sixth embodiment of a coil in accordance with the first aspect of the magnetic crash sensor.
Figure 15B:
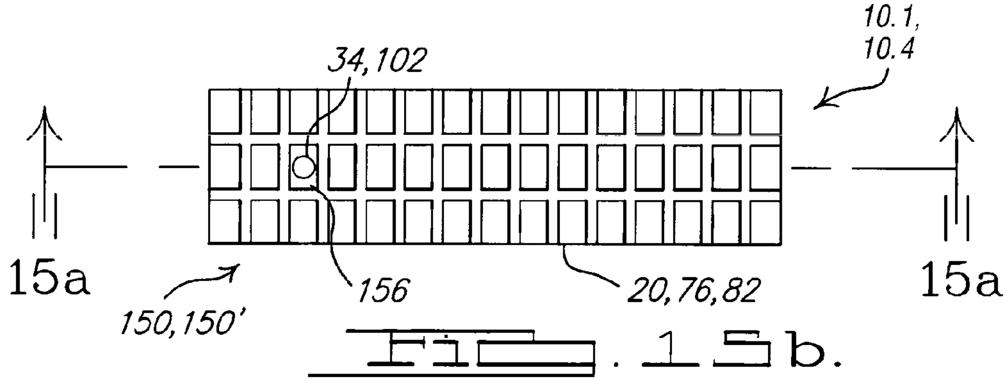

Referring to FIGS. 15*a* and 15*b*, in accordance with a sixth embodiment of a coil 14.6 in accordance with the first aspect of the magnetic sensor 10.1, a conductive portion 154 of at least one of the portions 20, 76, 82 of the vehicle 12—for example, an inner surface of a body of the vehicle 12—adapted to cooperate with the plurality of coil elements 14 comprises a pattern 150 adapted to control associated eddy currents 34, 102 therein. The magnetic axes 144 of the coil elements L' are oriented so that the associated magnetic field components 140 interact with the conductive portion 154 so as to generate associated eddy currents 34, 102 therein in accordance with Lenz's Law. The conductive portion 154 may be adapted, for example, by either etching, forming (e.g. which a sheet metal forming tool), coating (e.g. with an E-coat process), or machining a pattern 150 in or on a surface thereof so as to control, e.g. limit, the associated eddy currents 34, 102 therein. The format, depth, and distribution of the pattern 150 can be optimized to provide optimal sensing resolution for a given operating frequency. For example, a deterministic pattern 150', such as the grid-etched pattern illustrated in FIG. 15*b* may provide for distinguishing the associated portions 20, 76, 82 of the vehicle 12 responsive to displacement or deformation thereof. Each portion of the pattern 150 extends through at least a portion of the conductive portion 154 so as to provide for blocking or impeding eddy currents 34, 102 thereacross, so that the associated eddy currents 34, 102 become primarily confined to the contiguous conductive portions 156 therebetween or thereunder. For example, the pattern 150 may adapted to a frequency of the associated at least one time-varying signal.

Figure 16:
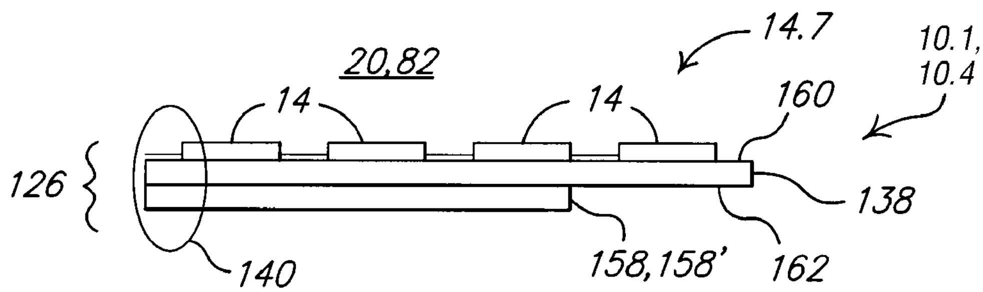
FIG. 16 illustrates a side view of a seventh embodiment of a coil in accordance with the first aspect of the magnetic crash sensor.

A conductive element 158 may be adapted to cooperate with at least one of the plurality of coil elements 14 so as to provide for shaping, controlling or limiting at least one the associated magnetic field components 140. For example, referring to FIG. 16, in accordance with a seventh embodiment of a coil 14.7 in accordance with the first aspect of the magnetic sensor 10.1, at least one coil 14 is operatively coupled to a first side 160 of a substrate 138, and the conductive element 158 comprises a conductive layer 158', e.g. a conductive film or plate spanning a portion of the opposite, second side 162 of the substrate 138, for example, as could be embodied with a printed circuit board 126. The conductive element 158 is relatively fixed with respect to the at least one coil 14 and provides for effectively shielding the at least one coil 14 proximate thereto from interference from proximate metal objects on the second side 162 of the substrate 138, so as to effectively provide for a non-sensing side 164 of the at least one coil 14 so shielded. The shielding action of the conductive element 158 results from eddy currents 34, 102 that are induced therein by the associated magnetic field components 140 of the associated at least one coil 14. The conductive layer 158' could also be used to provide for shielding the at least one coil 14 from being responsive to localized deformations or intrusions of portions 20, 76, 82 of the vehicle 12 proximate thereto, for an at least one coil 14 adapted, either individually or in cooperation with another coil or magnetic sensing element, so as to provide for detecting changes to an associated magnetic circuit 68 over a relatively broad associated sensing area, without interference from localized deformations or intrusions, for example, in cooperation with the second aspect of the magnetic crash sensor 10.2 described hereinabove, or with embodiments disclosed in U.S. Pat. Nos. 6,777,927, 6,587,048, 6,586,926, 6,583,616, 6,631,776, 6,433,688, 6,407,660, each of which is incorporated herein by reference.

Figure 17A:
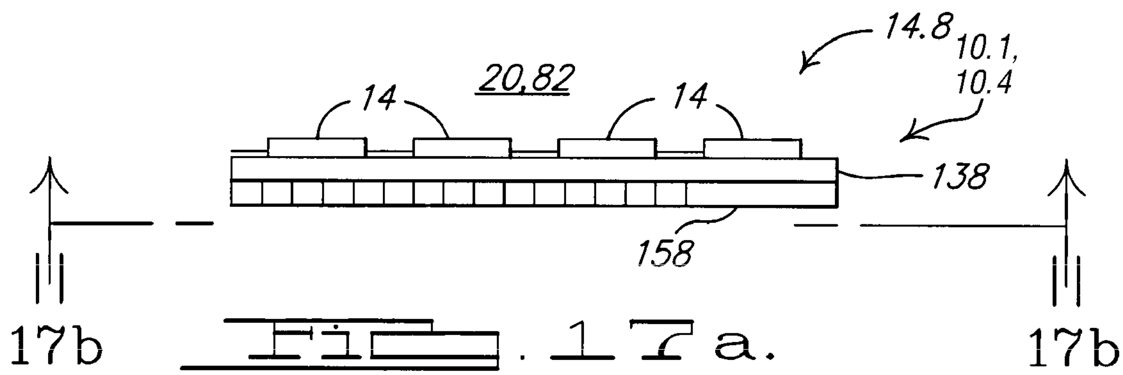
FIGS. 17*a* and 17*b* an eighth embodiment of a coil in accordance with the first aspect of the magnetic crash sensor.
Figure 17B:
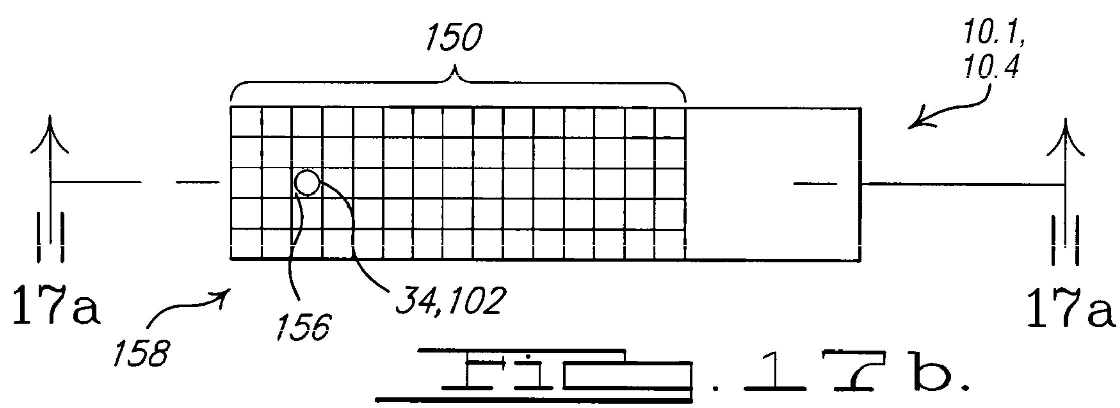

As another example, referring to FIGS. 17*a* and 17*b*, in accordance with an eighth embodiment of a coil 14.8 in accordance with the first aspect of the magnetic sensor 10.1, at least a portion of the conductive element 158 may be adapted to control or mitigate against eddy currents 34, 102 therein. For example, the conductive element 158 may be adapted, for example, by either etching, forming (e.g. with a sheet metal forming tool), or machining a pattern 150 in or on a surface thereof so as to control, e.g. limit, the associated eddy currents 34, 102 therein. The format, depth, and distribution of the pattern 150 can be optimized to provide optimal sensing resolution for a given operating frequency. Each portion of the pattern 150 extends through at least a portion of the conductive element 158 so as to provide for blocking or impeding eddy currents 34, 102 thereacross, so that the associated eddy currents 34, 102 become primarily confined to the contiguous conductive portions 156 therebetween or thereunder. For example, the pattern 150 may adapted to a frequency of the associated at least one time-varying signal. Furthermore, the depth of the pattern 150 may be adapted so that a plurality of contiguous conductive portions 156 are electrically isolated from one another.

Referring to FIG. 18, in accordance with a third aspect of a magnetic sensor 10.3 incorporated in a vehicle 12, at least one first coil 14 is located at a corresponding first location 166 of a body 168 of the vehicle 12. For example, the first coil 14 could be located around the striker 170.1 of the door latch assembly 172.1 of the front door 78.1, operatively coupled to the B-pillar 174 of the vehicle 12, or around a striker 170.2 of the door latch assembly 172.2 of the rear door 78.2 operatively coupled to the C-pillar 175 of the vehicle 12, or around a hinge 176 of a door 78, e.g. the front door 78.1. The at least one first coil 14 may also be located within a gap 178 between a fixed body structure and a door 78, e.g. the front door 78.1. Although FIG. 18 illustrates this first coil 14 located between the front edge 180 of the front door 78.1 and an adjacent edge 182 of the A-pillar 184, this first coil 14 could be located elsewhere in the gap 178 between either the front 78.1 or rear 78.2 door and the fixed body structure of the vehicle 12.

The at least one first coil 14 is operatively coupled to a corresponding coil driver 28, 56, 96, which is in turn operatively coupled to an oscillator 30, 58, 98, wherein an oscillatory signal from the oscillator 30, 58, 98 is applied by the coil driver 28, 56, 96 so as to cause an associated current in the first coil 14, responsive to which the first coil 14 generates a magnetic field 26, 140 comprising magnetic flux 186 in associated first 188.1 and second 188.2 magnetic circuits. The oscillator 30, 58, 98 generates a oscillating signal, for example, having either a sinusoidal, square wave, triangular or other waveform shape, of a single frequency, or a plurality of frequencies that are either stepped, continuously swept or simultaneous. The frequency is adapted so that the resulting magnetic field 26, 140 is conducted through the first 188.1 and second 188.2 magnetic circuits. For example, the oscillation frequency would typically be less than about 50 KHz for a steel structure, e.g. 10 to 20 KHz in one embodiment. The magnetic field 26, 140 is responsive to the reluctance $\mathcal{R}$ of the associated first 188.1 and second 188.2 magnetic circuits, which is affected by a crash involving the elements thereof and/or the gaps 178 therein. The magnetic flux 186 propagates within the associated magnetically permeable material of the first 188.1 and second 188.2 magnetic circuits. The doors 78.1, 78.2 are isolated from the remainder of the vehicle 12, e.g. the frame, by the gaps 178 therebetween, except where the hinges 176 and door latch assemblies 172.1, 172.2 provide relatively lower reluctance paths therebetween.

The at least one first coil 14 can each be used alone in a single-port mode to both generate the magnetic flux 186 and to detect a signal responsive thereto, and may also be used in cooperation with one or more magnetic sensors 190 in a multi-port mode. For example, one or more first coils 14 at corresponding first locations 166 can be used in cooperation with a plurality of magnetic sensors 190.1, 190.2 at a corresponding plurality of second locations 192.1, 192.2 of the vehicle 12. For example, for a first coil 14 located around the striker 170.1 of the door latch assembly 172.1 of the front door 78.1, in one embodiment, the magnetic sensors 190.1, 190.2 comprise a second coil 194 around a hinge 176 of the front door 78.1, and a third coil 196 around a striker 170.2 of the door latch assembly 172.2 of the rear door 78.2 and the striker 170.2 of the door latch assembly 172.2 of the rear door 78.2 is operatively coupled to the C-pillar 175 of the vehicle 12. The second 194 and third 196 coils surround metallic elements of the associated first 188.1 and second 188.2 magnetic circuits, and the magnetic flux 186 propagating within the associated magnetically permeable material of the first 188.1 and second 188.2 magnetic circuits also flows through the second 194 and third 196 coils surrounding the associated magnetically permeable material. The second 194 and third 196 coils generate voltage signals responsive to the oscillating magnetic flux 186, or component thereof, directed along the axis of the second 194 and third 196 coils respectively, in accordance with Faraday's law of magnetic induction.

In operation in accordance with a single-port mode, a time varying signal 198 is generated by a signal source 200, for example, and oscillator or a pulse generator, and applied to the at least one first coil 14 by an associated coil driver 202. For example, an oscillatory signal source 200 would function similar to that described hereinabove for any of oscillators 30, 58 and 98, and the coil driver 202 would function similar to that described hereinabove for any of coil drivers 28, 56 and 96, depending upon the particular application. The two leads of the at least one first coil 14 define a port $A_i$, which is also connected to an associated signal conditioner/preprocessor circuit 114 which processes a signal associated with the at least one first coil 14, the signal being responsive to the time varying signal 198 applied thereto, and responsive to the self-impedance of the associated at least one first coil 14. As disclosed more fully hereinbelow, the coil driver 202 can be incorporated into the circuitry of the associated signal conditioner/preprocessor circuit 114. The at least one first coil 14 generates a magnetic field 26, 140 in and throughout the associated magnetic circuit 188.1, 188.2, responsive to the time varying signal 198 applied thereto. For example, an at least one first coil 14 located within a gap 178 between a fixed body structure and a proximal surface of another element of the body provides for detecting a relative movement between the fixed body structure and the proximal surface, responsive to a crash, for example, responsive to an intrusion of the proximal surface relative to the fixed body structure.

In a two-port mode, one or more associated magnetic sensors 190, 190.1, 190.2 at respective second locations 192.1, 192.2 are operatively coupled at a port $B_j$ to a corresponding one or more signal conditioner/preprocessor circuits 40, which provide for generating a signal responsive to the magnetic field 26, 140 at the corresponding one or more second locations 192.1, 192.2.

The signal conditioner/preprocessor circuit(s) 114, 40 are operatively coupled to an associated processor 204, and provide for conditioning the associated signal(s) from the at least one first coil 14 and one or more associated magnetic sensors 190, 190.1, 190.2. The signal conditioner/preprocessor circuit(s) 114, 40 demodulate the signal(s) from the associated at least one first coil 14 or one or more associated magnetic sensors 190, 190.1, 190.2 with an associated demodulator, and converts the associated signal(s) from analog to digital form with an associated analog-to-digital converter, which is then sampled and input to the processor 204. The signal conditioner/preprocessor circuit(s) 114, 40 may also provide for amplification. Changes to the magnetic field 26, 140 at a particular location in the first 188.1 and second 188.2 magnetic circuits propagate therewithin at the speed of light and are seen therethroughout. Accordingly, the magnetic field 26, 140 sensed by the at least one first coil 14, and possibly by one or more associated magnetic sensors 190.1, 190.2, contains information about the nature of the remainder of the magnetic circuit, including the front 78.1 and rear 78.2 doors and the adjacent A-pillar 184, B-pillar 174 and C-pillar 175, any of which could be involved in, or affected by, a crash, responsive to which the processor 204 provides for detecting the crash and controlling a safety restraint actuator 44 responsive thereto. In FIG. 18, the ports of the various first coils 14 and magnetic sensors 190 illustrated therein are labeled as "A or B" to indicate that that particular first coil 14 or magnetic sensor 190 could be connected to either of ports port $A_i$ or $B_j$ of the associated signal processing circuitry, depending upon the particular sensing configuration, provided that at least one first coil 14 is connected to a corresponding at least one port $A_i$. For example, the system could be configured to operate with only one or more first coils 14 in a single-port mode, for example, as disclosed herein, or in accordance with U.S. Pat. No. 6,587,048, 6,583,616 or 6,433,688, each of which is incorporated herein by reference. Alternatively, the system could be configured to also operate with one or more associated magnetic sensors 190.1, 190.2 in a multi-port mode, for example, in accordance with U.S. Pat. No. 6,777,927, 6,586,926, 6,631,776 or 6,433,688, each of which is incorporated herein by reference.

Figure 19:
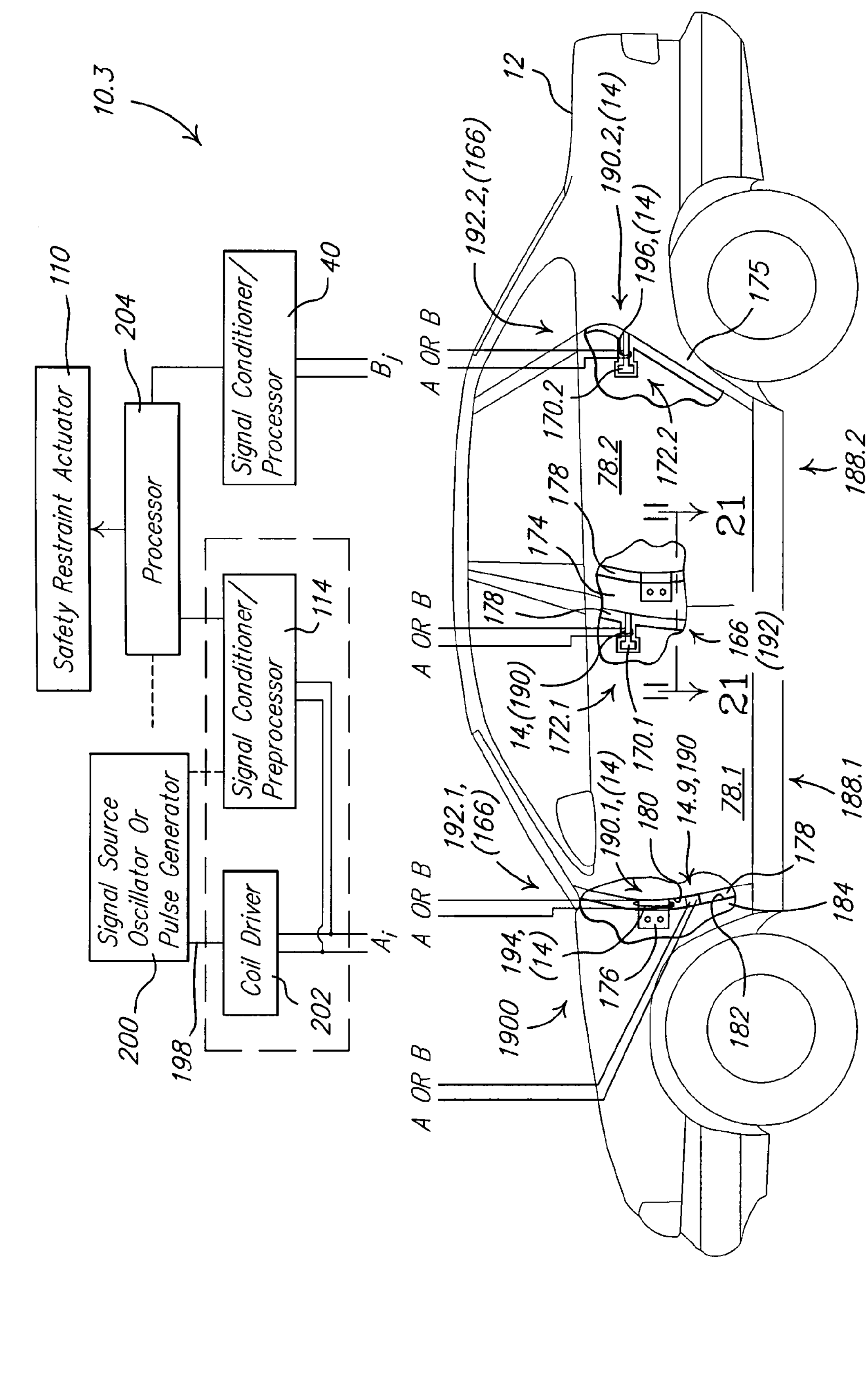
FIG. 19 illustrates a detailed view of several coils from the third aspect illustrated in FIG. 18, and illustrates several coil embodiments.
Figure 19:
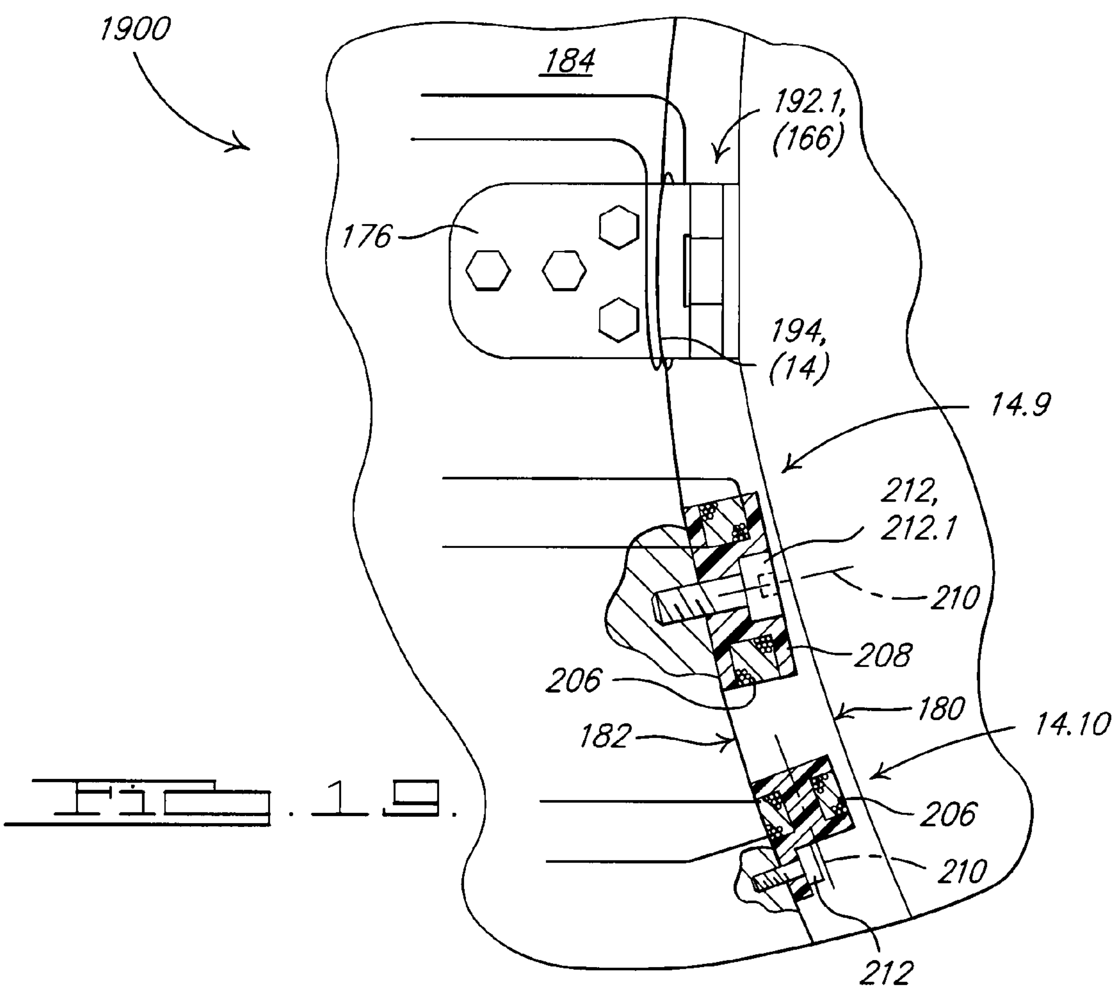

Referring to FIG. 19, the fragmentary view 1900 of the A-pillar 184 and front door 78.1 from FIG. 18 is illustrated in greater detail, illustrating several possible embodiments of the at least one first coil 14 in greater detail, two of which comprise a gap coil 206 that is sufficiently small to be located within the gap 178 between the A-pillar 184 and the front door 78.1. The gap coil 206 of the at least one first coil 14 is not necessarily constrained to surround existing magnetic permeable components of the first 188.1 or second 188.2 magnetic circuits, so as to provide for placement of the gap coil 206 in locations without being adversely constrained by the geometries or functions of proximate elements of the vehicle 12. The gap coil 206 is wound around an associated spool 208 which is fastened to the fixed structure of the vehicle, e.g. the edge 182 of the A-pillar 184 facing the front edge 180 of the front door 78.1. The gap coil 206 can be oriented to as to optimize the signal-to-noise ratio of the signal generated thereby responsive to a crash or other disturbance to be monitored.

For example, in a ninth embodiment of a coil 14.9, the axis 210 of the gap coil 206 is substantially perpendicular to the edge 182 of the A-pillar 184 and to the front edge 180 of the front door 78.1 when the front door 78.1 is closed. The coil 14.9 is attached to the A-pillar 184 with a fastener 212 through the associated spool 208, e.g. a socket head screw 212.1 through a counterbore in the spool 208. The magnetic permeability of the fastener 212 can be adapted in accordance with the sensing or field generating requirements of the associated gap coil 206. For example, the fastener 212 associated with the coil 14.9 is substantially aligned with the axis 210 of the gap coil 206, so that a fastener 212 of a material with a relatively high permeability, e.g. carbon steel or electrical steel, will tend to concentrate the magnetic flux 186 through the gap coil 206, whereas a fastener 212 of a material with a relatively low permeability, e.g. stainless steel, aluminum or brass, will tend to emulate an air core so that the coil 14.9 has less of a tendency to perturb the associated first 188.1 or second 188.2 magnetic circuit. As another example, in a tenth embodiment of a coil 14.10, the axis 210 of the gap coil 206 is substantially parallel to the edge 182 of the A-pillar 184 and to the front edge 180 of the front door 78.1, so as to be substantially aligned with the length of the associated gap 178. The coil 14.10 is shown attached to the A-pillar 184 with a fastener 212 through a flange that depends from the associated spool 208.

Figure 20:
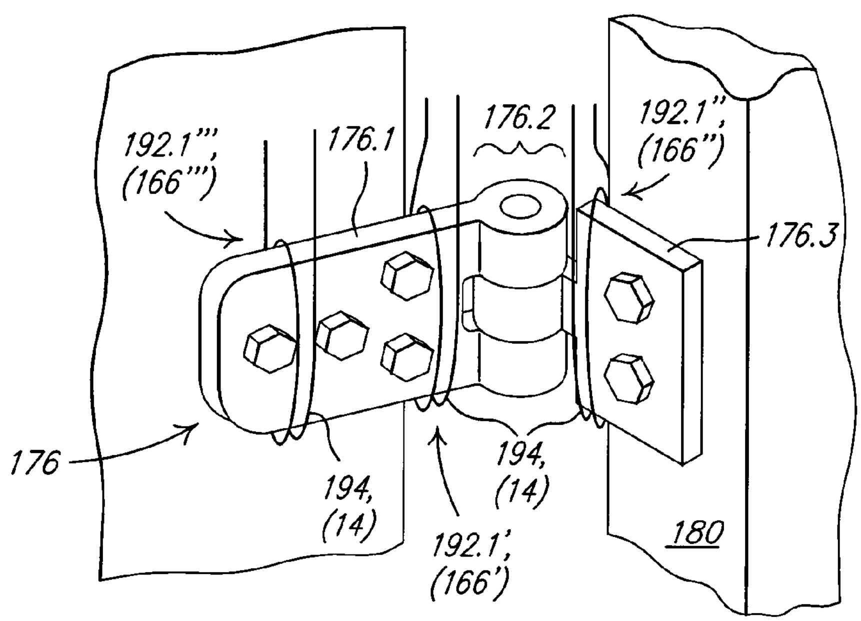
FIG. 20 illustrates various locations for a coil around a door hinge.

FIG. 19 also illustrates an embodiment of the at least one first coil 14 around a hinge 176 of the front door 78.1. Referring to FIG. 20, the at least one first coil 14 can be located at various first 166', 166", 166''' or second 192.1', 192.1", 192.1''' locations relative to the hinge 176. For example, in one embodiment, the first 166' or second 192.1' location is on around a portion of the hinge plate 176.1 that attaches to the fixed vehicle structure, e.g. the A-pillar 184 or B-pillar 174, at a location between the A-pillar 184 or B-pillar 174 and the hinge joint 176.2. In another embodiment, the first 166" or second 192.1" location is on around a portion of the hinge plate 176.1 that attaches to the fixed vehicle structure, e.g. the A-pillar 184 or B-pillar 174, at a location where the hinge plate 176.1 is bolted to the A-pillar 184 or B-pillar 174. In yet another embodiment, the first 166''' or second 192.1''' location is on around a portion of the hinge plate 176.3 that attaches to the front 78.1 or rear 78.2 door, at a location between the front edge 180 of the front 78.1 or rear 78.2 door and the hinge joint 176.2.

Figure 21:
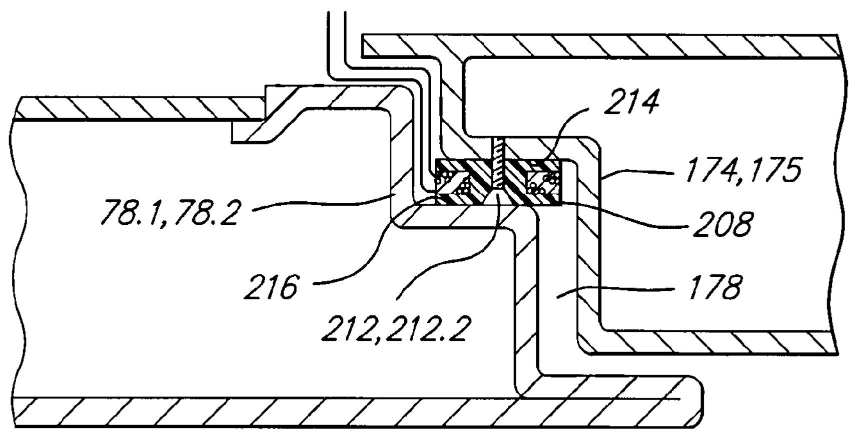
FIG. 21 illustrates a coil mounted so as to provide for sensing a door opening condition.

Referring to FIG. 21, a gap coil 206 may be mounted on the B-pillar 174 or C-pillar 175 on an outward facing surface 214 in the gap 178 between the outward facing surface 214 and a corresponding proximate inward facing surface 216 of the front 78.1 or rear 78.2 door respectively. In the embodiment illustrated in FIG. 21, the gap coil 206 is secured to the outward facing surface 214 with a flat head screw 212.2 through the spool 208 around which the coil is wound. The gap coil 206 illustrated in FIG. 21 is responsive to changes in reluctance of the associated first 188.1 or second 188.2 magnetic circuit responsive to the door opening state of the associated front 78.1 or rear 78.2 door and accordingly can be used to generate a signal indicative thereof, e.g. so as to provide for discriminating between a closed door, a partially latched door and an open door.

Figure 22:
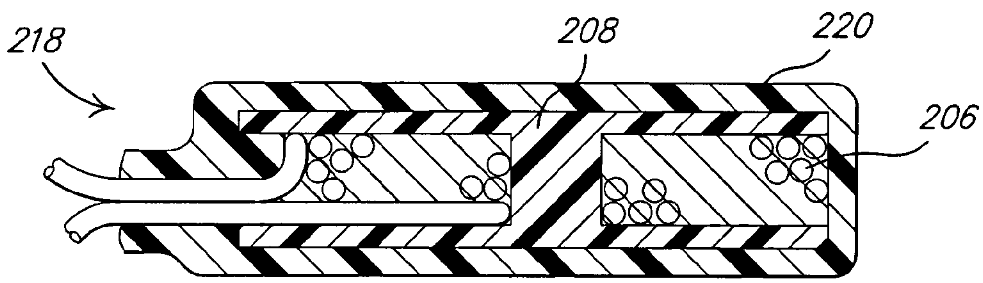
FIG. 22 illustrates an encapsulated coil assembly.

Referring to FIG. 22, a gap coil assembly 218 comprises a gap coil 206 wound around a spool 208, both of which are encapsulated in an encapsulant 220, e.g. a silicone potting compound, so as mitigate against environmentally induced degradation. The gap coil 206 for example, is wound of wire, e.g. 10 to 50 gauge enamel coated conductive wire, e.g. copper or aluminum. The spool 208 is, for example, made of a relatively rigid material such as plastic or aluminum.

Figure 23:
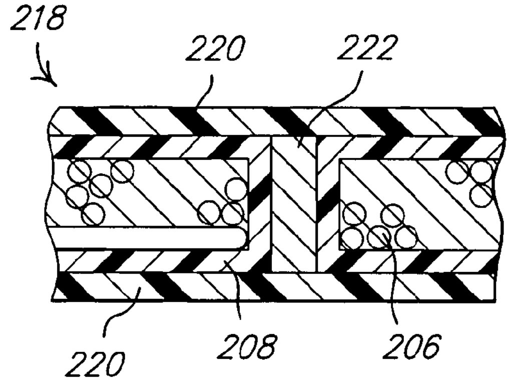
FIG. 23 illustrates a portion of a coil assembly incorporating a magnetically permeable core.

Referring to FIG. 23, the gap coil assembly 218 can further comprise a core 222 of a material having relatively high magnetic permeability such as ferrite, mu-metal, or amorphous metal, e.g. METGLAS®.

Figure 24:
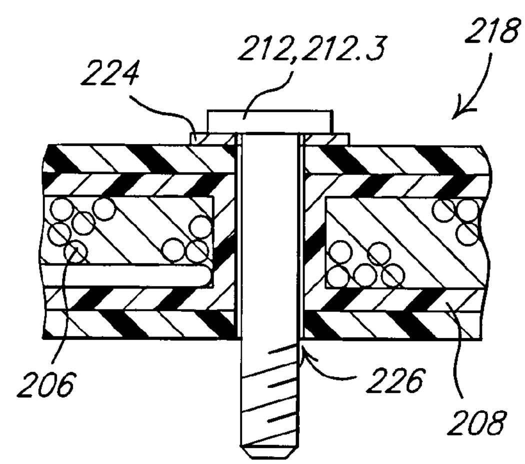
FIG. 24 illustrates a portion of a coil assembly adapted for mounting with a fastener.

The gap coil assemblies 218 illustrated in FIGS. 22 and 23 can be mounted, for example, by bonding or clamping. Referring to FIG. 24, the gap coil assembly 218 is mounted with a fastener 212, e.g. a cap screw 212.3 and washer 224, through a central mounting hole 226 in the spool 208. The material and dimensions of the fastener 212 would be selected according to the particular application. A material having relatively high magnetic permeability such as carbon steel or electrical steel could be used to concentrate the associated magnetic flux 186 through the gap coil 206, whereas a material of relatively low magnetic permeability such as aluminum, brass or stainless steel could be used to emulate an air core, thereby having less influence on the inherent flow of magnetic flux 186 across the associated gap 178 within which the gap coil assembly 218 is located.

Figure 25:
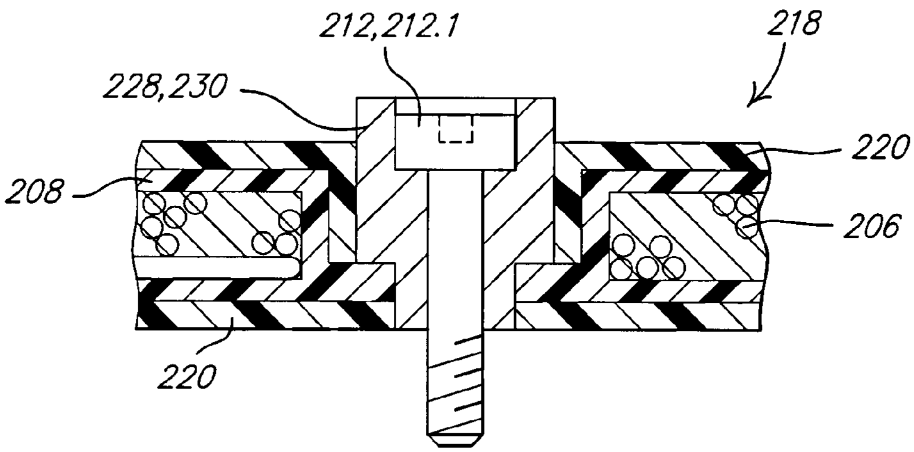
FIG. 25 illustrates a portion of a coil assembly adapted for mounting with a fastener, further comprising a magnetically permeable core.

Referring to FIG. 25, the gap coil assembly 218 is mounted with a fastener 212, e.g. a socket head screw 212.1, and further incorporates a magnetically permeable core 228 comprising a shouldered sleeve 230 that is recessed within the central mounting hole 226 in the spool 208. For example, the magnetically permeable core 228 can comprise either carbon steel, electrical steel, mu-metal, ferrite, or amorphous metal, e.g. METGLAS®. The length of the shouldered sleeve 230 can be adjusted in relation to the associated gap 178 in which the gap coil assembly 218 is mounted depending upon the extent of associated magnetic focusing required.

Figure 26A:
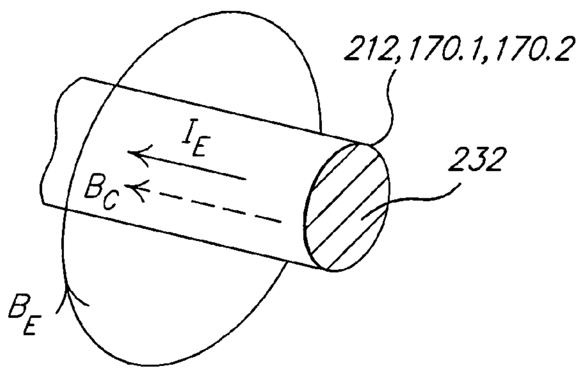
FIGS. 26*a* and 26*b* illustrate eddy currents, associated magnetic fields and axial magnetic fields in various ferromagnetic elements.
Figure 26B:
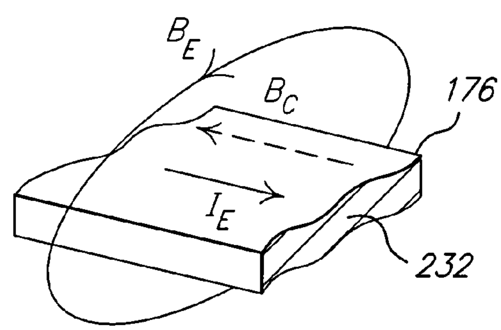
Figure 27:
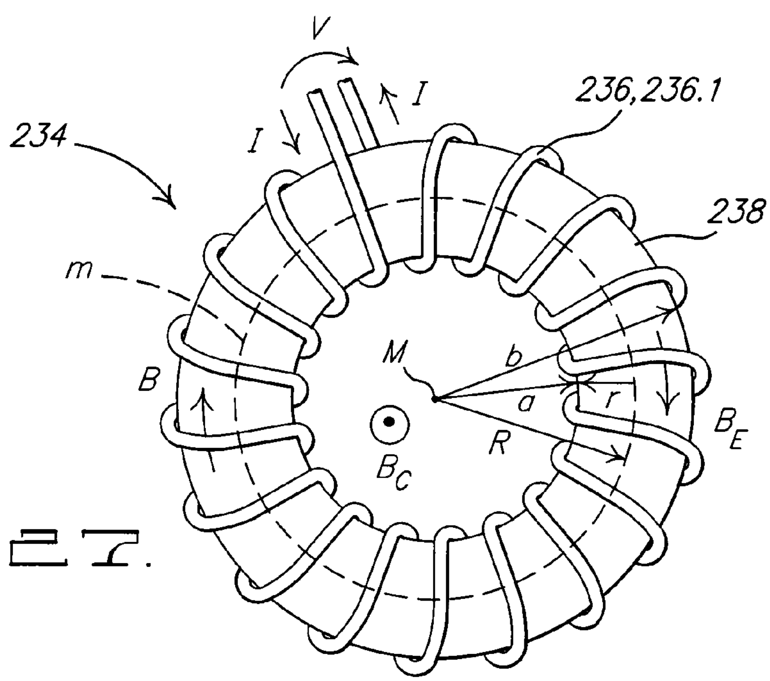
FIG. 27 illustrates a toroidal helical coil.
Figure 28:
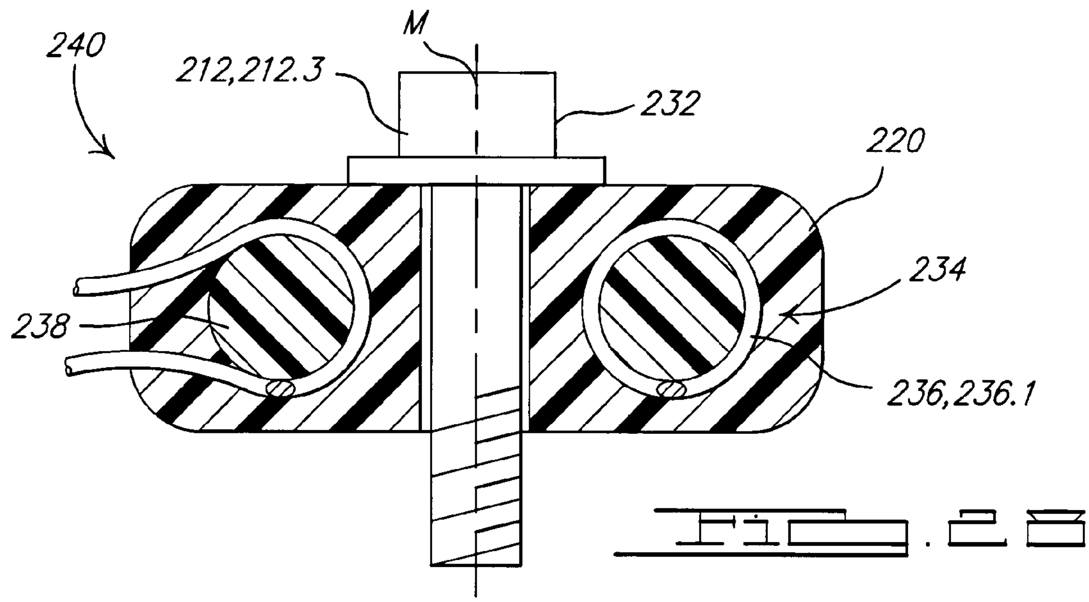
FIG. 28 illustrates a toroidal helical coil assembly.

Referring to FIGS. 26*a* and 26*b*, modeling and test results suggest that eddy currents $I_E$ are produced on the surface of steel pins or fasteners 212, strikers 170.1, 170.2, and hinges 176, wherein the eddy currents $I_E$ oscillate longitudinally along the associated steel core 232, producing an associated circumferential magnetic field $B_E$ surrounding the axes of the associated steel core 232. Referring to FIGS. 27 and 28, a toroidal helical coil 234 provides for generating a voltage signal V responsive to the associated oscillating circumferential magnetic field $B_E$ in accordance with Faraday's Law, responsive to which an associated current signal I is generated when the toroidal helical coil 234 is connected to an associated circuit, e.g. a signal conditioner/preprocessor circuit 114. The toroidal helical coil 234 comprises a conductive path 236, e.g. a winding of conductive wire 236.1, e.g. copper or aluminum wire, around a toroidal core 238. Although the toroidal core 238 is illustrated in FIGS. 27 and 28 as having a circular shape (FIG. 27) and a uniform circular cross section (FIG. 28)—i.e. doughnut shaped—, in general the, the toroidal core 238 can have any closed shape with any cross-sectional shape, either uniform or not. For example, the toroidal core 238 could have a rectangular cross-section, similar to that of a washer. The toroidal core 238 comprises a major axis M and a minor axis m, wherein the conductive path 236 makes at least one turn around the minor axis m, and at least one turn around the major axis M. For example, in the embodiment illustrated in FIG. 27, the conductive path 236 makes a plurality of turns around the minor axis m, and a single turn around the major axis M. The at least one turn around the minor axis m provides for generating a component of the voltage signal V responsive to an oscillating circumferential magnetic field $B_E$, and the at least one turn around the major axis M provides for generating a component of the voltage signal V responsive to an oscillating axial magnetic field $B_C$, the latter of which is illustrated in FIGS. 26*a* and 26*b*. Accordingly, the toroidal helical coil 234 can be used to sense both axial $B_C$ and circumferential $B_E$ magnetic fields. The doughnut-shaped toroidal core 238 illustrated in FIGS. 27 and 28 comprises a major radius R, a minor radius r, and an associated outside b and inside a radii and a minor diameter 2*r*, and may be constructed of either a ferromagnetic or a non-ferromagnetic material, depending upon the application, i.e. whether or not it is necessary to concentrate circumferential magnetic flux within the toroidal core 238. For example, referring to FIG. 28, a toroidal helical coil assembly 240 comprises a toroidal helical coil 234 encapsulated in an encapsulant 220 about a central mounting hole 226 adapted to receive an associated fastener 212, e.g. a cap screw 212.3. The modeling and testing done with a toroidal helical coil 234 suggests that the eddy currents $I_E$ (and therefore the associated circumferential magnetic field $B_E$) are substantially enhanced when the steel core 232 associated with the toroidal helical coil 234 is electrically connected to the front 78.1 or rear 78.2 doors and/or the vehicle frame, whereby an electrical connection to both, e.g. via a hinge 176, is beneficial. Tests have indicated that a stronger signal may be obtained when using a toroidal helical coil 234 instead of a circular wound gap coil 206 at a location otherwise suitable for a gap coil assembly 218.

The signal from the signal conditioner/preprocessor circuit 114 responsive to the at least one coil 14 may be used to detect changes to the associated magnetic circuit 188 to which the at least one coil 14 is operatively associated. Generally, the changes to the associated magnetic circuit 188 comprise a combination of effects, including 1) changes to the reluctance $\mathcal{R}$ of the magnetic circuit 188 to which the at least one coil 14 is magnetically coupled, and 2) eddy currents 34, 102 induced in a proximal conductive element 88 responsive to a first magnetic field 26, 94 generated by the at least one coil 14, which generate an eddy-current-induced magnetic field component 38, 104 in opposition to the first magnetic field 26, 94, thereby affecting the self-induced voltage in the at least one coil 14.

Figure 29:
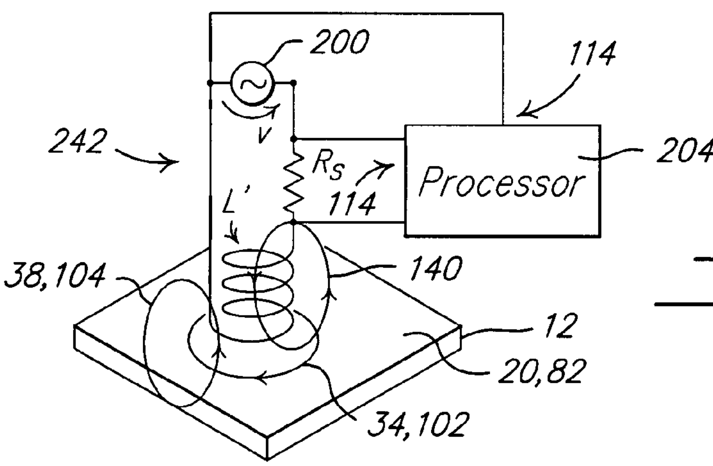
FIG. 29 illustrates the operation of an eddy current sensor.

Referring to FIG. 29, a particular coil element L' is driven by an oscillatory time-varying voltage signal v operatively coupled thereto through an associated sense resistor $R_S$. The oscillatory time-varying voltage signal v generates an associated oscillatory current i in the associated series circuit 242 which generates an associated magnetic field component 140 that interacts with an associated second portion 20, 82 of the vehicle 12. If the associated second portion 20, 82 of the vehicle 12 is conductive, then the associated magnetic field component 140 interacting therewith will generate associated eddy currents 34, 102 therein in accordance with Faraday's Law of induction. The direction of the associated eddy currents 34, 102 is such that the resulting associated eddy-current-induced magnetic field component 38, 104 opposes the associated magnetic field component 140 generated by the current i in the coil element L'. If the associated second portion 20, 82 of the vehicle 12 is not perfectly conductive, then the eddy currents 34, 102 will heat the associated conductive material resulting in an associated power loss, which affects the relative phase of the eddy-current-induced magnetic field component 38, 104 relative to the phase of the oscillatory time-varying voltage signal v. Furthermore, a ferromagnetic associated second portion 20, 82 of the vehicle 12 interacting with the associated magnetic field component 140 can affect the self-inductance L of the associated coil element L'.

Figure 30:
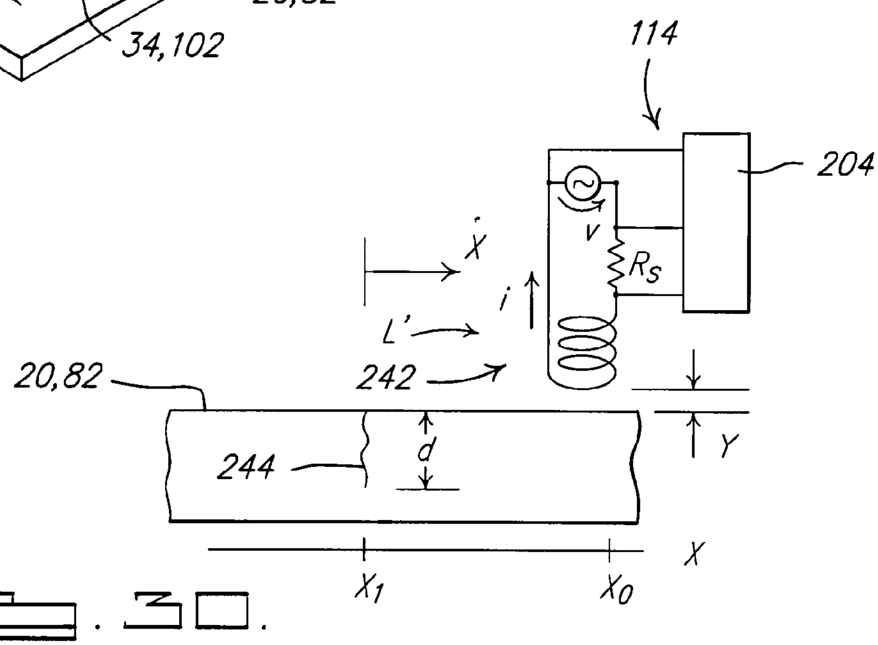
FIG. 30 illustrates the operation of an eddy current sensor to detect a crack in an object.
Figure 25:
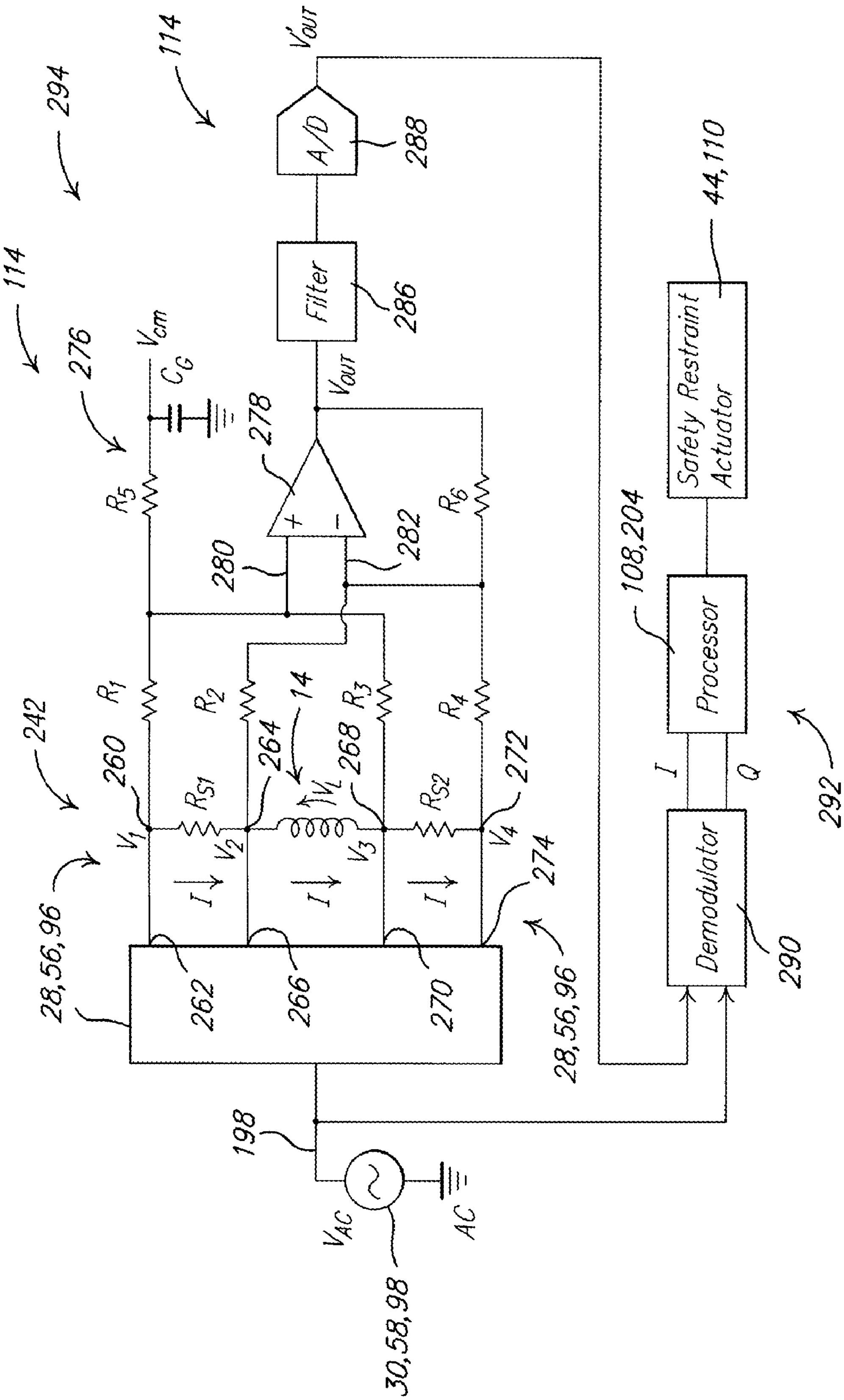

Referring to FIGS. 30 and 31, the impedance Z of the coil element L' is illustrated as a function of the transverse position x of the coil element L' relative to a crack 244 extending into in a conductive second portion 20, 82 of the vehicle 12, for various crack depths d, with the coil element L' at a constant distance y from the conductive second portion 20, 82 of the vehicle 12, wherein the distance y is the length of the gap between the coil element L' and the surface of the conductive second portion 20, 82 of the vehicle 12. In FIG. 31, the inductive reactance $X_L$ and resistance $R_L$ components of impedance Z of the coil element L' are plotted in the complex plane as a function of transverse position x for families of crack depth d, wherein the resistance $R_L$ of the coil element L' is responsive to a component of the current i that is in-phase with respect to the associated time-varying voltage signal v, and the inductive reactance $X_L$ of the coil element L' is responsive to a component of the current i that is in quadrature-phase with respect to the associated time-varying voltage signal v. Relative to the nominal impedance $Z_0=(X_0, R_0)$ of the coil element L', corresponding to a negligible perturbation from the crack 244, the effective inductive reactance $X_L$ of the coil element L' increases, and the effective resistance $R_L$ decreases, with increasing crack depth d and with increasing proximity to the crack 244 (i.e. decreasing transverse (x) distance with respect to the crack 244). The eddy-current-induced magnetic field component 38, 104 opposing the magnetic field component 140 responsive to the current i therein causes the nominal decrease in the effective impedance Z of the coil element L' relative to free-space conditions, and the crack 244 disrupts the eddy currents 34, 102 in the conductive second portion 20, 82 of the vehicle 12 causing a resulting increase in effective impedance Z. Similarly, the effective impedance Z of the coil element L' is a function of the distance y from, and the magnetic and conductive properties of, the conductive second portion 20, 82 of the vehicle 12. The at least one coil 14 provides for substantially generating a corresponding at least one measure responsive to the impedance Z of each associated coil element L', which provides for detecting an associated change in the magnetic condition of the vehicle 12 over or within an associated sensing region associated with the at least one coil element 14, which is responsive to changes in the gap distance y to the associated proximate second portion 20, 82 of the vehicle 12, and responsive to changes in the magnetic and conductive properties thereof and to changes in the reluctance $\mathcal{R}$ of the associated magnetic circuit 188.

Figure 32:
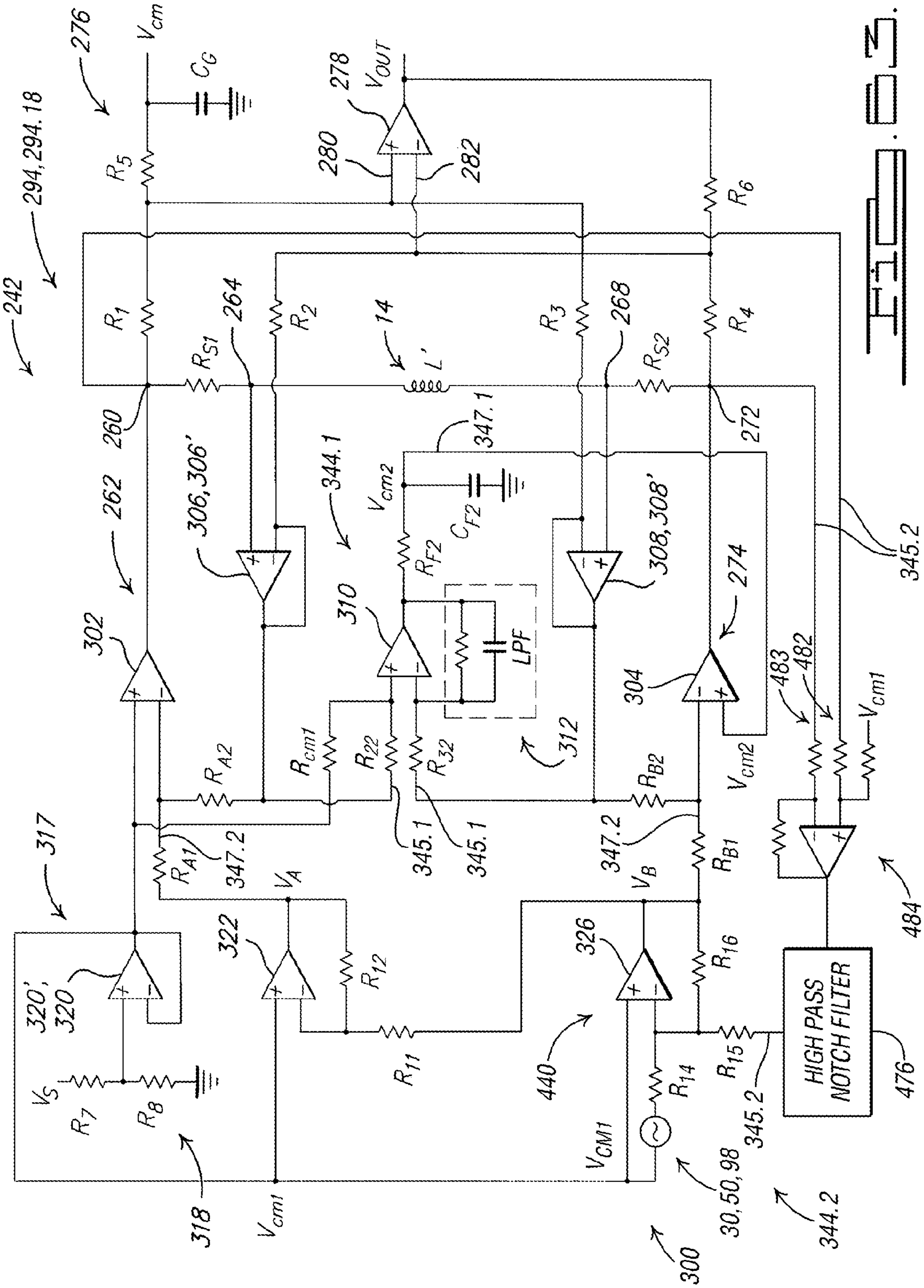
FIG. 32 illustrates a Maxwell-Wien bridge for measuring complex impedance.

The signal conditioner/preprocessor circuit 114 provides for detecting the impedance Z of at least one coil element 14, or of a combination or combinations of a plurality of coil elements 14. For example, referring to FIG. 32, a Maxwell-Wien bridge 246 may be used to measure the inductive reactance $X_L$ and resistance $R_L$ components of impedance Z of a coil element L' or a combination of coil elements L'. Alternatively, the signal conditioner/preprocessor circuit 114, provides for measuring at least one signal across a coil element L' or a combination of the coil elements L' and provides for measuring the signal applied thereto by the associated coil driver 202. The signal conditioner/preprocessor circuit 114—alone, or in combination with the processor 204, provides for decomposing the signal from the coil element L' or a combination of the coil elements L' into real and imaginary components, for example, using the signal applied by the associated coil driver 202 as a phase reference.

The coil element L', or a combination of the coil elements L', is/are magnetically coupled, either directly or indirectly, to at least a portion of the vehicle 12 susceptible to deformation responsive to a crash, wherein changes thereto (e.g. deformation thereof) responsive to a crash affects the reluctance $\mathcal{R}$ of the associated magnetic circuit 68, 188, and/or induces eddy currents 34, 102 in an associated proximal conductive element 18, either of which affects the current i in the coil element L', or a combination of the coil elements L', detection of which provides for detecting the resulting associated change in the magnetic condition of the vehicle 12 associated with the deformation of the associated portion of the vehicle 12 responsive to the crash.

Referring to FIG. 33, a coil 14 of a magnetic crash sensor 10.1, 10.1', 10.1'', 10.1''' or 10.3 is illustrated in proximity to a proximal conductive element 80 located a distance x from the coil 14 and subject to a crash-responsive movement 248 relative to the coil 14. The coil 14 driven with a time-varying current source 250 generates a first magnetic field 26, 94 which induces eddy currents 34, 102 in the conductive element 80, which in turn generate a second magnetic field 38, 104. A voltage signal V is generated across the coil 14 responsive to the self-inductance L and intrinsic resistance $R_L$ thereof, and responsive to induction from the second magnetic field 38, 104. Referring to FIG. 34, the phasor value of the resulting complex voltage signal V can be decomposed into a first signal component 252 given by $$C_1+C_2\cdot x \tag{1}$$

which includes a bias component $C_1$ and a displacement component $C_2\cdot x$ responsive to static displacement x of the conductive element 80 relative to the coil 14; and a second signal component 254 given by:

$$C_3\cdot\frac{\partial x}{\partial t} \tag{2}$$

which is responsive to the velocity of the conductive element 80 relative to the coil 14, wherein the phasor phase values of the first 252 and second 254 signal components are referenced with respect to the drive current signal $I_{dr}$ applied by the time-varying current source 250 and are orthogonal with respect to one another in the complex plane. It is hypothesized that the velocity dependent second signal component 254 is related to the momentum transferred to the vehicle 12 by the object or other vehicle in collision therewith, and that the displacement component $C2\cdot x$ is related to the energy absorbed by the vehicle 12 during the crash, wherein relatively soft vehicles 12 would tend to absorb relatively more energy and would tend to produce relatively more low frequency signals, and relatively stiff vehicles 12 would tend to receive relatively more momentum and would tend to produce relatively more high frequency signals. Furthermore, the real component 256 of the complex voltage signal V is related to the resistive losses in the coil 14 or the eddy current losses in the conductive element 80, whereas the imaginary component 258 is related to the self-inductance of the coil 14 which is responsive to the permeability of the magnetic elements inductively coupled therewith.

Referring to FIG. 35, in accordance with a first aspect of a signal conditioning circuit 294, the coil 14 is in series combination with a balanced pair of sense resistors $R_{S1}$, $R_{S2}$ in a series circuit 242 and is driven by a coil driver 28, 56, 96 fed with a time varying signal 198 from an oscillator 30, 58, 98, wherein a first terminal of a first sense resistor $R_{S1}$ is coupled at a first node 260 of the series circuit 242 to a first output terminal 262 of the coil driver 28, 56, 96, a second terminal of the first sense resistor $R_{S1}$ is coupled at a second node 264 of the series circuit 242 both to a first sense terminal 266 of the coil driver 28, 56, 96 and to a first terminal of the coil 14, a second terminal of the coil 14 is coupled at a third node 268 of the series circuit 242 both to a second sense terminal 270 of the coil driver 28, 56, 96 and to a first terminal of a second sense resistor $R_{S2}$, and a second terminal of the second sense resistor $R_{S2}$ is coupled at a fourth node 272 of the series circuit 242 to a second output terminal 274 of the coil driver 28, 56, 96. For example, the time varying signal 198 is sinusoidal having a frequency between 10 KHz and 100 KHz, and is DC biased with a common mode voltage so a to provide for operation of the associated circuitry using a single-ended power supply. The AC signals of the outputs from the first 262 and second 274 output terminals of the coil driver 28, 56, 96 are of opposite phase with respect to one another, and the coil driver 28, 56, 96 is adapted so as to control these output signals so that the peak-to-peak AC voltage $V_L$ across the coil 14 sensed across the first 266 and second 270 sense terminals of the coil driver 28, 56, 96 is twice the peak-to-peak AC voltage $V_{AC}$ of the oscillator 30, 58, 98. The coil driver 28, 56, 96 is further adapted to substantially null any DC current component through the coil 14 so as to prevent a magnetization of the vehicle 12 by the first magnetic field 26, 94 generated by the coil 14. The first 260, second 264, third 268 and fourth 272 nodes, having corresponding voltages $V_1$, $V_2$, $V_3$ and $V_4$ respectively, are coupled to input resistors $R_1$, $R_2$, $R_3$ and $R_4$ of a summing and difference amplifier 276 implemented with an operational amplifier 278, a resistor $R_5$ from the non-inverting input 280 thereof to a DC common mode voltage signal $V_{cm}$ and to a ground through a capacitor $C_G$, thereby providing for an AC ground, and a resistor $R_6$ between the inverting input 282 and the output 284 thereof, wherein input resistors $R_1$ and $R_3$ are coupled to the non-inverting input 280, and input resistors $R_2$ and $R_4$ are coupled to the inverting input 282.

The first 266 and second 270 sense terminals of the coil driver 28, 56, 96 are of relatively high impedance, so that the first $R_{S1}$ and second $R_{S2}$ sense resistors and the coil 14 each carry substantially the same current I from the coil driver 28, 56, 96. The voltage $V_{out}$ at the output 284 of summing and difference amplifier 276 is given as:

$$V_{out}=(V_1-V_4)-(V_2-V_3)=I\cdot(R_{S1}+R_{S2}) \tag{3}$$

which is equal to the total voltage drop across the sense resistors $R_{S1}$, $R_{S2}$, which provides a measure of the current through the coil 14. Accordingly, given that the voltage $V_L$ across the coil 14 is controlled to a value of twice the peak-to-peak AC voltage $V_{AC}$ of the oscillator 30, 58, 98, and is therefore known, the measure of current I through the coil 14—responsive to $V_{out}$—can be used in combination with the known voltage $V_L$ across the coil 14, to determine the self-impedance Z of the coil 14. Alternatively, the current I through the coil 14 can be demodulated into in-phase I and quadrature-phase Q components phase-relative to the sinusoidal time varying signal 198 of the oscillator 30, 58, 98 so as to provide substantially equivalent information, wherein the in-phase component I provides a measure of the effective resistance R of the coil 14, and the quadrature-phase component Q provides a measure of the effective impedance Z of the coil 14. In accordance with this latter approach, the output 284 of the summing and difference amplifier 276 is filtered by a low-pass filter 286, converted from analog to digital form by an analog-to-digital converter 288, and demodulated into the in-phase I and quadrature-phase Q components by a demodulator 290 which is phase-referenced to the time varying signal 198 of the oscillator 30, 58, 98.

The in-phase I and/or quadrature-phase Q component, individually or in combination, is/are then processed by a crash sensing algorithm 292 in the processor 108, 204 to provide for discriminating or detecting crash events that are sufficiently severe to warrant the deployment of the safety restraint actuator 44. For example, in one set of embodiments, the in-phase component I, possibly in combination with the quadrature-phase Q component, is processed to provide for discriminating or detecting crash events that are sufficiently severe to warrant the deployment of the safety restraint actuator 44. Alternatively, the in-phase component I, possibly in combination with the quadrature-phase Q component, may be used to provide a safing signal to prevent the actuation of a safety restraint actuator 44 absent a crash of sufficient severity to warrant a possible deployment thereof.

Figure 36:
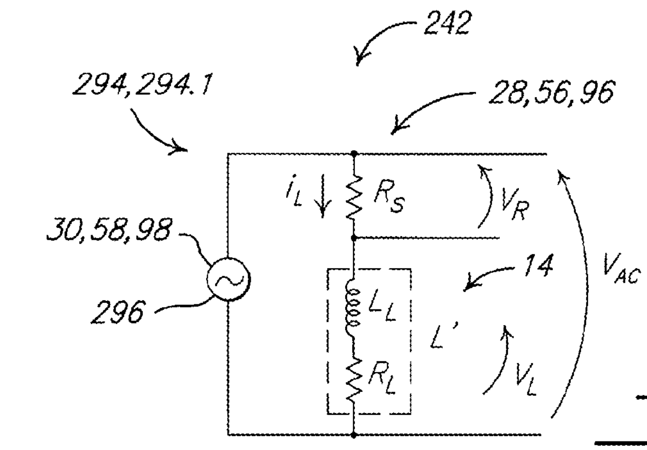
FIG. 36 illustrates a first embodiment of a signal conditioning circuit that provides for generating one or more measures responsive to a self-impedance of a coil.

Referring to FIG. 36, the self-impedance $Z_L$ of a coil 14, L', or the associated self-resistance $R_L$ or self-inductance $L_L$ thereof, may be determined using a first embodiment of a signal conditioning circuit 294.1 wherein a time-varying voltage $V_{AC}$ is applied by an oscillator 296 across the series combination of a sense resistor $R_S$ and the coil 14, L'. The current $i_L$ through the series combination, and therefore through the coil 14, L', is given by the ratio of the complex or phasor voltage $V_R$ across sense resistor $R_S$, divided by the value $R_S$ of the sense resistor $R_S$, wherein the voltage $V_R$ is measured as either a magnitude and a phase relative to the applied time varying voltage $V_{AC}$, or by demodulation into in-phase I and quadrature-phase Q components relative to the applied time varying voltage $V_{AC}$. The self-impedance $Z_L$ of the coil 14, L' is then given from Ohms Law as the ratio of the voltage $V_L$ across the coil 14, L', i.e. $V_L=V_{AC}-V_R$, divided by the current $i_L$ through the coil 14, L', or:

$$Z_L = \frac{R_S \cdot V_L}{V_R} = \frac{R_S \cdot (V_{AC} - V_R)}{V_R} \quad (4)$$

Figure 37:
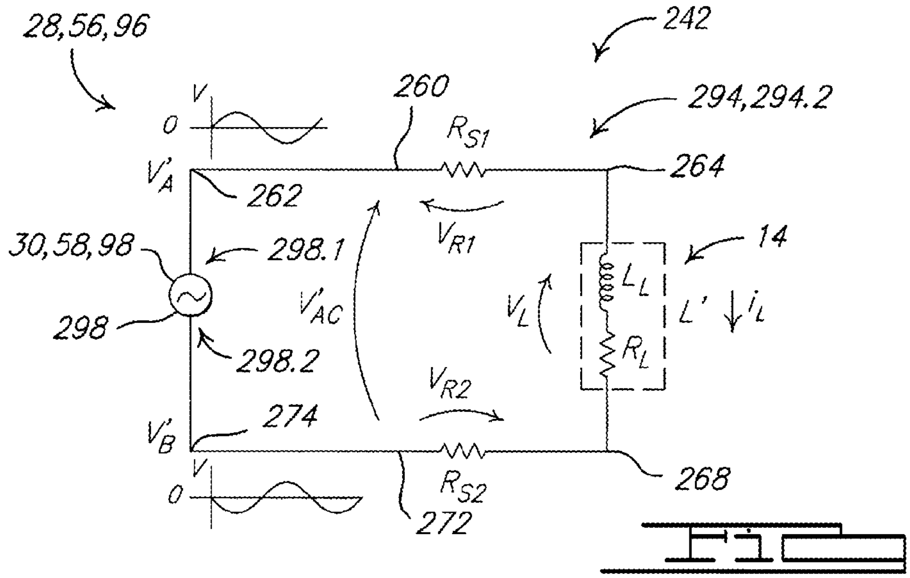
FIG. 37 illustrates a second embodiment of a signal conditioning circuit that provides for generating one or more measures responsive to a self-impedance of a coil.

Referring to FIG. 37, in accordance with a second embodiment of a signal conditioning circuit 294.2 that provides for generating one or more measures responsive to the self-impedance $Z_L$ of a coil 14, L', a balanced time varying voltage $V_{AC}'$ is applied by an oscillator 298 across the series combination of the coil 14, L' and two sense resistors $R_{S1}$, $R_{S2}$ in a balanced architecture, wherein the sense resistors $R_{S1}$, $R_{S2}$ are of substantially equal value, the coil 14, L' is coupled between the sense resistors $R_{S1}$, $R_{S2}$, and the remaining terminals of the sense resistors $R_{S1}$, $R_{S2}$ are coupled to first 298.1 and second 298.2 terminals of the oscillator 298 which provide for complementary output signals $V_A'$ and $V_B'$ respectively, each of which has a substantially zero-mean value and is of substantially opposite phase to the other. For example, in one embodiment, the output signal $V_A'$ is given by $A\cdot\sin(\omega t)$ and the output signal $V_B'$ is given by $-A\cdot\sin(\omega t)$, wherein A is the peak amplitude and ω is the associated radian frequency, so that the time varying voltage $V_{AC}'$ is given by $V_{AC}'=V_A'-V_B'=2\cdot A\cdot\sin(\omega t)$. The balanced feed architecture provides for reduced EMI (Electromagnetic Interference) susceptibility and emissions. The self-impedance $Z_L$ of the coil 14, L' is given from Equation (1) by substituting therein $V_{AC}'$ for $V_{AC}$, and $(V_{R1}+V_{R2})$ for $V_R$, wherein $V_{R1}$ and $V_{R2}$ are the measured voltages across the respective sense resistors $R_{S1}$, $R_{S2}$.

Figure 38:
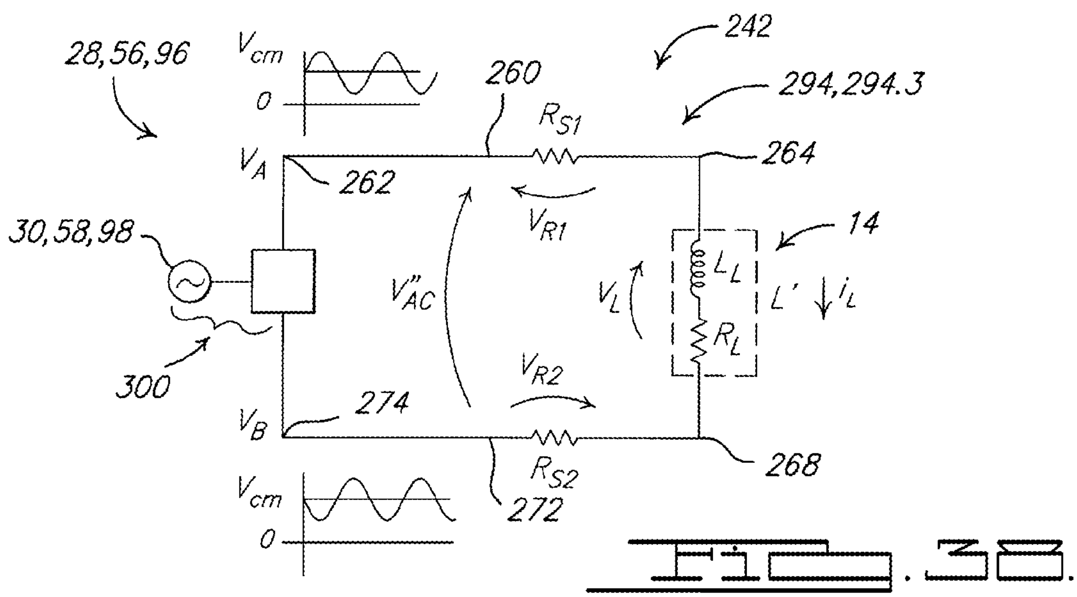
FIG. 38 illustrates a third embodiment of a signal conditioning circuit that provides for generating one or more measures responsive to a self-impedance of a coil.

Referring to FIG. 38, a third embodiment of a signal conditioning circuit 294.3 that provides for generating one or more measures responsive to the self-impedance $Z_L$ of a coil 14, L' is similar to the second embodiment illustrated in FIG. 37, with the exception of the incorporation of an oscillator 300 adapted to provide for single-ended complementary output signals $V_A$ and $V_B$, so as to provide for operation with associated single-ended electronic devices, i.e. where all signals are between 0 and $+V_{max}$ volts. For example, each of the output signals $V_A$ and $V_B$ is biased by a DC common mode voltage signal $V_{cm}$, so that $V_A=V_{cm}-A\cdot\sin(\omega t)$ and $V_B=V_{cm}-A\cdot\sin(\omega t)$, wherein, in one embodiment for example, $V_{cm}=V_{max}/2$ and the peak amplitude A is less than or equal to $V_{cm}$. In one embodiment, the oscillator 300 comprises a digital clock generator and sine/cosine shaper that generates digital complementary signals which are converted to analog form with a digital-to-analog converter to generate the complementary output signals $V_A$ and $V_B$.

Figure 39:
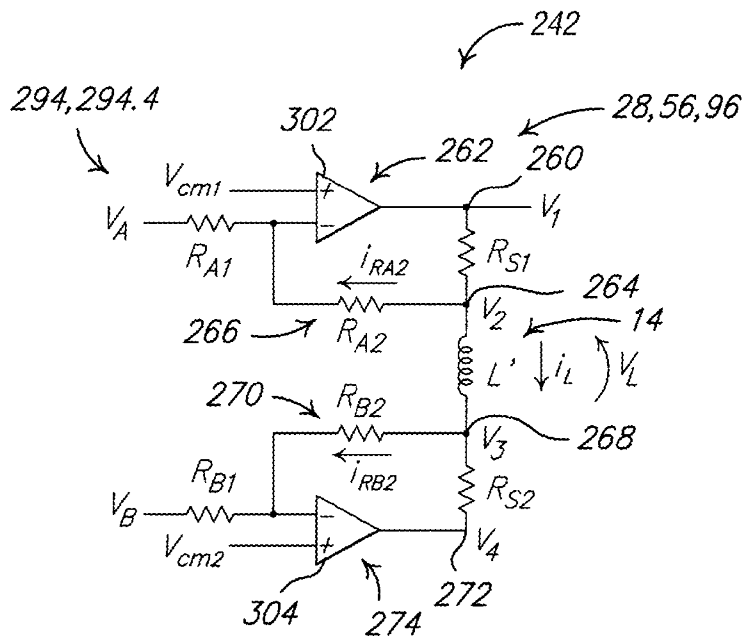
FIG. 39 illustrates a fourth embodiment of a signal conditioning circuit that provides for generating one or more measures responsive to a self-impedance of a coil.

Referring to FIG. 39, in accordance with a fourth embodiment of a signal conditioning circuit 294.4 that provides for generating one or more measures responsive to the self-impedance $Z_L$ of a coil 14, L', the voltage $V_L$ across the coil 14, L' is controlled by using feedback control of the signals applied to the first 260 and fourth 272 nodes at the sense resistors $R_{S1}$, $R_{S2}$ in series with the coil 14, L' responsive to feedback signals from the second 264 and third 268 nodes across the coil 14, L'. More particularly, the first complementary output signal $V_A$ is fed through a first input resistor $R_{A1}$ to the inverting input of a first operational amplifier 302, which is also coupled through a first feedback resistor $R_{A2}$ to the second node 264 where the first sense resistor $R_{S1}$ is coupled to a first terminal of the coil 14, L'. Furthermore, the second complementary output signal $V_B$ is fed through a second input resistor $R_{B1}$ to the inverting input of a second operational amplifier 304, which is also coupled through a second feedback resistor $R_{B2}$ to the third node 268 where the second sense resistor $R_{S2}$ is coupled to the second terminal of the coil 14, L'. The output 262 of the first operational amplifier 302 is coupled to the first node 260 at the first sense resistor $R_{S1}$, and the output 274 of the second operational amplifier 304 is coupled to the fourth node 272 at the second sense resistor $R_{S2}$. A first common mode voltage signal $V_{cm1}$ is coupled to the non-inverting input of the first operational amplifier 302, and a second common mode voltage signal $V_{cm2}$ is coupled to the non-inverting input of the second operational amplifier 304.

For ideal first 302 and second 304 operational amplifiers, and for:

$$\frac{R_{A2}}{R_{A1}} = \frac{R_{B2}}{R_{B1}} = \alpha \quad (5)$$

$$V_{CM1}=V_{CM2}=V_{CM} \quad (6)$$

$$V_A=V_{CM}-A\cdot\sin(\omega t), \text{ and} \quad (7a)$$

$$V_B=V_{CM}+A\cdot\sin(\omega t) \quad (7b)$$

the voltage $V_L$ across the coil 14, L' is given by:

$$V_L=V_2-V_3=\alpha\cdot(V_B-V_A)=2\cdot\alpha\cdot A\cdot\sin(\omega t) \quad (8)$$

Accordingly, the feedback control loop provides for controlling the value of the voltage $V_L$ across the coil 14, L', and, for example, setting this to a value higher than would be obtained, for example, with the third embodiment of the signal conditioning circuit 294.3 illustrated in FIG. 38, so as to provide for higher signal levels and correspondingly higher associated signal-to-noise ratios. For example, with α=1, the voltage $V_L$ across the coil 14, L' would be $V_B-V_A$, whereas in the third embodiment of the signal conditioning circuit 294.3 illustrated in FIG. 38, this is the value of the voltage applied across the series combination of the sense resistors $R_{S1}$, $R_{S2}$ and the coil 14, L'. The first 302 and second 304 operational amplifiers control the voltage $V_L$ across the coil 14, L', the current $i_L$ through the coil 14, L' is responsive to the self-impedance $Z_L$ of the coil 14, L', i.e. ($i_L=V_L/Z_L$), and the voltages at the first 260 and fourth 272 nodes are automatically set by the first 302 and second 304 operational amplifiers so as to provide the current necessary to control the voltage $V_L$ across the coil 14, L'. However, the currents through the first $R_{S1}$ and second $R_{S2}$ sense resistors will not correspond exactly to the current $i_L$ through the coil 14, L' because of the currents $i_{RA2}$ and $i_{RB2}$ through the first $R_{A2}$ and second $R_{B2}$ feedback resistors, and the corresponding signal from Equation (3) used to measure the current $i_L$ through the coil 14, L' is given by:

$$V_{out} = (V_1 - V_4) - (V_2 - V_3) = (R_{S1} + R_{S2}) \cdot \left(i_L + \frac{1}{2} \cdot (i_{RA2} - i_{RB2})\right) \tag{9}$$

wherein:

$$i_{RA2} = \frac{V_2 - V_{CM}}{R_{A2}}, \text{ and} \tag{10}$$

$$i_{RB2} = \frac{V_3 - V_{CM}}{R_{B2}} \tag{11}$$

Figure 40:
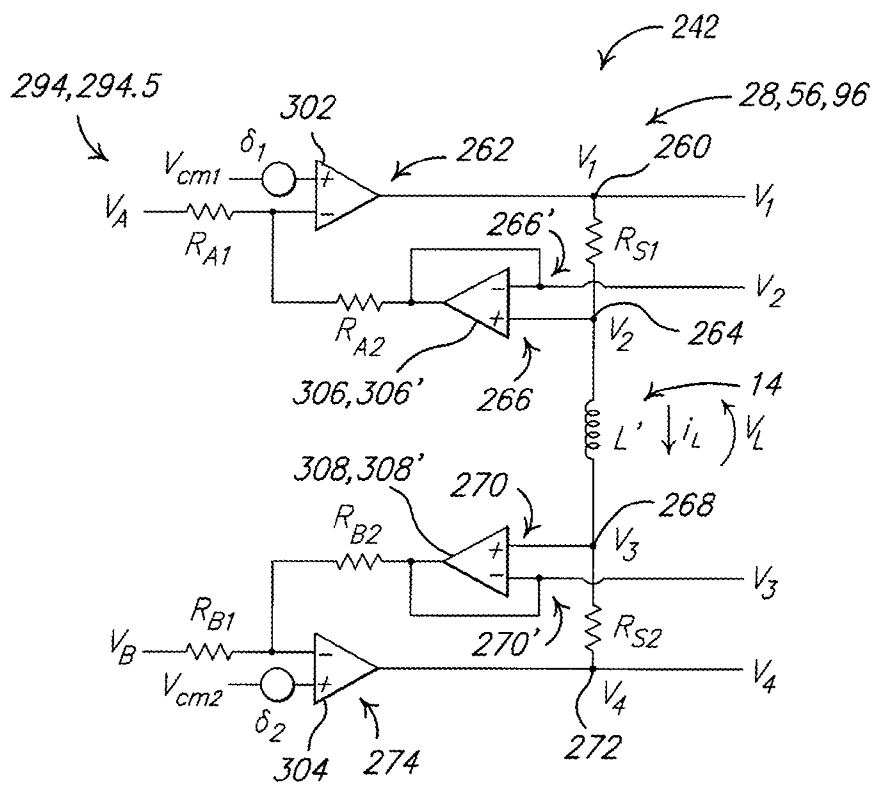
FIG. 40 illustrates a fifth embodiment of a signal conditioning circuit that provides for generating one or more measures responsive to a self-impedance of a coil.

Referring to FIG. 40, in accordance with a fifth embodiment of a signal conditioning circuit 294.5 that provides for generating one or more measures responsive to the self-impedance $Z_L$ of a coil 14, L', the affect of the currents $i_{RA2}$ and $i_{RB2}$ through the first $R_{A2}$ and second $R_{B2}$ feedback resistors can be mitigated by using third 306 and fourth 308 operational amplifiers configured as respective buffer amplifiers 306', 308' so as to provide for substantially eliminating any loading by the first $R_{A2}$ and second $R_{B2}$ feedback resistors on the second 264 and third 268 nodes, respectively, so that the current through each of the sense resistors $R_{S1}$, $R_{S2}$ is substantially the same as the current $i_L$ through the coil 14, L'. Accordingly, the signal from Equation (3) used to measure the current $i_L$ through the coil 14, L' is representative thereof and is given by:

$$V_{out}=(V_1-V_4)-(V_2-V_3)=(R_{S1}+R_{S2})\cdot i_L \tag{12}$$

The remaining portions of the signal conditioning circuit 294.5 function the same as for the fourth embodiment of the signal conditioning circuit 294.4 illustrated in FIG. 39, except that the first 302 and second 304 operational amplifiers are illustrated as real operational amplifiers rather than ideal operational amplifiers, wherein respective DC bias voltage sources $\delta_1$ and $\delta_2$ are added to the non-inverting inputs thereof, respectively, to provide for simulating the affects of internal biases associated with real operational amplifiers. Accordingly, for the conditions of Equations (5), (7a) and (7b), the voltage $V_L$ across the coil 14, L' is given by:

$$V_L=V_2-V_3=\alpha\cdot(V_B-V_A)+(1+\alpha)\cdot((V_{CM1}-V_{CM2})+(\delta_1-\delta_2)) \tag{13}$$

Under the conditions of Equation (6), this reduces to:

$$V_L=V_2-V_3=\alpha\cdot(V_B-V_A)+(1+\alpha)\cdot(\delta_1-\delta_2) \tag{14}$$

Under the conditions of Equations (7a) and (7b), this reduces to:

$$V_L=V_2-V_3=2\cdot\alpha\cdot A\cdot\sin(\omega t)+(1+\alpha)\cdot(\delta_1-\delta_2) \tag{15}$$

The AC component of the voltage $V_L$ across the coil 14, L' has a value of:

$$V_L^{AC}=(V_2-V_3)^{AC}=2\cdot\alpha\cdot A\cdot\sin(\omega t) \tag{16}$$

which, for α=1, is comparable to that of third embodiment of the signal conditioning circuit 294.3 illustrated in FIG. 38.

Accordingly, the DC bias voltage sources $\delta_1$ and $\delta_2$ cause the voltage $V_L$ across the coil 14, L' to have a DC bias of:

$$(1+\alpha)\cdot(\delta_1-\delta_2), \tag{17}$$

which, for α=1 and $\delta=\max(|\delta_1|,|\delta_2|)$, can have a value as great as 4δ—because the DC bias voltage sources $\delta_1$ and $\delta_2$ are uncorrelated—which causes a corresponding DC bias current in the coil 14, L', which might adversely magnetize the vehicle 12.

Figure 41:
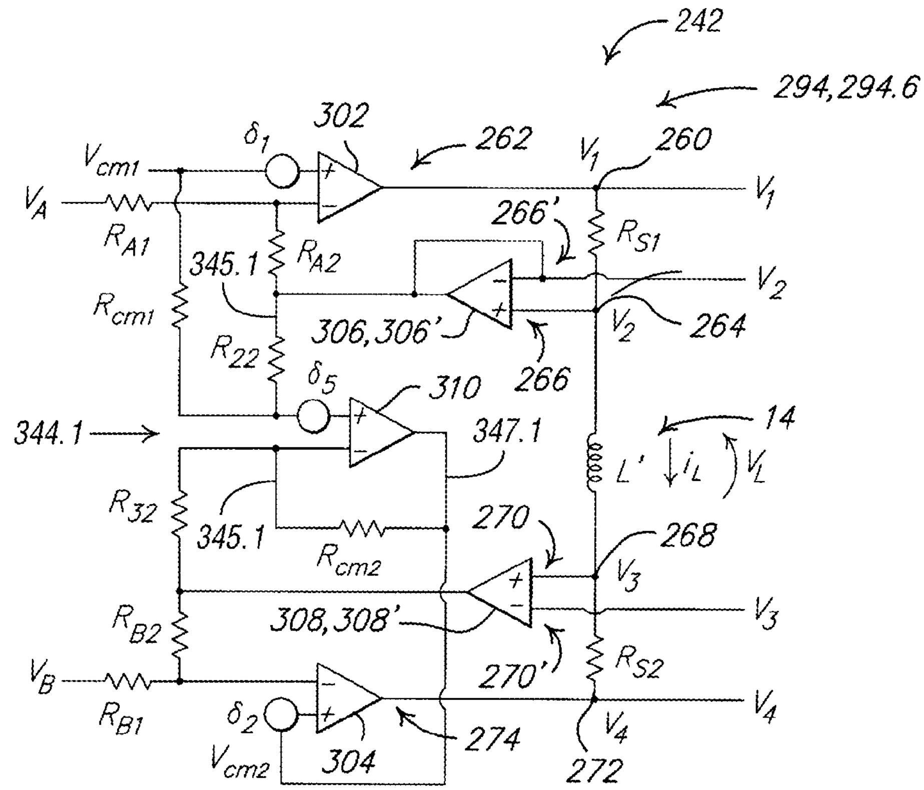
FIG. 41 illustrates a sixth embodiment of a signal conditioning circuit that provides for generating one or more measures responsive to a self-impedance of a coil.

Referring to FIG. 41, in accordance with a sixth embodiment of a signal conditioning circuit 294.6 that provides for generating one or more measures responsive to the self-impedance $Z_L$ of a coil 14, L', the fifth embodiment of the signal conditioning circuit 294.5 illustrated in FIG. 40 is modified with the inclusion of a fifth operational amplifier 310 adapted to provide for operating on the voltage $V_L$ across the coil 14, L', so as to provide for nulling DC biases therein. More particularly, the non-inverting input of the fifth operational amplifier 310 is coupled through a third input resistor $R_{22}$ to the output of the third operational amplifier 306, and is also coupled through a fourth input resistor $R_{cm1}$ to the first common mode voltage signal $V_{cm1}$. The inverting input of the fifth operational amplifier 310 is coupled through a fifth input resistor $R_{32}$ to the output of the fourth operational amplifier 308, and is also coupled through a second feedback resistor $R_{cm2}$ to the output of the fifth operational amplifier 310 and to the non-inverting input of the second operational amplifier 304 so as to provide the second common mode voltage signal $V_{cm2}$ thereto.

Letting:

$$\frac{R_{CM2}}{R_{32}} = \frac{R_{CM1}}{R_{22}} = G, \tag{18}$$

the second common mode voltage signal $V_{CM2}$ is then given by:

$$V_{CM2}=V_{CM1}+G\cdot(V_2-V_3)+(1+G)\cdot\delta_5, \tag{19}$$

and the resulting voltage $V_L$ across the coil 14, L' is then given by:

$$V_L = V_2 - V_3 = \frac{\alpha\cdot(V_B - V_A) + (1+\alpha)\cdot(\delta_1 - \delta_2 - (1+G)\cdot\delta_5)}{1 + (1+\alpha)\cdot G}, \tag{20}$$

wherein a prospective DC offset of the fifth operational amplifier 310 is represented by a DC bias voltage source $\delta_5$ at the non-inverting input thereof.

For the first $V_A$ and second $V_B$ complementary output signals given by Equations (7a) and (7b) respectively, the resulting voltage $V_L$ across the coil 14, L' is given by:

$$V_L = \frac{2\cdot\alpha\cdot A\cdot\sin(\omega t) + (1+\alpha)\cdot(\delta_1-\delta_2)}{1+(1+\alpha)\cdot G} - \frac{(1+\alpha)\cdot(1+G)}{1+(1+\alpha)\cdot G}\cdot\delta_5 \tag{21}$$

For $\alpha=1$, the resulting voltage $V_L$ across the coil 14, L' is given by:

$$V_L = \frac{2\cdot A\cdot\sin(\omega t) + 2\cdot(\delta_1-\delta_2) - \delta_5}{1+2\cdot G} - \delta_5 \tag{22}$$

Accordingly, as the gain G is increased, the magnitude of the first component of Equation (22)—which includes the entire AC component and the DC components attributable to the DC bias voltage sources $\delta_1$ and $\delta_2$—decreases. For example, for G=1, the voltage $V_L$ across the coil 14, L' is given by:

$$V_L = A\cdot\sin(\omega t) + (\delta_1-\delta_2) - 1.5\cdot\delta_5\text{, and} \tag{23}$$

and as the gain G approaches infinity, the voltage $V_L$ across the coil 14, L' approaches the value of the DC bias voltage source $\delta_5$ associated with the fifth operational amplifier 310:

$$V_L = -\delta_5. \tag{24}$$

Accordingly, with sufficient gain G, the sixth embodiment of the signal conditioning circuit 294.6 illustrated in FIG. 41 provides for reducing the affect of the DC bias voltage sources $\delta_1$ and $\delta_2$ on the voltage $V_L$ across the coil 14, L', but at the expense of also reducing that magnitude of the associated AC signal component.

Figure 42:
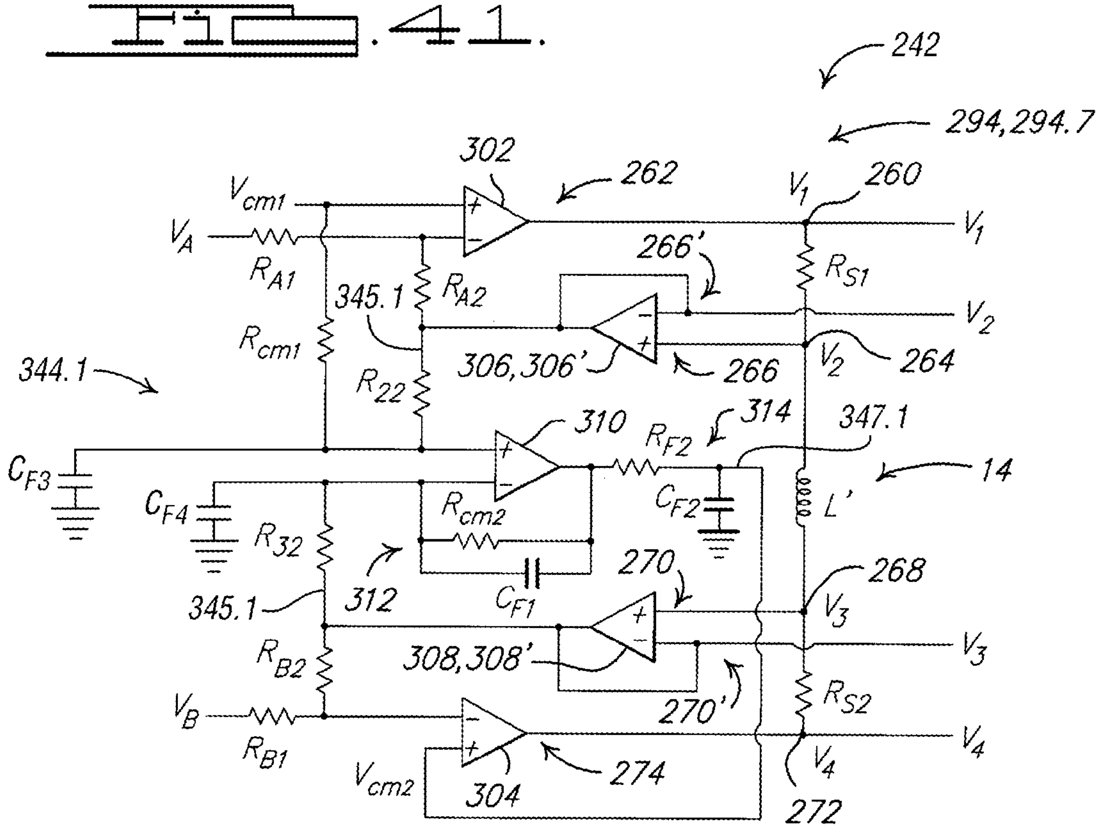
FIG. 42 illustrates a seventh embodiment of a signal conditioning circuit that provides for generating one or more measures responsive to a self-impedance of a coil.

Referring to FIG. 42, in accordance with a seventh embodiment of a signal conditioning circuit 294.7 that provides for generating one or more measures responsive to the self-impedance $Z_L$ of a coil 14, L', the affect of the DC bias voltage sources $\delta_1$ and $\delta_2$ on the voltage $V_L$ across the coil 14, L' may be reduced without adversely affecting the associated AC signal component by modifying the fifth operational amplifier 310 to act as a low pass filter, for example, by adding a feedback capacitor $C_{F1}$ between the output and the inverting input of the fifth operational amplifier 310, across the second feedback resistor $R_{cm2}$, the combination of which forms an low-pass filter circuit 312, which acts to reduce the gain G with increasing frequency. The cutoff frequency of the low-pass filter circuit 312 is set substantially lower than the operating frequency of the oscillator 300. For example, in one embodiment, the cutoff frequency of the low-pass filter circuit 312 is set at least two decades below the operating frequency of the oscillator 300. The seventh embodiment of a signal conditioning circuit 294.7 further comprises a low-pass filter 314 between the output of the fifth operational amplifier 310 and the non-inverting input of the second operational amplifier 304, for example, comprising a series resistor $R_{F2}$ and a parallel capacitor $C_{F2}$. As illustrated in FIG. 42, filter capacitors $C_{F3}$ and $C_{F4}$ may be respectively added from the non-inverting and inverting inputs of the fifth operational amplifier 310, each to ground, respectively, so as to increase the order of the associated low-pass filter circuit 312.

Figure 43:
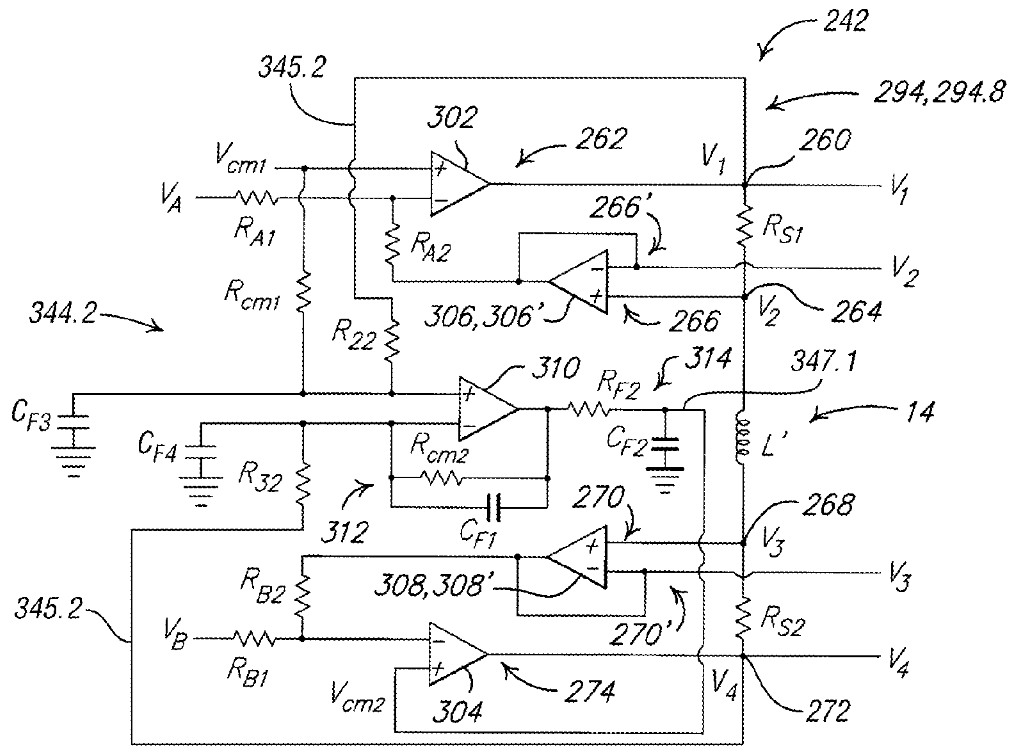
FIG. 43 illustrates an eighth embodiment of a signal conditioning circuit that provides for generating one or more measures responsive to a self-impedance of a coil.

The seventh embodiment of the signal conditioning circuit 294.7 illustrated in FIG. 42 is unable to compensate for the affect of prospective respective DC bias voltage sources $\delta_3$ and/or $\delta_4$, if any, of the third 306 and/or fourth 308 operational amplifiers, respectively, on the voltage $V_L$ across the coil 14, L'. Referring to FIG. 43, in accordance with an eighth embodiment of a signal conditioning circuit 294.8 that provides for generating one or more measures responsive to the self-impedance $Z_L$ of a coil 14, L', this limitation, and a similar limitation in the sixth embodiment of the signal conditioning circuit 294.6 illustrated in FIG. 41, may be remedied by coupling the non-inverting input of the fifth operational amplifier 310 through the third input resistor $R_{22}$ to the first node 260 of the series circuit 242, rather than to the output of the third operational amplifier 306; and by coupling the inverting input of the fifth operational amplifier 310 through the fifth input resistor $R_{32}$ to the fourth node 272 of the series circuit 242, rather than to the output of the fourth operational amplifier 308. Accordingly, the fifth operational amplifier 310 and associated circuitry of the eighth embodiment of a signal conditioning circuit 294.8 provides for nulling a DC bias of the voltage across the first 260 and fourth 272 nodes of the series circuit 242, associated with a DC bias of the current $i_L$ therethrough. In comparison, the seventh embodiment of the signal conditioning circuit 294.7 acts to null the DC bias voltage across the second 264 and third 268 nodes of the series circuit 242. The eighth embodiment of a signal conditioning circuit 294.8 is effective because even though the voltages across the second 264 and third 268 nodes and the first 260 and fourth 272 nodes are generally different when the current $i_L$ is non-zero, both of these voltages will equal to zero when the current $i_L$ through the series circuit 242 is equal to zero.

Figure 44:
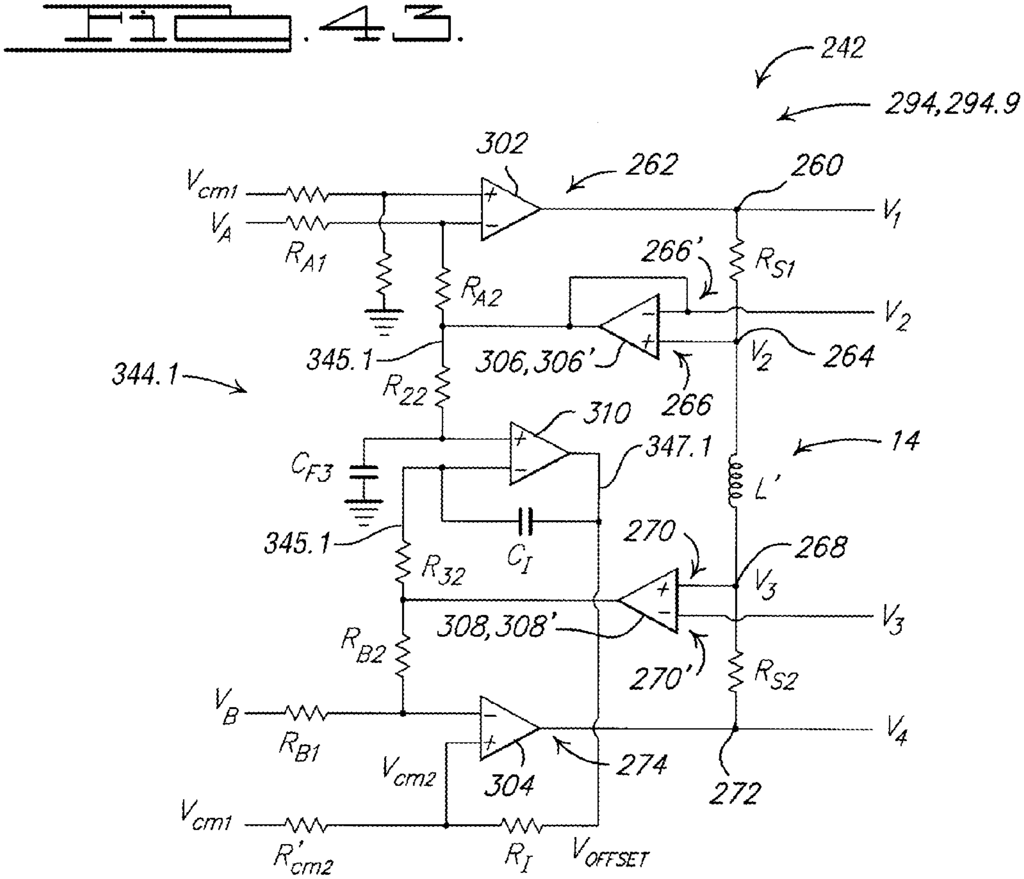
FIG. 44 illustrates a ninth embodiment of a signal conditioning circuit that provides for generating one or more measures responsive to a self-impedance of a coil.
Figure 4:
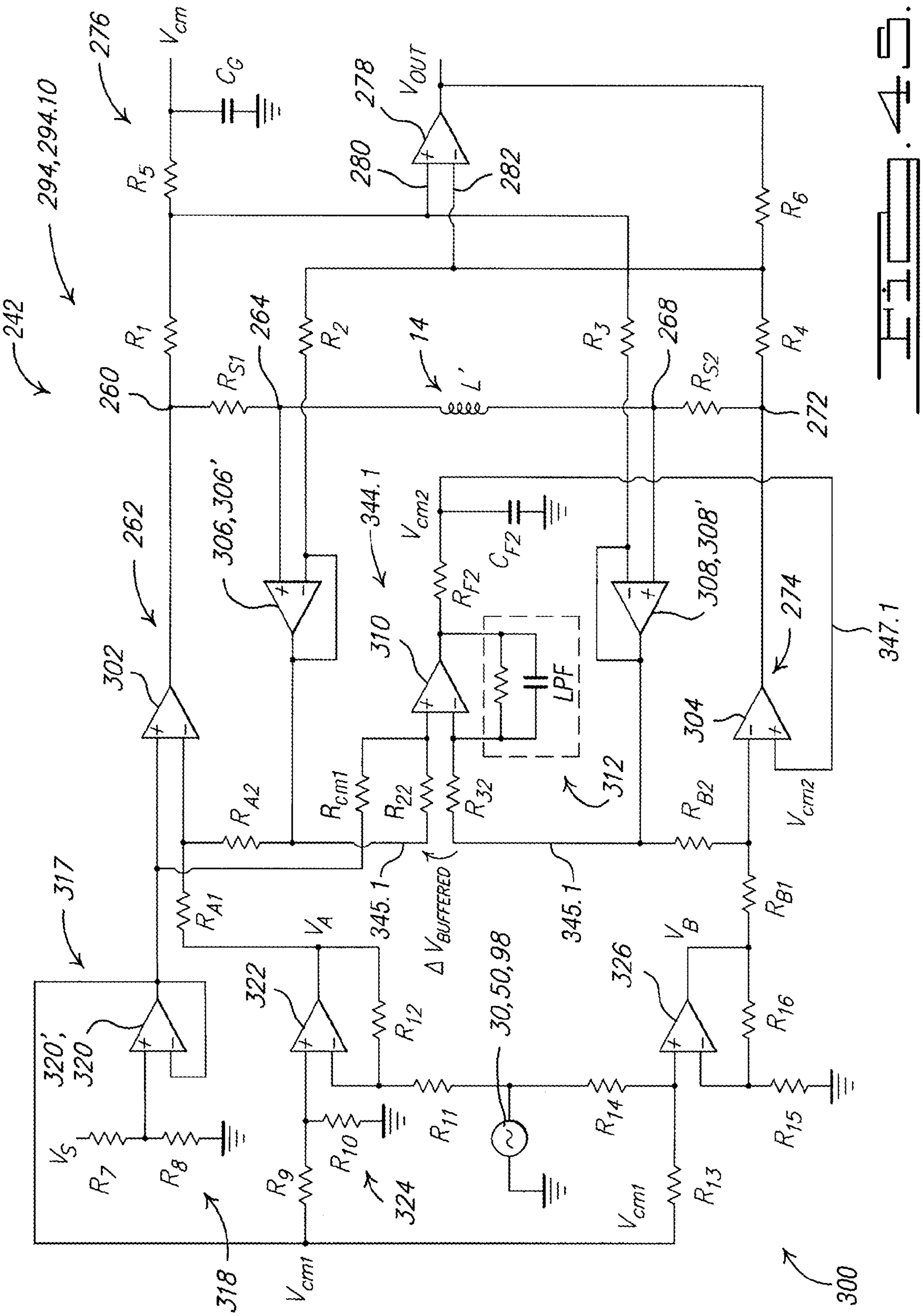
Figure 14:
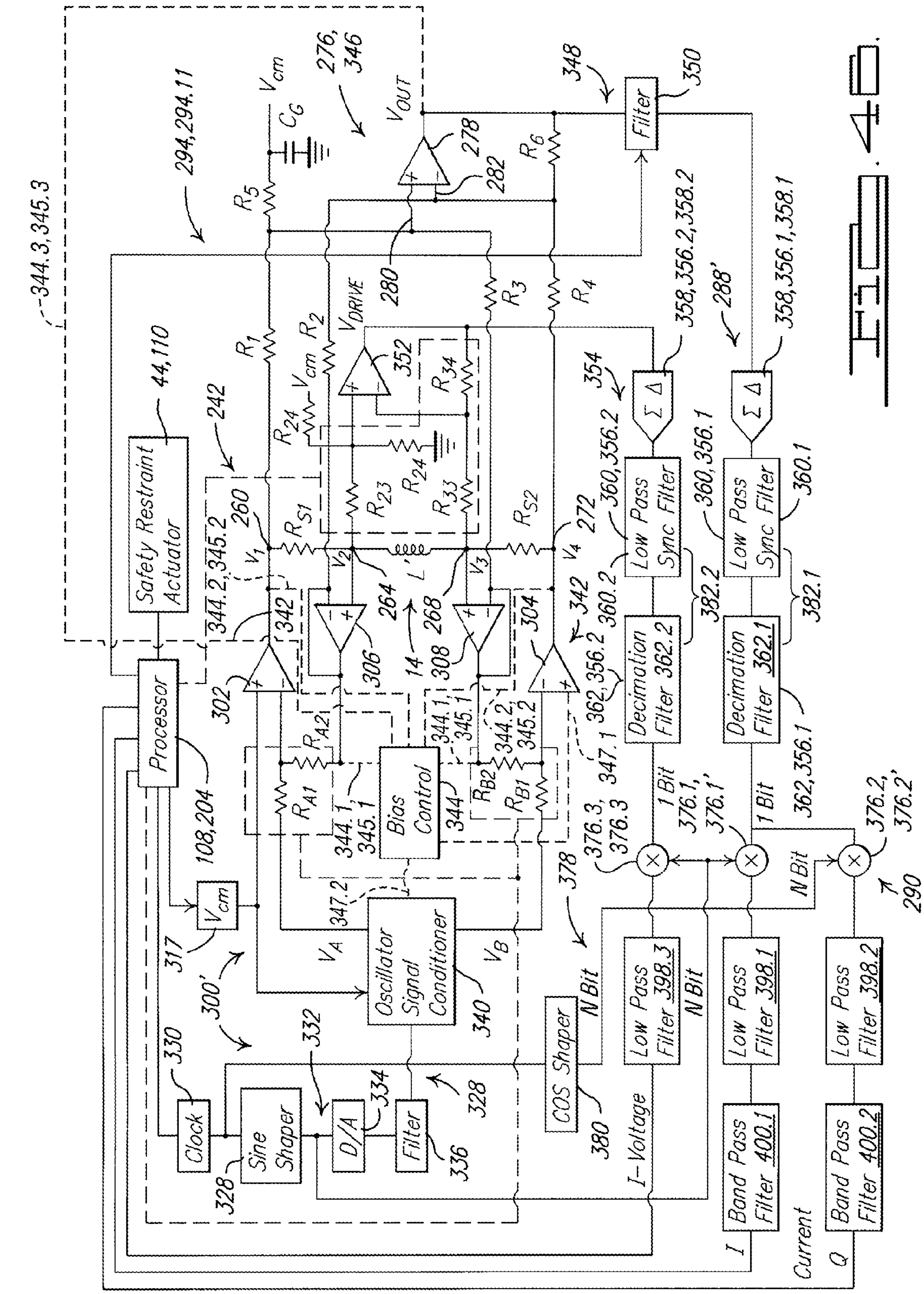

Referring to FIG. 44, in accordance with a ninth embodiment of a signal conditioning circuit 294.9 that provides for generating one or more measures responsive to the self-impedance $Z_L$ of a coil 14, L', as an alternative to the seventh embodiment of the signal conditioning circuit 294.7 illustrated in FIG. 42, the fifth operational amplifier 310 is configured as an integrator 316, wherein the non-inverting input of the fifth operational amplifier 310 is coupled through the third input resistor $R_{22}$ to the output of the third operational amplifier 306, and is also coupled to ground through a filter capacitor $C_{F3}$. The inverting input of the fifth operational amplifier 310 is coupled through the fifth input resistor $R_{32}$ to the output of the fourth operational amplifier 308, and is also coupled through an integrator capacitor $C_I$ to the output of the fifth operational amplifier 310 and through an output resistor $R_I$ to the non-inverting input of the second operational amplifier 304, the latter of which is also coupled through a sixth input resistor $R_{cm2}'$ to the first DC common mode voltage signal $V_{cm1}$. Accordingly, a DC bias in the voltage $V_L$ across the coil 14, L' is integrated by the integrator 316 so as to generate the second common mode voltage signal $V_{cm2}$ at the non-inverting input of the second operational amplifier 304 so as to provide compensation therefore, so as to provide for reducing or eliminating the DC bias in the voltage $V_L$ across the coil 14, L'.

Referring to FIG. 45, a tenth embodiment of a signal conditioning circuit 294.10 that provides for generating one or more measures responsive to the self-impedance $Z_L$ of a coil 14, L', is based upon the embodiment illustrated in FIG. 35 described hereinabove, wherein the coil driver 28, 56, 96 comprises a circuit based upon the seventh embodiment of a signal conditioning circuit 294.7 illustrated in FIG. 42, together with an example of circuitry for generating the output signals $V_A$ and $V_B$ from the associated oscillator 300. For example, the low-pass filter 312 can be as described in accordance with the seventh embodiment of a signal conditioning circuit 294.7.

The tenth embodiment of the signal conditioning circuit 294.10 further illustrates an example of a circuit 317 for generating the first common mode voltage signal $V_{cm1}$. For example, the circuit 317 comprises a first voltage divider 318 of resistors $R_7$ and $R_8$ fed by a supply voltage source $V_S$. The output of the voltage divider 318 is buffered by an associated sixth operational amplifier 320 configured as an associated buffer amplifier 320'. For example, for resistors $R_7$ and $R_8$ of equal value, the resulting first common mode voltage signal $V_{cm1}$ would be half the value of the supply voltage source $V_S$.

The tenth embodiment of the signal conditioning circuit 294.10 further illustrates an example of an embodiment of the associated oscillator 300, wherein the output signal $V_A$ is generated by a seventh operational amplifier 322, the non-inverting input of which is coupled to the output of a second voltage divider 324 comprising resistors $R_9$ and $R_{10}$ fed by the first common mode voltage signal $V_{cm1}$, the inverting input of which is coupled by an input resistor $R_{11}$ to an oscillator 30, 58, 98, and by a feedback resistor $R_{12}$ to the output of the seventh operational amplifier 322. For resistors $R_9$ and $R_{10}$ of equal value, and for resistors $R_{11}$ and $R_{12}$ of equal value, and for the output of the oscillator 30, 58, 98 given by $A \cdot \sin(\omega t)$, then the output signal $V_A$ is given by Equation (7a).

Furthermore, the output signal $V_B$ is generated by an eighth operational amplifier 326, the non-inverting input of which is coupled to the first common mode voltage signal $V_{cm1}$ through a first input resistor $R_{13}$, and to the oscillator 30, 58, 98 through a second input resistor $R_{14}$; and the non-inverting input of which is coupled by a an input resistor $R_{15}$ to ground, and by a feedback resistor $R_{16}$ to the output of the eighth operational amplifier 326. For resistors $R_{13}$ and $R_{14}$ of equal value, and for resistors $R_{15}$ and $R_{16}$ of equal value, and for the output of the oscillator 30, 58, 98 given by $A \cdot \sin(\omega t)$, then the output signal $V_B$ is given by Equation (8).

Referring to FIG. 46, an eleventh embodiment of a signal conditioning circuit 294.11 that provides for generating one or more measures responsive to a self-impedance $Z_L$ of a coil 14, L', is substantially based upon the tenth embodiment of the signal conditioning circuit 294.10 illustrated in FIG. 45, wherein like reference signs correspond to similar elements which function as described hereinabove, and FIG. 45 includes supplemental aspects as described hereinbelow. In accordance with a second embodiment of an oscillator 300', a sine shaper 328 driven by a clock 330 generates a digital time series 334 of a sine wave, for example, with 8-bit digital sample values, which is fed into a digital-to-analog converter 332 which generates a corresponding sampled analog sine wave waveform, which is in turn filtered by a low-pass filter 336 to remove artifacts of the associated quantization and sampling processes, such as associated harmonics and clocking noise associated with the digital-to-analog converter 332. For example, in one embodiment, the sine shaper is programmable from 15.6 kilohertz to 44.9 kilohertz, and the resulting analog sine wave has a 0.8 volt peak-peak magnitude. The filtered sine wave signal 338 from the low-pass filter 336 is fed into an oscillator signal conditioner 340 adapted to generate the single-ended first $V_A$ and second $V_B$ complementary output signals, for example, as described hereinabove, for example, in accordance with the circuitry associated with the seventh 322 and eighth 324 operational amplifiers and associated circuitry described hereinabove in association with the tenth embodiment of the signal conditioning circuit 294.10 illustrated in FIG. 45. The first 302 and second 304 operational amplifiers provide for a linear driver 342 that drives the coil 14, L' with a sine wave responsive to the first $V_A$ and second $V_B$ complementary output signals, wherein the associated gain $\alpha$ thereof given by Equation (5) is programmable responsive to the processor 108, 204 by adjustment of the associated input $R_{A1}$, $R_{B1}$ and feedback $R_{A2}$, $R_{B2}$ resistors associated with the first 302 and second 304 operational amplifiers. For example, each of the input $R_{A1}$, $R_{B1}$ and feedback $R_{A2}$, $R_{B2}$ resistors can be adjusted by switching a corresponding network of resistors interconnected with associated FET transistors, or using an FET transistor as a variable resistor. For example, in one embodiment, the processor 108, 204 is adapted to adjust the current $i_L$ through the coil 14, L' so as to be within the range of 10-50 milliamperes RMS, by adjusting the gain $\alpha$ of the linear driver 342, wherein in the eleventh embodiment of the signal conditioning circuit 294.11, the corresponding voltage from the linear driver 342 is within the range of 0.8 to 64 volts peak-to-peak in 0.8 volt steps, responsive to a corresponding range of gain $\alpha$ of 1 to 80 volts/volt. The common mode voltage signal $V_{cm}$ is generated by an associated circuit 317, for example, as illustrated in FIG. 45, which in one embodiment is adjustable responsive to the processor 108, 204, for example, so as to provide for a common mode voltage signal $V_{cm}$ that is adjustable between 2.4 and 21 volts in 0.6 volt steps, so as to prevent saturation of the linear driver 342.

As with the embodiments illustrated in FIGS. 39-45, the voltage $V_L$ across the coil 14, L' is controlled by using the first 302 and second 304 operational amplifiers to provide for feedback control of the signals applied to the first 260 and fourth 272 nodes at the sense resistors $R_{S1}$, $R_{S2}$ in series with the coil 14, L' responsive to feedback signals from the second 264 and third 268 nodes across the coil 14, L'.

Furthermore, a bias control circuit 344 provides for substantially nulling any DC current bias in the current $i_L$ through the coil 14, L'. For example, in accordance with a first aspect of a bias control circuit 344.1, for example, as illustrated in FIGS. 41, 42, 44 and 45 hereinabove, and in FIGS. 59, 61 and 63 hereinbelow, this is provided by the circuitry associated with the fifth operational amplifier 310 thereof, which provides for using feedback 345.1 responsive to voltages $V_2$, $V_3$ at the second 264 and third 268 nodes of the series circuit 242, i.e., across the coil 14, L' therewithin, to generate either a) a first aspect of a control signal 347.1 that is applied to the non-inverting input of the second operational amplifier 304, which controls the voltage $V_4$ at the fourth node 272 of the series circuit 242 so as to substantially null the DC current bias in the current $i_L$ through the coil 14, L'; or b) a second aspect of control signals 347.2 that are applied to the oscillator signal conditioner 340 to the inverting inputs of the first 302 and second 304 operational amplifier 304, in opposite senses respectively, which controls the voltages $V_1$, $V_4$ at the first 260 and fourth 272 nodes of the series circuit 242 respectively, so as to substantially null the DC current bias in the current $i_L$ through the coil 14, L'. The first aspect of the bias control circuit 344.1 utilizes feedback 345.1 responsive to a voltage signal across the coil 14 L' within the series circuit 242, and accordingly is also referred to herein as "inner voltage feedback", which provides for nulling the current $i_L$ through the coil 14, L' by nulling the voltage thereacross.

In accordance with a second aspect of a bias control circuit 344.2, for example, as illustrated in FIG. 43 hereinabove, and in FIGS. 62 and 63 hereinbelow, feedback 345.2 responsive to voltages $V_1$, $V_4$ at the first 260 and fourth 272 nodes of the series circuit 242, i.e. across the series circuit 242, is used to generate either a) the first aspect of the control signal 347.1 that is applied to the non-inverting input of the second operational amplifier 304, which controls the voltage $V_4$ at the fourth node 272 of the series circuit 242 so as to substantially null the DC current bias in the current $i_L$ through the coil 14, L'; or b) the second aspect of control signals 347.2 that are applied to the oscillator signal conditioner 340 to the inverting inputs of the first 302 and second 304 operational amplifier 304, in opposite senses respectively so as to substantially null the DC current bias in the current $i_L$ through the coil 14, L'. The second aspect of the bias control circuit 344.2 utilizes feedback 345.2 responsive to a voltage signal across the series circuit 242, and accordingly is also referred to herein as "outer voltage feedback", which provides for nulling the current $i_L$ through the coil 14, L' by nulling the voltage across the series circuit 242.

Yet further, as with the embodiments illustrated in FIGS. 35 and 45, the eleventh embodiment of the signal conditioning circuit 294.11 incorporates a sum-and-difference amplifier circuit 346 comprising an operational amplifier 278 and associated circuitry, which provides for generating an output voltage $V_{out}$ responsive to the sum of the voltage drops across the sense resistor $R_{S1}$, $R_{S2}$, which provides a measure of the current $i_L$ through the coil 14, L', i.e. a current measure 348. For example, in one embodiment, the sum-and-difference amplifier circuit 346 is nominally unity gain. The sense resistor $R_{S1}$, $R_{S2}$ are adapted so as to provide for an output voltage $V_{out}$ of about 0.8 volts peak-to-peak under nominal operating conditions.

In accordance with a third aspect of a bias control circuit 344.3, for example, as illustrated in FIGS. 54-56, 59 and 61 hereinbelow, feedback 345.3 responsive to the voltage $V_{out}$ at the output 284 of summing and difference amplifier 276, i.e. associated with the current measure 348, is used to generate either a) the first aspect of the control signal 347.1 that is applied to the non-inverting input of the second operational amplifier 304, which controls the voltage $V_4$ at the fourth node 272 of the series circuit 242 so as to substantially null the DC current bias in the current $i_L$ through the coil 14, L'; or b) the second aspect of control signals 347.2 that are applied to the oscillator signal conditioner 340 to the inverting inputs of the first 302 and second 304 operational amplifier 304, in opposite senses respectively so as to substantially null the DC current bias in the current $i_L$ through the coil 14, L'. The third aspect of the bias control circuit 344.3 utilizes feedback 345.3 responsive to the voltage $V_{out}$ associated with the current measure 348 that provides a measure of the current $i_L$ through the coil 14, L', and accordingly is also referred to herein as "current feedback", which provides for nulling the current $i_L$ through the coil 14, L' by nulling the voltage $V_{out}$ associated with the current measure 348.

The voltage $V_{out}$ providing a measure of the current $i_L$ through the coil 14, L' is filtered with a band-pass filter 350 and then converted to digital form with an associated first analog-to-digital converter 288'. For example, in one embodiment, the band-pass filter 350 is a second order two-input fully differential switched capacitor bandpass filter having a Butterworth approximation, and a programmable center frequency that, responsive to the processor 108, 204, is automatically set to the same frequency as that of the sine shaper 328 and associated clock 330. In this embodiment, the bandpass filter 350 has a fixed 6 kiloHertz passband and is used to limit the susceptibility to out-of-band energy radiated from other sources.

A ninth operational amplifier 352 configured as a differential amplifier provides for measuring the actual voltage across the voltage $V_L$ across the coil 14, L', notwithstanding that this is otherwise controlled by the circuitry associated with the linear driver 342 and bias control circuit 344 as described hereinabove. More particularly, the second node 264 coupled to a first terminal of the coil 14, L', at a voltage $V_2$, is coupled through a first input resistor $R_{23}$ to the non-inverting input of the ninth operational amplifier 352, which is also connected to the DC common mode voltage signal $V_{cm}$ ground through a resistor $R_{24}$. Furthermore, the third node 268 coupled to the second terminal of the coil 14, L', at a voltage $V_3$, is coupled through a second input resistor $R_{33}$ to the inverting input of the ninth operational amplifier 352, which is also connected to the output thereof through a feedback resistor $R_{34}$. Accordingly, the output of the ninth operational amplifier 352, designated as voltage $V_{OUT}$, is given as follows:

$$V_{Drive}=\gamma\cdot(V_2-V_3), \tag{25}$$

wherein the gain γ is given by:

$$\gamma=\frac{R_{24}}{R_{23}}=\frac{R_{34}}{R_{33}} \tag{26}$$

In various embodiments, for example, the gain γ may be programmable responsive to the processor 108, 204. For example, in one embodiment, the gain γ is programmable over a range of 1 to 80 volts/volt, so that the resulting voltage $V_{Drive}$ from the ninth operational amplifier 352 is within the range of 0-1 volt peak-to-peak for input to an associated second analog-to-digital converter 354.

Figure 47:
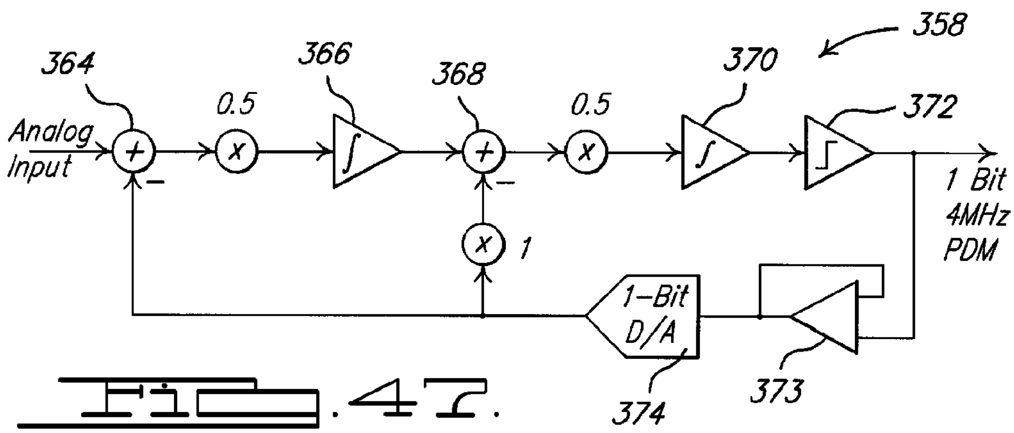
FIG. 47 illustrates a block diagram of a sigma-delta converter incorporated in the eleventh embodiment of a signal conditioning circuit illustrated in FIG. 46.
Figure 49:
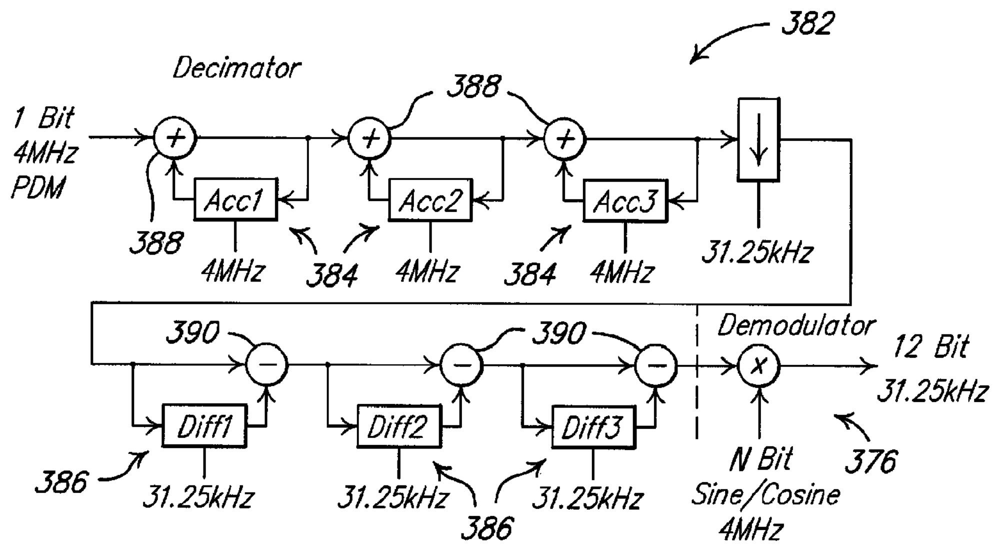
FIG. 49 illustrates a block diagram of a decimator comprising a low-pass sync filter a decimation filter associated with the sigma-delta converter, and a mixer, incorporated in the eleventh embodiment of a signal conditioning circuit illustrated in FIG. 46.

Referring to FIGS. 46-47, as an example of one embodiment, the first 288' and second 354 analog-to-digital converters are each embodied with corresponding first 356.1 and second 356.2 sigma-delta analog-to-digital converters, each comprising the combination of a sigma-delta converter 358, followed by a low-pass sync filter 360, followed by a decimation filter 362. Referring to FIGS. 47 and 49, the sigma-delta converter 358 is a separately clocked circuit that provides for converting a given signal level into a corresponding single-bit Pulse Density Modulated (PDM) signal. For a time-varying input signal, the clocking rate of the sigma-delta converter 358 is substantially higher than the corresponding sampling rate of the associated time-varying input signal, so that the time-varying input signal is effectively over-sampled. For example, in one embodiment, for a time-varying input signal with a sampling rate between 10 and 50 kiloHertz, the clock rate of the sigma-delta converter 358 is set at 4 megaHertz. In accordance with the embodiment of a sigma-delta converter 358 illustrated in FIG. 47, the current value of the output $Vout_n$ of the sigma-delta converter 358 is subtracted at a first summing junction 364 from the current value of the input signal $Vin_n$, and the result is scaled by a gain of ½ and integrated by a first integrator 366. The current value of the output $Vout_n$ of the sigma-delta converter 358 is then subtracted at a second summing junction 368 from the most recent updated value of the output $VINT1_{n+1}$ of the first integrator 366, and the result is scaled by a gain of ½ and integrated by a second integrator 370. The most recent updated value of the output $VINT2_{n+1}$ of the second integrator 370 is then input to a comparator 372, the output, which is the output $Vout_{n+1}$ of the sigma-delta converter 358, has a value of zero if the most recent updated value of the output $VINT2_{n+1}$ of the second integrator 370 is less than one, and otherwise has a value of one, and which is buffered by a buffer amplifier 373 and then converted to analog form with a one-bit digital-to-analog converter 374 and then fed back therefrom to the first 364 and second 368 summing junctions, wherein the comparator 372, buffer amplifier 373 and one-bit digital-to-analog converter 374 can be combined together in practice. The above-described operation of the sigma-delta converter 358 is modeled by the following equations, which provide for converting a signal having a magnitude between zero and one volt:

$$VINT1_{n+1} = VINT1_n + \frac{1}{2} \cdot (Vin_n - Vout_n) \tag{27}$$

$$VINT2_{n+1} = VINT2_n + \frac{1}{2} \cdot (VINT1_{n+1} - Vout_n) \tag{28}$$

$$Vout_{n+1} = \begin{Bmatrix} 0 & \text{if } (VINT2_{n+1} < 1) \\ 1 & \text{if } (VINT2_{n+1} \geq 1) \end{Bmatrix} \tag{29}$$

Referring to FIGS. 48*a-d*, the output $Vout_n$ of a sigma-delta converter 358 in accordance with Equations (27)-(29) is plotted as a function of internal clock cycle n for four different corresponding DC input voltages of 0.10, 0.25, 0.50 and 0.75 volts, respectively. It should be understood that output $Vout_n$ of a sigma-delta converter 358 is binary, with a value of zero or one, and that the ramped portions of the plots of FIGS. 48*a-d* are artifacts of the plotting process. The average value of each of the one-bit (i.e. binary valued) time series illustrated in FIGS. 48*a-d* is equal to the value of the corresponding DC input voltage, wherein the pulse density modulation level of each time series is equal to the value of the corresponding DC input voltage.

In one embodiment, the sigma-delta converter 358 is implemented with a fully differential second-order switched-capacitor architecture, using a sampling rate of 4 megahertz, with a usable differential input range of 0-1 volt peak-to-peak. In one embodiment, the sigma-delta converter 358 is principally used at about one half of full scale in order to avoid distortion from the one-bit digital-to-analog converter 374 which can occur for input signals having a magnitude greater than about eighty percent of full scale. Above full scale, the one-bit digital-to-analog converter 374 would overload, causing a loss of signal integrity. Using only half of full scale to avoid distortion, the sigma-delta converter 358 would have an effective gain of 0.5, although this can be compensated for in the associated decimation filter 362 which, for example, in one embodiment, is adapted to utilize a twelve-bit span for a one volt peak-to-peak input signal.

Referring to FIGS. 46 and 49, the output of a first sigma-delta converter 358.1 associated with the first sigma-delta analog-to-digital converter 356.1 is filtered with a first low-pass sync filter 360.1 and then decimated with a first decimation filter 362.1, so as to generate the digital representation—in one embodiment, for example, a twelve-bit representation—of the voltage $V_{out}$. For example, in one embodiment the first low-pass sync filter 360.1 and the first decimation filter 362.1 are embodied in a first decimator 382.1 structured in accordance with the decimator 382 illustrated in FIG. 49, which comprises a plurality of accumulators 384 followed by a plurality of differentiators 386 ganged together in series with a corresponding plurality of summing 388 and difference 390 junctions.

The number of bits needed in the accumulators 384 to avoid overflow errors is defined by:

$$w=K \cdot \log_2(N)+b \tag{30}$$

wherein K is the decimator order (e.g. 3), N is the decimation ratio (e.g. 128), and b is the number of bits entering the decimator (e.g. 1 or 8). For example, for K=3, N=128 and b=1, the accumulators 384 are 22 bits wide, whereas for b=8, the accumulators 384 would be 29 bits wide. Each of the accumulators 384 is defined by the following equation:

$$Vacc_{n+1}=Vacc_n+Vin_n \tag{31}$$

For example, for an input clock rate of 4 megahertz, the output of the last accumulator 384 illustrated in FIG. 49 would be sampled at 31.25 kilohertz. The output of the last accumulator 384 is then fed into the differentiators 386, which have the same number of bits as defined by Equation (30). Each of the differentiators 386 are defined by the following equation:

$$Vdiff_{n+1}=Vin_{n+1}-Vin_n \tag{32}$$

For example, in one embodiment, the output of the last differentiators 386 of the first 382.1 and second 382.2 decimators is truncated to twelve bits. The mixing process associated with the first and second mixers inherently has a gain of ½ (as a result of an associated ½ cosine factor), and this is compensated in the decimator 382 so that the twelve-bit span of the digital output thereof corresponds to a one volt peak-to-peak signal at the input to the sigma-delta converter 358. The associated generic equation of the decimator 382 is given by:

$$f=[(1-z_{-N})/(1-z_{-1})]^K \tag{33}$$

Figure 50:
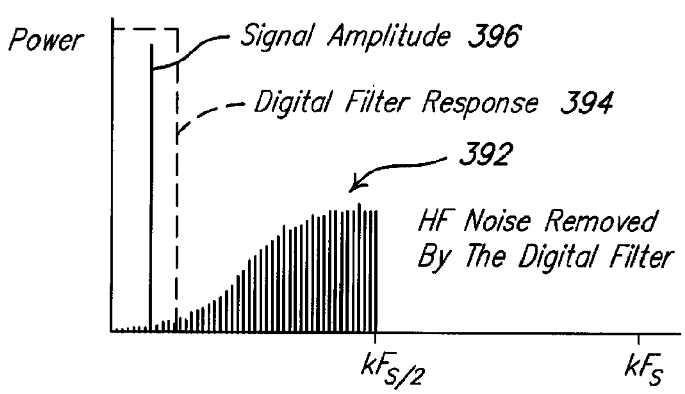
FIG. 50 illustrates the operation of a sigma-delta analog-to-digital converter in accordance with in the eleventh embodiment of a signal conditioning circuit illustrated in FIG. 46.
Figure 48A:
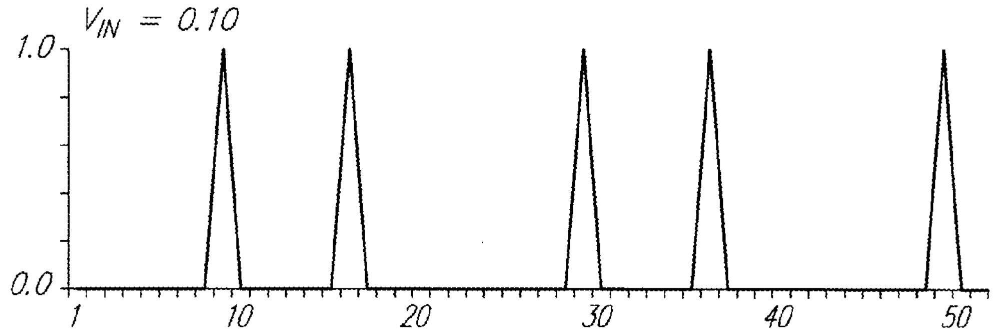
FIGS. 48*a-d* illustrate various outputs of the sigma-delta converter illustrated in FIG. 47 for various corresponding DC input voltages.
Figure 48B:
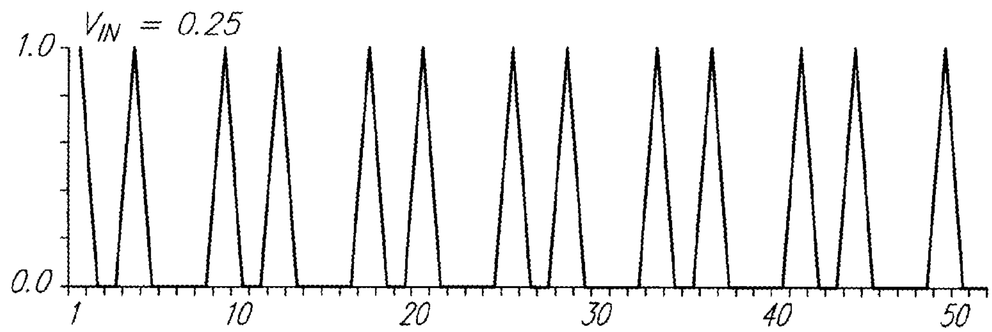
Figure 48C:
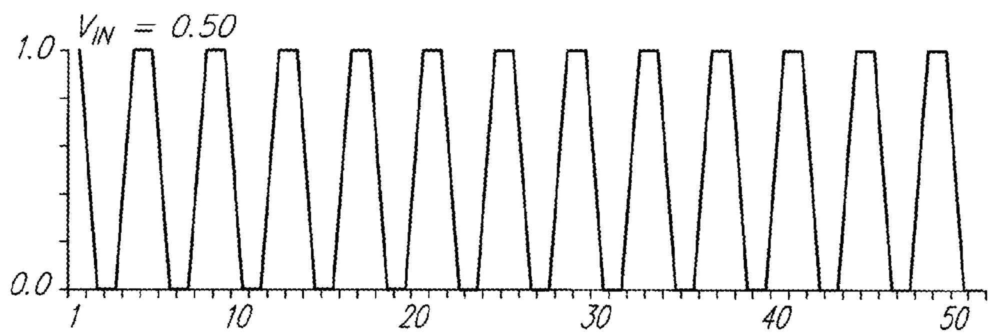
Figure 48D:
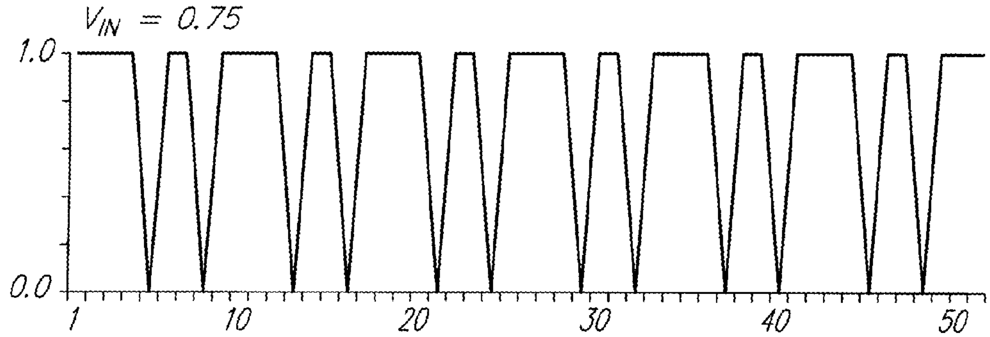

Referring to FIG. 50, the operation of a sigma-delta analog-to-digital converter 356 is illustrated by a power spectrum in the frequency domain, as described in the article "Demystifying Sigma-Delta ADCs", downloadable from the Internet at http://www.maxim-ic.com/appnotes.cfm/appnote_number/1870, and which is incorporated herein by reference in its entirety. The oversampling process of the sigma-delta converter 358 increases the signal-to-noise ratio (SNR), and the first 366 and second integrators 370 act as a highpass filter to the noise 392, and act to reshape the noise 392 as illustrated in FIG. 50. The low pass sync filter 360 in the time domain acts as a notch filter 394 in the frequency domain, which provides for removing a substantial portion of the noise 392 while preserving the signal 396.

Referring again to FIG. 46, the output from the first decimation filter 362.1 is operatively coupled to first 376.1 and second 376.2 demodulators which demodulate the signal therefrom into in-phase (I) and quadrature (Q) phase components of the voltage $V_{out}$ representative of the current $i_L$ through the coil 14, L'. The first demodulator 376.1 uses the digital time series 332 from the sine shaper 328 to demodulate the in-phase (I) component of the voltage $V_{out}$ down to a corresponding DC level, albeit the pulse density modulated (PDM) equivalent thereof, wherein, for example, in one embodiment, the digital time series 332 from the sine shaper 328 is fed into an associated first mixer 376.1' of the first demodulator 376.1 as an N-bit stream at the same over-sampled clock rate (e.g. 4 megahertz) as the signal from the first sigma-delta converter 358.1, so as to provide a measure representative of the in-phase (I) component of the current $i_L$ through the coil 14, L'. The second demodulator 376.2 uses a digital time series 378 from a cosine shaper 380 to demodulate the quadrature-phase (Q) component of the voltage $V_{out}$ down to a corresponding DC level, albeit the pulse density modulated (PDM) equivalent thereof, wherein, for example, in one embodiment, the digital time series 378 from the cosine shaper 380 is fed into an associated second mixer 376.2' of the second demodulator 376.2 as an N-bit stream at the same over-sampled clock rate (e.g. 4 megahertz) as the signal from the first sigma-delta converter 358.1 of the quadrature-phase (Q) component of the voltage $V_{out}$, so as to provide a measure representative of the quadrature-phase (Q) component of the current $i_L$ through the coil 14, L'. The cosine shaper 380 is driven in synchronism with the sine shaper 328 by a common signal from the clock 330, responsive to the processor 108, 204. For example, in one embodiment, the N-bit streams from the sine 328 and cosine 380 shapers are eight-bit streams.

The outputs of the first 376.1 and second 376.2 demodulators are respectively filtered by respective first 398.1 and second 398.2 low-pass filters, and are then respectively filtered by respective first 400.1 and second 400.2 band-pass filters. For example, in one embodiment, the first 398.1 and second 398.2 low-pass filters are second order digital filters with a programmable type (e.g. Butterworth or Chebyshev) and programmable filter coefficients k and gain factors G, the same type and values for each filter 398.1, 398.2; and the first 400.1 and second 400.2 band-pass filters are fourth order digital filters with a programmable type (e.g. Butterworth or Chebyshev) and programmable coefficients, the same type and values for each filter 400.1, 400.2. The gain factors G in each filter are adapted to provide for unity gain through each of the filters 398.1, 398.2, 400.1, 400.2. For example, the filter coefficients k and gain factors G are stored in a twelve-bit register in fixed point two's complement number format.

For example, the first 398.1 and second 398.2 low-pass filters are given generally by the following transfer function:

$$H(z) = G\left[\frac{1+2z^{-1}+z^{-2}}{1-k_1z^{-1}+k_2z^{-2}}\right], \text{ and} \tag{34}$$

the first 400.1 and second 400.2 band-pass filters are given generally by the following transfer function:

$$H(z) = G_1G_2\left[\frac{(1-z^{-2})^2}{(1+k_1z^{-1}+k_2z^{-2})(1+k_3z^{-1}+k_4z^{-2})}\right] \tag{35}$$

In one embodiment, the outputs of the first 400.1 and second 400.2 band-pass filters are averaged using a four point averaging process, for example, using a running average implemented with a moving window, so as to provide resulting in-phase (I) and quadrature (Q) phase components of the voltage $V_{out}$ representative of the current $i_L$ through the coil 14, L' at an update rate of about 7.8 kilohertz. In the present embodiment, the low-pass filters 398.1, 398.2 would not be used below 300 Hertz because of stability problems due to quantization errors in the associated gain factors G and filter coefficients k. The resulting in-phase I and quadrature-phase Q data can be used to calculate, with twelve-bit accuracy, the magnitude of the and phase of the current $i_L$ through the coil 14, L', as follows:

$$\text{Magnitude} = \sqrt{I^2+Q^2} \tag{36}$$

$$\text{Phase} = \arctan\left(\frac{Q}{I}\right) \tag{37}$$

wherein the phase is quadrant-corrected so that the resulting phase value is between −180° and +180°, with 0° on the positive I axis, 90° on the positive Q axis.

The output of a second sigma-delta converter 358.2 associated with the second sigma-delta analog-to-digital converter 356.2 is filtered with a second low-pass sync filter 360.2 and then decimated with a second decimation filter 362.2, so as to generate the digital representation—in one embodiment, for example, a twelve-bit representation—of the voltage $V_{Drive}$, representative of the voltage $V_L$ across the coil 14, L'. For example, in one embodiment the second low-pass sync filter 360.2 and the second decimation filter 362.2 are embodied in a second decimator 382.2, similar to the first decimator 382.1 described hereinabove, except that the output thereof is a ten-bit digital word. The output of the second decimator 382.2 is operatively coupled to a second demodulator 376.2 which demodulates an over-sampled signal (e.g. at 4 megahertz) from the second sigma-delta converter 358.2 into an in-phase component (I) of the voltage $V_{Drive}$ across the coil 14, L'. The second demodulator 376.2 uses the digital time series 332 from the sine shaper 328 to demodulate the in-phase (I) component of the voltage $V_{Drive}$ down to a corresponding DC level, albeit the pulse density modulated (PDM) equivalent thereof, wherein, for example, in one embodiment, the digital time series 332 from the sine shaper 328 is fed into an associated third mixer 376.3' of the third demodulator 376.3 as an N-bit stream at the same over-sampled clock rate (e.g. 4 megahertz) as the signal from the second sigma-delta converter 358.2. The demodulated output from the third mixer 376.3' is then filtered by a third low-pass filter 398.3, which is similar to the first 398.1 and second 398.2 low-pass filters described hereinabove.

The various signal conditioning circuits 294 in accordance with a first aspect illustrated in FIGS. 35-50 provide for determining the complex impedance of the coil 14, L' by generating a measure responsive to the complex current $i_L$ (i.e. in-phase (I) and quadrature-phase (Q) components thereof) therethrough responsive to a known or measured time-varying voltage $V_L$ thereacross, particularly for an oscillatory, e.g. sinusoidal, voltage $V_L$ thereacross.

Figure 51:
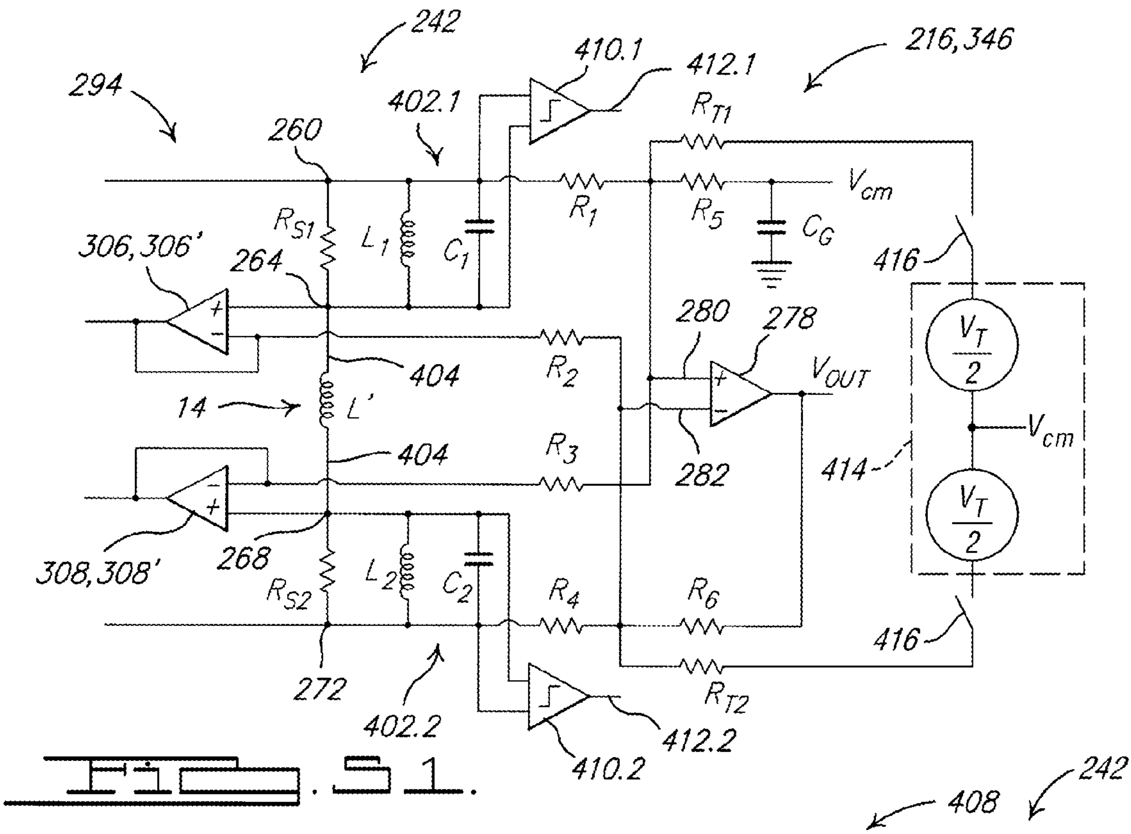
FIG. 51 illustrates embodiments of various features that can be incorporated in a signal conditioning circuit.

Referring to FIG. 51, there is illustrated a combination of various embodiments that provide for various associated additional features that can be incorporated,—either singly, in combination, or in various subcombinations,—in any of the signal conditioning circuits 294 described hereinabove.

In accordance with a first feature, first 402.1 and second 402.2 LC filters are respectively placed in parallel with the first $R_{S1}$ and second $R_{S2}$ sense resistors, respectively, wherein the first LC filter 402.1 comprises a first inductor $L_1$ in parallel with a first capacitor $C_1$, and the second LC filter 402.2 comprises a second inductor $L_2$ in parallel with a second capacitor $C_2$, wherein, for example, the resonant frequencies of the first 402.1 and second 402.2 LC filters would be substantially equal to the operating frequency of the associated oscillator 98. Accordingly, at the normal operating frequency of the signal conditioning circuit 294, the impedances of the first 402.1 and second 402.2 LC filters would be relatively high so as to not substantially perturb the operation of the associated signal conditioning circuit 294, whereas at frequencies substantially different from the normal operating frequency of the signal conditioning circuit 294, the impedances of the first 402.1 and second 402.2 LC filters would be relatively low so as to substantially attenuate any associated voltages across the first $R_{S1}$ and second $R_{S2}$ sense resistors, thereby substantially attenuating a resulting associated voltage $V_{out}$ from the summing and difference amplifier 276 representative of the current $i_L$ through the coil 14, L'. Accordingly, the first 402.1 and second 402.2 LC filters provide for substantially attenuating the affects of electromagnetic interference (EMI) on the output of the signal conditioning circuit 294 at frequencies that are substantially different from the normal operating frequency thereof.

Figure 52:
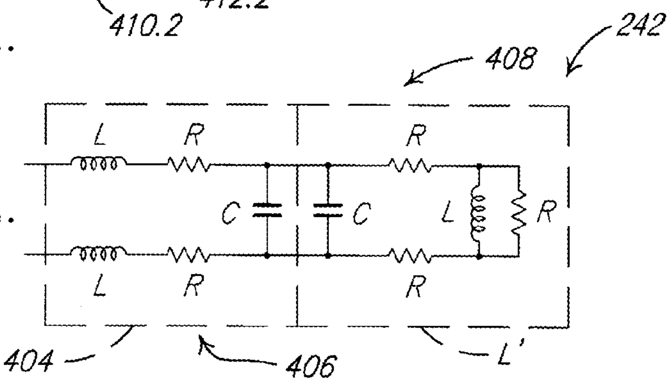
FIG. 52 illustrates an equivalent circuit model of a cable connected to a coil.

Referring to FIG. 52, the coil 14, L' is typically connected to the signal conditioning circuit 294 with a cable 404, an equivalent circuit model 406 of which is illustrated in combination with an equivalent circuit model 408 of the coil 14, L', wherein the first 402.1 and second 402.2 LC filters can be adapted in cooperation with the cable 404 and coil 14, L' so as to provide for substantially maximizing the associated signal-to-noise ratio of the signal conditioning circuit 294 when operated in the presence of EMI.

Alternatively, the signal conditioning circuit 294 can be operated at a plurality of different frequencies, i.e. by operating the associated oscillator 30, 58, 98 at a plurality of different frequencies, for example, which are either sequentially generated, fore example, stepped or chirped, or simultaneously generated and mixed, wherein for at least three different frequency components, the associated processor 108, 204 can be adapted to provide for generating a corresponding associated spectrally dependent detected values, wherein an associated voting system can then be used to reject spectral component values that are substantially different from a majority of other spectral component values, for example, as a result of an electromagnetic interference (EMI) at the corresponding operating spectral frequency component(s) of the oscillator 30, 58, 98 of the spectral component that becomes rejected.

Referring again to FIG. 51, in accordance with a second feature, at least one of first 410.1 and second 410.2 comparators with hysteresis respectively provided to monitor the voltages across the first $R_{S1}$ and second $R_{S2}$ sense resistors respectively, provides for determining whether or not the current path containing the coil 14, L' is open, wherein the first 410.1 and second 410.2 comparators with hysteresis respectively provide respective first 412.1 and second 412.2 signals that respectively indicate if the voltage across the respective first $R_{S1}$ and second $R_{S2}$ sense resistor is less than a threshold.

In accordance with a third feature, the sum-and-difference amplifier circuit 346 is adapted to provide for injecting a self-test signal $V_T$ from a balanced signal source 414 therein so as to test the operation thereof, wherein the balanced signal source 414, controlled by associated switch elements 416, e.g. electronic switches, e.g. controlled by software, is injected through respective first $R_{T1}$ and second $R_{T2}$ resistors to the to non-inverting 280 and inverting 282 inputs, respectively, of the associated operational amplifier 278 of the sum-and-difference amplifier circuit 346, wherein, responsive to the injection of the predetermined self-test signal $V_T$ through the associated switch element 416, if the resulting change in the voltage $V_{out}$ from the sum-and-difference amplifier circuit 346 differs from a predetermined amount by more than a threshold, then an error signal would be generated indicative of a malfunction of the associated sum-and-difference amplifier circuit 346.

Figure 53:
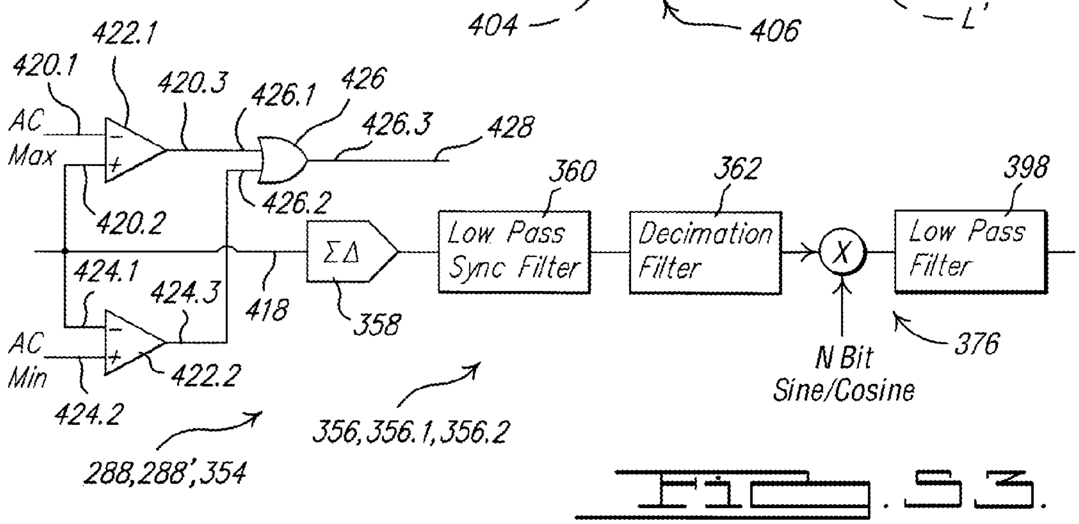
FIG. 53 illustrates various embodiments of various features that can be associated with an analog-to-digital converter.
Figure 24:
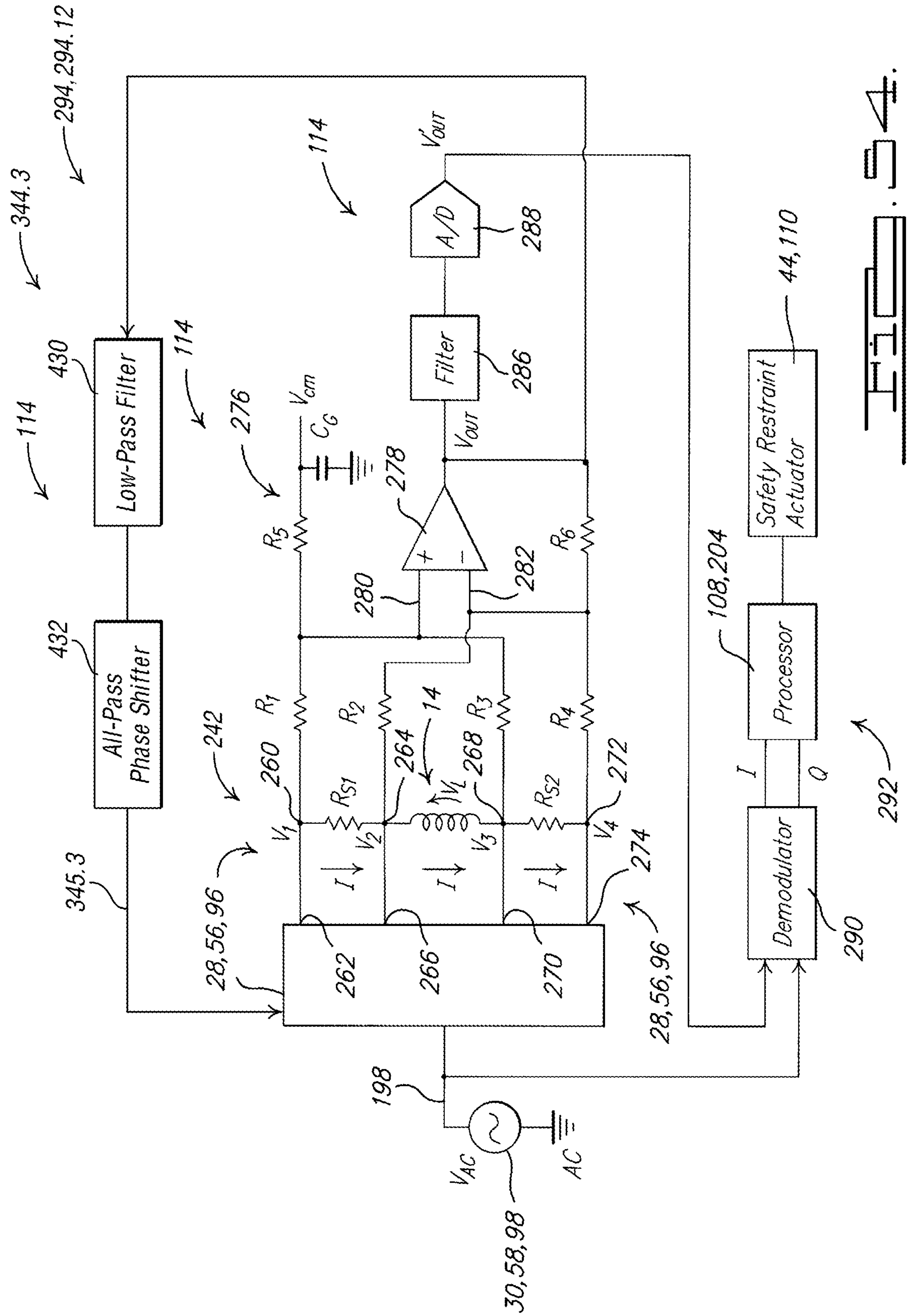
Figure 25:
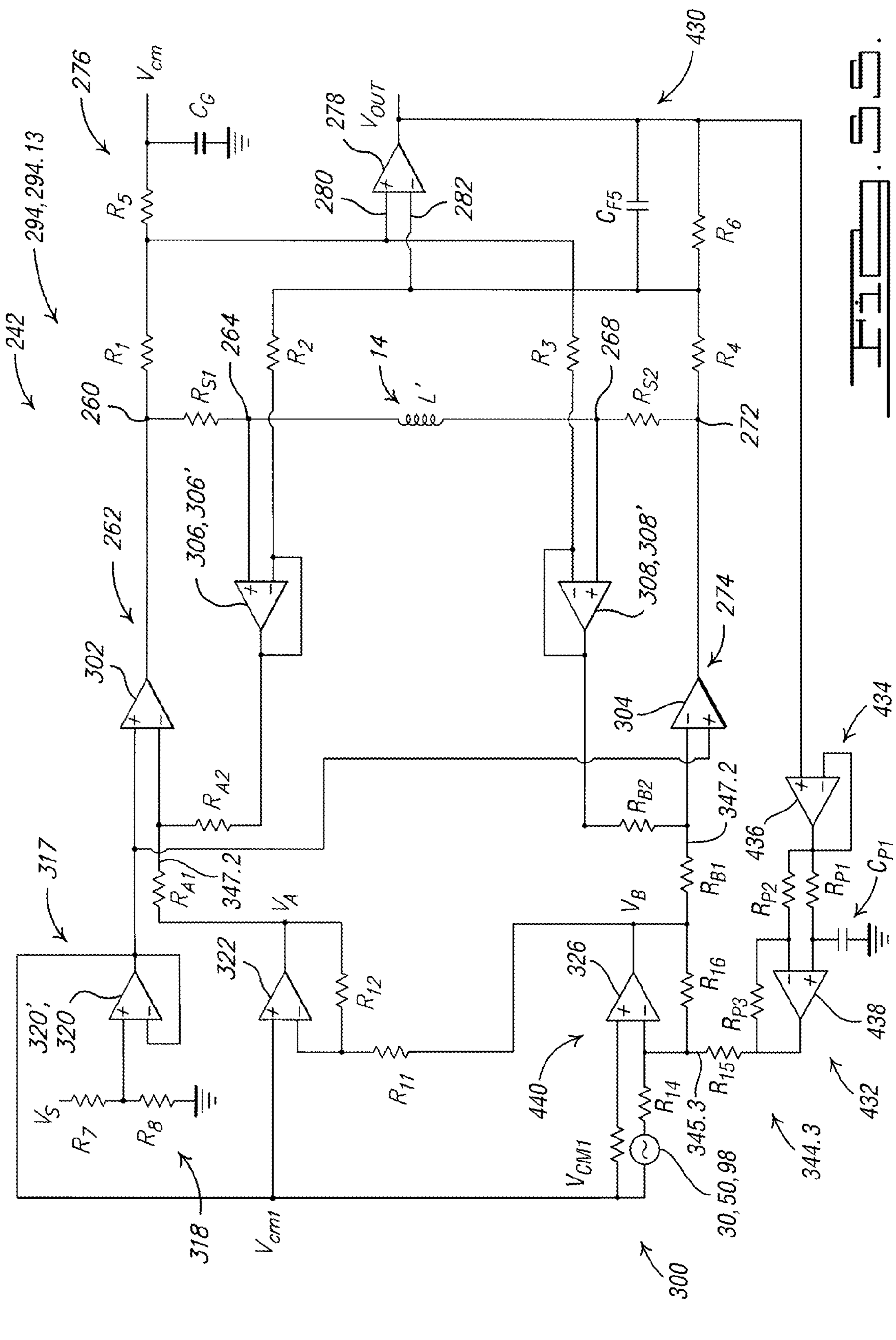
Figure 5A:
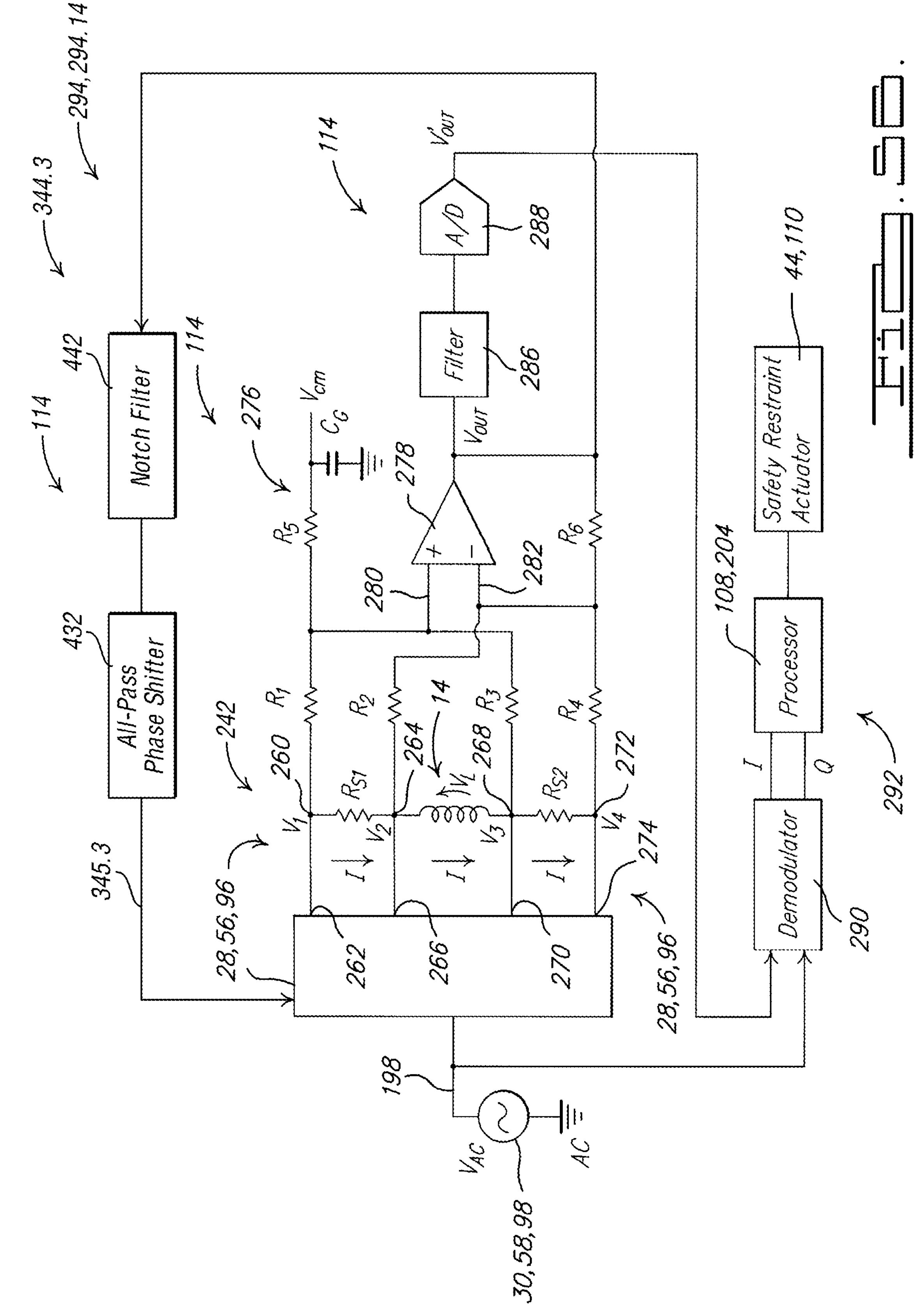

Referring to FIG. 53, in accordance with yet another embodiment, the inputs of each analog-to-digital converter 288 are provided with circuitry that provides for detecting whether the associated analog input signal is within acceptable limits. For example, the input 418 of a representative analog-to-digital converter 288, for example, a sigma-delta analog-to-digital converter 356, is connected to the non-inverting input 420.2 of a first comparator 422.1 and to the inverting input 424.1 of a second comparator 422.2. The inverting input 420.1 of the first comparator 422.1 is connected to a signal representative of a maximum threshold $AC_{MAX}$, and the non-inverting input 424.2 of the second comparator 422.2 is connected to a signal representative of a minimum threshold $AC_{MIN}$. The output 420.3 of the first comparator 422.1 is connected to a first input 426.1 of a two-input OR-gate 426, and the output 424.3 of the second comparator 422.2 is connected to a second input 426.2 of the OR-gate 426. The output 426.3 of the OR-gate 426 provides a signal 428 indicative of whether the input to the associated analog-to-digital converter 288 is either greater than the maximum threshold $AC_{MAX}$ or less than the minimum threshold $AC_{MIN}$, either of which would result if an associated peak-to-peak value was greater than an associated threshold. More particularly, if the level of the input 418 of the analog-to-digital converter 288 is greater than or equal to the maximum threshold $AC_{MAX}$, then the output 420.3 of the first comparator 422.1 will be TRUE, causing the output 426.3 of the OR-gate 426 to be TRUE. If the level of the input 418 of the analog-to-digital converter 288 is less than or equal to the minimum threshold $AC_{MIN}$, then the output 424.3 of the second comparator 422.2 will be TRUE, causing the output 426.3 of the OR-gate 426 to be TRUE. Otherwise the output 426.3 of the OR-gate 426 will be FALSE. The maximum threshold $AC_{MAX}$ is set so that a level of the input 418 less than this level can be properly converted to digital form by the analog-to-digital converter 288. For example, for a sigma-delta analog-to-digital converter 356 illustrated in FIGS. 47-50, the maximum threshold $AC_{MAX}$ would be set to a value less than or equal to one volt so as to provide for a digital output that is representative of the analog input. The minimum threshold $AC_{MIN}$, if used, provides for detecting signals at the input 418 of the analog-to-digital converter 288 having a value less than the maximum threshold $AC_{MAX}$ minus the maximum acceptable peak-to-peak level of the AC signal at the input 418 of the analog-to-digital converter 288. Accordingly, if the signal 428 at the output 426.3 of the OR-gate 426 is TRUE, then this would indicate that the resulting signal from the analog-to-digital converter 288 could be corrupted, for example, so as to alert the processor 108, 204 to ignore this signal.

Referring to FIG. 54, a twelfth embodiment of a signal conditioning circuit 294.12 that provides for generating one or more measures responsive to a self-impedance $Z_L$ of a coil 14, L', is substantially based upon the embodiment of the signal conditioning circuit 294 illustrated in FIG. 35, wherein like reference signs correspond to similar elements which function as described hereinabove, and FIG. 54 includes supplemental aspects as described hereinbelow. In some circumstances, external out-of-band electromagnetic interference can cause relatively large magnitude AC signal levels, relative to the in-band signal level, which otherwise are absorbed by the associated signal conditioning circuit 294. The twelfth embodiment of the signal conditioning circuit 294.12 is adapted with the third aspect of the bias control circuit 344.3 that utilizes feedback 345.3 so as to provide for controlling the respective voltages applied to the first 260 and fourth 272 nodes of the series circuit 242 so that they both relatively float with the out-of-band electromagnetic interference, thereby reducing the associated energy absorption requirements of the associated signal conditioning circuit 294. More particularly, this is accomplished by feeding the output, i.e. voltage $V_{out}$, from the summing and difference amplifier 276 through a low-pass filter 430 and an all-pass phase shifter 432, and then using the resulting signal to control the coil driver 28, 56, 96. The cutoff frequency of the low-pass filter 430 is set substantially lower than the operating frequency of the oscillator 300, and sufficiently greater than zero, so as to provide for substantially cancelling the affect of the DC bias voltage sources $\delta_1$ and $\delta_2$ on the voltage $V_L$ across the coil 14, L', without substantially affecting, i.e. attenuating, the AC component thereof from the oscillator 300. The all-pass phase shifter 432 is adapted to exhibit a relatively flat gain response, and is adapted to provide sufficient phase margin so as to prevent the signal conditioning circuit 294.12 from oscillating as a result of the associated feedback connection.

Referring to FIG. 55, a thirteenth embodiment of a signal conditioning circuit 294.13 that provides for generating one or more measures responsive to a self-impedance $Z_L$ of a coil 14, L', is substantially based upon the tenth and twelfth embodiments of the signal conditioning circuits 294.10, 294.12 illustrated in FIGS. 45 and 54, wherein, except as noted otherwise, like reference signs correspond to similar elements which function as described hereinabove, and FIG. 55 includes supplemental aspects as described hereinbelow. In the thirteenth embodiment of a signal conditioning circuit 294.13, the summing and difference amplifier 276 is adapted to also function as the low-pass filter 430 by incorporating a feedback capacitor $C_{F5}$ between the output of the associated operational amplifier 278 and the inverting input thereof. The output of the operational amplifier 278 is operatively coupled to a buffer amplifier 434 comprising a tenth operational amplifier 436, the output of which is then operatively coupled to the all-phase filter 432. The all-phase filter 432 comprises an eleventh operational amplifier 438, the non-inverting input of which is coupled through a capacitor $C_{P1}$ to ground, and through a resistor $R_{P1}$ to the output of the buffer amplifier 434, the latter of which is also operatively coupled through a resistor $R_{P2}$ to the inverting input of the eleventh operational amplifier 438, which in turn is coupled through feedback resistor $R_{P3}$ to the output of the eleventh operational amplifier 438. Several connections associated with the seventh 322 and eighth 326 operational amplifiers, and the oscillator 30, 58, 98 of the tenth embodiment of a signal conditioning circuit 294.10 are modified so as to provide for the thirteenth embodiment of a signal conditioning circuit 294.13. More particularly, the non-inverting inputs of the seventh 322 and eighth 326 operational amplifiers are each coupled directly to the first DC common mode voltage signal $V_{cm1}$, rather than through the associated resistors $R_9$ and $R_{13}$. Furthermore, the output of the eighth operational amplifier 326 is coupled through the input resistor $R_{11}$ to the inverting input of the seventh operational amplifier 322, and the inverting input of the eighth operational amplifier 326 is operatively coupled through the second input resistor $R_{14}$ to the oscillator 30, 58, 98, and through the input resistor $R_{15}$ to the output of the eleventh operational amplifier 438, i.e. the output of the all-phase filter 432, wherein the oscillator 30, 58, 98 is biased by the first DC common mode voltage signal $V_{cm1}$ applied to the non-inverting input of the eighth operational amplifier 326. Accordingly, the eighth operational amplifier 326 is configured as a summing amplifier 440, which provides for summing the biased output of the oscillator 30, 58, 98 with the output from the summing and difference amplifier 276 fed back through the low-pass filter 430 and the all-phase filter 432. The output signal $V_B$ of the summing amplifier 440 is operatively coupled to the second operational amplifier 304 so as to provide for driving the fourth node 272 of the series circuit 242, and this output signal $V_B$ is inverted by the seventh operational amplifier 322 so as to generate the complementary output signal $V_A$ that is operatively coupled to the first operational amplifier 302 so as to provide for driving the first node 260 of the series circuit 242. Accordingly, the thirteenth embodiment of the signal conditioning circuit 294.13 incorporates the third aspect of a bias control circuit 344.3, using associated feedback 345.3 and incorporating a second aspect of control signals 347.2, that provides for adapting the output signals $V_A$ and $V_B$ responsive to the voltage $V_{out}$, which is responsive to the current $i_L$ through the series circuit 242, so as to substantially cancel DC and out-of-band signal components thereof for frequencies that are passed by the low-pass filter 430. Although the low-pass filter 430 is presently implemented in the summing and difference amplifier 276, it should be understood that this could also be implemented separately, for example, using the tenth operational amplifier 436 configured as a low-pass filter rather than as a buffer amplifier 434 as illustrated in FIG. 55.

Figure 57:
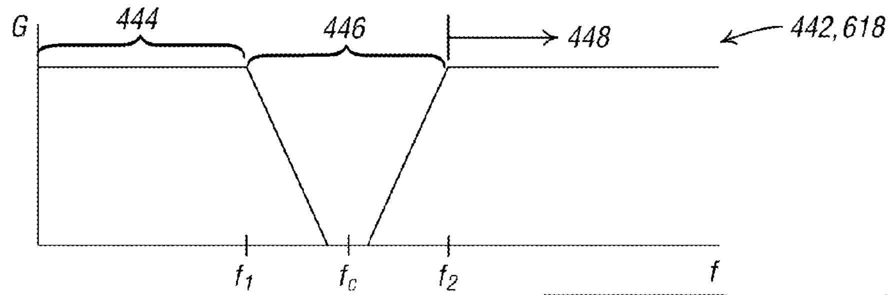
FIG. 57 illustrates a gain response of a notch filter.

Referring to FIG. 56, a fourteenth embodiment of a signal conditioning circuit 294.14 that provides for generating one or more measures responsive to a self-impedance $Z_L$ of a coil 14, L' incorporates the same structure as the twelfth embodiment of the signal conditioning circuit 294.12 illustrated in FIG. 54, except that the low-pass filter 430 of the twelfth embodiment is replaced with a notch filter 442 in the fourteenth embodiment. Referring to FIG. 57, the notch filter 442 exhibits a gain response G with a low frequency pass band 444 extending in frequency f up to a lower corner frequency $f_1$, a notch 446 centered about an associated center frequency $f_c$, and a high frequency pass band 448 extending in frequency f from an upper corner frequency $f_2$, wherein the center frequency $f_c$ is set substantially equal to the operating frequency of the oscillator 300. Accordingly, the fourteenth embodiment of the signal conditioning circuit 294.14 is adapted with a third aspect of a bias control circuit 344.3 that utilizes feedback 345.3 so as to provide for controlling the respective voltages applied to the first 260 and fourth 272 nodes of the series circuit 242 so that they both relatively float with the out-of-band electromagnetic interference in either the low 444 or high 448 frequency pass bands of the notch filter 442, thereby reducing the associated energy absorption requirements of the associated signal conditioning circuit 294, while nulling DC and low frequency current components having frequencies in the low frequency pass band 444 of the notch filter 442, and also nulling relatively high frequency current components having frequencies in the high frequency pass band 448 of the notch filter 442, while enabling the signal conditioning circuit 294.14 to control the voltage $V_L$ across the coil 14, L' and generate a voltage $V_{out}$ responsive to the current $i_L$ through the series circuit 242 at the operating frequency of the oscillator 300.

Figure 58A:
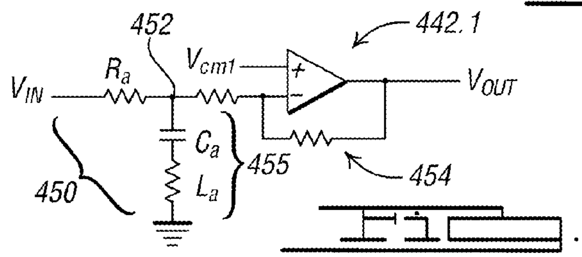
FIGS. 58*a-c* illustrate various embodiments of notch filters.
Figure 58B:
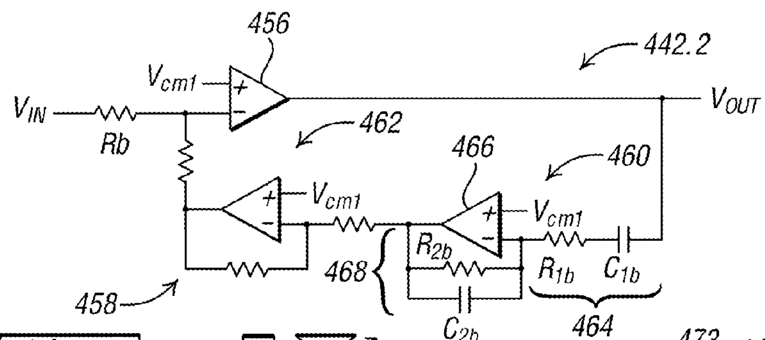
Figure 58C:
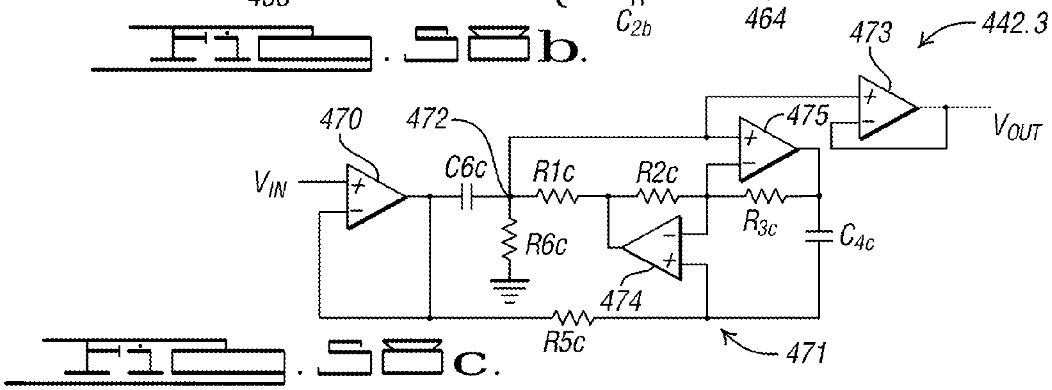

Examples of various notch filter 442 circuit embodiments are illustrated in FIGS. 58*a-c*. Referring to FIG. 58*a*, in accordance with a first embodiment of a notch filter 442.1, the input signal $V_{IN}$ to be filtered is applied to a first terminal of a resistor $R_a$ comprising a first arm of a two-arm bridge circuit 450. The second terminal of the resistor $R_a$ is connected at a bridge junction 452 to both the second arm of the two-arm bridge circuit 450 and to the input of an inverting amplifier 454 which generates the associated filtered output signal $V_{OUT}$, wherein the second arm of the two-arm bridge circuit 450 comprises a LC series network 455—comprising capacitor $C_a$ and inductor $L_a$—connected to ground. At resonance of the LC series network 455, i.e. $\omega=1/\sqrt{L_aC_a}$, the impedance thereof is minimized resulting in the notch 446 of the notch filter 442.1.

Referring to FIG. 58*b*, in accordance with a second embodiment of a notch filter 442.2, the input signal $V_{IN}$ to be filtered is applied to an input resistor $R_b$ which is coupled to the inverting input of an operational amplifier 456 that generates the associated filtered output signal $V_{OUT}$, wherein the output of the operational amplifier 456 is operatively coupled through a bandpass feedback network 458 to the inverting input of the operational amplifier 456. The bandpass feedback network 458 comprises an inverting bandpass filter 460 in series with an inverting amplifier 462, wherein the inverting bandpass filter 460 comprises a series RC network 464—comprising resistor $R_{1b}$ and capacitor $C_{1b}$—operatively coupled to the inverting input of an associated operational amplifier 466, and a parallel RC network 468—, comprising resistor $R_{2b}$ and capacitor $C_{2b}$—operatively coupled between the inverting input and the output of the operational amplifier 466 so as to provide for feedback therethough. Accordingly, the inverting bandpass filter 460 is configured as a practical differentiator circuit as described in "*An Applications Guide for Op Amps*" by National Semiconductor, Application Note 20, February 1969, which is incorporated herein by reference. The associated center frequency $f_c$ of the inverting bandpass filter 460 is given as follows by:

$$f_c = \frac{1}{2\pi R_{1b} C_{1b}} = \frac{1}{2\pi R_{2b} C_{2b}} \tag{38}$$

and the lower corner frequency $f_1$ at a 20 dB gain reduction is given by:

$$f_1 = \frac{1}{2\pi R_{2b} C_{1b}} \tag{39}$$

Various other embodiments of notch filters 442 are known in the art, for example, as described by Adel S. Sedra and Kenneth C. Smith in *Microelectronic Circuits, Third Edition*, Oxford University Press, 1991, Section 11.6, pages 792-799 which is incorporated herein by reference. For example, referring to FIG. 58*c*, a third embodiment of a notch filter 442.3, from FIG. 11.22(d) of the Sedra/Smith reference, incorporated herein by reference, comprises a first operational amplifier 470 configured as a buffer amplifier that receives the input signal $V_{IN}$, an active filter network 471 comprising an output node 472, and a second operational amplifier 473 also configured as a buffer amplifier, the input of which is connected to the output node 472, the output of which provides the filtered output signal $V_{OUT}$. The active filter network 471 comprises a first resistor $R_{1c}$ between the output node 472 and the output of a third operational amplifier 474, a second resistor $R_{2c}$ between the output and the inverting input of the third operational amplifier 474, a third resistor $R_{3c}$ between the inverting input of the third operational amplifier 474 and an output of a fourth operational amplifier 475, a first capacitor $C_{4c}$ between the output of the fourth operational amplifier 475 and the non-inverting input of the third operational amplifier 474, a fourth resistor $R_{5c}$ between the non-inverting input of the third operational amplifier 474 and the output of the first operational amplifier 470, a fifth resistor $R_{6c}$ between the output node 472 and ground, and a second capacitor $C_{6c}$ between the output of the first operational amplifier 470 and the output node 472, wherein the non-inverting input of the fourth operational amplifier 475 is connected to the output node 472, and the inverting input of the fourth operational amplifier 475 is connected to the inverting input of the third operational amplifier 474. The transfer function of the third embodiment of the notch filter 442.3 is given as follows from Table 11.1 of the Sedra/Smith reference, incorporated herein by reference, as follows:

$$T(s) = \frac{K \cdot \left[S^2 + \dfrac{R_{2c}}{C_{4c} \cdot C_{6c} \cdot R_{1c} \cdot R_{3c} \cdot R_{5c}}\right]}{S^2 + \dfrac{S}{C_{6c} \cdot R_{6c}} + \dfrac{R_{2c}}{C_{4c} \cdot C_{6c} \cdot R_{1c} \cdot R_{3c} \cdot R_{5c}}} \tag{40}$$

Referring to FIGS. 59, 61 and 63, the signal conditioning circuit 294 may be adapted to incorporate inner voltage feedback in combination with either current feedback or outer voltage feedback provided that the respective feedback control systems are adapted to not substantially interfere with one another.

For example, referring to FIG. 59, a fifteenth embodiment of a signal conditioning circuit 294.15 that provides for generating one or more measures responsive to a self-impedance $Z_L$ of a coil 14, L' incorporates a combination of an inner voltage feedback system 344.1—i.e. in accordance with the first aspect of the bias control circuit 344.1—of the tenth embodiment of the signal conditioning circuit 294.10 illustrated in FIG. 45, and a current feedback system 344.3—i.e. in accordance with the third aspect of the bias control circuit 344.3—of the thirteenth embodiment of the signal conditioning circuit 294.13 illustrated in FIG. 55, wherein a high-pass notch filter 476 is used instead of a low-pass filter 430 in the feedback path of the associated current feedback loop. More particularly, the output of the operational amplifier 278 of the summing and difference amplifier 276 is operatively coupled to a high-pass filter 478, for example, comprising a resistor $R_H$ in series with a capacitor $C_H$, the output of which is operatively coupled to a notch filter 442, for example, illustrated using the second embodiment of the notch filter 442.2 from FIG. 58*b*, the output of which is operatively coupled to the buffer amplifier 434 and all-pass phase shifter 432 from the thirteenth embodiment of the signal conditioning circuit 294.13 illustrated in FIG. 55, so as to provide for the current feedback system 344.3. The associated single-ended complementary output signals $V_A$ and $V_B$ are generated by the associated oscillator 300 in accordance with the thirteenth embodiment of the signal conditioning circuit 294.13, and the inner voltage feedback system 344.1 is configured in accordance with the tenth embodiment of the signal conditioning circuit 294.10, both as described hereinabove.

Figure 60:
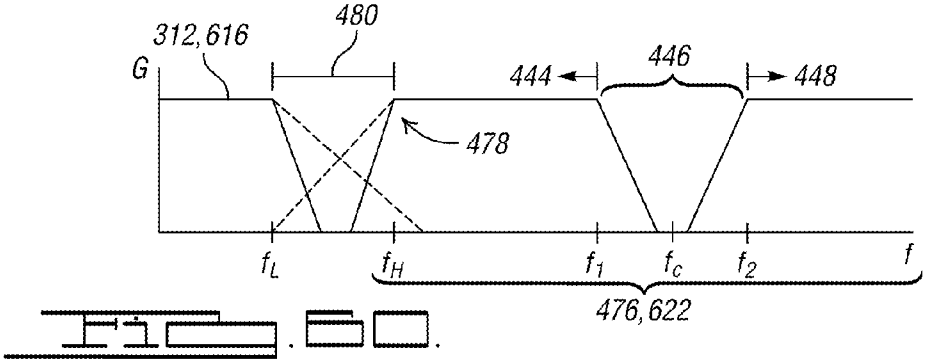
FIG. 60 illustrates gain responses a low-pass filter and a high-pass notch filter respectively overlaid upon one another.
Figure 9:
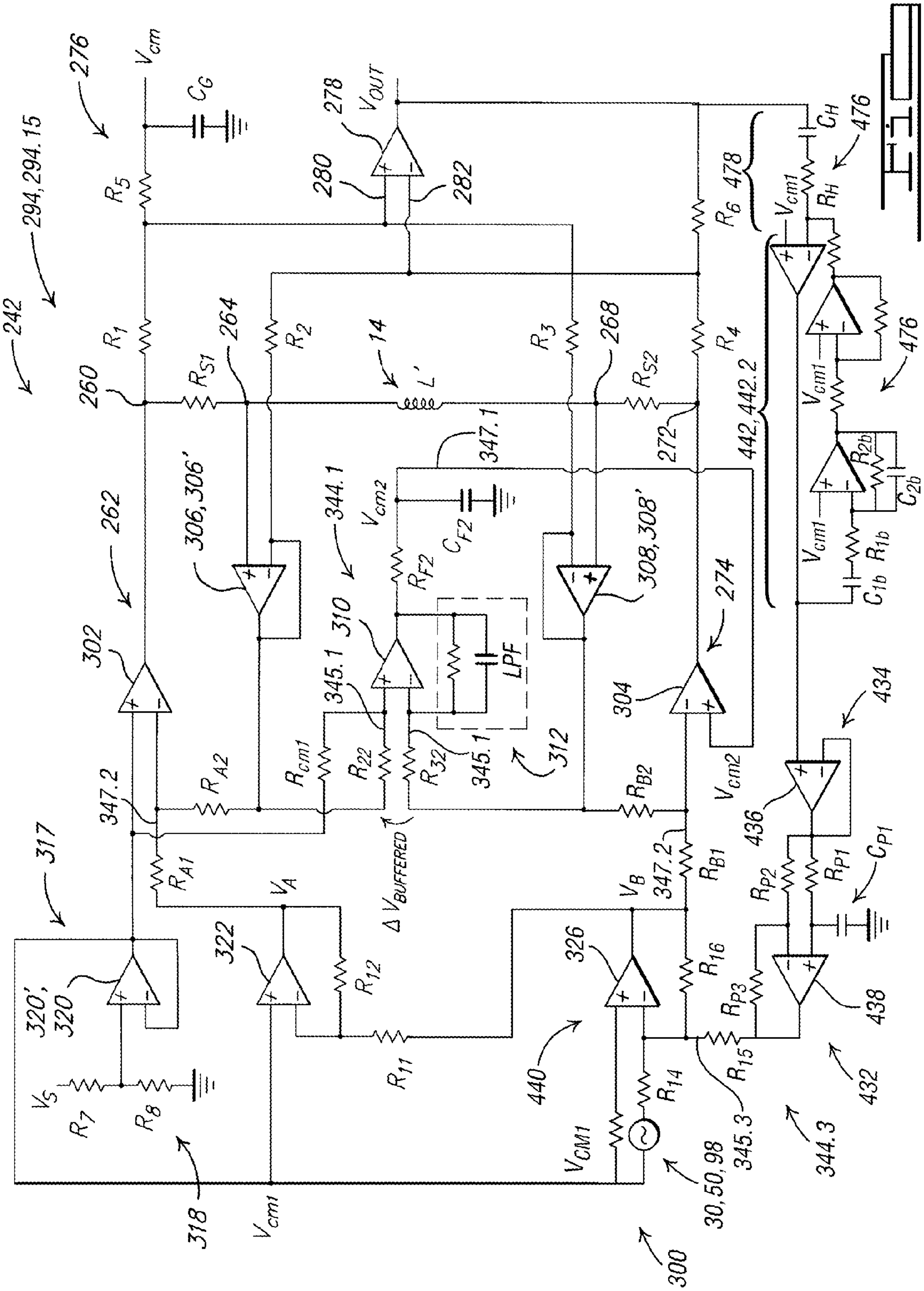
Figure 30:
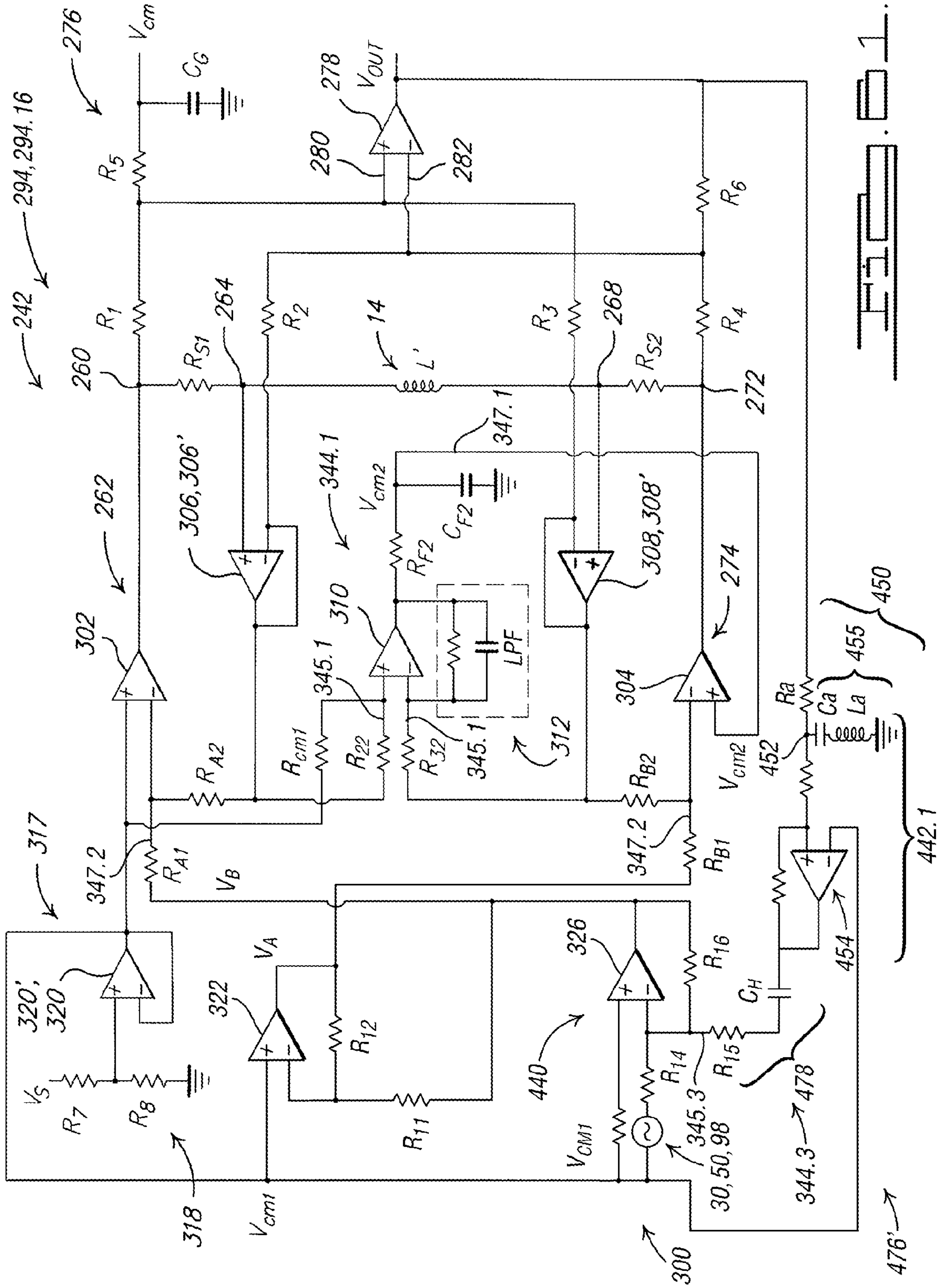

Referring to FIG. 60, the cutoff frequency $f_L$ of the low-pass filter circuit 312 of the inner voltage feedback system 344.1 is set sufficiently below the lower cutoff frequency $f_H$ of the high-pass notch filter 476 of the current feedback system 344.3 so that the inner voltage feedback system 344.1 and the current feedback system 344.3 do not substantially interfere with one another. For example, in one embodiment, the separation 480 between the cutoff frequency $f_L$ of the low-pass filter circuit 312 and the lower cutoff frequency $f_H$ of the high-pass notch filter 476 is at least two decades.

Accordingly, for the fifteenth embodiment of the signal conditioning circuit 294.15 illustrated in FIG. 59, the inner voltage feedback system 344.1 provides for nulling DC and relatively lower frequency components of the current $i_L$ through the coil 14, L', the current feedback system 344.3 provides for nulling relatively higher frequency components of the current $i_L$ through the coil 14, L', and the notch 446 of the high-pass notch filter 476 provides for generating the one or more measures responsive to a self-impedance $Z_L$ of the coil 14, L' at the operating frequency of the associated oscillator 300, at which frequency neither the low-pass filter circuit 312 nor the high-pass notch filter 476 have a non-negligible affect on the current $i_L$ through the coil 14, L'.

Referring to FIG. 61 a sixteenth embodiment of a signal conditioning circuit 294.16 that provides for generating one or more measures responsive to a self-impedance $Z_L$ of the coil 14, L' incorporates a combination of an inner voltage feedback system 344.1 and a current feedback system 344.3 similar to the fifteenth embodiment of the signal conditioning circuit 294.15 illustrated in FIG. 59 except that the high-pass notch filter 476 and the all-pass phase shifter 432 thereof are replaced by a second embodiment of a high-pass notch filter 476' which incorporates the first embodiment of the notch filter 442.1 as illustrated in FIG. 58*a* and described hereinabove, the input of which is operatively coupled to the output of the operational amplifier 278 of the summing and difference amplifier 276, the output of which is operatively coupled to a high-pass filter 478, for example, comprising a resistor $R_{15}$ in series with a capacitor $C_H$, the output of which is operatively coupled to the inverting input of the eighth operational amplifier 326 of the summing amplifier 440 of the oscillator 300, which provides the output signal $V_B$ that is operatively coupled to the first operational amplifier 302 that drives the first node 260 of the series circuit 242, and which is input to the seventh operational amplifier 322 and inverted thereby so as to provide for the complementary output signal $V_A$ that is operatively coupled to the second operational amplifier 304 that drives the fourth node 272 of the series circuit 242. Accordingly, for the sixteenth embodiment of the signal conditioning circuit 294.16 illustrated in FIG. 61, as with the fifteenth embodiment of the signal conditioning circuit 294.15 illustrated in FIG. 59, the inner voltage feedback system 344.1 provides for nulling DC and relatively lower frequency components of the current $i_L$ through the coil 14, L', the current feedback system 344.3 provides for nulling relatively higher frequency components of the current $i_L$ through the coil 14, L', and the notch 446 of the high-pass notch filter 476' provides for generating the one or more measures responsive to a self-impedance $Z_L$ of the coil 14, L' at the operating frequency of the associated oscillator 300, at which frequency neither the low-pass filter circuit 312 nor the high-pass notch filter 476' have a non-negligible affect on the current $i_L$ through the coil 14, L', wherein the low-pass filter circuit 312 and the high-pass notch filter 476' are generally characterized by the gain responses G illustrated in FIG. 60.

Figure 62:
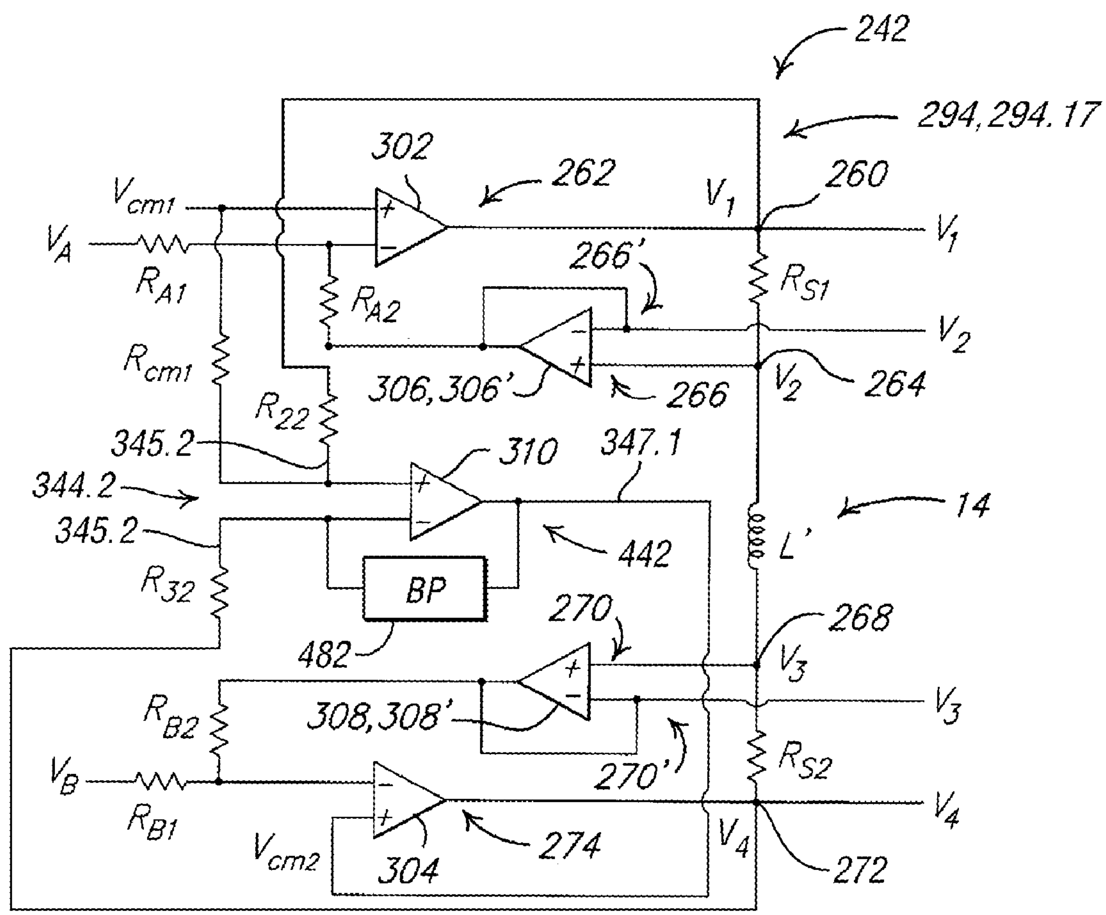
FIG. 62 illustrates a seventeenth embodiment of a signal conditioning circuit that provides for generating one or more measures responsive to a self-impedance of a coil.

Referring to FIG. 62, a seventeenth embodiment of a signal conditioning circuit 294.17 that provides for generating one or more measures responsive to a self-impedance $Z_L$ of a coil 14, L' incorporates the same structure as the eighth embodiment of the signal conditioning circuit 294.8 illustrated in FIG. 43, except that the low-pass filter circuit 312 of the eighth embodiment is replaced with a notch filter 442 in the seventeenth embodiment, wherein the notch filter 442 is implemented by a bandpass filter circuit 482 in the feedback path of the fifth operational amplifier 310, i.e. between the output and the non-inverting input thereof, wherein the notch filter 442 is generally characterized by the gain response G illustrated in FIG. 57 with the pass band of the bandpass filter circuit 482 defining the notch 446 of the notch filter 442. Accordingly, the seventeenth embodiment of the signal conditioning circuit 294.17 incorporates an outer voltage feedback system 344.2—i.e. in accordance with the first aspect of the bias control circuit 344.2—incorporating an associated notch filter 442, the low frequency pass band 444 of which that provides for nulling DC and relatively lower frequency components of the current $i_L$ through the coil 14, L', the high frequency pass band 448 of which provides for nulling relatively higher frequency components of the current $i_L$ through the coil 14, L', and the notch 446 of which provides for generating the one or more measures responsive to a self-impedance $Z_L$ of the coil 14, L' at the operating frequency of the associated oscillator 300.

Referring to FIG. 63, an eighteenth embodiment of a signal conditioning circuit 294.18 that provides for generating one or more measures responsive to a self-impedance $Z_L$ of the coil 14, L' incorporates a combination of an inner voltage feedback system 344.1—i.e. in accordance with the first aspect of the bias control circuit 344.1—of the tenth embodiment of the signal conditioning circuit 294.10 illustrated in FIG. 45, and an outer voltage feedback system 344.2, for example, generally in accordance with the seventeenth embodiment of a signal conditioning circuit 294.17 illustrated in FIG. 62, wherein a high-pass notch filter 476 is used instead of a notch filter 442 in the feedback path of the associated outer voltage feedback loop, and the feedback 345.2 of the outer voltage feedback system 344.2 is applied to the summing amplifier 440 associated with the oscillator 300 so as to directly affect both complementary output signals $V_A$, $V_B$ rather than to the non-inverting input of the second operational amplifier 304, which instead receives the feedback 345.1 of the inner voltage feedback system 344.1. More particularly, the first 260 and fourth 272 nodes of the of the series circuit 242 are respectively connected to first 482 and second 483 inputs of a differential amplifier 484, the output of which is operatively coupled to the high-pass notch filter 476, the output of which is operatively coupled through the input resistor $R_{15}$ to the inverting input of the eighth operational amplifier 326 configured as a summing amplifier 440 so as to provide for summing the feedback 345.2 of the outer voltage feedback system 344.2 into the output signal $V_B$ that is applied to the fourth node 272 of the series circuit 242, and which is inverted to form the complementary output signal $V_A$ that is applied to the first node 260 of the series circuit 242. Accordingly, the inner voltage feedback system 344.1 provides for nulling DC and relatively lower frequency components of the current $i_L$ through the coil 14, L', the outer voltage feedback system 344.2 provides for nulling relatively higher frequency components of the current $i_L$ through the coil 14, L', and the notch 446 of the high-pass notch filter 476 provides for generating the one or more measures responsive to a self-impedance $Z_L$ of the coil 14, L' at the operating frequency of the associated oscillator 300, at which frequency neither the low-pass filter circuit 312 nor the high-pass notch filter 476 have a non-negligible affect on the current $i_L$ through the coil 14, L'.

It should be understood that any of the above embodiments incorporating a pair of sense resistors $R_S$ may be adapted so that the associated current measure 348 that provides a measure of the current $i_L$ through the coil 14, L' is responsive only to the voltage across one of the two sense resistors $R_S$, rather than to both, for example, by replacing the summing and difference amplifier 276 with a difference amplifier that generates a signal responsive to the voltage drop across one of the two sense resistors $R_S$, or across a single sense resistors $R_S$ of the associated series circuit 242.

Furthermore, referring to FIGS. 64-68, and further to the general embodiment illustrated in FIG. 36, a signal conditioning circuit 294 that provides for generating one or more measures responsive to a self-impedance $Z_L$ of a coil 14, L' may be adapted to do so using a single oscillatory drive signal as the source of voltage across the associated series circuit 242, rather than a pair of complementary output signals $V_A$, $V_B$, that otherwise provides for a balanced circuit and associated a reduced common mode voltage when used in combination with a pair of sense resistors $R_S$. All of the embodiments illustrated in FIGS. 64-68 are adapted for single-supply operation of the associated amplifiers, e.g. operational amplifiers, i.e. using a mono-polar rather than a bi-polar power supply. Each of these embodiments incorporates a monopolar signal generator 600 comprising an oscillator 602 biased by a DC common mode voltage signal $V_{cm1}$—for example, having a value of about half the associated DC supply voltage—and operatively coupled through a first resistor $R_1$ to the inverting input of a first operational amplifier 604 configured as a summing amplifier. The output of the first operational amplifier 604 is operatively coupled through a second resistor $R_2$ to the inverting input of the first operational amplifier 604, and the DC common mode voltage signal $V_{cm1}$ is operatively coupled to the non-inverting input of the first operational amplifier 604. Accordingly, if the oscillator 602 generates a sinusoidal voltage $V_{AC}$, then if the values of the first $R_1$ and second $R_2$ resistors are equal to one another, the output $V_A$ of the monopolar signal generator 600 is given by:

$$V_A = V_{CM1} - V_{AC} \tag{41}$$

which will be monopolar if the magnitude of the sinusoidal voltage $V_{AC}$ is less than or equal to the magnitude of the DC common mode voltage signal $V_{cm1}$.

The output $V_A$ of the monopolar signal generator 600 is operatively coupled through a third resistor $R_3$ to the inverting input of a second operational amplifier 606, which is used as a driver 606' to drive a series circuit 608 comprising the sense resistor $R_S$ between a first node 260 and a second node 264, in series with the coil 14, L' between the second node 264 and a third node 268, i.e. so as to apply a voltage across the series circuit 608 which causes a current $i_L$ therethrough. More particularly, the output of the second operational amplifier 606 is operatively coupled to a first terminal of the sense resistor $R_S$ at the first node 260 of the series circuit 608, and the second terminal of the sense resistor $R_S$ at the second node 264 of the series circuit 608 is operatively coupled to a buffer amplifier 610' comprising a third operational amplifier 610, the output of which is operatively coupled through a fourth resistor $R_4$ to the inverting input of the second operational amplifier 606. The non-inverting input of the second operational amplifier 606 is operatively coupled to the DC common mode voltage signal $V_{cm1}$. Accordingly, the buffer amplifier 610' applies the voltage $V_2$—of the second node 264 of the series circuit 608—to the fourth resistor $R_4$ which feeds back to the inverting input of the second operational amplifier 606, and which, for equal values of the third $R_3$ and fourth $R_4$ resistors, controls the voltage $V_2$ at the second node 264 of the series circuit 608 as follows:

$$V_2 = V_{CM1} + V_{AC} \tag{42}$$

The DC common mode voltage signal $V_{cm1}$ is applied as voltage $V_3$ to the terminal of the coil 14, L' at the third node 268 of the series circuit 608. Accordingly, the voltage $V_L$ across the coil 14, L', which is between the second 264 and third 268 nodes of the series circuit 608, is then given by:

$$V_L = V_2 - V_3 = (V_{CM1} + V_{AC}) - V_{CM1} = V_{AC} \tag{43}$$

Accordingly, the driver 606' configured with feedback through the buffer amplifier 610' from the second node 264 of the series circuit 608 provides for controlling the voltage $V_L$ across the coil 14, L'.

The first 260 and second 264 nodes of the series circuit 608—i.e. across the sense resistor $R_S$—are then operatively coupled to the inputs of a first differential amplifier 612, the output voltage $V_{OUT}$ of which is responsive to the voltage drop $V_{RS}$ across the sense resistor $R_S$, which provides a measure of current through the coil 14, L', and which is also biased by the DC common mode voltage signal $V_{cm1}$ so as to provide for single-supply operation thereof.

Equation (43) shows that under ideal conditions, the voltage $V_L$ across the coil 14, L' does not exhibit a DC bias, so that under these conditions, there would be no corresponding DC current component through the coil 14, L'. However, as described hereinabove, a real operational amplifier can exhibit a DC bias, i.e. a non-zero output signal for no input signal, which can in turn cause a corresponding DC bias current in the series circuit 608 and coil 14, L', which if not otherwise compensated, could possibly be problematic depending upon the magnitude thereof. Accordingly, the embodiments the signal conditioning circuits 294.19-294.23 of FIGS. 64-68 illustrate various inner voltage feedback systems 344.1, outer voltage feedback systems 344.2, and current feedback systems 344.3, alone and in combination with one another, that may be used to supplement the above-described circuitry so as to provide for mitigating the affects of biases and noise, if necessary for a particular application.

Figure 64:
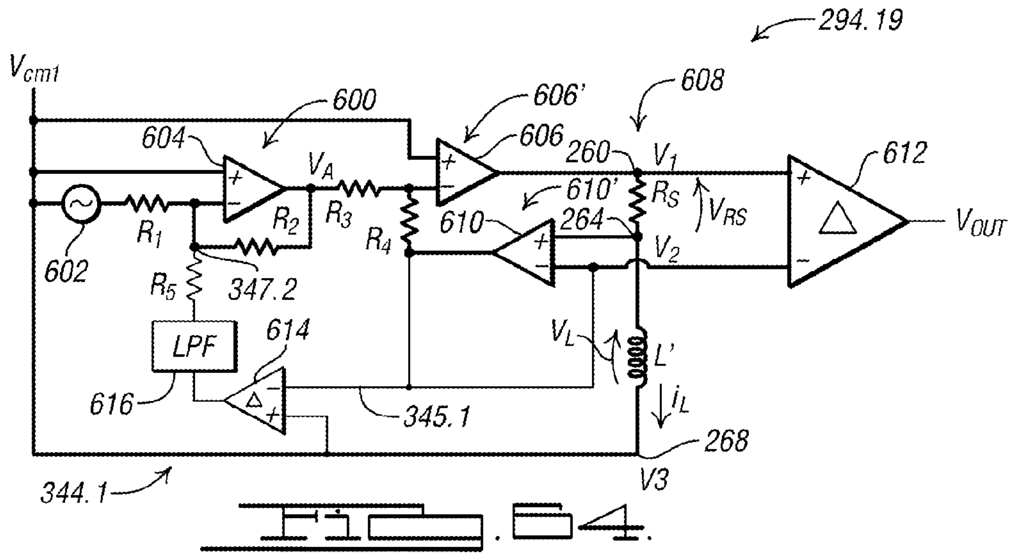
FIG. 64 illustrates a nineteenth embodiment of a signal conditioning circuit that provides for generating one or more measures responsive to a self-impedance of a coil.

Referring to FIG. 64, a nineteenth embodiment of a signal conditioning circuit 294.19 that provides for generating one or more measures responsive to a self-impedance $Z_L$ of a coil 14, L' illustrates a general structure of an inner voltage feedback system 344.1 utilizing a single oscillatory drive signal as the source of voltage across the associated series circuit 242, which is a counterpart to the seventh and tenth embodiments of the signal conditioning circuits 294.7, 294.10 illustrated in FIGS. 42 and 45 respectively. More particularly, the inner voltage feedback system 344.1 comprises a second differential amplifier 614 and a low-pass filter 616, wherein the output of the buffer amplifier 610' is operatively coupled to the inverting input of the second differential amplifier 614, the DC common mode voltage signal $V_{cm1}$ (or the third node 268 of the series circuit 608) is operatively coupled to the non-inverting input of the second differential amplifier 614, and the output of the second differential amplifier 614 is operatively coupled to the low-pass filter 616, the output of which is operatively coupled through a fifth resistor $R_5$ to the inverting input of the first operational amplifier 604 in accordance with the second aspect of a control signal 347.2. Accordingly, the second aspect of the control signal 347.2 is given by the DC and low frequency components of $(V_3-V_2)$, which, similar to the voltage $V_{AC}$, is added to the voltage $V_L$ across the coil 14, L' in accordance with Equation (43) (if the values of the first $R_1$, second $R_2$ and fifth $R_5$ resistors are equal) so as to cancel the corresponding DC and low frequency components of $(V_2-V_3)$ that generated the second aspect of the control signal 347.2 in the first place, so as to control the voltage $V_L$ across the coil 14, L' to be substantially equal to the voltage $V_{AC}$.

Figure 65:
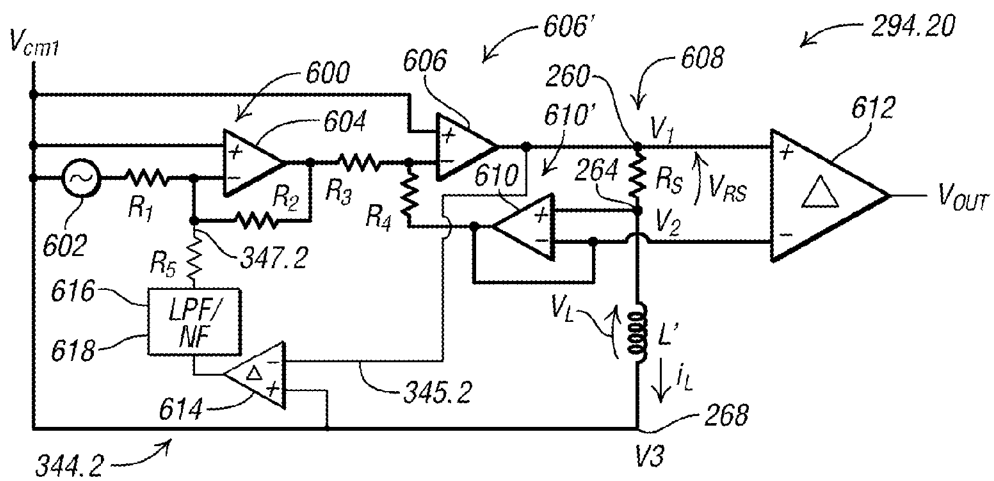
FIG. 65 illustrates a twentieth embodiment of a signal conditioning circuit that provides for generating one or more measures responsive to a self-impedance of a coil.

Referring to FIG. 65, a twentieth embodiment of a signal conditioning circuit 294.20 that provides for generating one or more measures responsive to a self-impedance $Z_L$ of a coil 14, L' illustrates a general structure of an outer voltage feedback system 344.2 utilizing a single oscillatory drive signal as the source of voltage across the associated series circuit 242, which is a counterpart to the eighth and seventeenth embodiments of the signal conditioning circuits 294.8, 294.17 illustrated in FIGS. 43 and 62 respectively. More particularly, the outer voltage feedback system 344.2 comprises a second differential amplifier 614 and either a low-pass filter 616 or a notch filter 618, wherein the first node 260 of the series circuit 608 is operatively coupled to the inverting input of the second differential amplifier 614, the DC common mode voltage signal $V_{cm1}$ (or the third node 268 of the series circuit 608) is operatively coupled to the non-inverting input of the second differential amplifier 614, and the output of the second differential amplifier 614 is operatively coupled to the low-pass filter 616, or to the notch filter 618, whichever is used, the output of which is operatively coupled through a fifth resistor $R_5$ to the inverting input of the first operational amplifier 604 in accordance with the second aspect of a control signal 347.2. Accordingly, the second aspect of a control signal 347.2 is given by either the DC and low frequency components of $(V_3-V_1)$ in the case of a low-pass filter 616, or all but the notch 446 frequency components of $(V_3-V_1)$ in the case of a notch filter 618, which provides for canceling the corresponding DC and other frequency components (depending upon whether a low-pass filter 616 or a notch filter 618 is used) of $(V_1-V_3)$ that generated the second aspect of a control signal 347.2 in the first place, so as to control the voltage $V_L$ across the coil 14, L' to be substantially equal to the voltage $V_{AC}$.

Figure 66:
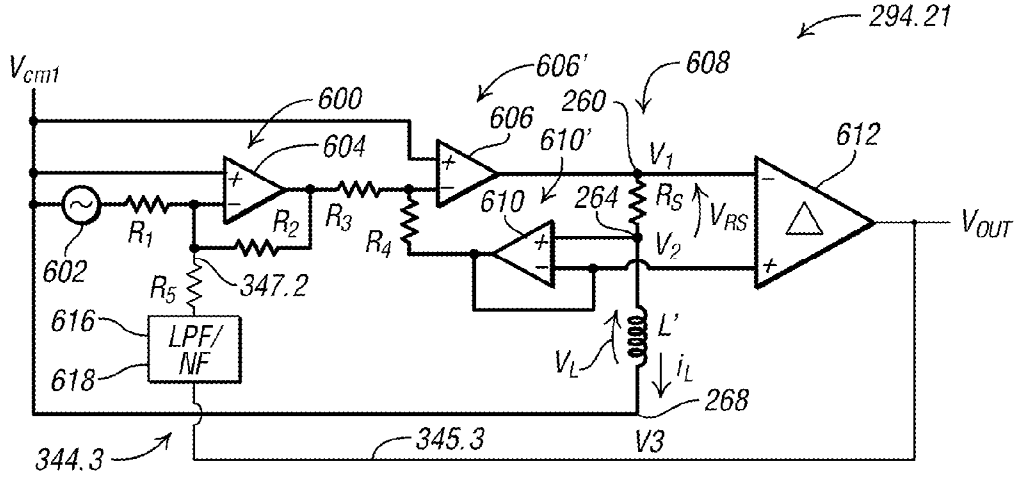
FIG. 66 illustrates a twenty-first embodiment of a signal conditioning circuit that provides for generating one or more measures responsive to a self-impedance of a coil.

Referring to FIG. 66, a twenty-first embodiment of a signal conditioning circuit 294.21 that provides for generating one or more measures responsive to a self-impedance $Z_L$ of a coil 14, L' illustrates a general structure of a current feedback system 344.3 utilizing a single oscillatory drive signal as the source of voltage across the associated series circuit 242, which is a counterpart to the twelfth through fourteenth embodiments of the signal conditioning circuits 294.12-294.14 illustrated in FIGS. 54-56 respectively. More particularly, the current feedback system 344.3 comprises either a low-pass filter 616 or a notch filter 618, wherein the input polarities of the first differential amplifier 612 are reversed relative to the nineteenth and twentieth embodiments of the signal conditioning circuit 294.19, 294.20—i.e. with the inverting input thereof operatively coupled to the first node 260 of the series circuit 608, and the inverting input thereof operatively coupled to the output of the buffer amplifier 610'—so that the output voltage $V_{OUT}$ thereof is responsive to $(V_2-V_1=-V_{RS})$, and the output of the first differential amplifier 612 is operatively coupled to the low-pass filter 616, or to the notch filter 618, whichever is used, the output of which is operatively coupled through a fifth resistor $R_5$ to the inverting input of the first operational amplifier 604 in accordance with the second aspect of a control signal 347.2. Accordingly, the second aspect of a control signal 347.2 is given by either the DC and low frequency components of $(V_2-V_1)$ in the case of a low-pass filter 616, or all but the notch 446 frequency components of $(V_2-V_1)$ in the case of a notch filter 618, which provides for canceling the corresponding DC and other frequency components (depending upon whether a low-pass filter 616 or a notch filter 618 is used) of $(V_1-V_2)$ that generated the second aspect of the control signal 347.2 in the first place, so as to control the voltage $V_L$ across the coil 14, L' to be substantially equal to the voltage $V_{AC}$.

Figure 67:
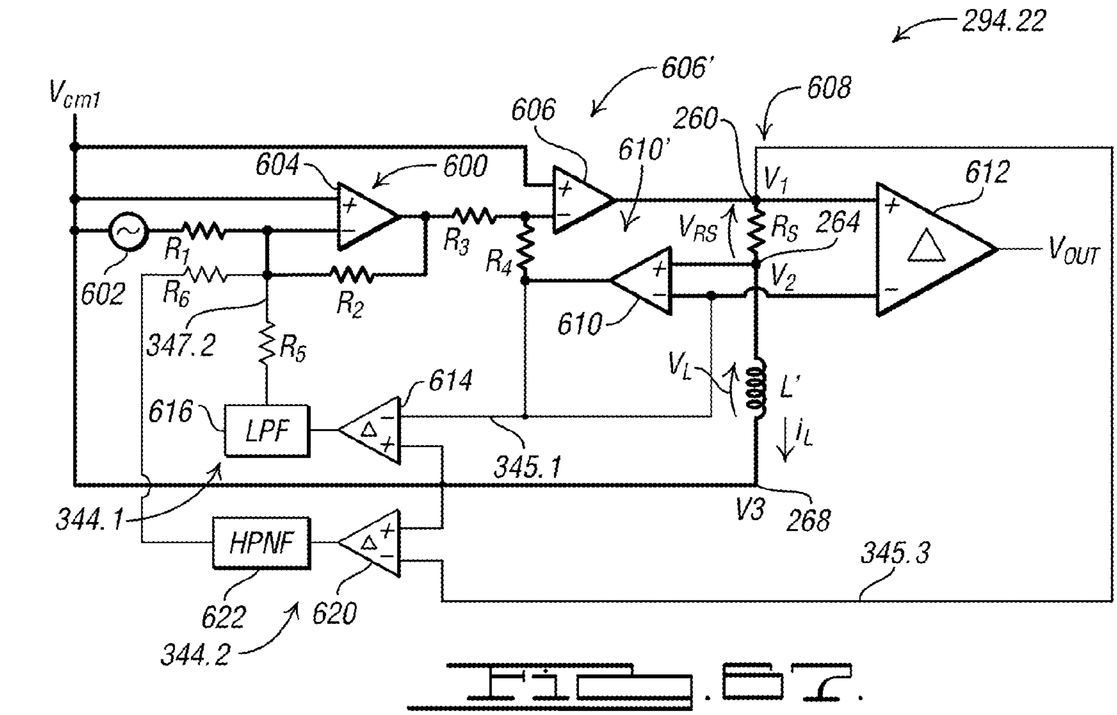
FIG. 67 illustrates a twenty-second embodiment of a signal conditioning circuit that provides for generating one or more measures responsive to a self-impedance of a coil.

Referring to FIG. 67, a twenty-second embodiment of a signal conditioning circuit 294.22 that provides for generating one or more measures responsive to a self-impedance $Z_L$ of a coil 14, L' illustrates a general structure of a combination of an inner voltage feedback system 344.1 with an outer voltage feedback system 344.2, both utilizing a single oscillatory drive signal as the source of voltage across the associated series circuit 242, which is a counterpart to the eighteenth embodiment of the signal conditioning circuits 294.18 illustrated in FIG. 63. More particularly, the inner voltage feedback system 344.1 is structured in accordance with the nineteenth embodiment of a signal conditioning circuit 294.19 illustrated in FIG. 64, as described hereinabove, and the outer voltage feedback system 344.2 comprises a third differential amplifier 620 and a high-pass notch filter 622, wherein the first node 260 of the series circuit 608 is operatively coupled to the inverting input of the third differential amplifier 620, the DC common mode voltage signal $V_{cm1}$ (or the third node 268 of the series circuit 608) is operatively coupled to the non-inverting input of the third differential amplifier 620, and the output of the third differential amplifier 620 is operatively coupled to the high-pass notch filter 622, the output of which is operatively coupled through a sixth resistor $R_6$ to the inverting input of the first operational amplifier 604 in accordance with the second aspect of a control signal 347.2. The gain responses G of the low-pass filter 616 of the inner voltage feedback system 344.1 and the high-pass notch filter 622 of the outer voltage feedback system 344.2 are characterized in accordance with FIG. 60 as described hereinabove. Accordingly, the second aspect of a control signal 347.2 is given by the combination of the DC and low frequency components of $(V_3-V_2)$ from the inner voltage feedback system 344.1, and the higher frequency excluding the notch 446 frequency components of $(V_3-V_1)$, which provides for canceling the corresponding DC and other frequency components—except for at least the notch 446 frequency components—of $(V_2-V_3)$ and $(V_1-V_3)$ respectively, that collectively generated the second aspect of a control signal 347.2 in the first place, so as to control the voltage $V_L$ across the coil 14, L' to be substantially equal to the voltage $V_{AC}$.

Figure 68:
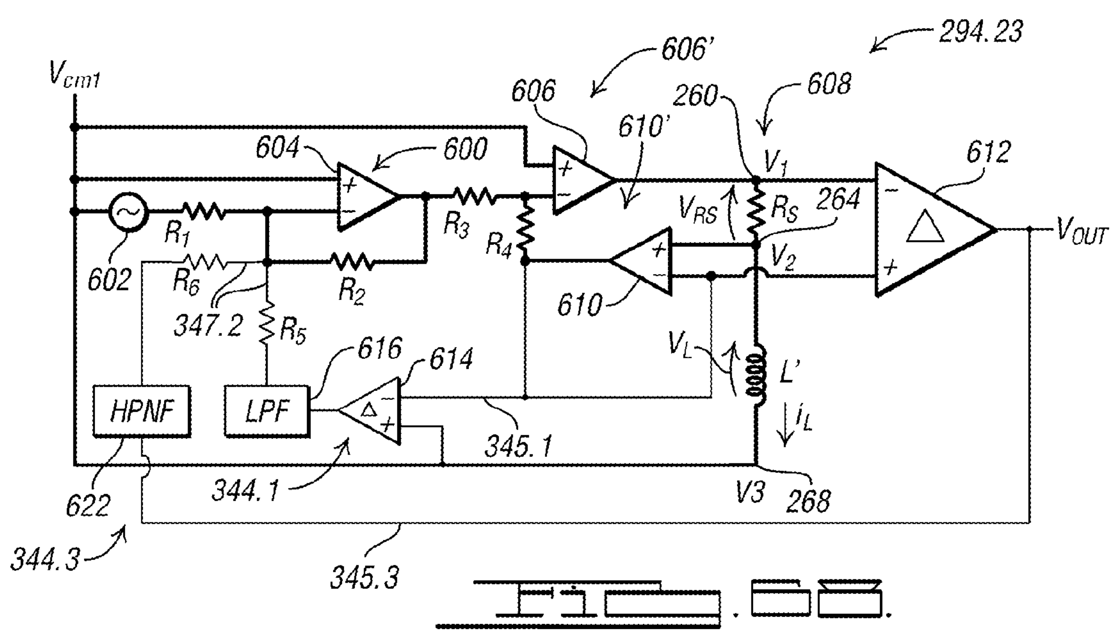
FIG. 68 illustrates a twenty-third embodiment of a signal conditioning circuit that provides for generating one or more measures responsive to a self-impedance of a coil.

Referring to FIG. 68, a twenty-third embodiment of a signal conditioning circuit 294.23 that provides for generating one or more measures responsive to a self-impedance $Z_L$ of a coil 14, L' illustrates a general structure of a combination of an inner voltage feedback system 344.1 with a current feedback system 344.3, both utilizing a single oscillatory drive signal as the source of voltage across the associated series circuit 242, which is a counterpart to the fifteenth and sixteenth embodiments of the signal conditioning circuits 294.15, 294.16 illustrated in FIGS. 59 and 61 respectively. More particularly, the inner voltage feedback system 344.1 is structured in accordance with the nineteenth embodiment of a signal conditioning circuit 294.19 illustrated in FIG. 64, as described hereinabove, and the current feedback system 344.3 comprises a high-pass notch filter 622, wherein the input polarities of the first differential amplifier 612 are configured as in the twenty-first embodiment of a signal conditioning circuit 294.21—i.e. with the inverting input thereof operatively coupled to the first node 260 of the series circuit 608, and the inverting input thereof operatively coupled to the output of the buffer amplifier 610'—so that the output voltage $V_{OUT}$ thereof is responsive to $(V_2-V_1=-V_{RS})$, and the output of the first differential amplifier 612 is operatively coupled to the high-pass notch filter 622, the output of which is operatively coupled through a sixth resistor $R_6$ to the inverting input of the first operational amplifier 604 in accordance with the second aspect of a control signal 347.2. The gain responses of the low-pass filter 616 of the inner voltage feedback system 344.1 and the high-pass notch filter 622 of the current feedback system 344.3 are characterized in accordance with FIG. 60 as described hereinabove. Accordingly, the second aspect of a control signal 347.2 is given by the combination of the DC and low frequency components of $(V_3-V_2)$ from the inner voltage feedback system 344.1, and the higher frequency excluding the notch 446 frequency components of $(V_2-V_1)$, which provides for canceling the corresponding DC and other frequency components—except for at least the notch 446 frequency components—of $(V_2-V_3)$ and $(V_1-V_2)$, respectively, that collectively generated the second aspect of a control signal 347.2 in the first place, so as to control the voltage $V_L$ across the coil 14, L' to be substantially equal to the voltage $V_{AC}$.

Referring to FIGS. 69*a-c*, 70*a-c*, 71*a-b*, 72, and 73*a-e*, a second aspect of a signal conditioning circuit 502 provides for generating a measure responsive to the complex impedance of the coil 14, L' using a time constant method, wherein the time constant of an associate RL or RLC circuit incorporating the coil determines the time response thereof to a pulse applied thereto, and a measure responsive to the complex impedance of the coil 14, L' responsive to one or more measures of this time response.

Figure 69A:
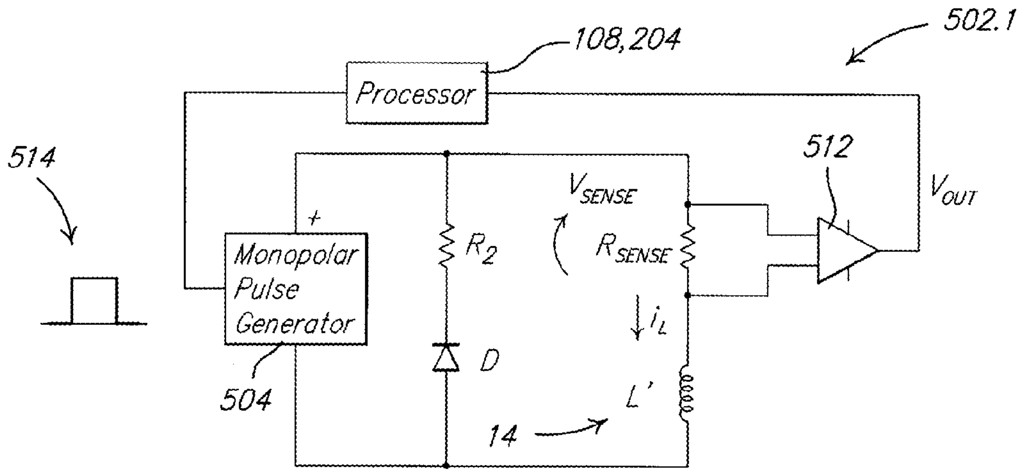
FIG. 69*a* illustrates a first embodiment of a second aspect of a signal conditioning circuit that provides for generating one or more measures responsive to a self-impedance of a coil.
Figure 69B:
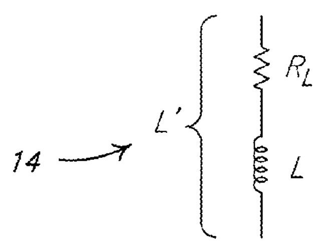
FIG. 69*b* illustrates a model of a the coil illustrated in FIG. 69*a;*
Figure 69C:
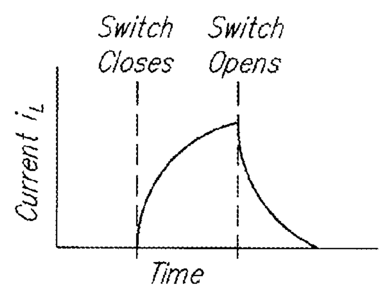
FIG. 69*c* illustrates an operation of the second aspect of a signal conditioning circuit illustrated in FIG. 69*a;*
Figure 70A:
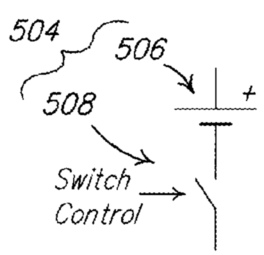
FIGS. 70*a-c* illustrates a various embodiments of a monopolar pulse generator in accordance with the second aspect of a signal conditioning circuit illustrated in FIG. 69*a;*
Figure 70B:
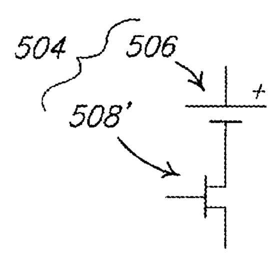
Figure 70C:
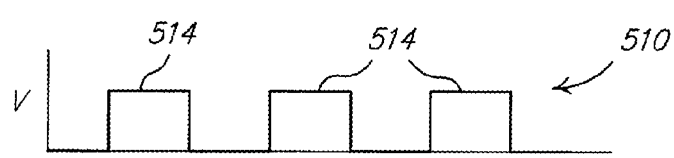

Referring to FIG. 69*a*, in accordance with a first embodiment of the second aspect of the signal conditioning circuit 502.1 that provides for generating one or more measures responsive to a self-impedance $Z_L$ of a coil 14, L', a monopolar pulse generator 504 under control of a processor 108, 204 is operatively coupled across a series combination of a sense resistor $R_{sense}$ and the coil 14, L', in parallel with a series combination of a second resistor $R_2$ and a diode D that is reverse biased relative to the polarity of the monopolar pulse generator 504. Referring to FIGS. 70*a-c*, examples of various embodiments of the monopolar pulse generator 504 include a battery 506 in series with a controlled switch 508, e.g. a transistor or relay, as illustrated in FIG. 70*a*; a battery 506 in series with an FET transistor switch 508', as illustrated in FIG. 70*b*; and an oscillator circuit that provides for the generation of a monopolar pulse train 510 as illustrated in FIG. 70*c*. A differential amplifier 512 generates a signal $V_{OUT}$ responsive to the voltage $V_{sense}$ across the sense resistor $R_{sense}$, which is responsive to the current $i_L$ through the coil 14, L' in accordance with Ohm's law, i.e. $V_{sense}=R_{sense}\cdot i_L$. Referring to FIG. 69*b*, the coil 14, L' can be modeled as an inductor L in series with a resistor $R_L$, wherein the resistance $R_L$ accounts for the combination of the inherent resistance of the coil 14, L' and the effective resistance resulting from proximal eddy current effects. The monopolar pulse generator 504 generates a pulse 514, e.g. upon closure of the controlled switch 508 or the FET transistor switch 508', and, referring to FIG. 69*c*, the subsequent rate of increase of the current $i_L$ provides a measure of the inductance L and resistance $R_L$, which together provide the impedance Z of the coil 14, L'. The time constant $\tau_{ON}$ of a pure RL circuit would be given by:

$$\tau_{ON} = \frac{R_{sense} + R_L}{L} \tag{44}$$

and the current $i_L$ would be given as follows:

$$i_L(t) = \frac{V}{R_{sense} + R_L} \cdot \left(1 - e^{-\frac{(R_{sense}+R_L)\cdot t}{L}}\right) \tag{45}$$

If the duration of the pulse 514 were sufficiently long, e.g. t>>τ, the current $i_L$ would approach a value of:

$$i_L^{max} = \frac{V}{R_{sense} + R_L} \tag{46}$$

The pulse 514 is held on for a duration sufficient to provide for measuring the time constant $\tau_{ON}$, for example, responsive to any of the following: 1) the current $i_L$ at and associated time t as the current $i_L$ is rising, e.g. at the end of a pulse 514 having a duration less than several time constants $\tau_{ON}$; 2) the rate of change of current $i_L$ as the current $i_L$ is rising; 3) the time or times required after initiation of a pulse 514 for the current $i_L$ to reach a predetermined value or to reach a set of predetermined values; or 4) an integral of the current $i_L$ over at least a portion of the period when the pulse 514 is on.

For example, from Equation (45) may be rewritten as:

$$i_L(t) = i_L^{max} \cdot \left(1 - e^{\frac{t}{\tau}}\right) \tag{47}$$

where $\tau=\tau_{ON}$. The first derivative of the current $i_L$ with respect to time is given by:

$$i_L'(t) = i_L^{max} \cdot \frac{t}{\tau} \cdot e^{-\frac{t}{\tau}} \tag{48}$$

From Equations (47) and (48), the current $i_L$ can be given as a function of the first derivative of the current $i_L$ as:

$$i_L(t) = i_L^{max} - \frac{\tau}{t} \cdot i_L'(t) \tag{49}$$

If the current $i_L$ is measured as $i_1$ and $i_2$ at two corresponding different times $t_1$ and $t_2$, and if the first derivative of the current $i_L$ is determined as $i_1'$ and $i_2'$ at these same times, then the time constant $\tau_{ON}$ is given by:

$$\tau_{ON} = \frac{i_2 - i_1}{\left(\frac{i_1'}{t_1} - \frac{i_2'}{t_2}\right)} = \frac{L}{R_{sense} + R_L} \tag{50}$$

From Equations (49) and (46), the effective resistance $R_L$ of the coil 14, L' is then given by:

$$R_L = \frac{V}{i_1 + \frac{\tau_{ON}}{t_1} \cdot i_1'} - R_{sense} = \frac{V}{i_2 + \frac{\tau_{ON}}{t_2} \cdot i_2'} - R_{sense} \tag{51}$$

and the inductance L of the coil 14, L' is given by:

$$L=\tau_{ON}\cdot(R_{sense}+R_L) \tag{52}$$

After the pulse 514 is turned off, e.g. upon the opening of the controlled switch 508 or the FET transistor switch 508', the energy stored in the coil 14, L' is dissipated relatively quickly through the parallel circuit path of the second resistor $R_2$ in series with the diode D, having a time constant $\tau_{OFF}$ given by:

$$\tau_{OFF} = \frac{R_{sense} + R_L + R_2}{L} \tag{53}$$

wherein the value of the second resistor $R_2$ is chosen to magnetically discharge the coil 14, L' to zero current $i_L$ before the next pulse 514. A monopolar pulse train 510 as illustrated in FIG. 70*c* can be used to make a continuous plurality of measurements, which can be averaged—over a selectable number of pulses 514, on a fixed or running basis—or used individually, depending upon the rate at which the resulting measure(s) is/are to be updated. Equation (45) and the associated measurement process can also be adapted to account for the affect of the inherent capacitance of the coil 14, L', if non-negligible.

Figure 71:
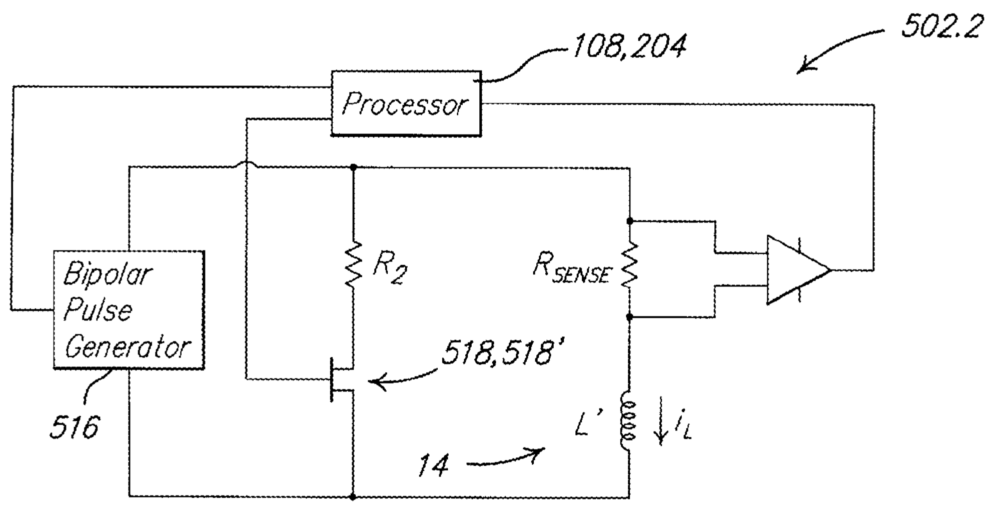
FIG. 71 illustrates a second embodiment of the second aspect of a signal conditioning circuit that provides for generating one or more measures responsive to a self-impedance of a coil.
Figure 72:
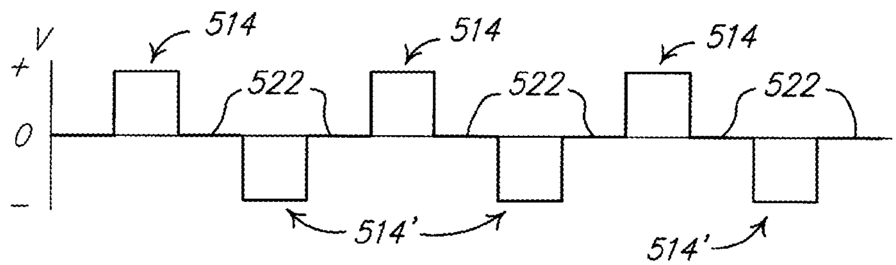
FIG. 72 illustrates a pulse train in accordance with the second embodiment of the second aspect of the signal conditioning circuit illustrated in FIG. 71.

Referring to FIG. 71, a second embodiment of the second aspect of a signal conditioning circuit 502.2 is similar to the first embodiment of signal conditioning circuit 502.1 described hereinabove except that the monopolar pulse generator 504 is replaced with a bipolar pulse generator 516, and the diode D is replaced with a transistor switch 518, e.g. an FET switch 518', wherein, the bipolar pulse generator 516 is adapted to generate a bipolar pulse train 520, one embodiment of which, for example, is illustrated in FIG. 72. The second aspect of a signal conditioning circuit 502.2 provides for periodically reversing the direction of current $i_L$ through the coil 14, L' so as to prevent a magnetization of associated ferromagnetic elements, e.g. of the vehicle 12, in proximity thereto. The bipolar pulse train 520 comprises both positive 514 and negative 514' polarity pulses, during which times the transistor switch 518 would be switched off to provide for magnetically charging the coil 14, L'; separated by dwell periods 522 of zero voltage, during which times the transistor switch 518 would be switched on to provide for magnetically discharging the coil 14, L'.

Figure 73:
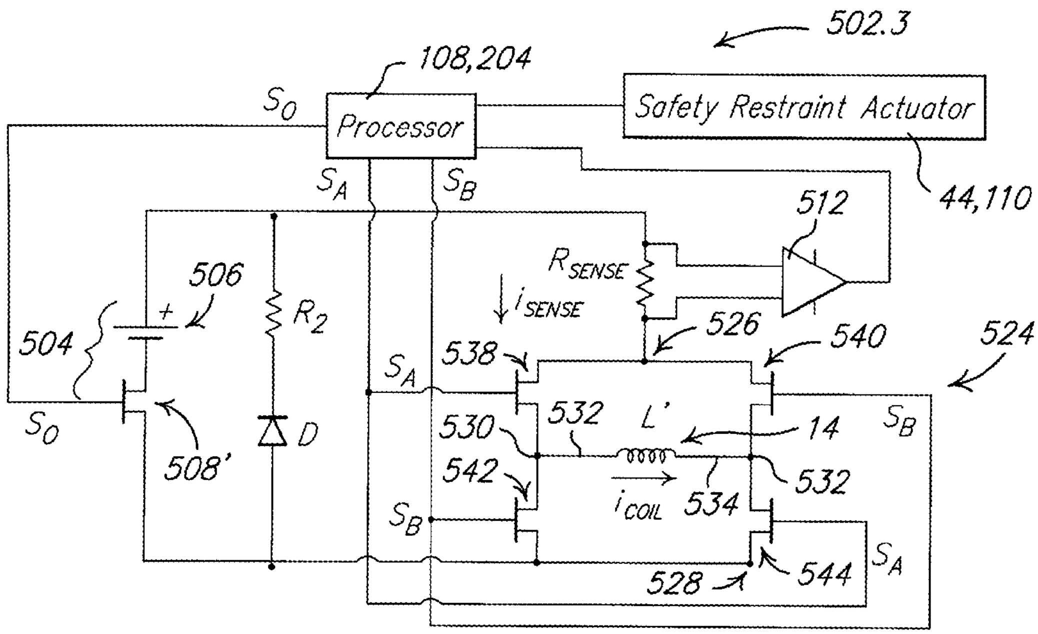
FIG. 73 illustrates a third embodiment of the second aspect of a signal conditioning circuit that provides for generating one or more measures responsive to a self-impedance of a coil.
Figure 74:
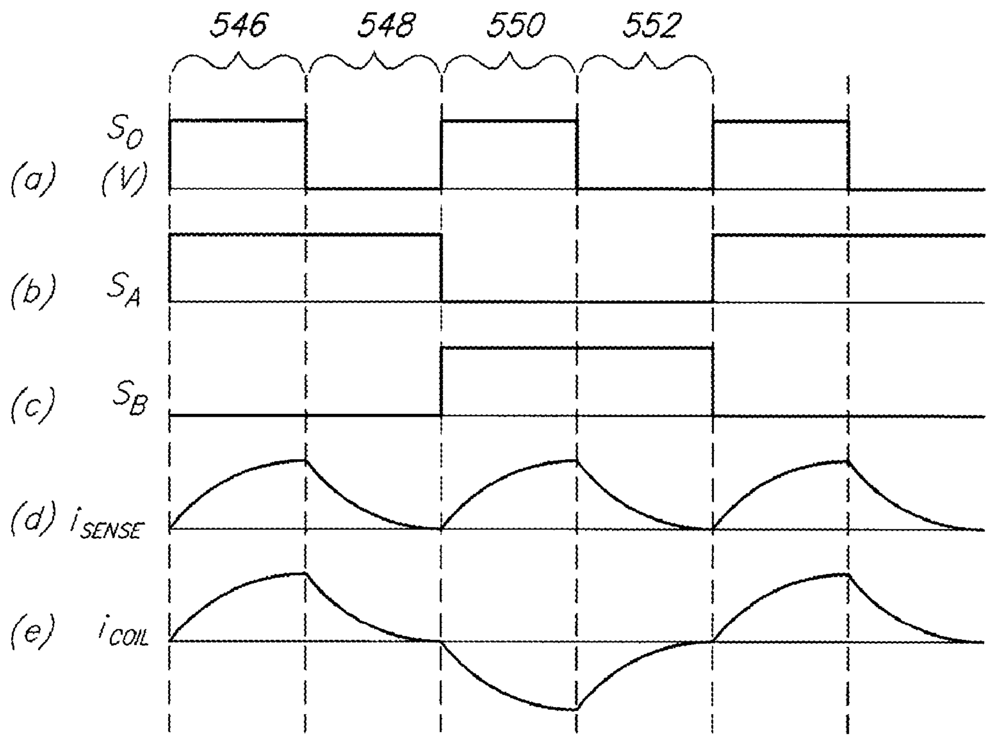
FIGS. 74*a-e* illustrates various waveforms associated with the third embodiment of the second aspect of the signal conditioning circuit illustrated in FIG. 73.

Referring to FIG. 73, a third embodiment of the second aspect of a signal conditioning circuit 502.3 is similar to the first embodiment of signal conditioning circuit 502.1 described hereinabove—incorporating the embodiment of the monopolar pulse generator 504 illustrated in FIG. 70*b*—except that the coil 14, L' is driven through an H-switch 524 so as to provide for periodically reversing the direction of current $i_L$ through the coil 14, L' so as to prevent a magnetization of associated ferromagnetic elements, e.g. of the vehicle 12, in proximity thereto, without requiring a bipolar pulse generator 516 and associated bipolar electronic elements. The H-switch 524 comprises respective first 526 and second 528 nodes, respectively connected to the sense resistor $R_{sense}$ and monopolar pulse generator 504 respectively, as had been connected the coil 14, L' in the first embodiment of the second aspect of a signal conditioning circuit 502.1. The H-switch 524 also comprises respective third 530 and fourth 532 nodes respectively connected to the first 534 and second 536 terminals of the coil 14, L'. A first transistor switch 538 (e.g. FET switch) under control of a first switch signal $S_A$ from the processor 108, 204 is operative to control a flow of current between the first 526 and third 530 nodes of the H-switch 524. A second transistor switch 540 (e.g. FET switch) under control of a second switch signal $S_B$ from the processor 108, 204 is operative to control a flow of current between the first 526 and fourth 532 nodes of the H-switch 524. A third transistor switch 542 (e.g. FET switch) under control of the second switch signal $S_B$ from the processor 108, 204 is operative to control a flow of current between the second 528 and third 530 nodes of the H-switch 524. A fourth transistor switch 544 (e.g. FET switch) under control of the first switch signal $S_A$ from the processor 108, 204 is operative to control a flow of current between the second 528 and fourth 532 nodes of the H-switch 524. The FET transistor switch 508' of the monopolar pulse generator 504 under control of pulse switch signal $S_0$ controls the flow of current from the battery 506 to the coil 14, L'.

Referring to FIGS. 74*a-e*, the signal conditioning circuit 502.3 is controlled as follows: In a first step 546, the pulse switch signal $S_0$ and the first switch signal $S_A$ are activated, which turns the FET transistor switch 508' and the first 538 and fourth 544 transistor switches on, thereby providing for current $i_L$ to flow through the coil 14, L' in a first direction. Then, in a second step 548, the pulse switch signal $S_0$ is deactivated without changing the first switch signal $S_A$, thereby providing for the coil 14, L' to magnetically discharge through the second resistor R and diode D, with current $i_L$ continuing to flow through the coil 14, L' in the first direction until dissipated. Then, in a third step 550, first switch signal $S_A$ is deactivated which turns the first 538 and fourth 544 transistor switches off, after which the pulse switch signal $S_0$ and the second switch signal $S_B$ are activated, which turns the FET transistor switch 508' and the second 540 and third 542 transistor switches on, thereby providing for current $i_L$ to flow through the coil 14, L' in a second direction. Finally, in a fourth step 552, the pulse switch signal $S_0$ is deactivated without changing the second switch signal $S_B$, thereby providing for the coil 14, L' to magnetically discharge through the second resistor R and diode D, with current $i_L$ continuing to flow through the coil 14, L' in the second direction until dissipated. After the fourth step 552, the above process repeats with the first step 546 as described hereinabove.

Figure 75A:
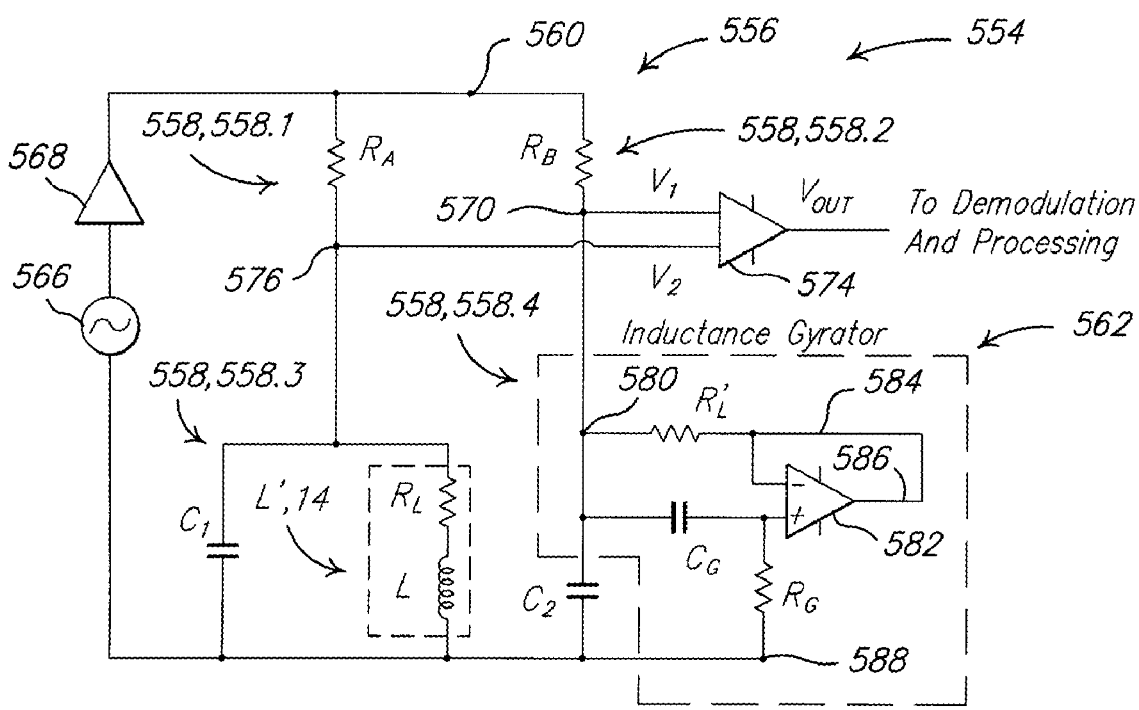
FIG. 75*a* illustrates a third aspect of a signal conditioning circuit that provides for generating one or more measures responsive to a self-impedance of a coil.
Figure 75B:
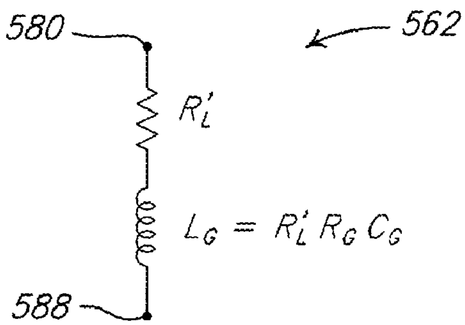
FIG. 75*b* illustrates an equivalent circuit of a gyrator incorporated in the third aspect of the signal conditioning circuit illustrated in FIG. 75*a;*

Referring to FIG. 75*a*, in accordance with a third aspect, a signal conditioning circuit 554 provides for generating one or more measures responsive to a self-impedance $Z_L$ of a coil 14, L' from a measurement of a differential voltage $V_{out}$ of a four-arm bridge circuit 556 incorporating the coil 14, L' as one of the arms 558 thereof. More particularly, for example, in one embodiment of the four-arm bridge circuit 556, the first 558.1 and second 558.2 arms respectively comprise first $R_A$ and second $R_B$ bridge resistors, e.g. for example, of equal value, which are interconnected at a first node 560 of the four-arm bridge circuit 556. The third arm 558.3 comprises the coil 14, L' and the associated cabling, wherein the coil 14, L' is modeled as an inductor L in series with a resistor $R_L$, and the associated cabling and inter-coil capacitance of the coil 14, L' is modeled as a first capacitor $C_1$ in parallel with the coil 14, L'. The fourth arm 558.4 comprises a gyrator 562 in parallel with a second capacitor $C_2$. The third 558.3 and fourth 558.4 arms are interconnected at a second node 564 of the four-arm bridge circuit 556. An oscillator 566 and associated amplifier 568 are interconnected across the first 560 and second 564 nodes, and provide for generating an oscillatory signal, e.g. a sinusoidal signal, thereacross. The second 558.2 and fourth 558.4 arms of the four-arm bridge circuit 556 are interconnected at a third node 570 which is connected to a first input 572 of a differential amplifier 574; and the first 558.1 and third 558.3 arms of the four-arm bridge circuit 556 are interconnected at a fourth node 576 which is connected to a second input 578 of the differential amplifier 574. Accordingly, the two bridge resistors $R_B$ provide for balancing the second 558.2 and fourth 558.4 arms of the four-arm bridge circuit 556, and the combination of the gyrator 562 in parallel with the second capacitor $C_2$ in the fourth arm 558.4 provides for balancing the coil 14, L' in the third arm 558.3, thereby providing for balancing the four-arm bridge circuit 556 so as to null the associated differential voltage $V_{out}$ thereof, which is given by the difference between the voltage $V_1$ at the third node 570 and the voltage $V_2$ at the fourth node 576. The gyrator 562 is an active circuit two terminal circuit using resistive and capacitive elements, which provides for modeling an inductor of arbitrary inductance and series resistance. More particularly, a first gyrator resistor $R_L'$ is connected from a first terminal 580 of the gyrator 562 to the inverting input of an operational amplifier 582, which is also connected by a feedback loop 584 to the output 586 of the operational amplifier 582. A gyrator capacitor $C_G$ is connected from the first terminal 580 of the gyrator 562 to the non-inverting input of the operational amplifier 582, which is also connected to a second gyrator resistor $R_G$, which is then connected to the second terminal 588 of the gyrator 562. Referring to FIG. 75*b*, the equivalent circuit of the gyrator 562 illustrated in FIG. 75*a* comprises a resistor $R_L'$ having a resistance $R_L'$ equal to that of the first gyrator resistor $R_L'$, in series with an inductor $L_G$ having an inductance $L_G$ given as follows:

$$L_G = R_L \cdot R_G \cdot C_G \tag{54}$$

In one embodiment, for example, the resistance $R_G$ of second gyrator resistor $R_G$ is controlled to control the effective inductance $L_G$ of the gyrator 562 so as to balance or nearly balance the four-arm bridge circuit 556, i.e. so that the differential voltage $V_{out}$ is nulled or nearly nulled. The second capacitor $C_2$ is provided to balance the first capacitor $C_1$, wherein, for example, in one embodiment, the value of the second capacitor $C_2$ is set equal to or slightly greater than the value of the first capacitor $C_1$, but would not be required if the associated capacitances of the cabling and coil 14, L' were negligible. The resistance of the first gyrator resistor $R_L$' is provided to balance the combination of the inherent resistance of the coil 14, L', the resistance of the associated cabling, and the effective resistance of proximal eddy currents upon the coil 14, L'. One or both of the first $R_L$' and second $R_G$ gyrator resistors can be made controllable, e.g. digitally controllable, and the value of the gyrator capacitor $C_G$ would be chosen so as to provide for a necessary range of control of the inductance $L_G$ of the gyrator 562 to match that of the coil 14, L', given the associated control ranges of the first $R_L$' and second $R_G$ gyrator resistors. For example, the values of the first $R_L$' and second $R_G$ gyrator resistors can be slowly updated by an associated processor 108, 204 so as to maintain a desired level of balance of the four-arm bridge circuit 556 during normal, non-crash operating conditions. When the four-arm bridge circuit 556 is nulled, i.e. so as to null the differential voltage $V_{out}$, then the values of the resistance $R_L$ and inductance L of the coil 14, L' are given as follows:

$$R_L = R'_L \cdot \frac{R_A}{R_B}, \text{ and} \tag{55}$$

$$L = L_G \cdot \frac{R_A}{R_B} \tag{56}$$

In another embodiment, the inductance $L_G$ of the gyrator 562 is adapted to be slightly lower than the inductance of the coil 14, L' so that the differential voltage $V_{out}$ is not completely nulled, so as to provide a continuous small signal during normal operation, which allows for real-time diagnostics of the coil 14, L' and associated signals and circuitry. Under off-null conditions, the output of the differential amplifier 574 would generally be complex or phasor valued, which would be demodulated, for example into in-phase (I) and quadrature-phase (Q) components,—for example, using circuitry and processes described hereinabove for FIGS. 46-50,—for subsequent processing and/or associated crash detection.

The third aspect of a signal conditioning circuit 554 can be adapted to provide relatively high accuracy measurements, with relatively high resolution, of the self-impedance $Z_L$ of a coil 14, L'.

In either mode of operation, i.e. nulled or off-null, and generally for any of the aspects of the signal conditioning circuits described herein, the associated signal detection process may be implemented by simply comparing the output of the signal conditioning circuit with an associated reference value or reference values, wherein the detection of a particular change in a magnetic condition affecting the coil 14 is then responsive to the change in the associated signal or signals relative to the associated value or reference values. Accordingly, whereas the in-phase (I) and quadrature (Q) phase components of the signal can be determined analytically and related to the associated impedance Z of the coil 14, this is not necessarily necessary for purposes of detecting a change in an associated magnetic condition affecting the coil 14, which instead can be related directly to changes in the associated signals from the signal conditioning circuit.

Figure 76A:
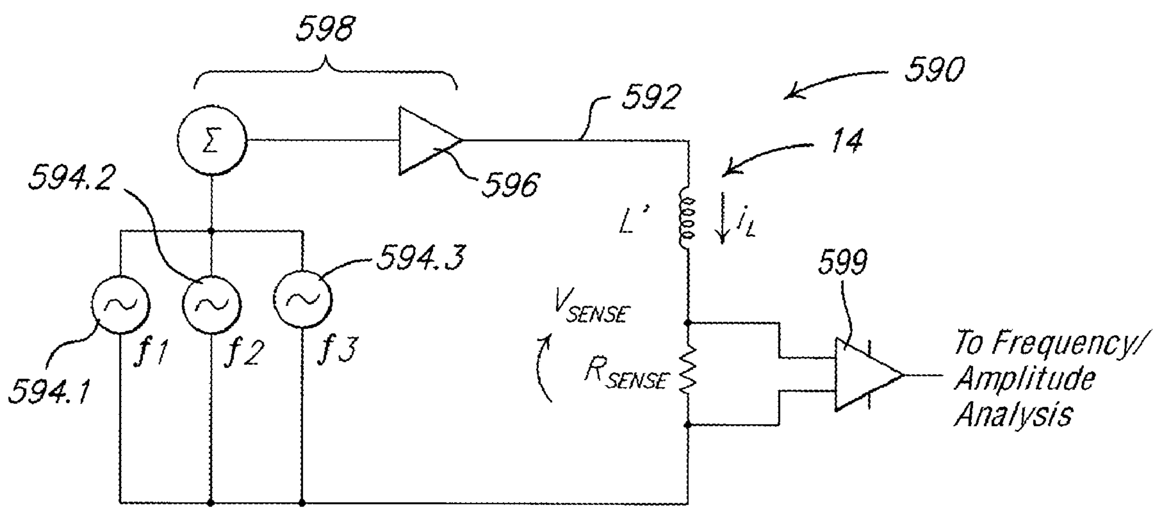
FIG. 76*a* illustrates a fourth aspect of a signal conditioning circuit that provides for generating one or more measures responsive to a self-impedance of a coil.

Referring to FIG. 76*a*, in accordance with a fourth aspect of a signal conditioning circuit 590 that provides for generating one or more measures responsive to a self-impedance $Z_L$ of a coil 14, L', a multi-frequency signal 592 is generated by summing and amplifying a plurality of signals from an associated plurality of oscillators 594.1, 594.2, 594.3 operating at a corresponding plurality of different frequencies $f_1$, $f_2$, $f_3$ that are applied to the coil 14, L' in series with a sense resistor $R_{sense}$, wherein the operations of summing and amplifying may be performed by a operational amplifier 596 adapted as a summing amplifier 598. The self-impedance $Z_L$ of the coil 14, L' at a frequency f is given by:

$$Z_L = R_L + 2\pi f \cdot L \tag{57}$$

wherein $R_L$ and L are the effective resistance and the self-inductance of the coil 14, L', respectively. Accordingly, for a frequency-dependent applied voltage signal v(f) from the summing amplifier 598, the complex voltage $V_{sense}$ across the sense resistor $R_{sense}$ is given by:

$$V_{Sense} = \frac{v(f)}{\left(1 + \frac{R_L}{R_{Sense}}\right)\cdot\left(1 + \frac{f^2}{f_0^2}\right)} \cdot \left(1 - i \cdot \frac{f}{f_0}\right) \tag{58}$$

wherein the cut-off frequency $f_0$ of the associated low-pass filter comprising the coil 14, L' in series with the sense resistor $R_{sense}$ is given by:

$$f_0 = \frac{R_{Sense} + R_L}{2\pi \cdot L} \tag{59}$$

The frequency-dependent current $i_L$ through the coil 14, L' is then given by:

$$i_L = \frac{V_{Sense}}{R_{Sense}} = \frac{v(f)}{R_{Sense}\cdot\left(1 + \frac{R_L}{R_{Sense}}\right)\cdot\left(1 + \frac{f^2}{f_0^2}\right)} \cdot \left(1 - i \cdot \frac{f}{f_0}\right) \tag{60}$$

having a corresponding frequency dependent magnitude $\|i_L\|$ and phase $\phi$ respectively given by:

$$\|i_L\| = \frac{v(f)}{R_{Sense}\cdot\left(1 + \frac{R_L}{R_{Sense}}\right)\cdot\left(1 + \frac{f^2}{f_0^2}\right)^{\frac{1}{2}}}, \text{ and} \tag{61}$$

$$\phi = \tan^{-1}\left(-\frac{f}{f_0}\right) \tag{62}$$

The voltage $V_L$ across the coil 14, L' is given by:

$$V_L = v(f) - V_{Sense} \tag{63}$$

which provides a phase reference and therefore has a phase of 0 degrees. The ratio of the voltage $V_L$ across the coil 14, L' to the current $i_L$ through the coil 14, L' provides a measure of the self-impedance $Z_L$ of a coil 14, L'. The voltage $V_{sense}$ is sensed with a differential amplifier 599, the output of which is operatively coupled to a processor 108, 204 for subsequent analysis.

Figure 76B:
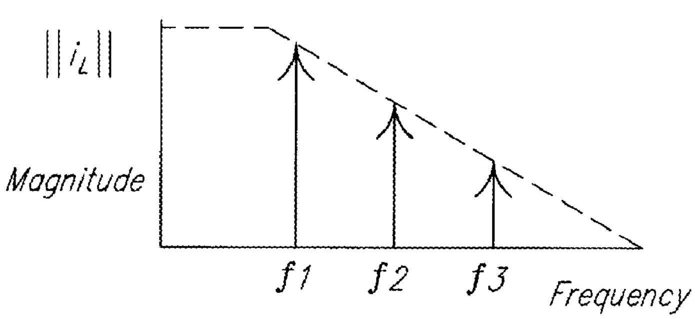
FIG. 76*b* illustrates a frequency dependency of the current through the coil illustrated in FIG. 76*a;*

Referring to FIG. 76*b*, the magnitude $\|i_L\|$ and phase $\phi$ of the current $i_L$ through the coil 14, L' is dependent upon the frequency of the applied voltage signal v(f), and will be different for each of the different associated frequency components associated with the plurality of different frequencies $f_1$, $f_2$, $f_3$. Although a single frequency f can be used, plural frequencies $f_1$, $f_2$, $f_3$ provide additional information that provides some immunity to the affects of noise and electromagnetic interference on the associated measurements. For example, if the frequency-dependent ratio of the voltage $V_{sense}$ across the sense resistor $R_{sense}$ to the applied voltage signal v(f) is inconsistent with that which would be expected from Equation (58) for one or more frequencies $f_1$, $f_2$, $f_3$, then the measurements at those frequencies may be corrupted. Three or more frequencies $f_1$, $f_2$, $f_3$ distributed over a frequency range can provide for determining if any of the associated measurements are affected by a particular noise source.

Although the signal conditioning circuits 294 described herein have been illustrated for generating a measure responsive to a self-impedance of a coil, in general, these signal conditioning circuits 294 may generally be used to measure the impedance of a two terminal circuit element, or a two terminal combination of circuit elements so as to provide for generating a measure responsive to the self-impedance of the two terminal circuit element or the two terminal a combination of circuit elements.

Figure 77:
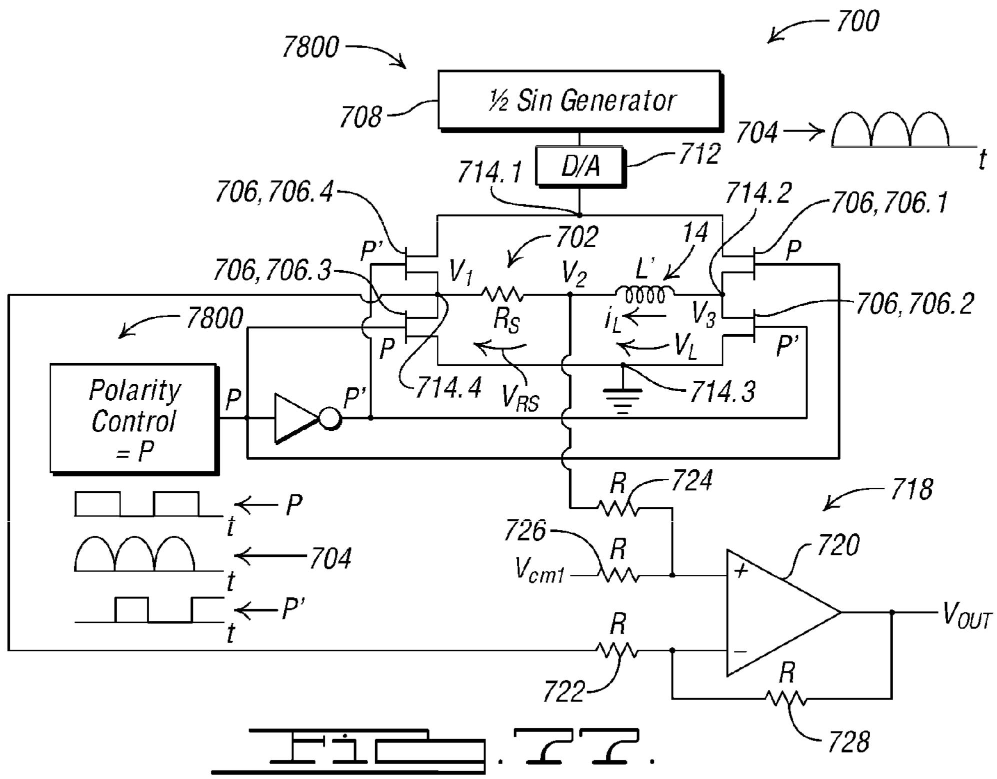
FIG. 77 illustrates a fifth aspect of a signal conditioning circuit that provides for generating one or more measures responsive to a self-impedance of a coil.
Figure 78:
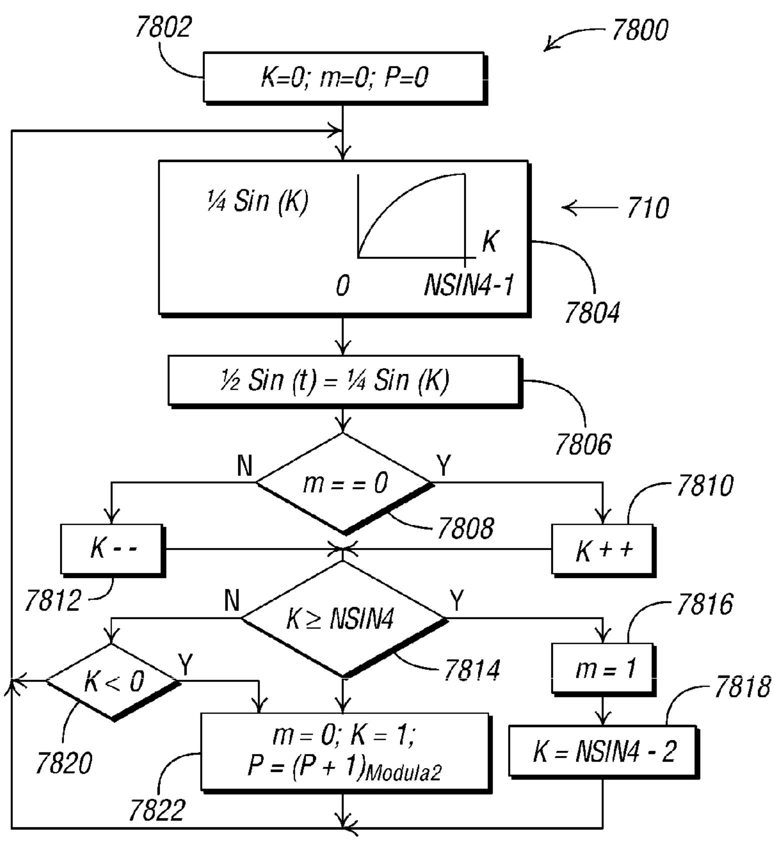
FIG. 78 illustrates a flow chart of a process for generating a half-sine waveform used in the fifth aspect of a signal conditioning circuit illustrated in FIG. 77, and a process for generating a polarity control signal used therein.

Referring to FIGS. 77 and 78, in accordance with a fifth aspect of a signal conditioning circuit 700 that provides for generating one or more measures responsive to a self-impedance $Z_L$ of a coil 14, L', a series circuit 702 incorporating the coil 14, L' in series with a sense resistor $R_S$ is driven by a half-sine signal 704 through an associated H-switch 706 that provides for controlling the polarity of the half-sine signal 704 relative to the series circuit 702. The half-sine signal 704 is generated by a half-sine generator 708, which in one embodiment, digitally generates the half-sine signal 704 using a table-lookup of a quarter-sine waveform 710 and associated software control logic, and also generates a polarity control signal p for controlling the H-switch 706. The digital output of the half-sine generator 708 is converted to the analog half-sine signal 704 using a digital-to-analog converter 712, the output of which can be subsequently filtered to remove noise. The H-switch 706 comprises a first switch 706.1 operative between a first node 714.1 and a second node 714.2, a second switch 706.2 operative between the second node 714.2 and a third node 714.3, a third switch 706.3 operative between the second node 714.2 and a fourth node 714.4, and a fourth switch 706.4 operative between the fourth node 714.4 and the first node 714.1, wherein the half-sine signal 704 is applied to the first node 714.1, the third node 714.3 is connected to ground, and the series circuit 702 is connected between the second 714.2 and fourth 714.4 nodes. For example, in one embodiment, the first 706.1, second 706.2, third 706.3, and fourth 706.4 switches of the H-switch 706 comprise transistor switches, for example, field-effect transistor switches as illustrated in FIG. 77. The control terminals, e.g. gates, of the first 706.1 and third 706.3 switches are operatively coupled to the polarity control signal p, which is also operatively coupled to an inverter 716 that generates an inverse polarity control signal p', which is operatively coupled to the control terminals, e.g. gates, of the second 706.2 and fourth 706.4 switches. The activity of the polarity control signal p and the inverse polarity control signal p' is mutually exclusive, i.e. when the polarity control signal p is in an ON state, so as to turn the first 706.1 and third 706.3 switches on, the inverse polarity control signal p' is in an OFF state, so as to turn the second 706.2 and fourth 706.4 switches off, and when the polarity control signal p is in an OFF state, so as to turn the first 706.1 and third 706.3 switches off, the inverse polarity control signal p' is in an ON state, so as to turn the second 706.2 and fourth 706.4 switches on. Accordingly, for a positive half-sine signal 704, when the polarity control signal p is in the ON state, the H-switch 706 applies the half-sine signal 704 to the series circuit 702 such that current $i_L$ flows therethrough from the second node 714.2 to the fourth node 714.4, and when the polarity control signal p is in the OFF state, the H-switch 706 applies the half-sine signal 704 to the series circuit 702 such that current $i_L$ flows therethrough from the fourth node 714.4 to the second node 714.2. The polarity control signal p and the inverse polarity control signal p' are synchronized with the half-sine signal 704 so that the states thereof are switched after the completion of each half-sine waveform of the half-sine signal 704, the latter of which comprises a continuous repetition of half-sine waveforms.

Referring to FIG. 78, a process 7800 for generating the half-sine signal 704 and the polarity control signal p commences with step (7802), wherein a first counter k, a second counter m, and the polarity control signal p are each initialized to zero. Then, in step (7804), a table-lookup is performed using the value of the first counter k to look up the $k^{th}$ value of the corresponding quarter-sine waveform 710 from a table of NSIN4 values, which in step (7806) is output to the digital-to-analog converter 712 as the value of the half-sine signal 704. Then, in step (7808), if the value of the second counter m, which is associated with the increasing portion of the associated half-sine waveform, is equal to zero, then in step (7810), the value of the first counter k is incremented by one; otherwise, in step (7812), the value of the first counter k is decremented by one. Then, in step (7814), if the value of the first counter k is greater than or equal to NSIN4, the number of values in the quarter-sine table, then, in step (7816), the second counter m is set to a value of one, and, in step (7818), the first counter k is set to a value of NSIN4-2, so as to prepare for generating the decreasing portion of the associated half-sine waveform. Otherwise, from step (7814), if, in step (7820), the value of the first counter k is less than zero, then the half-sine waveform has been competed and, in step (7822), the value of the first counter k is set to one, the value of the second counter m is set to zero, and the value of the polarity control signal p is incremented by one, and then set to the modula-2 value of the result, so as to effectively toggle the polarity control signal p, and so as to prepare for generating the increasing portion of the next half-sine waveform. Then, following any of steps 7818, 7820 or 7822, the process continues with step 7804, so as to repetitively generate the associated half-sine waveform, which provides for the half-sine signal 704.

Accordingly, the half-sine signal 704 in cooperation with the control of the associated H-switch 706 by the polarity control signal p provides for generating the equivalent of a zero-biased sine waveform across the series circuit 702, the current $i_L$ through which is detected by the sum and difference amplifier 718 comprising an operational amplifier 720, the inverting input of which is connected through a first resistor 722 to one terminal of the sense resistor $R_S$, designated by voltage $V_1$, the non-inverting input of which is connected through a second resistor 724 to the other terminal of the sense resistor $R_S$, designated by voltage $V_2$, and through a third resistor 726 to the DC common mode voltage signal $V_{cm1}$, and the output of which is connected through a fourth resistor 728 to the non-inverting input thereof, and which provides the voltage $V_{OUT}$ representative of the current $i_L$ through the coil 14, L', as follows:

$$V_{OUT}=V_2-V_1+V_{CM1}=i_L\cdot R_S+V_{CM1} \quad (64)$$

Figure 79:
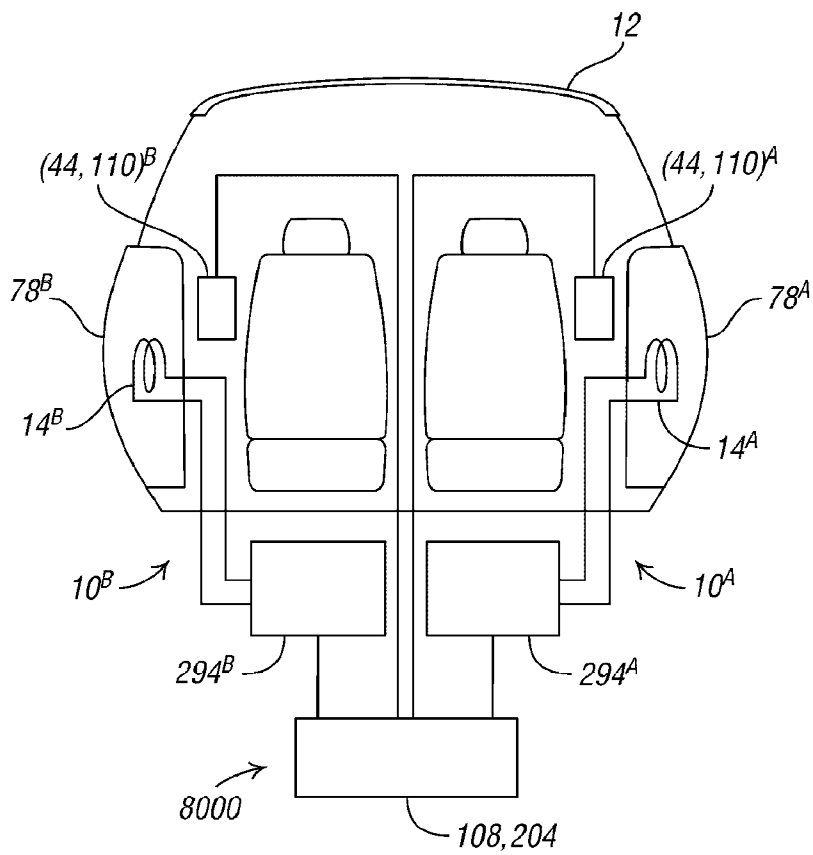
FIG. 79 illustrates a cross-section of a vehicle incorporating safety restraint actuators on opposing sides of a vehicle and associated coils of associated magnetic crash sensors associated with opposing doors of the vehicle, wherein the associated crash sensing systems cooperate with one another to mitigate the affect of electromagnetic noise.
Figure 80:
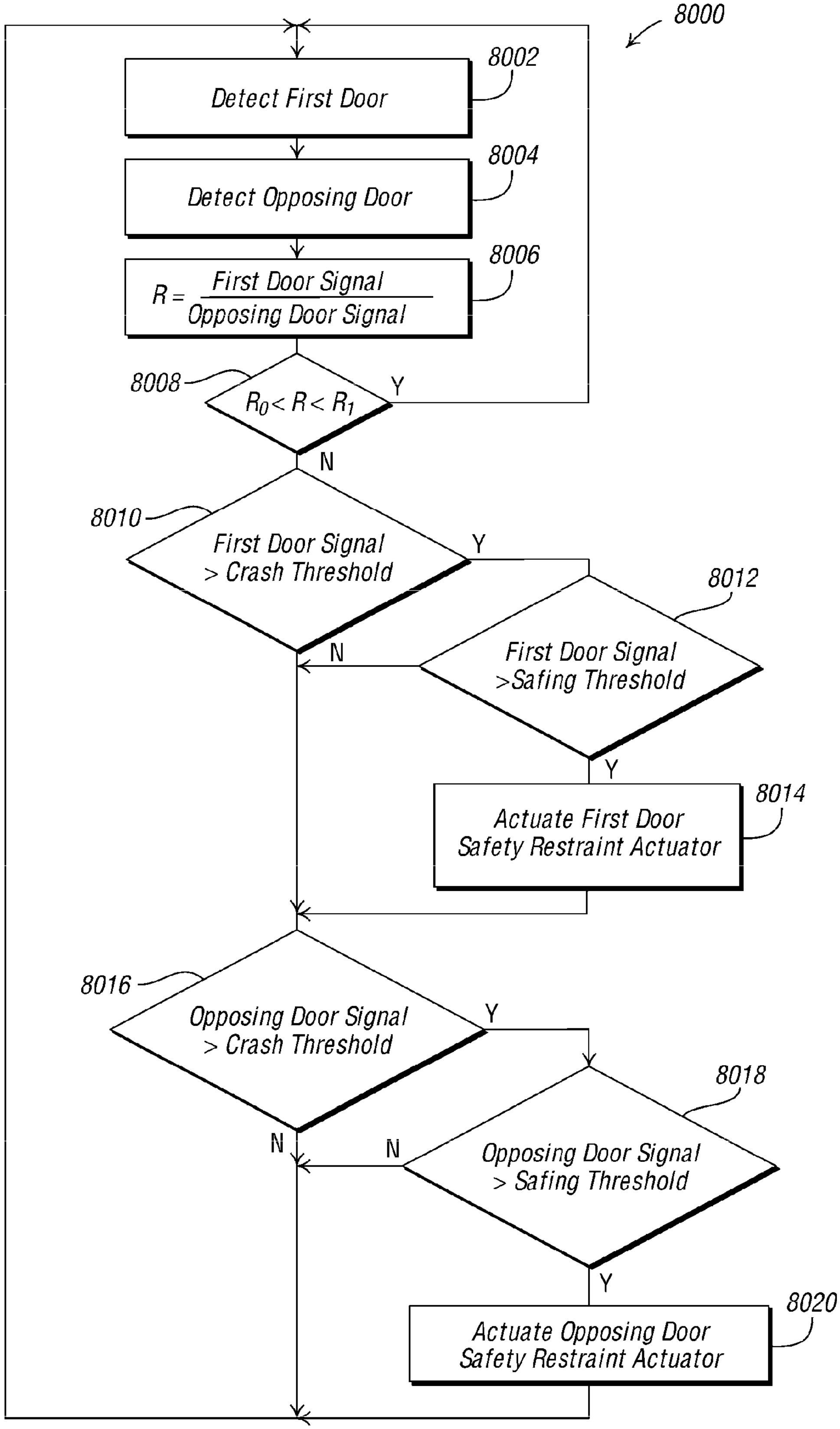
FIG. 80 illustrates a flow chart of a process for controlling the actuation of the safety restraint actuators of the embodiment illustrated in FIG. 79, and for mitigating the affect of electromagnetic noise on the associated magnetic crash sensors.

Referring to FIGS. 79 and 80, the affect of electromagnetic noise on a first magnetic crash sensor $\mathbf{10}^A$ may be mitigated through cooperation with a second magnetic crash sensor $\mathbf{10}^B$, both located so to be responsive to substantially the same electromagnetic noise. For example, in the embodiment illustrated in FIG. 79, the first magnetic crash sensor $\mathbf{10}^A$ comprises a first coil $14^A$ located in a first door $78^A$ of a vehicle 12, and the second magnetic crash sensor $10^B$ comprises a second coil $14^B$ located in a second door $78^B$ of the vehicle 12, wherein the first $78^A$ and second 78 doors are opposing one another so that the first $14^A$ and second $14^B$ coils experience substantially the same external magnetic noise flux that might extend transversely through the vehicle 12. The first magnetic crash sensor $10^A$ further comprises a first signal conditioning circuit $294^A$, for example in accordance with any of the embodiments disclosed herein, operatively coupled to the first coil $14^A$. Similarly, the second magnetic crash sensor $10^B$ further comprises a second signal conditioning circuit $294^B$, for example in accordance with any of the embodiments disclosed herein, operatively coupled to the second coil $14^B$. The outputs of the first $294^A$ and second $294^B$ signal conditioning circuits are operatively coupled to an associated processor 108, 204, which provides for controlling respective first $(44,110)^A$ and second $(44,110)^B$ safety restraint actuators associated with the first $78^A$ and second $78^B$ doors, respectively.

Referring to FIG. 80, the processor 108, 204 operates in accordance with a noise rejection process 8000 that provides for mitigating the affect of electromagnetic noise by preventing actuation of the first $(44,110)^A$ and second $(44,110)^B$ safety restraint actuators if both the first $294^A$ and second $294^B$ signal conditioning circuits detect substantially the same signal, for example, as determined ratiometrically. More particularly, the noise rejection process 8000 commences with steps (8002) and (8004) which provide for detecting signals from the first $14^A$ and second $14^B$ coils, for example, from respective opposing doors $78^A$,$78^B$ of the vehicle 12. Then, in step (8006), a ratio R of the respective signals from the first $294^A$ and second $294^B$ signal conditioning circuits is calculated. Then, in step (8008), if the magnitude of the ratio R is greater than a lower threshold $R_0$ and less than an upper threshold $R_1$—which would occur responsive to an electromagnetic noise stimulus affecting both the first $10^A$ and second $10^B$ magnetic crash sensor—then the process repeats with step (8002), and neither the first $(44,110)^A$ or second $(44,110)^B$ safety restraint actuators are actuated. Otherwise, in step (8010), if the signal from the first magnetic crash sensor $10^A$ is greater than an associated crash threshold, and if, in step (8012), an associated safing condition is satisfied, then, in step (8014), the first safety restraint actuator $(44,110)^A$ is actuated. Then, or otherwise from step (8010), in step (8016), if the signal from the second magnetic crash sensor $10^B$ is greater than an associated crash threshold, and if, in step (8018), an associated safing condition is satisfied, then, in step (8020), the second safety restraint actuator $(44, 110)^B$ is actuated.

Figure 82:
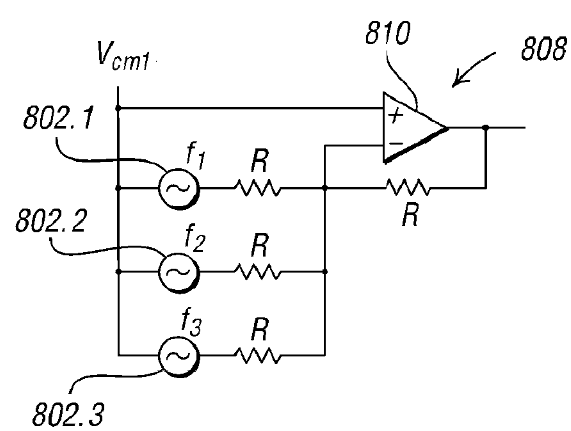
FIG. 82 illustrates a circuit for generating a signal that is a combination of a plurality of separate signals at corresponding different oscillation frequencies.
Figure 81:
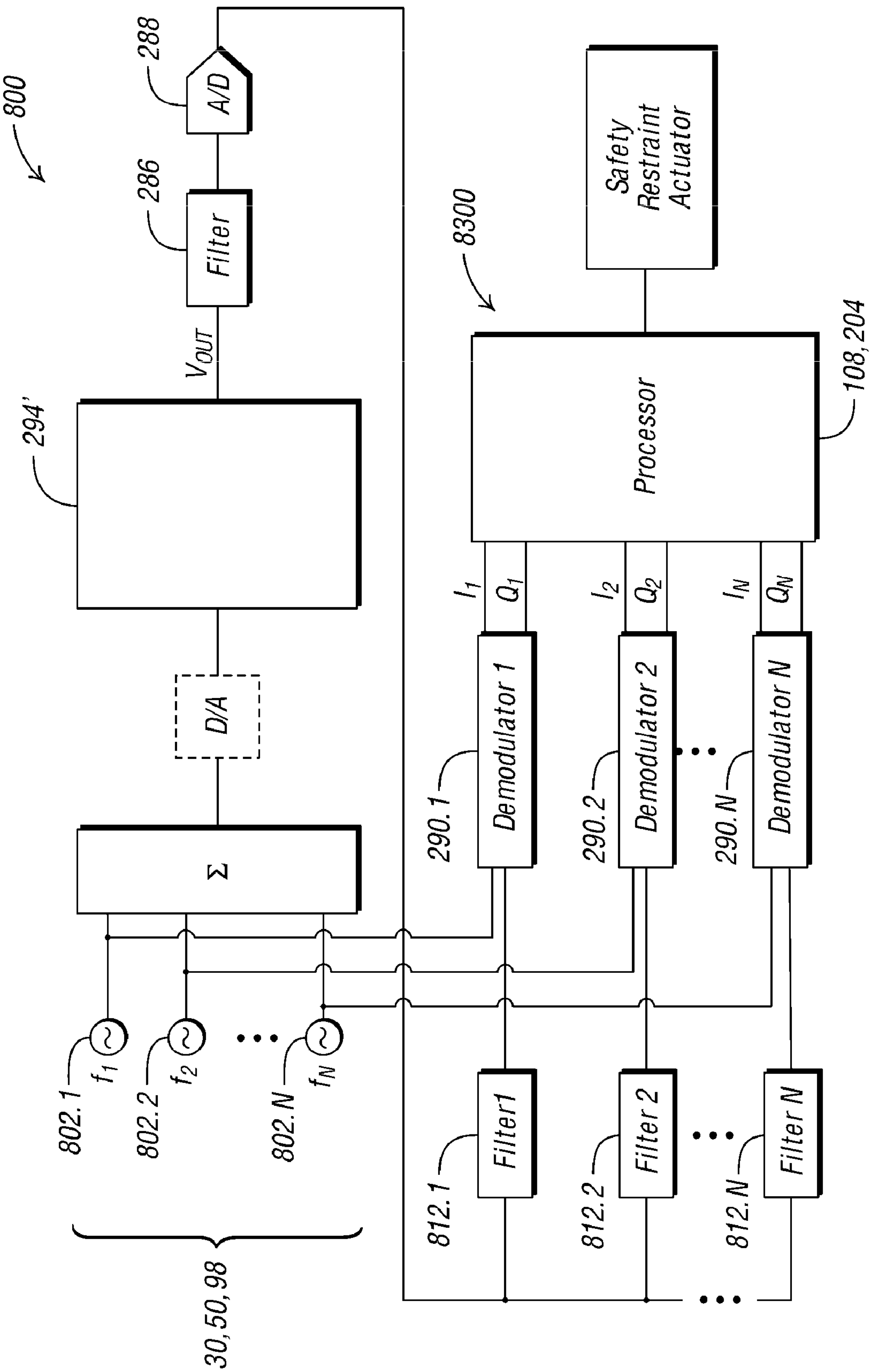
FIG. 81 illustrates a block diagram of a magnetic crash sensing system adapted to mitigate the affect of electromagnetic noise on the associated magnetic crash sensor.

Referring to FIGS. 81 and 82, in accordance with a sixth aspect of a signal conditioning circuit 800 that provides for generating one or more measures responsive to a self-impedance $Z_L$ of a coil 14, L', any of the magnetic crash sensors 10 described herein, including all of the above-described signal conditioning circuits 294, may be adapted to operate at a plurality of frequencies so as to provide for mitigating the affects of electromagnetic noise thereupon. More particularly, the oscillator 30, 50, 98 of any of the above-described embodiments may comprise a multi-frequency generator, for example, that generates either a simultaneous combination of a plurality of oscillatory waveforms, each at a different frequency $f_1$, $f_2$ . . . $f_N$, or that generates a time-multiplexed combination of a plurality of oscillatory waveforms, each at a different frequency. For example, FIG. 81 illustrates a plurality of N oscillators 802.1, 802.2 . . . 802.N, for example, either digital or analog, each at a respective frequency $f_1$, $f_2$ . . . $f_N$, wherein N is at least two. For a composite signal embodiment, the outputs of the N oscillators 802.1, 802.2 . . . 802.N are summed by a summer 804, either analog or digital, so as to generate a corresponding composite waveform, and the output therefrom, if digital, is converted to analog form by a digital-to-analog converter 806. For example, referring to FIG. 82, a composite analog multi-frequency signal may be generated by summing separate analog signals from N separate analog oscillators 802.1, 802.2 . . . 802.N using an inverting summing amplifier circuit 808 comprising an associated operational amplifier 810, which is DC biased by a DC common mode voltage signal $V_{cm1}$. The multi-frequency signal is then used by the remaining portions 294' of the above-described signal conditioning circuits 294 as the signal from the associated oscillator 30, 50, 98, wherein the associated filters of the associated remaining portions 294' of the above-described signal conditioning circuits 294 would be designed to accommodate each of the associated frequencies $f_1$, $f_2$ . . . $f_N$. The output voltage $V_{OUT}$ from either the operational amplifier 278 of the associated summing and difference amplifier 276, or from the first differential amplifier 612, depending upon the particular signal conditioning circuit 294, is then converted to digital form by an analog-to-digital converter 288 after filtering with a low-pass anti-aliasing filter 286. The multi-frequency signal from the analog-to-digital converter 288 is then separated into respective frequency components by a group of digital filters 812.1, 812.2, . . . 812.N, for example, notch filters, each of which is tuned to the corresponding respective frequency $f_1$, $f_2$ . . . $f_N$, the outputs of which are demodulated into respective in-phase $I_1$, $I_2$ . . . $I_N$ and quadrature-phase $Q_1$, $Q_2$ . . . $Q_N$ components by respective demodulators 290.1, 290.2, . . . 290.N, each of which is operatively coupled to the corresponding respective oscillator 802.1, 802.2 . . . 802.N. The output of the demodulators 290.1, 290.2, . . . 290.N is operatively coupled to a processor 108, 204 and used by a process 8300 to control the actuation of an associated safety restraint actuator 44, 110.

Figure 83:
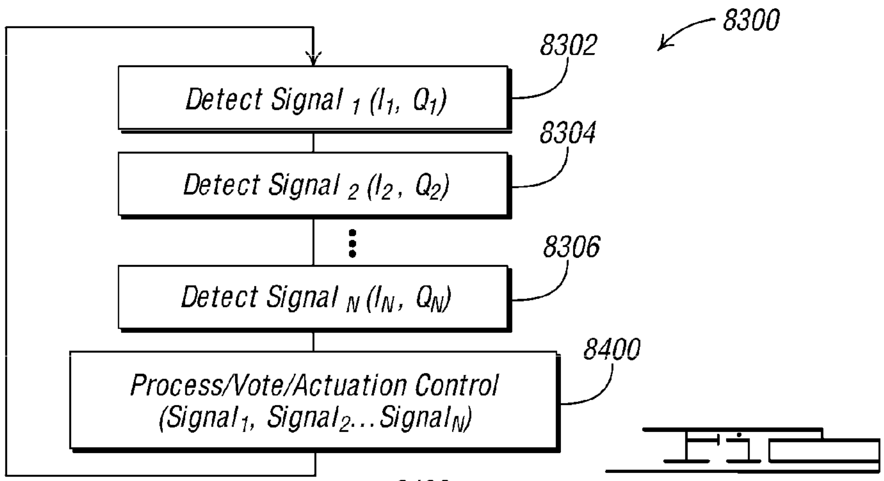
FIG. 83 illustrates a flow chart of a process for detecting signals from the magnetic crash sensing system illustrated in FIG. 81 associated with separate and different oscillation frequencies and for controlling the actuation of an associated safety restraint actuator responsive thereto while mitigating the affect of electromagnetic noise on the associated magnetic crash sensor.

For example, referring to FIG. 83, in one embodiment of a process 8300 for controlling a safety restraint actuator 44, 110 responsive to signals from a multi-frequency embodiment of a magnetic crash sensors 10, the respective in-phase $I_1$, $I_2$ . . . $I_N$ and quadrature-phase $Q_1$, $Q_2$ . . . $Q_N$ components from the demodulators 290.1, 290.2, . . . 290.N are detected in steps (8302), (8304) and (8306) respectively, and are then processed in step (8400) so as to determine whether or not to actuate the associated safety restraint actuator 44, 110, after which the process repeats with step (8302).

Figure 84:
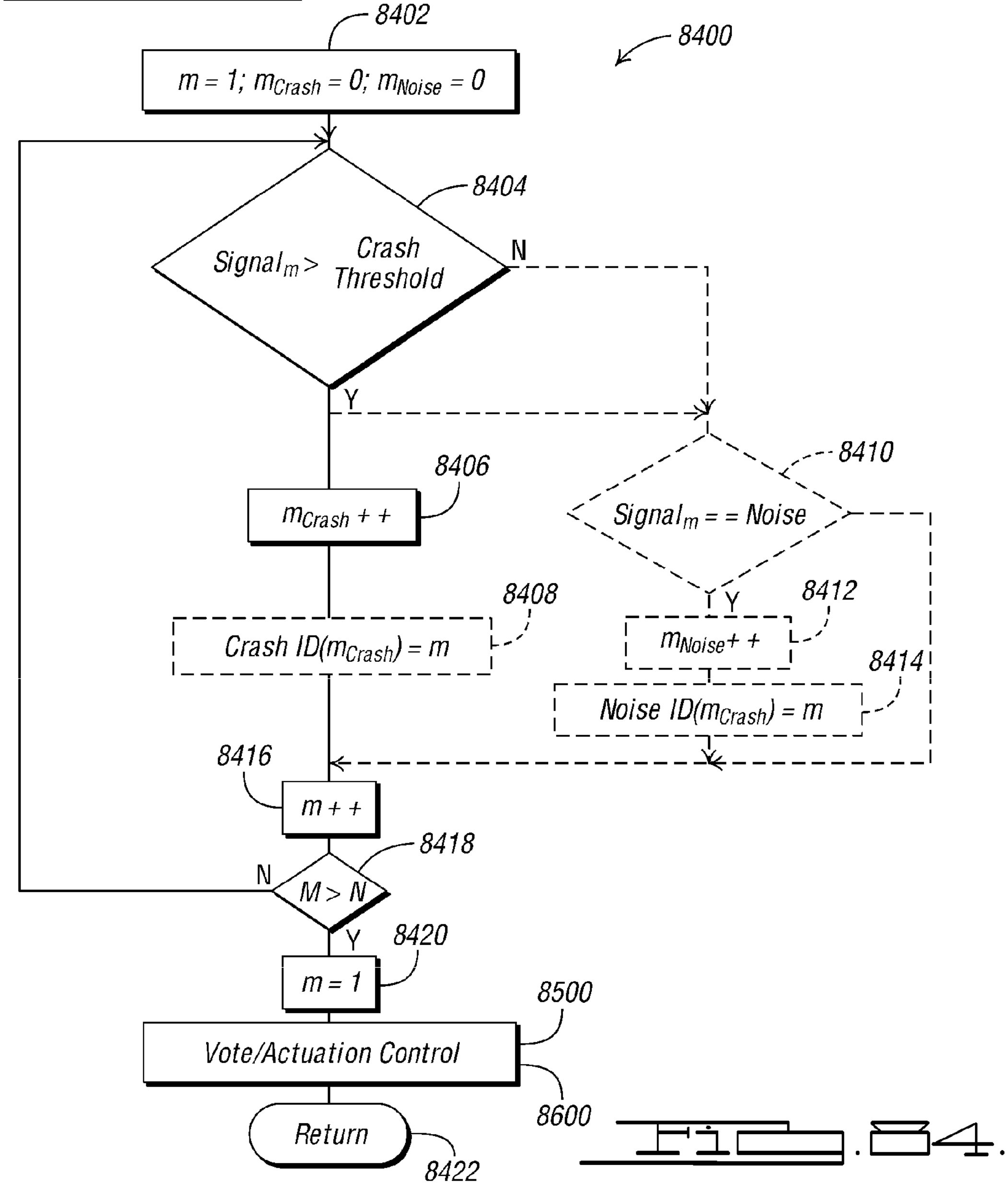
FIG. 84 illustrates a flow chart of a sub-process of the process illustrated in FIG. 83, wherein the sub-process provides for determining which of the signals from the magnetic crash sensing system illustrated in FIG. 81 are representative of a crash.

Referring to FIG. 84, one embodiment of a sub-process 8400 for controlling a safety restraint actuator 44, 110 responsive to signals from a multi-frequency embodiment of a magnetic crash sensors 10 commences with step (8402), wherein a counter m is initialized to 1, a crash counter $m_{CRASH}$ is initialized to zero, and if used, a noise counter $m_{NOISE}$ is also initialized to zero. Then, in step (8404), if the signal $SIGNAL_m$—comprising in-phase $I_m$ and quadrature-phase $Q_m$ components—exceeds a corresponding crash threshold, then, in step (8406), the crash counter $m_{CRASH}$ is incremented, and optionally, in step (8408), the associated frequency channel represented thereby is stored in an associated CrashID vector for use in subsequent processing. In an alternative supplemental embodiment, wherein a noise signal can be identified from a distinguishing characteristic of the signal $SIGNAL_m$, then, from step (8404), if the signal $SIGNAL_m$ is identified as noise, then in step (8412), the noise counter $m_{NOISE}$ and optionally, in step (8414), the associated frequency channel represented thereby is stored in an associated NoiseID vector for use in subsequent processing. Then, from either step ($\mathbf{8408}$) or step (8414), in step (8416), the counter m is incremented so as to set up for processing the next frequency component. Then, in step (8418), if the value of the counter m is greater than the total number N of frequency components, then in step (8420), the counter m is reset to one, a further sub-process (8500) or (8600) is called to determine whether or not to actuate the associated safety restraint actuator 44, 110, and the sub-process then returns control in step (8422). Otherwise, from step (8418), the process repeats with step (8404) until all frequency components have bee processed.

Figure 85:
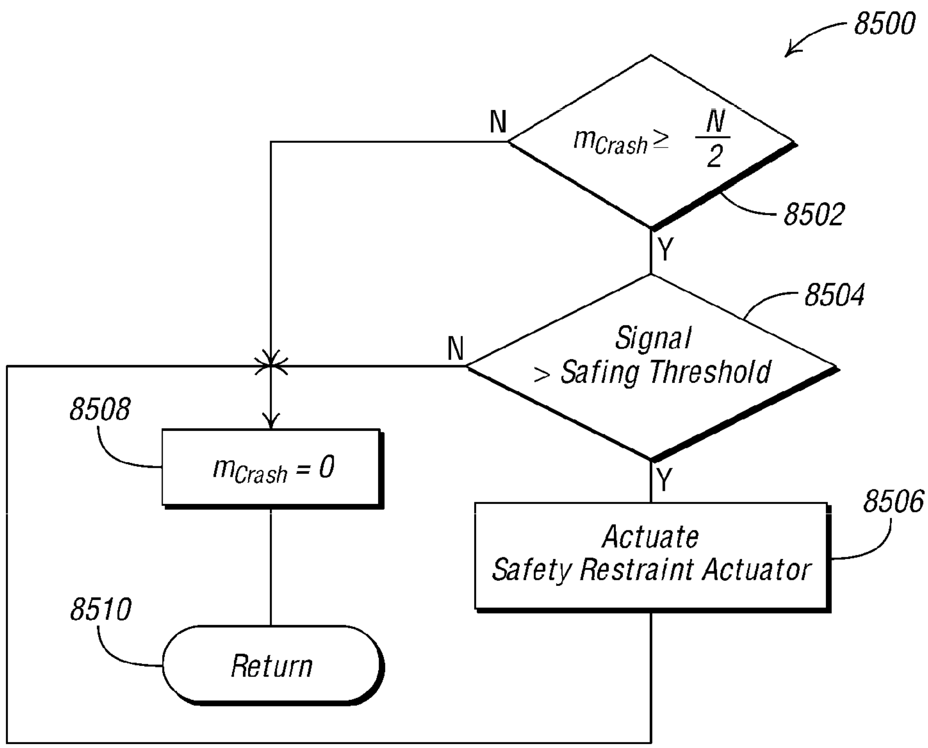
FIG. 85 illustrates a flow chart of a first embodiment of a sub-process of the process illustrated in FIG. 84, wherein the first embodiment of the sub-process provides for voting and for controlling the actuation of an associated safety restraint actuator responsive thereto, so as to provide for mitigating the affect of electromagnetic noise on the associated magnetic crash sensor.

Referring to FIG. 85, in accordance with sub-process (8500) which provides for voting to determine whether or not to actuate the associated safety restraint actuator 44, 110, if for a majority of frequency components the signal $SIGNAL_m$ has exceeded the corresponding crash threshold in step (8404), i.e. if the value of the crash counter $m_{CRASH}$ exceeds the total number N of frequency components, then, in step (8504), if the associated safing threshold is also exceeded by the signal from the associated safing sensor, then, in step (8506), the safety restraint actuator 44, 110 is actuated. Otherwise, or from step (8506), in step (8508), the crash counter $m_{CRASH}$ is initialized to zero, and the sub-process returns control in step (8510). An odd number N of frequencies $f_1$, $f_2 \ldots f_N$ will prevent a tie in the associated voting process.

Figure 86:
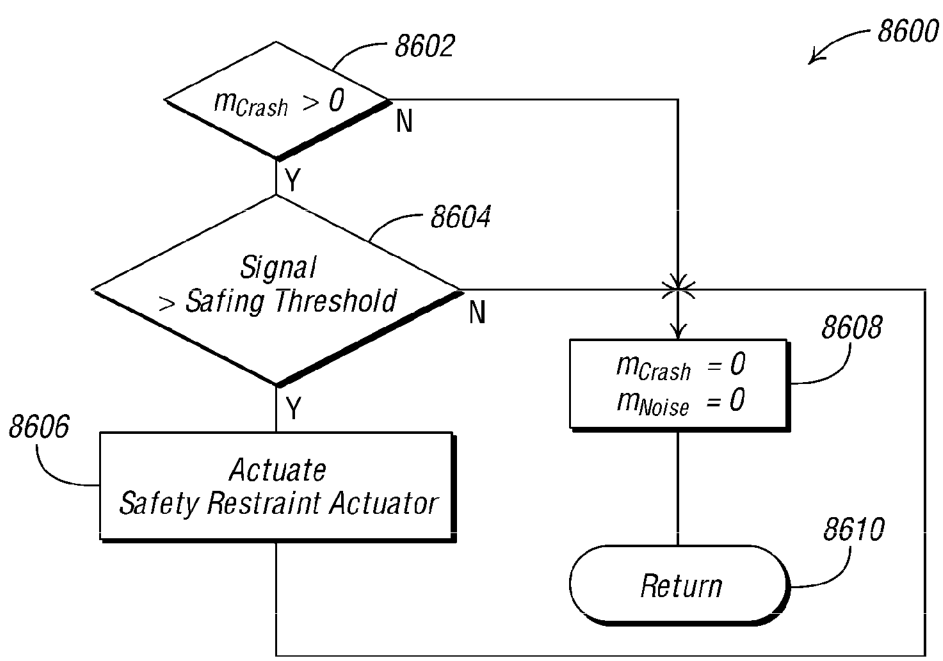
FIG. 86 illustrates a flow chart of a second embodiment of a sub-process of the process illustrated in FIG. 84, wherein the second embodiment of the sub-process provides for controlling the actuation of an associated safety restraint actuator responsive any of the signals that are indicative of a crash but which are not indicative of electromagnetic noise, so as to provide for mitigating the affect of electromagnetic noise on the associated magnetic crash sensor.

Alternatively, referring to FIG. 86, in a system for which a crash signal can be distinguished from noise on a channel-by-channel basis, if, in step (8602), the crash counter $m_{CRASH}$ has a value greater than zero, or possibly greater than some other predetermined threshold, then, in step (8604), if the associated safing threshold is also exceeded by the signal from the associated safing sensor, then, in step (8606), the safety restraint actuator 44, 110 is actuated. Otherwise, or from step (8606), in step (8608), the crash counter $m_{CRASH}$ and the noise counter $m_{NOISE}$ are initialized to zero, and the sub-process returns control in step (8610).

The selection and separation of the frequencies $f_1, f_2 \ldots f_N$ is, for example, chosen so as to increase the likelihood of simultaneous interference therewith by electromagnetic interference (EMI), which can arise from a number of sources and situations, including, but not limited to electric vehicle noise, telecommunications equipment, television receivers and transmitters, engine noise, and lightning. For example, in one embodiment, the frequencies are selected in a range of 25 KHz to 100 KHz. As the number N increases, the system approaches spread-spectrum operation.

It should be understood that frequency diversity may be used with any known magnetic sensor technology, including crash, safing or proximity detection that include but are not limited to systems that place a winding around the undercarriage, door opening or hood of the automobile, place a winding around the front fender of the automobile, placing a ferrite rod inside the hinge coil, or inside the striker coil for magnetic focusing, placing a ferrite rod coil in the gap or space between the doors, or placing a supplemental first coil on the side view rear molding which extends sideward away from the vehicle. This algorithm can also be used with signals that are generated by the magnetic sensor that set up alternate frequencies to create system safing on the rear door to enhance the system safing of the front door, AM, FM or pulsed demodulation of the magnetic signature multitone, multiphase electronics, a magnetically biased phase shift oscillator for low cost pure sine wave generation, a coherent synthetic or phase lock carrier hardware or microprocessor based system, a system of microprocessor gain or offset tuning through D/A then A/D self adjusting self test algorithms, placing a standard in the system safing field for magnetic calibration, inaudible frequencies, and the like.

It should also be understood that the performance of the coil 12 used for either generating or sensing a magnetic field can be enhanced by the incorporation of an associated magnetic core of relatively high magnetic permeability. It should also be understood that the signal applied to either at least one first coil, second coil, or of any other coils could be a direct current signal so as to create a steady magnetic field. Furthermore, it should be understood that the particular oscillatory wave form of the oscillators is not limiting and could be for example a sine wave, a square wave, a saw tooth wave, or some other wave form of a single frequency, or a plural frequency that is either stepped or continuously varied or added together and sent for further processing therefrom.

It should be noted that any particular circuitry may be used such as that not limited to analog, digital or optical. Any use of these circuits is not considered to be limiting and can be designed by one of ordinary skilled in the art in accordance with the teachings herein. For example, where used, an oscillator, amplifier, or large scaled modulator, demodulator, and a deconverter can be of any known type for example using transistors, field effect or bipolar, or other discrete components; integrated circuits; operational amplifiers or logic circuits, or custom integrated circuits. Moreover, where used a microprocessor can be any computing device. The circuitry and software for generating, mixing demodulating and processing the sinusoidal signals at multiple frequencies can be similar to that used in other known systems.

Magnetic crash sensors and methods of magnetic crash sensing are known from the following U.S. Pat. Nos. 6,317,048; 6,407,660; 6,433,688; 6,583,616; 6,586,926; 6,587,048; 6,777,927; and 7,113,874; the following U.S. patent application Ser. No. 10/666,165 filed on 19 Sep. 2003; and Ser. No. 10/905,219 filed on 21 Dec. 2004; and U.S. Provisional Application No. 60/595,718 filed on 29 Jul. 2005; all of which are commonly assigned to the Assignee of the instant application, and all of which are incorporated herein by reference.

Figure 87:
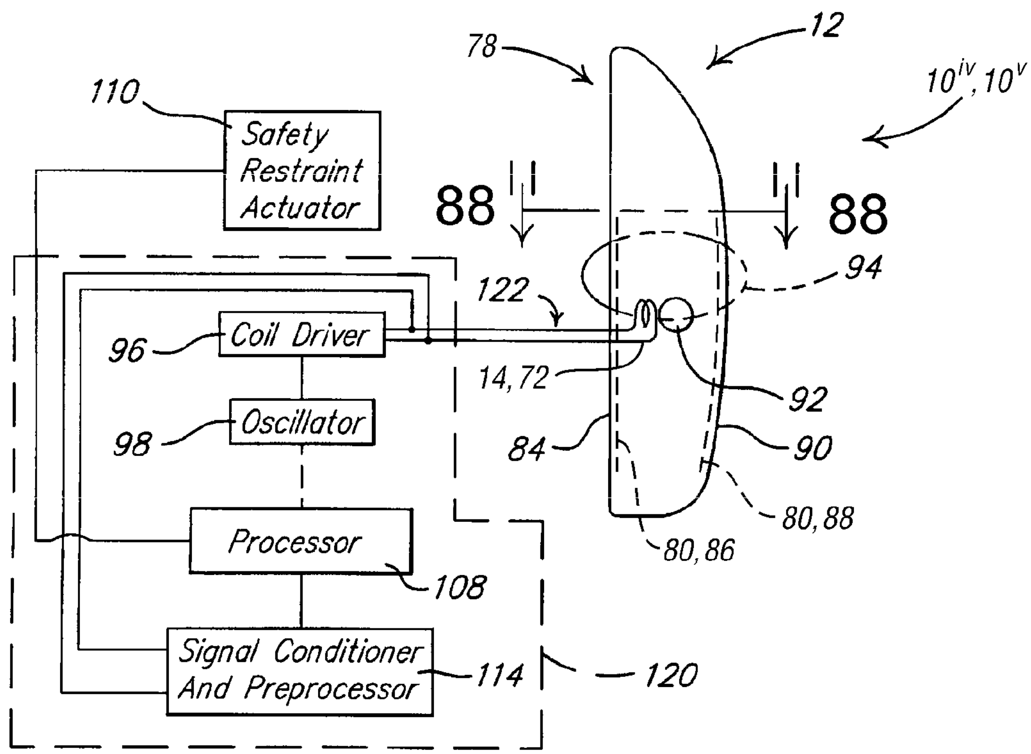
FIG. 87 illustrates a fifth embodiment of the first aspect of a magnetic crash sensor in the door of a vehicle, showing an end view cross-section of the door.
Figure 88:
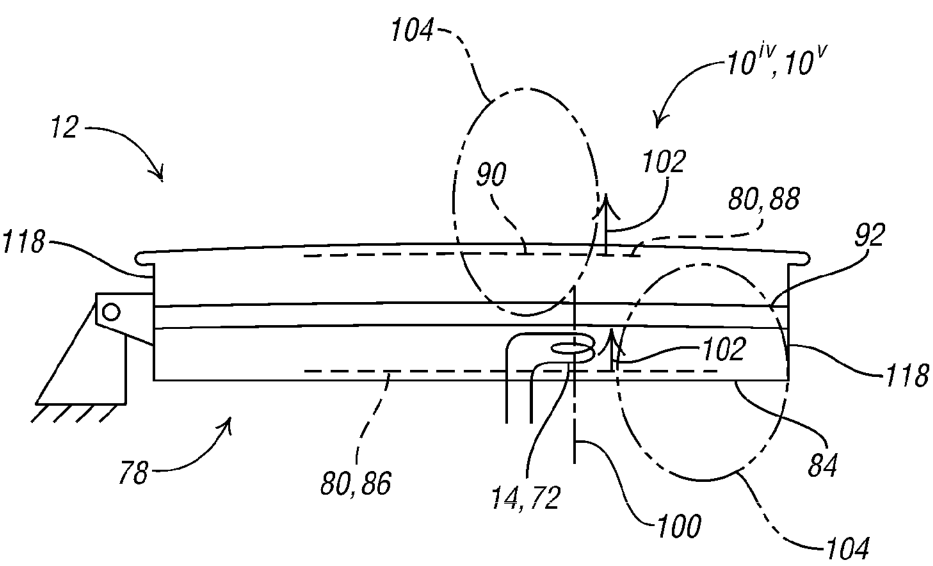
FIG. 88 illustrates the fourth embodiment of the first aspect of the magnetic crash sensor in the door of the vehicle, showing a top view cross-section of the door.

Referring to FIGS. 87 and 88, in accordance with fourth $\mathbf{10.1}^{iv}$ and fifth $\mathbf{10.1}^{v}$ embodiments of the first aspect of a magnetic crash sensor $\mathbf{10.1}^{iv}$, $\mathbf{10.1}^{v}$ adapted to sense a side impact crash, at least one coil 14, 72 is operatively associated with a first portion 76 of a door 78 of a vehicle 12, and is adapted to cooperate with at least one conductive element 80 that is operatively associated with, or at least a part of, a proximate second portion 82 of the door 78. The fourth $\mathbf{10.1}^{iv}$ and fifth $\mathbf{10.1}^{v}$ embodiments of the first aspect of a magnetic crash sensor 10.1"" are similar to the third embodiment of the first aspect of a magnetic crash sensor 10.1''' described hereinabove, except for the locations of the associated at least one coil 14, 72 and at least one of the associated at least one conductive element 80, respectively, wherein in the fourth embodiment $\mathbf{10.1}^{iv}$, at least one coil 14, 72 is operatively associated with a portion of the vehicle that is subject to deformation responsive to a crash, and in the fifth embodiment $\mathbf{10.1}^{v}$, at least one associated conductive element 80 is operatively associated with a portion of the vehicle that is relatively isolated from or unaffected by the crash for at least an initial portion of the crash.

For example, in the combination of the fourth $\mathbf{10.0}^{iv}$ and fifth $\mathbf{10.1}^{v}$ embodiments illustrated in FIGS. 87 and 88, the first portion 76 of the door 78 comprises the door beam 92 of the door 78, and the at least one conductive element 80 comprises either just a first conductive element 86 operatively associated with the inner panel 84 of the door 78 constituting a second portion 82 of the door 78; or first 86 and second 88 conductive elements at the inner panel 84 and outer skin 90 of the door 78, respectively, constituting respective second portions 82 of the door 78. For example, if the inner panel 84 of the door 78 were non-metallic, e.g. plastic, a first conductive element 86 could be operatively associated therewith, for example, either bonded or otherwise fastened thereto, so as to provide for cooperation there of with the at least one coil 14, 72. Alternatively, the inner panel 84, if conductive, could serve as the associated conductive element 80 without requiring a separate first conductive element 86 distinct from the inner panel 84 of the door 78; or the outer skin 90, if conductive, could serve as the associated conductive element 80 without requiring a separate second conductive element 88 distinct from the outer skin 90 of the door 78.

The at least one coil 14, 72 is electrically conductive and is adapted for generating a first magnetic field 94 responsive to a current applied by a coil driver 96, e.g. responsive to a first oscillatory signal generated by an oscillator 98. The magnetic axis 100 of the at least one coil 14, 72 is oriented towards the second portion 82 of the door 78—e.g. towards the inner panel 84 of the door 78, or towards both the inner panel 84 and outer skin 90 of the door 78, e.g. substantially along the lateral axis of the vehicle for the embodiment illustrated in FIGS. 87 and 88—so that the first magnetic field 94 interacts with the conductive elements 80, 86, 88 operatively associated therewith, thereby causing eddy currents 102 to be generated therein in accordance Lenz's Law. Generally the coil 14, 72 comprises an element or device that operates in accordance with Maxwell's and Faraday's Laws to generate a first magnetic field 94 responsive to the curl of an associated electric current therein, and similarly to respond to a time-varying first magnetic field 94 coupled therewith so as to generate a voltage or back-EMF thereacross responsive thereto, responsive to the reluctance of the magnetic circuit associated therewith. For example, the at least one coil 14, 72 may comprise a coil of wire of one or more turns, or at least a substantial portion of a turn, wherein the shape of the coil 14, 72 is not limiting, and may for example be circular, elliptical, rectangular, polygonal, or any production intent shape. For example, the coil 14, 72 may be wound on a bobbin, and, for example, sealed or encapsulated, for example, with a plastic or elastomeric compound adapted to provide for environmental protection and structural integrity. The resulting coil assembly may further include a connector integrally assembled, e.g. molded, therewith. Alternatively, the at least one coil 14, 72 may be formed by wire bonding, wherein the associated plastic coating is applied during the associated coil winding process.

For example, in one embodiment, an assembly comprising the at least one coil 14, 72 is positioned within the door 78 of the vehicle 12 so that the magnetic axis 100 of the at least one coil 14, 72 is substantially perpendicular to the inner panel 84 of the door 78, wherein the inner panel 84 is used as an associated sensing surface. Alternatively, the mounting angle relative to the inner panel 84 may be optimized to account for the shape of the associated metal surface and the relative proximity and influence of an associated door beam 92 or other structural elements relative to the inner panel 84.

In one embodiment, the radius of the coil 14, 72 is adapted to be similar to or greater than the initial distance to the principal or dominant at least one conductive element 80 being sensed thereby. The coil 14, 72 does not require any particular shape, and regardless of the shape, the associated effective sensing distance can be measured experimentally. The particular distance of the coil 14, 72 from the element or surface being sensed will depend upon the particular application. Generally, a range of mounting distances is possible. For example, the mounting distance may be determined by a combination of factors including, but not limited to, the conductivity of the conductive element, the coil size, the range of crash speeds that the coil is designed to sense before being damaged by contact with the conductive element, and the desired time to fire performance for specific crash events.

For example, in one embodiment, a coil 14, 72 of about 10 cm in diameter is located about 40 mm from the inner panel 84 of the door 78, which provides for monitoring about as much as 40 mm of stroke of coil 14, 72 motion, depending upon where along the length of the door beam 92 the coil 14, 72 is mounted and depending upon the door beam 92 intrusion expected during threshold ON (i.e. minimal severity for ON condition) and OFF (i.e. maximal severity for OFF condition) crash events for which the associated safety restraint actuator 44 should preferably be either activated or not activated, respectively. For example, in one embodiment, the location of the coil 14, 72 is adapted so that the associated motion thereof is relatively closely correlated to the bending of the door beam 92. For example, in an alternative mounting arrangement, the coil 14, 72 might be operatively associated with the outer skin 90 of the door 78 if the associated signal therefrom were sufficiently consistent and if acceptable to the car maker. For example, a CAE (Computer Aided Engineering) analysis involving both crash structural dynamics and/or electromagnetic CAE can be utilized to determine or optimized the size, shape, thickness—i.e. geometry—of the coil 14, 72 that both satisfies associated packaging requirements within the door 78 and provides sufficient crash detection capability. The position of the coil 14, 72 may be chosen so that a signal from the coil 14, 72 provides for optimizing responsiveness to a measure of crash intrusion for ON crashes, while also providing for sufficient immunity to OFF crashes, for both regulatory and real world crash modes. For example, the coil 14, 72 operatively associated with the door beam 92 may be adapted to be responsive to the inner panel 84, a conductive element 80, 86 operatively associated therewith, the outer skin 90, or a conductive element 80, 88 operatively associated therewith, either individually or in combination. The bending motion of the door beam 92 relative to the inner panel 84 has been found to be most reliable, however the initial motion of the outer skin 90 can be useful for algorithm entrance and for rapid first estimate of crash speed.

The position, size, thickness of the chosen sensor coil 14, 72 are selected to fit within the mechanical constraints of and within the door 78 associated with electrical or mechanical functions such as window movement, door 78 locks, etc.

Figure 90:
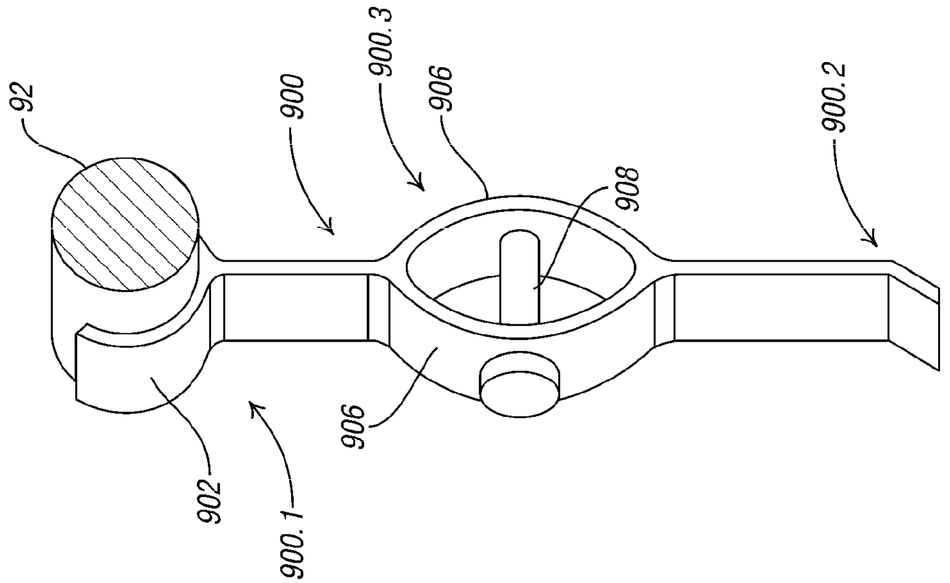
FIG. 90 illustrates a bracket in cooperation with a door beam in accordance with the first embodiment of a coil attachment in accordance with the fourth embodiment of the first aspect of the magnetic crash sensor in the door of the vehicle.
Figure 89:
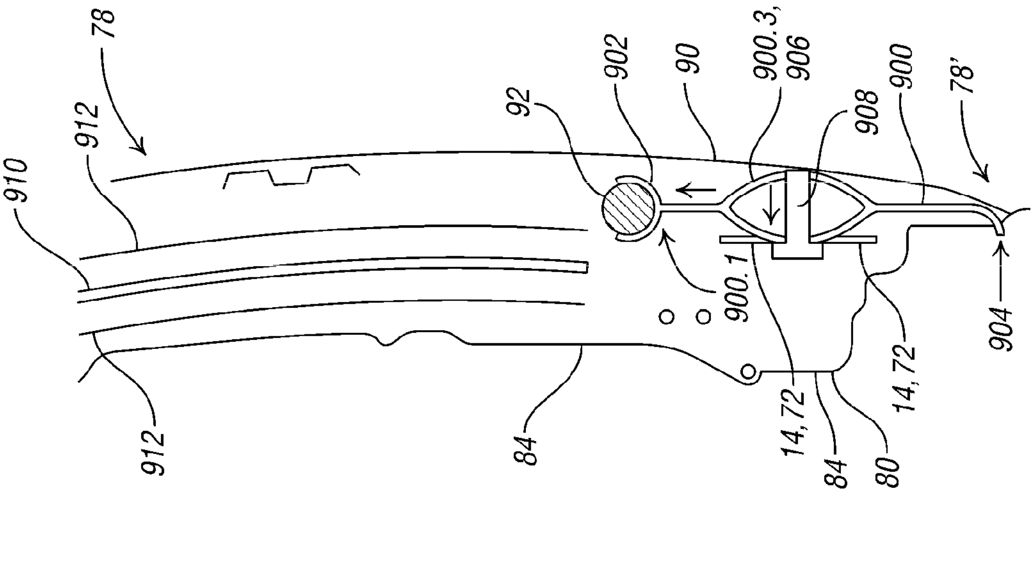
FIG. 89 illustrates a first embodiment of a coil attachment in accordance with the fourth embodiment of the first aspect of the magnetic crash sensor in the door of the vehicle.

For example, referring to FIGS. 89 and 90, in accordance with a first embodiment of a coil attachment, the coil 14, 72 is attached to a bracket 900 which is clamped between the door beam 92 and a lower portion 78' of the door 78, so as to provide for operatively associating the coil 14, 72 with the door beam 92 so that the coil 14, 72 will move—i.e. rotate and translate—relative to the inner panel 84 of the door 78 responsive to an inward bending motion of the door beam 92 relative thereto responsive to a crash. The bracket 900 comprises a saddle portion 902 at a first end 900.1 thereof that shaped—, e.g. having a similarly shaped contour—so as to provide for engaging the door beam 92. A second end 900.2 of the bracket 900 is adapted to wedge into a lower portion 78' of the door 78, for example, to engage a preexisting weep hole 904, an added hole, on an inboard side of the lower portion 78' of the door 78. A central portion 900.3 of the bracket 900 is provided with a hollow portion 906 which is adapted with a bolt 908 that, when tightened, provides for collapsing the hollow portion 906 and thereby elongating the bracket 900, so that the bracket 900—with the coil 14, 72 attached thereto—becomes clamped between the door beam 92 and the lower portion 78' of the door 78. For example, the coil 14, 72 may be attached to the bracket 900 using the bolt 908, wherein the coil 14, 72 is located on the side of the bracket 900 proximate to the inner panel 84 of the door 78. Accordingly, the coil 14, 72 is located below the window 910 and associated window guides 912 within the door 78. Alternatively, the second end 900.2 of the bracket 900 could be fastened to the lower portion 78' of the door 78, for example, by bolting, riveting, welding or bonding, and the bracket 900 could be designed to bend allowing the coil 14, 72 to approach the inner panel 84 as the door beam 92 bends inwardly. Alternatively, the bracket 900 could be adapted to provide for connecting the first end 900.1 to the door beam 92 by either a scissors-type mechanism, or with a lip to provide for attachment thereto using a worm-gear type clamp at least partially around the door beam 92.

The bracket 900, for example, may be constructed of either a ferromagnetic material, e.g. steel, some other conductive material, e.g. aluminum, or a non-conductive material, e.g. plastic. A nonconductive bracket 900 could increase the coil sensitivity of the coil 14, 72 to relative motion of other conductive target structures while a conductive bracket 900 could provide directional shielding to lessen the signal from the coil 14, 72 responsive to conductive door structures on the side of the bracket 900. A bracket could be made of both materials, for example, a steel part that is welded to the beam and a plastic part that is bolted to the steel part to provide for easy attachment of the coil and bracket to the beam.

Figure 91:
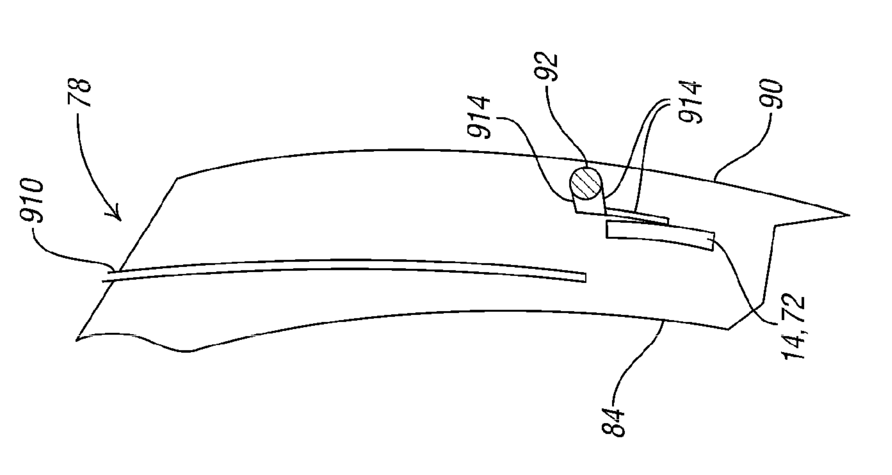
FIG. 91 illustrates a second embodiment of a coil attachment in accordance with the fourth embodiment of the first aspect of the magnetic crash sensor in the door of the vehicle.

For another example, referring to FIG. 91, in accordance with a second embodiment of a coil attachment, the coil 14, 72 is attached to a bracket 914 that depends from the door beam 92, for example, by welding thereto, attachment to a flange dependent therefrom, or using any type locking clip-on or clamp technique that would cooperate with either a hole in the door beam 92 or a protrusion therefrom.

The bending of the door beam 92 responsive to a crash is relatively consistent and predictable, wherein the amount of bending is proportional to total crash energy and the rate of bending is proportional to crash speed. The material properties of the door beam 92, e.g. relatively high yield strength, provide for relatively more uniform beam flexing sustained over significant beam bending. Furthermore, the strength and end mounting of the door beam 92 provides for relatively similar bending patterns regardless of the location on the door beam 92 where a crash force is applied. Abuse impacts to the door by lower mass, higher speed objects will generally cause the primary door beam 92 to deflect a small amount, but possibly at an initially high rate of speed. Abuse impacts to the door by higher mass, low speed objects may result in larger total main door beam 92 deflections, but at a substantially lower rate of the deflection. Mechanical abuse events can be ignored using a signal from the coil 14, 72—moving with the door beam 92—responsive to the inner panel 84 of the door 78. Although, the coil 14, 72 can be located almost anywhere along the door beam 92, locating the coil 14, 72 near the center third of the door beam 92 will provide the most consistent response. Also, locating the coil 14, 72 relatively near the center of the door beam 92 will provide for a more rapid displacement of the coil 14, 72 toward the inner panel 84 so as to provide a more rapid increase in the signal-to-noise ratio of the signal from the coil 14, 72 during a crash event. Rotation of the door beam 92 during the crash stroke, resulting from the off-axis inertia of the coil 14, 72 and its bracket 914, can be reduced by reducing the mass of the coil 14, 72 and bracket 914, and by locating their combined center of mass relatively close to the height of the center of the door beam 92, while avoiding interference with internal parts of the door 78. Furthermore, rotation of the door beam 92 and deflection of the bracket 914 during a relatively high acceleration of the door beam 92 during an ON crash event can be reduced if the bracket 914 attaching the coil 14, 72 to the door beam 92 is made of a relatively high stiffness but low mass material. Generally, a pole crash would engage the door beam 92 for almost any impact location along the door and most cars are designed so that the door beam 92 will engage the bumpers of regulatory MDB (Moving Deformable Barrier) impacts, making motion of the door beam 92 a reliable indicator of crash severity for many crash types.

Furthermore, the region below the door beam 92 in many doors 78 is relatively unused, often providing ample space for packaging a coil 14, 72 that will not conflict with existing/future door design and interior equipment. More particularly, in this location, the door window glass 910 would typically not constrain the placement of the coil 14, 72 relative to the surface(s) to be sensed, so the size (and cost) of the coil 14, 72 can be reduced and the coil-to-target initial distance can be optimized to give a larger signal (increased SNR) during the sensing time.

Yet further, a coil 14, 72 in cooperation with the inner panel 84 of the door 78 can provide for relatively less susceptibility to motion of metal inside the vehicle cabin in comparison with a coil operatively coupled to the inner panel 84 if near an access hole.

However, a system using a coil 14, 72 attached to the door beam 92 may be susceptible to delayed or inconsistent performance when an impacting vehicle has a bumper that is sufficiently high so as to not directly engage the door beam 92 during a collision therewith. Furthermore, vibration of the coil 14, 72 attached to the door beam 92 during operation of the vehicle may need to be controlled. For some door beam 92 cross-sectional profiles, for example, cross-sectional profiles that are not substantially curved or round, such as rectangular or square cross-sectional profiles, the associated door beam 92 may exhibit either unacceptable or unpredictable rotation during variable impacts such that a coil 14, 72 attached thereto may not provide a consistent and reliable signal for determining crash severity, particularly if the coil 14, 72 is not mounted sufficiently near the height of the center of the door beam 92.

The magnetic crash sensor 10.1$^{iv}$, 10.1$^{v}$ may be adapted to sense both the motion of the outer skin 90 of the door moving towards the coil 14, 72 and the motion of the coil 14, 72 towards the inner panel 84, which would provide for a relatively rapid signal to "wake-up" the sensing system, provide a relatively quick indication of the speed of impact (e.g. rate of movement of the outer skin 90), and so as to provide a relatively more complex, feature-right signal that would be a superposition of signals responsive to both associated relative motions, but for which it is relatively more difficult to ascribe physical meaning to the associated response, and which would be more susceptible to mechanical abuse events of the vehicle.

Alternatively, magnetic crash sensor 10.1$^{iv}$ may be adapted to principally sense primarily only the relative motion of the door beam 92 relative to the inner panel 84, in which case, the coil 14, 72 would be magnetically shielded or decoupled from the outer skin 90, for example, by incorporating a magnetic shield (which, for example, may also include an eddy current shield as described herein above) into the bracket so as to reduce the magnetic communication between the coil 14, 72 and the outer skin 90 of the door 78 or by initially placing the coil 14, 72 substantially closer to the inner panel 84 than to the outer skin 90 so that motion of the outer skin 90 causes only a relatively small change in the signal from the coil 14, 72. Such an arrangement would be expected to provide a relatively delayed response during impact—relative to the arrangement that is adapted to also be responsive to the outer skin 90—but which would exhibit a relative high immunity to abuse events—e.g. that would either not cause significant total bending or would not cause a high bending rate of the door beam 92—whereby a crash could be discriminated responsive to an associated rate of motion in combination with a minimum or measure of total bending. Such an arrangement would provide for a relatively simple physical interpretation of the associated signals as being related to bending of the door beam 92 and the associated intrusion thereof towards the inner panel 84.

The conductive elements 86, 88 each comprise, for example, a thin metal sheet, film or coating, comprising either a paramagnetic or diamagnetic material that is relatively highly conductive, e.g. aluminum or copper, and which, for example, could be an integral part of the second portion 82 of the door 78. For example, the conductive elements 86, 88 could be in the form of relatively thin plates, a film, a tape (e.g. aluminum or copper), or a coating that is mounted on, applied to, or integrated with existing or supplemental structures associated with the inner panel 84 and the inside surface of the outer skin 90 of the door 78 respectively.

The frequency of the oscillator 98 is adapted so that the corresponding oscillating magnetic field generated by the at least one coil 14, 72 both provides for generating the associated eddy currents 102 in the conductive elements 86, 88, and is magnetically conducted through the ferromagnetic elements of the door 78 and proximate structure of the vehicle 12.

The at least one coil 14, 72 is responsive to both the first magnetic field 94 generated by the at least one coil 14, 72 and a second magnetic field 104 generated by the eddy currents 102 in the conductive elements 86, 88 responsive to the first magnetic field 94. The self-impedance of the coil 14, 72 is responsive to the characteristics of the associated magnetic circuit, e.g. the reluctance thereof and the affects of eddy currents in associated proximal conductive elements. Accordingly, the coil 14, 72 acts as a combination of a passive inductive element, a transmitter and a receiver. The passive inductive element exhibits self-inductance and self resistance, wherein the self-inductance is responsive to the geometry (coil shape, number of conductors, conductor size and cross-sectional shape, and number of turns) of the coil 14, 72 and the permeability of the associated magnetic circuit to which the associated magnetic flux is coupled; and the self-resistance of the coil is responsive to the resistivity, length and cross-sectional area of the conductors constituting the coil 14, 72. Acting as a transmitter, the coil 14, 72 generates and transmits a first magnetic field 94 to its surroundings, and acting as a receiver, the coil 14, 72 generates a voltage responsive to a time varying second magnetic field 104 generated by eddy currents in associated conductive elements within the surroundings, wherein the eddy currents are generated responsive to the time varying first magnetic field 94 generated and transmitted by the coil 14, 72 acting as a transmitter. The signal generated by the coil 14, 72 responsive to the second magnetic field 104 received by the coil 14, 72, in combination with the inherent self-impedance of the coil 14, 72, causes a complex current within or voltage across the coil 14, 72 responsive to an applied time varying voltage across or current through the coil 14, 72, and the ratio of the voltage across to the current through the coil 14, 72 provides an effective self-impedance of the coil 14, 72, changes of which are responsive to changes in the associated magnetic circuit, for example, resulting from the intrusion or deformation of proximal magnetic-field-influencing—e.g. metal—elements.

The at least one coil 14, 72 is operatively coupled to a signal conditioner/preprocessor circuit 114, which, for example, provides for preamplification, filtering, synchronous demodulation, and analog to digital conversion of the associated signal(s) therefrom, e.g. as described hereinabove. The signal conditioner/preprocessor circuit 114 is operatively coupled to a processor 116 which processes the signal therefrom, thereby providing for discriminating a crash, and controlling an associated safety restraint actuator 110—e.g. a side air bag inflator—operatively coupled thereto. More particularly, the signal conditioner/preprocessor circuit 114 provides for determining a measure responsive to the self-impedance of the at least one coil 14, 72 responsive to an analysis of the complex magnitude of the signal from the at least one coil 14, 72, for example, in relation to the signal applied thereto by the associated oscillator 98. For example, in one embodiment, the signal conditioner/preprocessor circuit 114, coil driver 96, oscillator 98 and processor 108 are incorporated in an electronic control unit 120 that is connected to the at least one coil 14, 72 with standard safety product cabling 122, which may include associated connectors.

In operation, the magnetic crash sensor $\mathbf{10.1}^{iv}$, $\mathbf{10.1}^{v}$ provides a measure of the relative motion of the door beam 92 relative to the inner panel 84 and/or the outer skin 90 of the door 78, for example, as caused by a crushing of the outer skin 90 of the door 78 or the bending of the door beam 92 responsive to a side-impact of the vehicle 12. During non-crash conditions, an oscillating magnetic field resulting from the combination of the first 94 and second 104 magnetic fields would be sensed by the at least one coil 14, 72. If an object impacted the outer skin 90 of the door 78 causing a physical deflection thereof, then this oscillating magnetic field would be perturbed at least in part by changes in the second magnetic field 104 caused by movement or deformation of the associated first conductive element 80, 86 and the associated changes in the associated eddy currents 102 therein. If the impact is of sufficient severity, then the door beam 92 and the associated coil 14, 72 would also be moved or deformed thereby, causing additional changes in the associated eddy currents 102 in the first conductive element 80, 86 and the corresponding second magnetic field 104. Generally, the door beam 92 would not be significantly perturbed during impacts that are not of sufficient severity to warrant deployment of the associated safety restraint actuator 110, notwithstanding that there may be substantial associated deformation of the outer skin 90 of the door 78. Accordingly, in one embodiment, a magnetic crash sensor $\mathbf{10.1}^{iv}$ might incorporate the first conductive element 88, and not the first conductive element 86.

Responsive to a crash with an impacting object of sufficient energy to deform the at least one conductive element 80, changes to the shape or position of the at least one conductive element 80 relative to the at least one coil 14, 72, or vice versa, affect the magnetic field affecting the at least one coil 14, 72. A resulting signal is preprocessed by the signal conditioner/preprocessor circuit 114, which provides for measuring the signal across the at least one coil 14, 72 and provides for measuring the signal applied thereto by the associated coil driver 96. The signal conditioner/preprocessor circuit 114—alone, or in combination with another processor 116—provides for decomposing the signal from the at least one coil 14, 72 into real and imaginary components, for example, using the signal applied by the associated coil driver 96 as a phase reference.

Figure 92A:
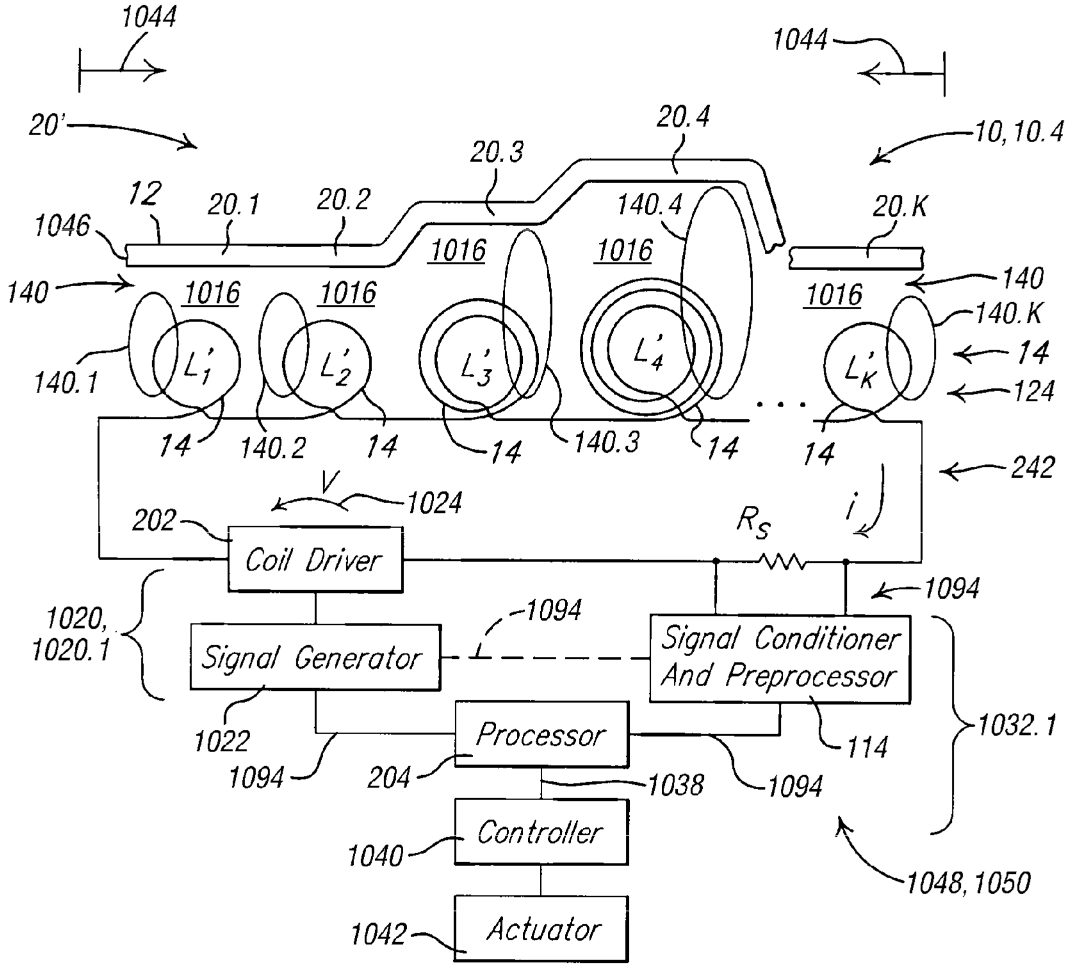
FIG. 92*a* illustrates a first schematic block diagram of a first embodiment of a fourth aspect of a magnetic sensor in a vehicle, incorporating a plurality of non-overlapping coil elements.
Figure 92B:
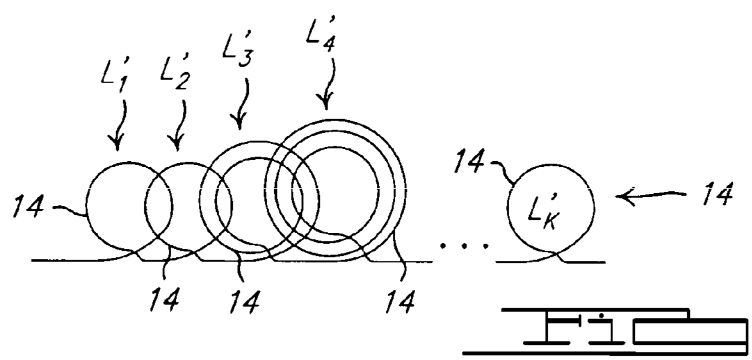
FIG. 92*b* illustrates a plurality of overlapping coil elements.
Figure 92C:
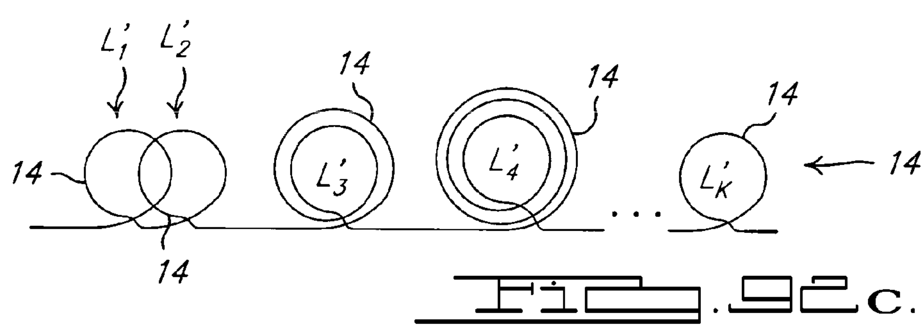
FIG. 92*c* illustrates a plurality of coil elements, some of which are overlapping, and some of which are non-overlapping.
Figure 93:
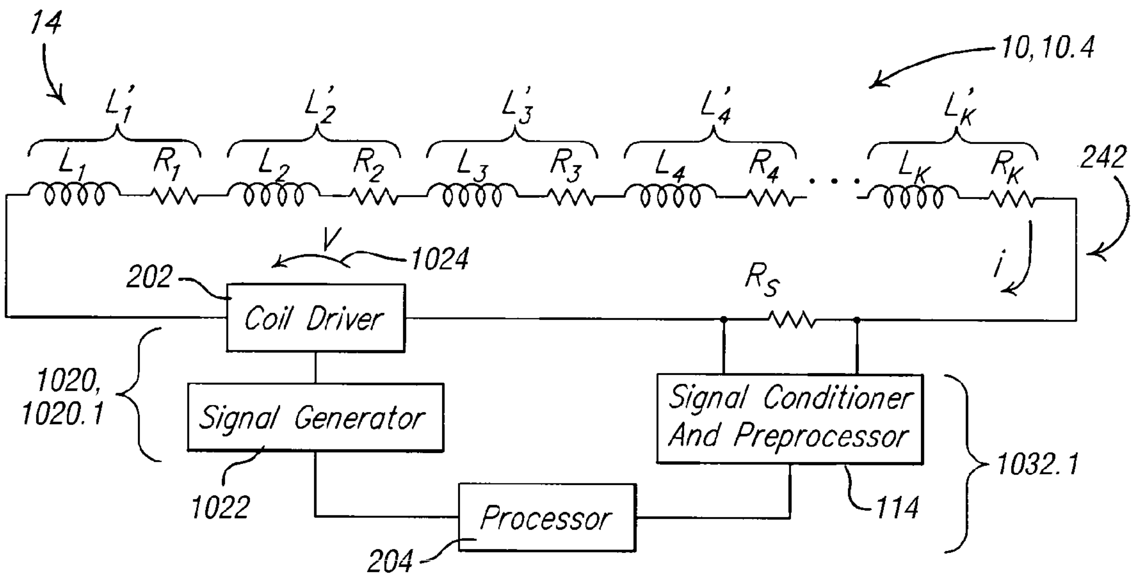
FIG. 93 illustrates a second schematic block diagram of the first embodiment of the fourth aspect of the magnetic sensor.

Referring to FIGS. 92*a*, 92*b* and 93, in accordance with a first embodiment of a fourth aspect 10.4, a magnetic sensor 10 operatively associated with a vehicle 12 comprises a plurality of coil elements 14 electrically connected in series and distributed across a sensing region 1016 adapted so as to cooperate with various associated different portions 20.1, 20.2, 20.3, 20.4 and 20.*k* of the vehicle 12. The various coil elements 14 can be either non-overlapping as illustrated in FIG. 92*a*, over-lapping as illustrated in FIG. 92*b*, or, as illustrated in FIG. 92*c*, some of the coil elements 14 ($L_1'$, $L_2'$) may be overlapping, and other of the coil elements ($L_3'$, $L_4'$, . . . $L_K'$) may be non-overlapping. A time-varying signal source 1020 comprising a signal generator 1022 generates at least one time-varying signal 241024 that is operatively coupled to the plurality of coil elements 14, for example, through a coil driver 202. For example, referring to FIG. 93, in accordance with the first embodiment, the plurality of coil elements 14 comprise a plurality of k conductive coil elements $L_1'$, $L_2'$, $L_3'$, $L_4'$, . . . $L_K'$, each of which can be modeled as an associated self-inductance $L_1$, $L_2$, $L_3$, $L_4$, . . . $L_K$, in series with a corresponding resistance $R_1$, $R_2$, $R_3$, $R_4$, . . . $R_K$. The plurality of coil elements 14 are connected in series, a time-varying voltage signal v from a time-varying voltage source 1020.1 applied across the plurality of coil elements 14 through a sense resistor $R_S$, which causes a resulting current i to flow through the associated series circuit 242. Each of the associated coil elements $L_1'$, $L_2'$, $L_3'$, $L_4'$, . . . $L_K'$ generates an associated magnetic field component 140.1, 140.2, 140.3, 140.4, . . . 140.*k* responsive to the geometry thereof and to the current i therethrough. The associated magnetic field components 140.1, 140.2, 140.3, 140.4, . . . 140.*k* interact with the associated different portions 20.1, 20.2, 20.3, 20.4 and 20.*k* of the vehicle 12, which affects the effective impedance $Z_1$, $Z_2$, $Z_3$, $Z_4$, . . . $Z_K$ of the associated coil elements $L_1'$, $L_2'$, $L_3'$, $L_4'$, . . . $L_K'$, thereby affecting the complex magnitude of the associated current i through the associated series circuit 242. A detection circuit 1032.1 comprising a signal conditioner/preprocessor circuit 114 senses the current i through each of the plurality of coil elements 14 from an associated voltage drop across the sense resistor $R_S$. The at least one time-varying signal 1024, or a signal representative thereof from the signal generator 1022, and a signal from the signal conditioner/preprocessor circuit 114 at least representative of the response current i, are operatively coupled to a processor 204 of the detection circuit 1032.1 which provides for determining a detected signal 1038 comprising a measure responsive to the impedance $Z_1$, $Z_2$, $Z_3$, $Z_4$, . . . $Z_K$ of the associated coil elements $L_1'$, $L_2'$, $L_3'$, $L_4'$, . . . $L_K'$, responsive to which a controller 1040 provides for controlling an actuator 1042, either directly or in combination with a second confirmatory signal from a second sensor, e.g. a second crash sensor, or for providing associated information to the driver or occupant of the vehicle 12, or to another system. For example, the actuator 1042 may comprise a safety restraint system, e.g. an air bag inflator (e.g. frontal, side, overhead, rear, seat belt or external), a seat belt pretensioning system, a seat control system, or the like, or a combination thereof.

With the plurality of coil elements 14 connected in series, the current i through the series circuit 242, and the resulting detected signal 1038, is responsive associated sensed signal components from each of the coil elements $L_1'$, $L_2'$, $L_3'$, $L_4'$, . . . $L_K'$, wherein each sensed signal component would correspond to the associated respective impedance $Z_1$, $Z_2$, $Z_3$, $Z_4$, . . . $Z_K$ of the respective coil element $L_1'$, $L_2'$, $L_3'$, $L_4'$, . . . $L_K'$, wherein the associated respective impedances $Z_1$, $Z_2$, $Z_3$, $Z_4$, . . . $Z_K$ of the associated coil elements $L_1'$, $L_2'$, $L_3'$, $L_4'$, . . . $L_K'$ are responsive to the associated respective magnetic field components 140.1, 140.2, 140.3, 140.4, . . . 140.*k* responsive to the associated interactions of the respective coil elements $L_1'$, $L_2'$, $L_3'$, $L_4'$, . . . $L_K'$ with the respective different portions 20.1, 20.2, 20.3, 20.4 and 20.*k* of the vehicle 12. Accordingly, the detected signal 1038 provides for detecting a change in a magnetic condition of, or associated with, the vehicle 12, for example, as might result from either a crash or a proximate interaction with another vehicle. The plurality of coil elements are adapted to span a substantial region 1044 of a body or structural element 1046 of the vehicle 12, wherein the body or structural element 1046 of the vehicle 12 is susceptible to deformation responsive to a crash, or is susceptible to some other interaction with another vehicle that is to be detected. Accordingly, a detected signal 1038 responsive to the current i through the plurality of coil elements 14 distributed over a substantial region 1044 of a body or structural element 1046 of the vehicle 12, in a series circuit 242 driven by a time-varying voltage signal v across the series combination of the plurality of coil elements 14, provides for detecting from a single detected signal 1038 a change in a magnetic condition of, or associated with, the vehicle 12 over the associated substantial region 1044 of the body or structural element 1046 of the vehicle 12, so as to provide for a magnetic sensor 10 with relatively broad coverage.

Figure 94:
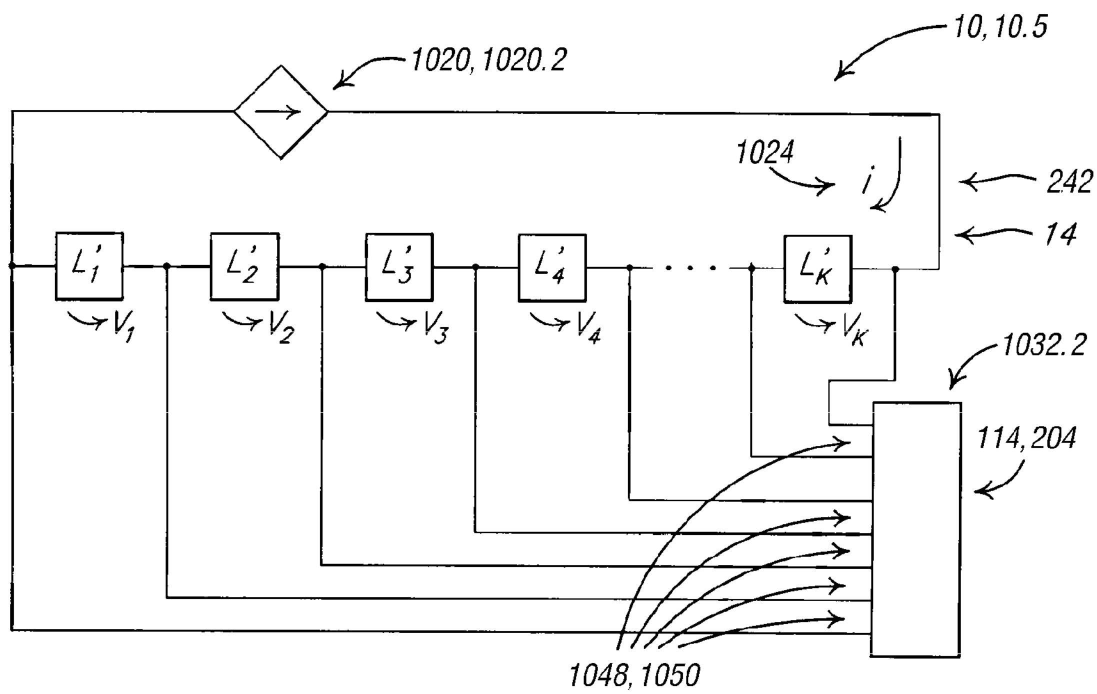
FIG. 94 illustrates a schematic block diagram of a first embodiment of the fifth aspect of a magnetic sensor.

In accordance with a fifth aspect 10.5 of the magnetic sensor 10, a plurality of response signals are measured each responsive to different coil elements $L_1'$, $L_2'$, $L_3'$, $L_4'$, . . . $L_K'$ or subsets thereof. Referring to FIG. 94, in accordance with a first embodiment of the fifth aspect 10.5 of the magnetic sensor 10, the time-varying signal source 1020 comprises a time-varying current source 1020.2, and the associated detection circuit 1032.2 is responsive to at least one voltage signal $v_1$, $v_2$, $v_3$, $v_4$, . . . $v_K$ across at least one of the corresponding coil elements $L_1'$, $L_2'$, $L_3'$, $L_4'$, . . . $L_K'$. For example, in the first embodiment illustrated in FIG. 94, each of the voltage signals $v_1$, $v_2$, $v_3$, $v_4$, . . . $v_K$ across each of the corresponding coil elements $L_1'$, $L_2'$, $L_3'$, $L_4'$, . . . $L_K'$ is measured by the detection circuit 1032.2, for example, by an associated processor 204 incorporating associated signal conditioner and preprocessor circuits 114, e.g. corresponding differential amplifiers 1048 and A/D converters 1050 operatively coupled across each of the coil elements $L_1'$, $L_2'$, $L_3'$, $L_4'$, . . . $L_K'$, so as to provide for generating at least one detected signal 1038 responsive to the impedances $Z_1$, $Z_2$, $Z_3$, $Z_4$, . . . $Z_K$ of the associated respective coil elements $L_1'$, $L_2'$, $L_3'$, $L_4'$, . . . $L_K'$.

Figure 95:
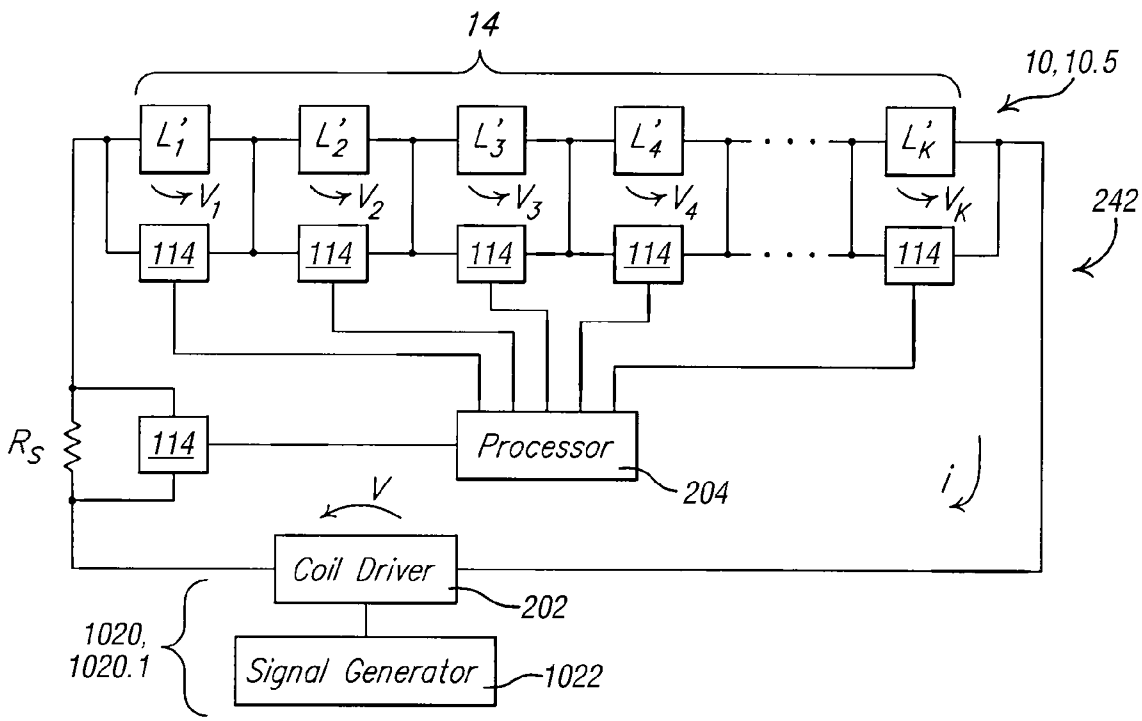
FIG. 95 illustrates a schematic block diagram of a second embodiment of the fifth aspect of the magnetic sensor.

Referring to FIG. 95, in accordance with a second embodiment of the fifth aspect 10.5 of the magnetic sensor 10, the plurality of coil elements 14 connected in a series circuit 242 are driven by a time-varying voltage source 1020.1 comprising a signal generator 221022 operatively coupled to a coil driver 202. The current i through the series circuit 242 is measured by the processor 204 from the voltage drop across a sense resistor $R_S$ in the series circuit 242, conditioned by an associated signal conditioner/preprocessor circuit 114 operatively coupled to the processor 204. Each of the voltage signals $v_1$, $v_2$, $v_3$, $v_4$, . . . $v_K$ across each of the coil elements $L_1'$, $L_2'$, $L_3'$, $L_4'$, . . . $L_K'$ are also measured by the processor 204 using associated signal conditioner and preprocessor circuits 114 operatively coupled therebetween, so as to provide for measuring—i.e. at least generating a measure responsive to—the corresponding impedances $Z_1$, $Z_2$, $Z_3$, $Z_4$, . . . $Z_K$ of each of the corresponding respective coil elements $L_1'$, $L_2'$, $L_3'$, $L_4'$, . . . $L_K'$, so as to provide for generating a measure responsive to the localized magnetic conditions of, or associated with, the vehicle 12 over the associated substantial region 1044 of the body or structural element 1046 of the vehicle 12 associated with the different portions 20.1, 20.2, 20.3, 20.4 and 20.*k* of the vehicle 12 associated with the corresponding respective coil elements $L_1'$, $L_2'$, $L_3'$, $L_4'$, . . . $L_K'$.

The at least one time-varying signal 1024 from the time-varying signal source 1020 may comprise either an oscillatory or pulsed waveform. For example, the oscillatory waveform may comprise a sinusoidal waveform, a triangular ramped waveform, a triangular sawtooth waveform, a square waveform, or a combination thereof, at a single frequency or a plurality of different frequencies; and the pulsed waveform may comprise any of various pulse shapes, including, but not limited to, a ramp, a sawtooth, an impulse or a rectangle, at a single pulsewidth or a plurality of different pulsewidths. Frequency diversity techniques can provide information about deformation depth or deformation rate of the associated different portions 20.1, 20.2, 20.3, 20.4 and 20.*k* of the vehicle 12 being sensed, and can also provide for improve electromagnetic compatibility and immunity to external electromagnetic noise and disturbances.

Figure 96:
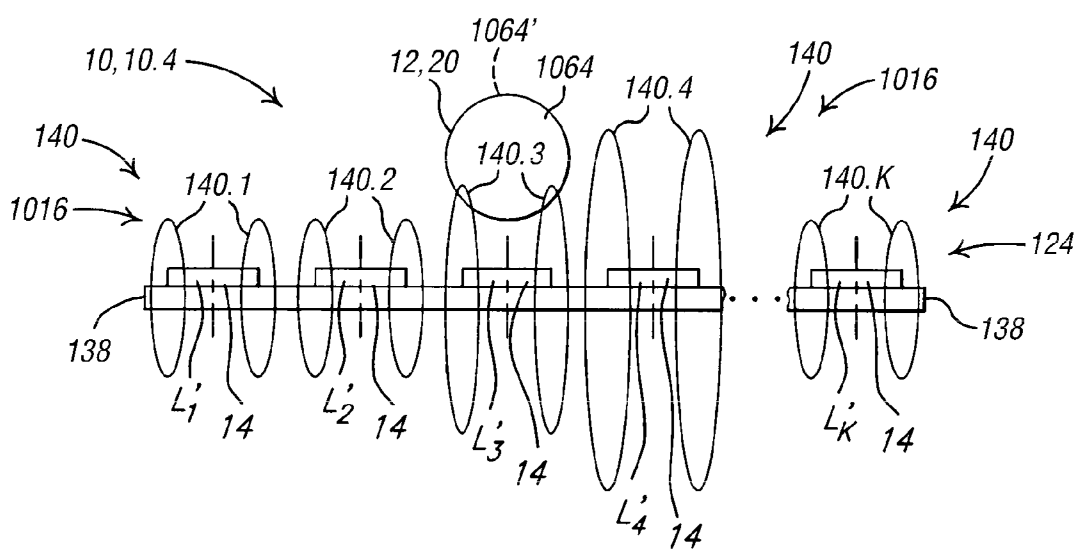
FIG. 96 illustrates a side view of the first embodiment of the fourth aspect of the magnetic sensor illustrating the operation thereof.

Referring to FIG. 96, in accordance with the first embodiment of the fourth aspect 10.4 of the magnetic sensor 10, a plurality of plurality of coil elements 14 electrically in series with one another constituting a distributed coil 124 operatively associated with, or mounted on, an associated substrate 138 are illustrated operating in proximity to a magnetic-field-influencing object 1064—e.g. either ferromagnetic, conductive, or a combination thereof—constituting either a second portion 20, 82 of a vehicle 12, or at least a portion of an object 1064' distinct the vehicle 12, e.g. a portion of another vehicle. Referring also to FIG. 92, different coil elements $L_1'$, $L_2'$, $L_3'$, $L_4'$, . . . $L_K'$ are adapted with different geometries, e.g. different associated numbers of turns or different sizes, so as to provide for shaping the associated magnetic field components 140.1, 140.2, 140.3, 140.4, . . . 140.*k*, so as to in shape the overall magnetic field 140 spanning the sensing region 1016, for example, so that the associated magnetic field components 140.1, 140.2, 140.3, 140.4, . . . 140.*k* are stronger—e.g. by using a greater number of turns for the associated coil elements $L_1'$, $L_2'$, $L_3'$, $L_4'$, . . . $L_K'$—proximate to different portions 20.1, 20.2, 20.3, 20.4 and 20.*k* that are nominally less magnetically influential on the associated impedances $Z_1$, $Z_2$, $Z_3$, $Z_4$, . . . $Z_K$ of the associated different coil elements $L_1'$, $L_2'$, $L_3'$, $L_4'$, . . . $L_K'$, than other coil elements $L_1'$, $L_2'$, $L_3'$, $L_4'$, . . . $L_K'$. For example, in the embodiment illustrated in FIG. 92, coil elements $L_1'$, $L_2'$ and $L_K'$ are illustrated each comprising one turn, coil element $L_3'$ is illustrated comprising two turns, and coil element $L_4'$ is illustrated comprising three turns, wherein the number of turns is inversely related to the relative proximity of the associated corresponding different portions 20.1, 20.2, 20.3, 20.4 and 20.*k* of the vehicle 12 to the corresponding coil elements $L_1'$, $L_2'$, $L_3'$, $L_4'$, . . . $L_K'$, respectively. Accordingly, the plurality of coil elements 14 are adapted so as to provide for shaping the associated magnetic field 140 responsive to at least one magnetic-field influencing property of at least one second portion 20, 82 of the vehicle 12 in proximity to the plurality of coil elements 14. The shaping of the composite distributed magnetic field 140 provides for normalizing the affect of a change in the associated magnetic condition of the associated magnetic-field-influencing object 1064 being sensed over the length or area of the associated sensing region 1016, and also provides for increasing the sensitivity of the magnetic sensor 10 in locations where necessary, and/or decreasing the sensitivity of the magnetic sensor 10 in other locations where necessary.

Referring again to FIGS. 11*a*, 11*b*, 12, 13, 14*a*, 14*b*, 15*a*, 15*b*, 16, 17*a* and 17*b*, it should be appreciated that the various embodiments of the coils 14.2-14.8 illustrated therein can also be used as the distributed coil 124 in accordance with the fourth aspect 10.4 of the magnetic sensor 10, so as to provide for a set of an associated plurality of coil elements 14 that are electrically connected in series and distributed across a sensing region 1016 adapted so as to cooperate with various associated different portions 20.1, 20.2, 20.3, 20.4 and 20.*k* of the vehicle 12.

Figure 97:
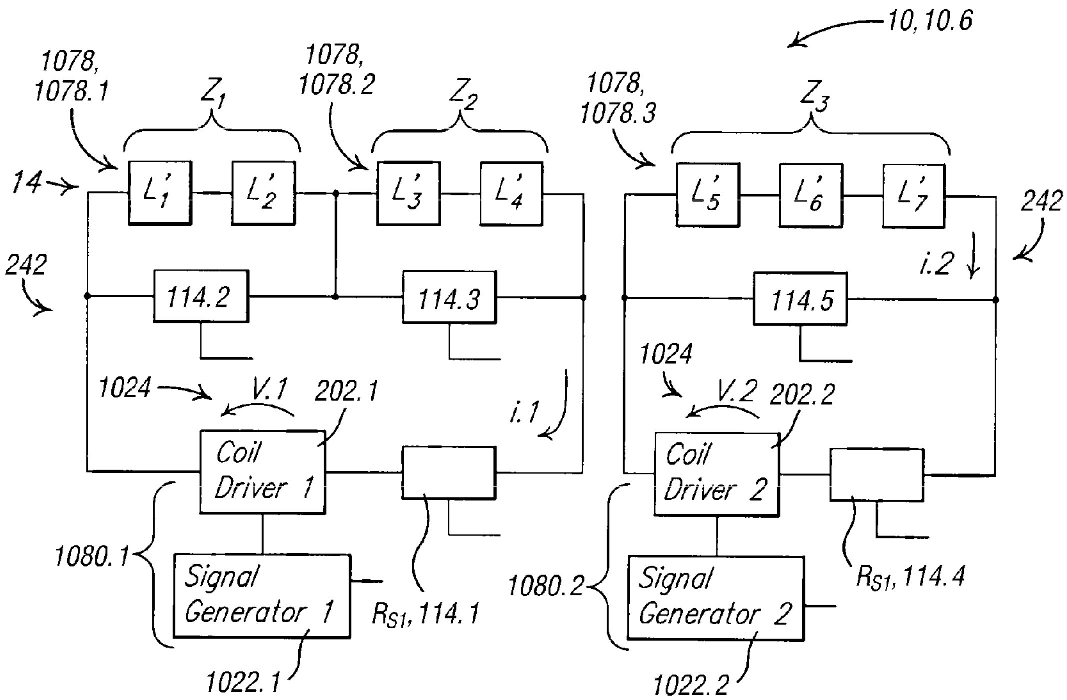
FIG. 97 illustrates a schematic block diagram of an embodiment of a sixth aspect of a magnetic sensor.

Referring to FIG. 97, in accordance with a sixth aspect 10.6 of the magnetic sensor 10, the plurality of coil elements 14 are grouped into a plurality of subsets 1078, for example, in an embodiment thereof, first 1078.1, second 1078.2 and third 1078.3 subsets of coil elements 14, wherein the coil elements 14 in each subset 1078 are connected in series, a series combination of the first 1078.1 and second 1078.2 subsets of coil elements 14 are driven by a first time-varying signal source 1080.1, i.e. a first time-varying voltage source 1080.1, comprising a first coil driver 202.1 driven by a first signal generator 1022.1, and the third subset 1078.3 of coil elements 14—electrically separated from the first 1078.1 and second 1078.2 subsets—is driven by a second time-varying signal source 1080.2, i.e. a second time-varying voltage source 1080.2, comprising a second coil driver 202.2 driven by a second signal generator 1022.2. A first time-varying voltage signal v.1 from the first time-varying voltage source 1080.1 generates a first current i.1 in the series combination of the first 1078.1 and second 1078.2 subsets of coil elements 14, which is sensed by a first signal conditioner/preprocessor circuit 114.1 responsive to the associated voltage drop across a first sense resistor $R_{S1}$. The first subset 1078.1 of coil elements 14 comprises a series combination of two coil elements $L_1'$ and $L_2'$, across which a second signal conditioner/preprocessor circuit 114.2 provides for measuring a voltage drop thereacross, which together with the first current i.1, provides for an associated processor 204 to generate a measure of the impedance $Z_1$ of the first subset 1078.1 of coil elements 14. Similarly, the second subset 1078.2 of coil elements 14 comprises a series combination of two coil elements $L_3'$ and $L_4'$, across which a third signal conditioner/preprocessor circuit 114.3 provides for measuring a voltage drop thereacross, which together with the first current i.1, provide for the associated processor 204 to generate a measure of the impedance $Z_2$ of the second subset 1078.2 of coil elements 14. A second time-varying voltage signal v.2 from the second time-varying voltage source 1080.2 generates a second current i.2 in the third subset 1078.3 of coil elements 14, which is sensed by a fourth signal conditioner/preprocessor circuit 114.4 responsive to the associated voltage drop across a second sense resistor $R_{S2}$. The third subset 1078.3 of coil elements 14 comprises a series combination of three coil elements $L_5'$, $L_6'$ and $L_7'$, across which a fifth signal conditioner/preprocessor circuit 114.5 provides for measuring a voltage drop thereacross, which together with the second current i.2, provides for an associated processor 204 to generate a measure of the impedance $Z_3$ of the third subset 1078.3 of coil elements 14. Accordingly, the sixth aspect 10.6 of the magnetic sensor 10 provides for applying different time-varying signals 24 to different subsets 1078 of coil elements 14, wherein the different time-varying signals 24 may comprise different magnitudes, waveforms, frequencies or pulsewidths, etc. The sixth aspect 10.6 of the magnetic sensor 10 also provides for measuring a plurality of impedances Z of a plurality of different subsets 1078 of coil elements 14, so as to provide for localized measures of the associated magnetic condition of the vehicle 12. The associated voltage measurements associated with the corresponding impedance measurements can be either simultaneous or multiplexed. Furthermore, the magnetic sensor 10 may be adapted so as to provide for measurements of both individual subsets 1078 of coil elements 14 and of the overall series combination of a plurality of subsets 1078 of coil elements 14, wherein the particular measurements may be chosen so as to provide localized measurements of some portions 20 of the vehicle 12 in combination with an overall measurement to accommodate the remaining portions 20, so as to possibly provide for a spatial localization of perturbations to the magnetic condition of the vehicle 12, or the rate of deformation or propagation of a magnetic disturbance, for example, as may result from a crash or proximity of another vehicle. It should be understood that a variety of measures may be used by the associated detection circuit 32, for example, impedance Z, a voltage signal from the associated signal conditioner/preprocessor circuit 114, or in-phase and/or quadrature-phase components of the voltage signal from the associated signal conditioner/preprocessor circuit 114. For example, a comparison of the ratio of a voltage from a subset 1078 of coil elements 14 to the voltage across the entire associated distributed coil 124 can provide for mitigating the affects of noise and electromagnetic susceptibility.

Figure 98:
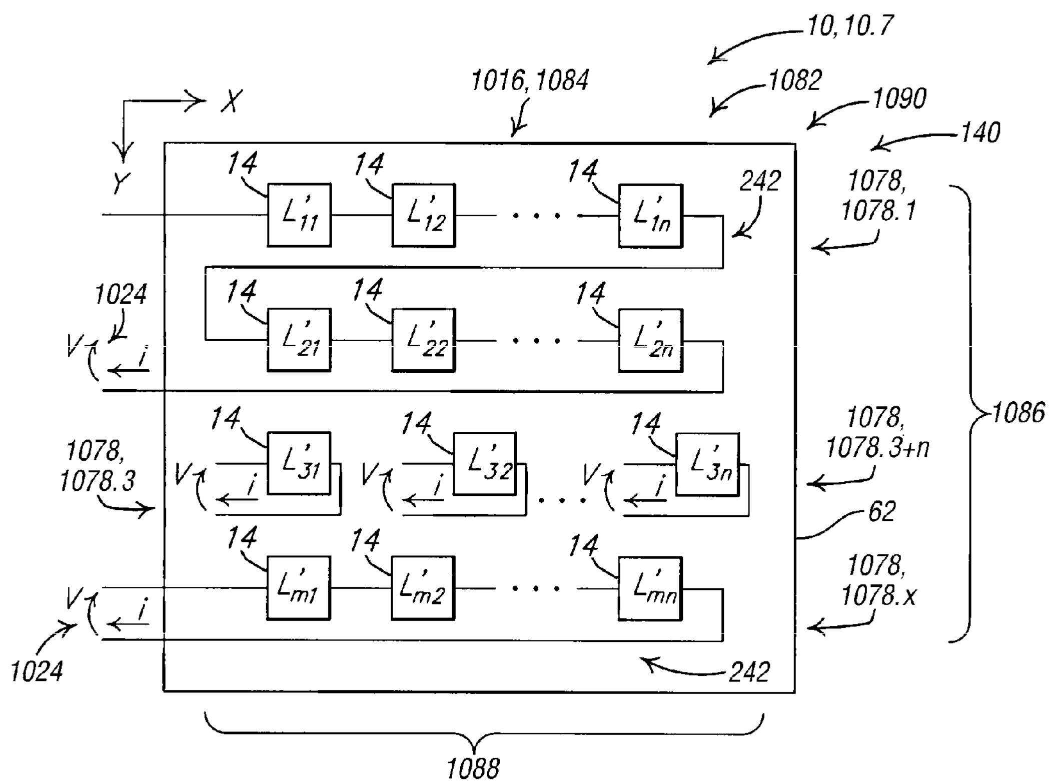
FIG. 98 illustrates a schematic block diagram of an embodiment of a seventh aspect of a magnetic sensor.

Referring to FIG. 98, in accordance with an embodiment of a seventh aspect 10.7 of a magnetic sensor 10, the plurality of coil elements 14 are arranged in a two-dimensional array 1082 on a substrate 138 so as to provide for sensing a change in a magnetic condition of the vehicle 12 over an associated two-dimensional sensing region 1084. For example, in accordance with a first embodiment, the two-dimensional array 1082 comprises m rows 1086 and n columns 1088 of associated coil elements 14, wherein different columns 1088 are at different X locations, and different rows 1086 are at different Y locations of a Cartesian X-Y coordinate system. In the first embodiment, the m×n two-dimensional array 1082 is organized in a plurality of subsets 1078, for example, a first subset 1078.1 comprising rows 1086 numbered 1 and 2 of the two-dimensional array 1082, the next n subsets **1078.3-1078.3+*n* respectively comprising the individual coil elements 14 of the third row 1086, and the last subset 1078.*x* comprising the last ($m^{th}$) row of the two-dimensional array 1082. Each subset 1078 comprises either a single coil element 14 or a plurality of coil elements 14 connected in series, and provides for a relatively localized detection of the magnetic condition of the vehicle 12 responsive to the detection of an associated measure responsive to the impedance Z of the associated subset 1078 of coil elements 14, using a detection circuit 32, for example, similar to that described hereinabove in accordance with other embodiments or aspects of the magnetic sensor 10. It should be understood that the plurality of coil elements 14 in accordance with the seventh aspect 10.7 of a magnetic sensor 10 need not necessarily be arranged in a Cartesian two-dimensional array 1082, but alternatively, could be arranged in accordance with some other pattern spanning a two-dimensional space, and furthermore, could also be arranged so in accordance with a pattern spanning a three-dimensional space, for example, by locating at least some coil elements 14 at different distances from an underlying reference surface. The geometry—e.g. shape, size, number of turns, or conductor size or properties—of a particular coil element 14 and the associated substrate 138 if present can be adapted to provide for shaping the overall magnetic field 140 spanning the sensing region 1016. For example, the coil elements 14 can be formed on or constructed from a flexible printed circuit board (PCB) or other flexible or rigid flat mounting structure, and, for example, the resulting assembly 1090 of coil elements 14 may be encapsulated for environmental protection or to maintain the necessary shape and/or size for proper operability thereof in cooperation with the vehicle 12. Different subsets 1078 of coil elements 14 may be driven with different time-varying signals 24, for example, each with an associated waveform or pulse shape, frequency, frequency band or pulse width, and amplitude adapted to the particular subset 1078 of coil elements 14** so as to provide for properly discriminating associated crash events or proximate objects as necessary for a particular application.

The fourth through seventh aspects 10.4-10.7 of the magnetic sensor 10 provides for detecting deformation and/or displacement of associated at least one magnetic-field-influencing object 1064 constituting portions 20 of the vehicle 12 responsive to a crash, and/or provides for detecting the proximity or approach of an approaching or proximate external magnetic-field-influencing object 1064, within the sensing range of at least one coil elements 14 of the plurality of coil elements 14 distributed across either one-, two- or three-dimensional space. The plurality of coil elements 14 driven by at least one time-varying signal 1024 exhibit a characteristic complex impedance Z which is affected and changed by the influence of a proximate magnetic-field-influencing object 1064 and/or deformation or displacement of associated magnetic-field-influencing portions 20' of the vehicle 12 in proximate operative relationship to coil elements 14 of the plurality of coil elements 14. Measurements of the voltage v across and current i through the coil elements 14 provide associated time varying sensed signals 1094 that provide for generating at least one detected signal 1038 responsive thereto and responsive to, or a measure of, the associated complex impedance Z of the associated plurality or pluralities of coil elements 14 or subsets 1078 thereof, which provides for a measure responsive to the dynamics of an approaching external magnetic-field-influencing object 1064, 1064' (e.g. metal, metalized or ferromagnetic), or responsive to the dynamics of deformation of the at least one magnetic-field-influencing object 1064 constituting portions 20 of the vehicle 12 responsive to a crash, and which are in operative proximate relationship to the plurality or pluralities of coil elements 14 or subsets 1078 thereof. The time varying sensed signals 1094 are responsive to ferromagnetic and eddy current affects on the associated complex impedance Z of each of the associated plurality or pluralities of coil elements 14 or subsets 1078 thereof spanning a substantial region 1044 of a body or structural element 1046 to be sensed.

In accordance with an aspect of the magnetic sensor 10, either the geometry of first $L_1'$ and at least second $L_2'$ coil elements associated with different first 20.1 and at least second 20.2 portions of the vehicle 12, the associated at least one time-varying signal 1024, or an associated at least one detection process of an associated at least one detection circuit 32, are adapted so as to provide that a first response of the at least one detection circuit 32 to a first sensed signal component from a first coil element $L_1'$ is substantially normalized—e.g. with respect to respective magnitudes or signal-to-noise rations of the associated sensed signal components—with respect to at least a second response of the at least one detection circuit 32 to at least a second sensed signal component from at least the second coil element $L_2'$ for a comparably significant crash or proximity stimulus or stimuli affecting the first 20.1 and at least second 20.2 portions of the vehicle 12. Accordingly, in addition to being distributed over a region of space associated with an associated sensing region 1016, for an associated sensing region 1016 spanning different portions 20.1, 20.2, 20.3, 20.4 and **20.*k* of the vehicle 12 that are magnetically different in their associated influence on the associated plurality of coil elements 14, at least one of at least one geometry of the plurality of coil elements 14, the at least one time-varying signal 1024, and at least one detection process is adapted so that at least one of a first condition, a second condition and a third condition is satisfied so as to provide that a first response of the at least one detection circuit 32 to a first sensed signal component from a first coil element $L_1'$ is substantially normalized with respect to at least a second response of the at least one detection circuit 32 to at least a second sensed signal component from at least the second coil element $L_2'$ for a comparably significant crash stimulus or stimuli affecting the first 20.1 and at least second 20.2 portions of the vehicle 12**.

The first condition is satisfied if the geometry—e.g. the size, shape, or number of turns—of the first $L_1'$ and at least a second $L_2'$ coil element are different. For example, referring to FIG. 92, the first coil element $L_1'$ being relatively closer in proximity to the corresponding first portion 20.1 of the vehicle 12 has fewer turns than the corresponding third $L_3'$ or fourth $L_4'$ coil elements which are relatively further in proximity to the corresponding third 20.3 and fourth 20.4 portions of the vehicle 12, respectively.

The second condition is satisfied if a first time-varying signal 1024.1 operatively coupled to a first coil element $L_1'$ is different from at least a second time-varying signal 1024.2 operatively coupled to at least a second coil element $L_2'$. For example, referring to FIG. 97 or 98, at least two different coil elements 14 or subsets 1078 thereof are driven by different associated time-varying signal sources 1080.1 and 1080.2. If the associated different coil elements 14 each have substantially the same geometry, but have a different magnetic coupling to the associated first 20.1 and at least second 20.2 different portions of the vehicle 12, e.g. as illustrated in FIG. 92, then different coil elements 14 could be driven with different associated levels of the associated time-varying signals 24.1 and 24.2, e.g. a coil element 14 of closer proximity to the associated portion 20 of the vehicle 12 being driven at a lower voltage than a coil element 14 of further proximity, so that strength of the associated corresponding magnetic field components 140.1, 140.2 are inversely related to the associated magnetic coupling, so that the affect on the detected signal 1038 of a change in the first portion 20.1 of the vehicle 12 is comparable to the affect on the detected signal 1038 of a change in the second portion 20.2 of the vehicle 12 for each change corresponding to a relatively similar crash or proximity stimulus or stimuli affecting the first 20.1 and at least second 20.2 portions of the vehicle 12.

The third condition is satisfied if a first detection process of the at least one detection circuit 32 operative on a first sensed signal component from or associated with a first coil element $L_1'$ is different at least a second detection process of the at least one detection circuit 32 operative on at least a second sensed signal component from or associated with at least a second coil element $L_2'$. For example, the associated signal gain associated with processing different signals from different coil elements 14 can be different, e.g. the signal from a coil element 14 of closer proximity to an associated first portion 20.1 of the vehicle 12 could be amplified less than the signal from a coil element 14 of further proximity to an associated second portion 20.2 of the vehicle 12, so that the affect on the detected signal 1038 of a change in the first portion 20.1 of the vehicle 12 is comparable to the affect on the detected signal 1038 of a change in the second portion 20.2 of the vehicle 12 for each change corresponding to a relatively similar crash or proximity stimulus or stimuli affecting the first 20.1 and at least second 20.2 portions of the vehicle 12.

Figure 99A:
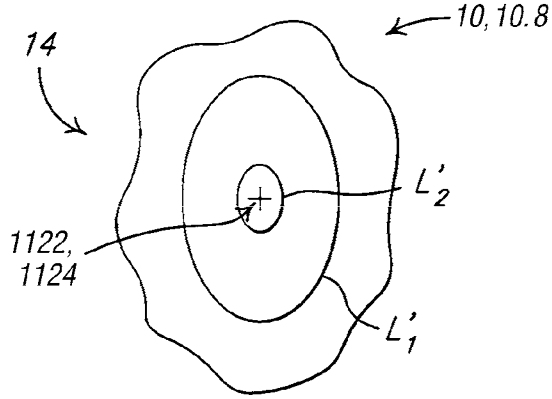
FIGS. 99*a* and 99*b* illustrate a first embodiment of an eighth aspect of a magnetic sensor.
Figure 99B:
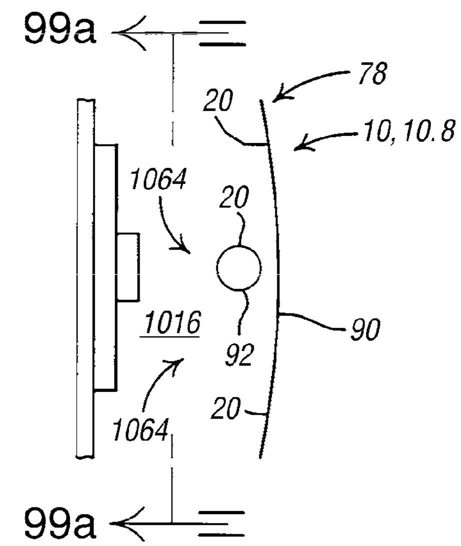

Referring to FIGS. 99*a*, 99*b*, 100*a* and 100*b*, in accordance with an eighth aspect 10.8 of a magnetic sensor 10, at least one relatively larger coil element $L_1'$ of the plurality of coil elements 14 at least partially surrounds at least another relatively smaller coil element $L_2'$ of the plurality of coil elements, wherein both the relatively larger coil element $L_1'$ and the relatively smaller coil element $L_2'$ are associated with the same general sensing region 1016, but each exhibits either a different sensitivity thereto or a different span thereof. For example, referring to FIGS. 99*a* and 99*b*, in accordance with a first embodiment of the seventh aspect 10.7 of a magnetic sensor 10, a first relatively larger coil element $L_1'$ surrounds a second relatively smaller coil element $L_2'$, wherein both coil elements $L_1'$, $L_2'$ may be either driven by the same oscillatory or pulsed time-varying signal source 201020; or by different oscillatory or pulsed time-varying signal sources 20, each providing either the same or different time-varying signals 24, wherein different time-varying signals 24 could differ by signal type, e.g. oscillatory or pulsed, waveform shape, oscillation frequency or pulsewidth, signal level or power level. The numbers of turns of the coil elements $L_1'$, $L_2'$, or the associated heights thereof, can be the same or different as necessary to adapt the relative sensitivity of the relatively larger coil element $L_1'$ in relation to the relatively smaller coil element $L_2'$ responsive to particular features of a particular magnetic-field-influencing object 1064 being sensed. For example, the relatively larger coil element $L_1'$ could have either the same, a greater number, or a lesser number of turns relative to the relatively smaller coil element $L_2'$, or the relatively larger coil element $L_1'$ could have either the same, a greater, or a lesser height than the relatively smaller coil element $L_2'$. Referring to FIGS. 99*a* and 99*b*, the relatively larger coil element $L_1'$ and the relatively smaller coil element $L_2'$ are adapted to sense the inside of a door 78 of the vehicle 12, and are substantially concentric with the associated respective centers 1122, 1124 being substantially aligned with an associated door beam 92 constituting a substantial magnetic-field-influencing object 1064 to be sensed, wherein the relatively smaller coil element $L_2'$ would be relatively more sensitive to the door beam 92 than the relatively larger coil element $L_1'$, the latter of which would also be responsive to relatively upper and lower regions of the associated outer skin 90 of the door 78.

Figure 100A:
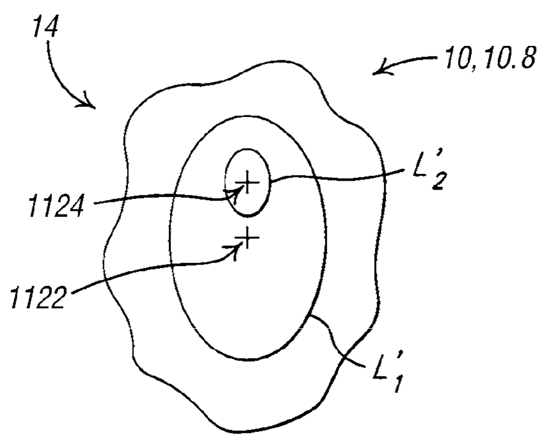
FIGS. 100*a* and 100*b* illustrate a second embodiment of the eighth aspect of the magnetic sensor.
Figure 100B:
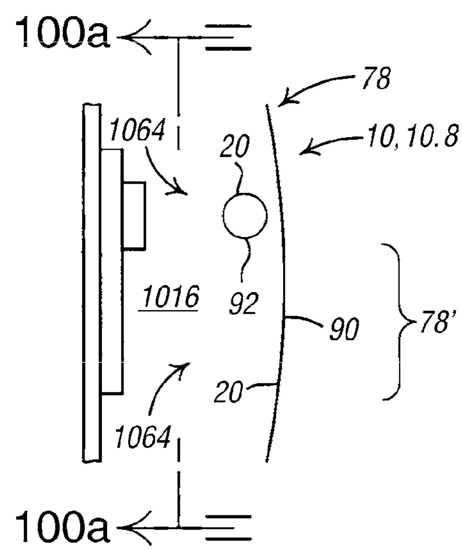

Referring to FIGS. 100*a* and 100*b*, in accordance with a second embodiment of the eighth aspect 10.8 of the magnetic sensor 10, the center 1122 of the relatively larger coil element $L_1'$ is located below the center 1124 of the relatively smaller coil element $L_2'$, the latter of which is substantially aligned with the door beam 92, so that the sensing region 1016 of the relatively larger coil element $L_1'$ is biased towards the lower portion 78' of the door 78. Accordingly, the relative position of the relatively larger coil element $L_1'$ in relation to the relatively smaller coil element $L_2'$ can be adapted to enhance or reduce the associated sensitivity thereof to the magnetic-field-influencing object 1064 being sensed, or to portions thereof.

Figure 101:
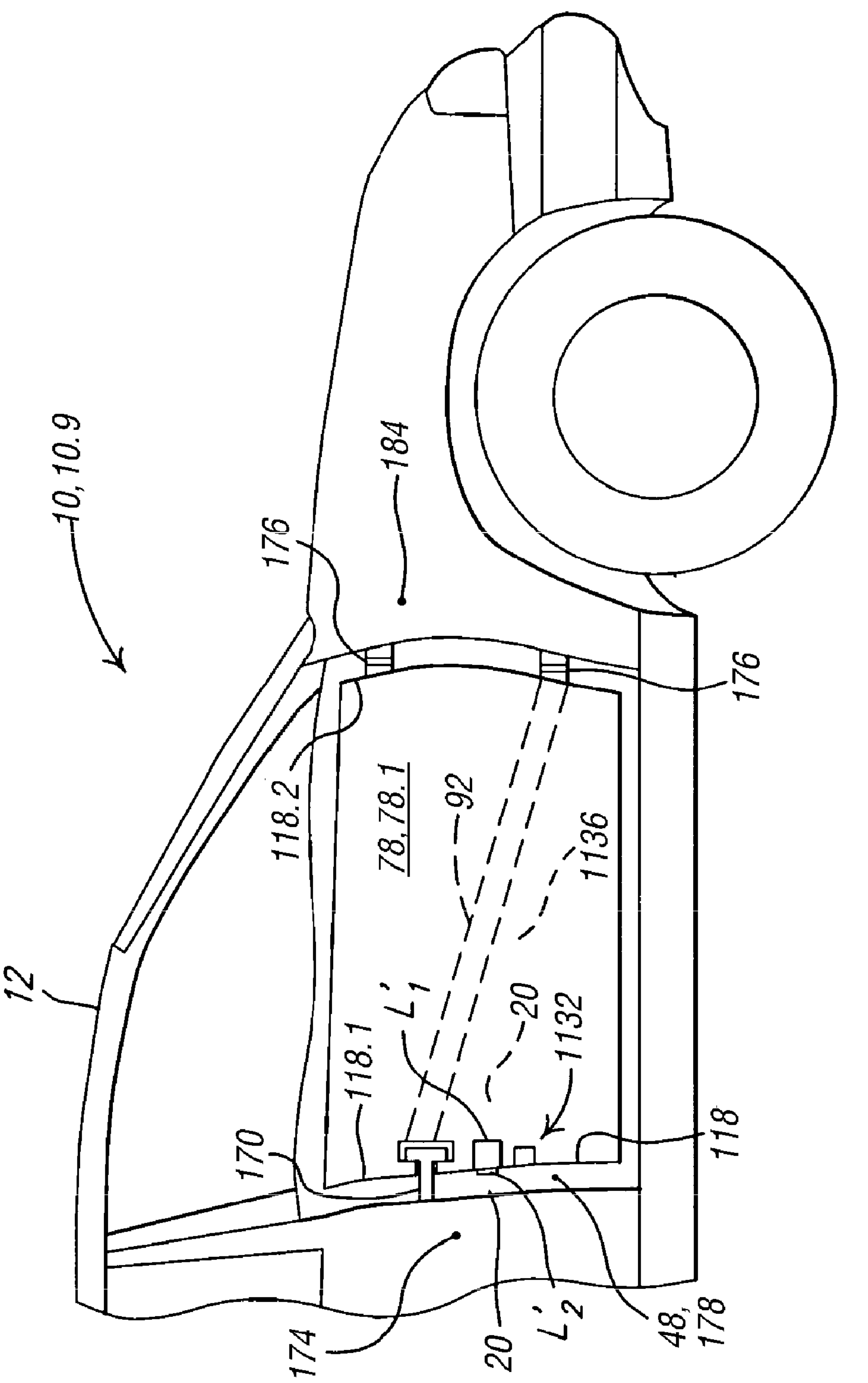
FIG. 101 illustrates an environment of a ninth aspect of the magnetic sensor.
Figure 102:
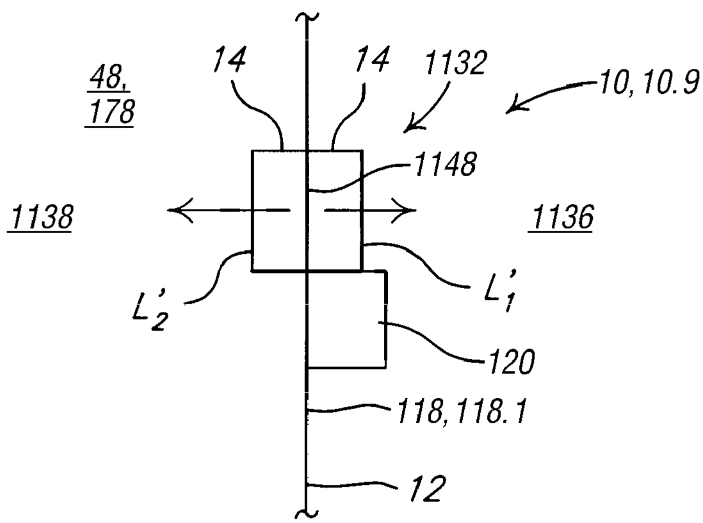
FIG. 102 illustrates an embodiment of the ninth aspect of the magnetic sensor.

Referring to FIGS. 101 and 102, in accordance with an embodiment of a ninth aspect 10.9 of the magnetic sensor 10, the magnetic sensor 10 comprises first $L_1'$ and second $L_2'$ coil elements relatively fixed with respect to one another and packaged together in a sensor assembly 1132 adapted to be mounted on an edge 118 of a door 78 so that the first coil element $L_1'$ faces the interior 1136 of the door 78, and the second coil element $L_2'$ faces the exterior 1138 of the door 78 towards the proximate gap 48, 178 between the edge 118 of the door 78 and an adjacent pillar 184, 174, 175, e.g. a B-pillar 174 for a sensor assembly 1132 adapted to cooperate with a front door 78.1. For example, in the embodiment illustrated in FIG. 101, the sensor assembly 1132 is mounted proximate to the striker 170 on a rear edge 118.1 of the door 78, so as to be responsive to distributed loads from the door beam 92, wherein the front edge 118.2 of the door 78 attached to the A-pillar 184 with associated hinges 176. The first $L_1'$ and second $L_2'$ coil elements can be substantially magnetically isolated from one another with a conductive and/or ferrous shield 1148 therebetween, e.g. a steel plate. The first coil element $L_1$' is responsive to a deformation of the door 78 affecting the interior 1136 thereof, e.g. responsive to a crash involving the door 78, whereas the second coil element $L_2$' is responsive to changes in the proximate gap 48, 178 between the door 78 and the proximate pillar 184, 174, 175, e.g. responsive to an opening or deformation condition of the door 78. Accordingly, the sensor assembly 1132 mounted so as to straddle an edge 118 of the door 78 provides for measuring several distinct features associated with crash dynamics. The sensor assembly 1132 could be mounted on any edge 118 of the door 78, e.g. edges 134.2, 134.1 facing the A-pillar 184, B-pillar 174 or on the bottom edge 118.3 of the door 78, wherein, for example, the position, size, coil parameters, frequency or pulsewidth of the associated at least one time-varying signal 1024, and power thereof, so as to provide for optimizing the discrimination of a crash from associated detected signal or signals 38, or associated components thereof, associated with the first $L_1$' and second $L_2$' coil elements responsive to deformation of the door 78 and changes in the associated proximate gap or gaps 48, 178. The sensor assembly 1132 can further incorporate an electronic control unit (ECU) 120 incorporating the associated signal conditioner and preprocessor circuits 114 and an associated detection circuit 32, processor 204 and controller 1040. The magnetic sensor 10 can be adapted as a self contained satellite utilizing associated shared electronics, or can incorporated shared connectors and mechanical mounting. The associated detected signal or signals 38, or associated components thereof, associated with the first $L_1$' and second $L_2$' coil elements can be either used together for crash discrimination, or can be used for combined self-safing and crash discrimination.

Figure 103:
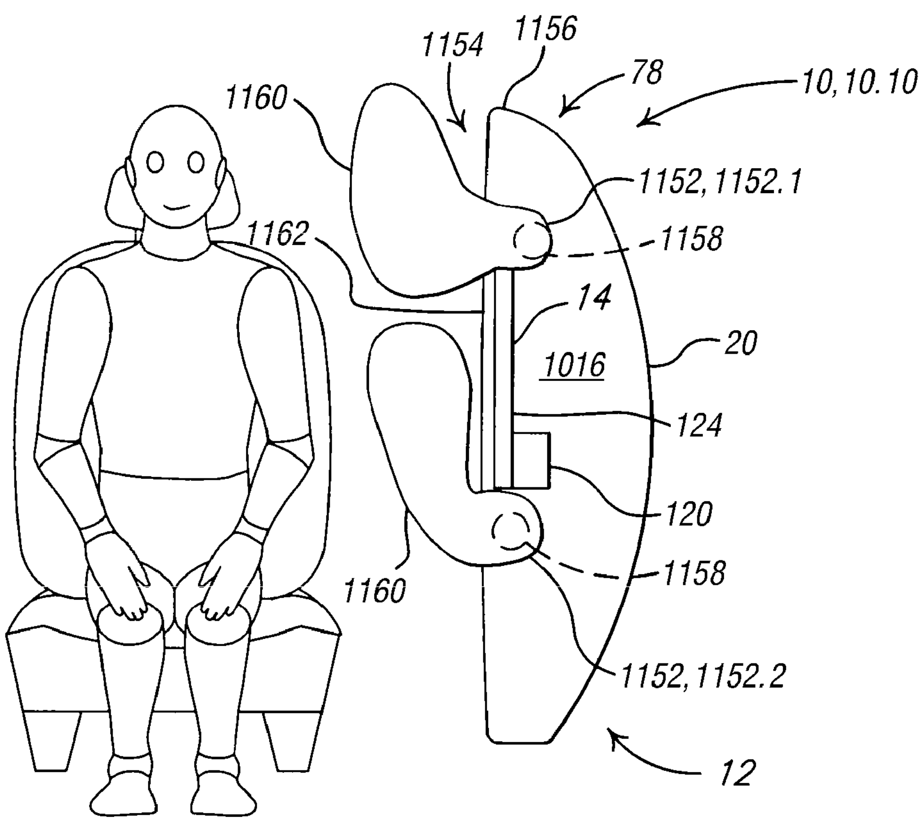
FIG. 103 illustrates an embodiment of a tenth aspect of a magnetic sensor associated with an air bag inflator.

Referring to FIG. 103, in accordance with an embodiment of a tenth aspect 10.10 of a magnetic sensor 10, a plurality of coil elements 14, e.g. in a distributed coil 124, together with an associated electronic control unit (ECU) 120, are operatively associated with one or more side-impact air bag inflator modules 1152, for example, mounted together therewith, in a safety restraint system 1154 comprising a combined side crash sensing and side-impact air bag inflator module 1156 so as to provide for a combined side impact crash sensor, one or more gas generators 1158, and one or more associated air bags 1160, in a single package. The combined side crash sensing and side-impact air bag inflator module 1156 could be placed on or proximate to an interior surface 1162 of a door 78, so as to provide for interior deployment of the associated one or more air bags 1160 responsive to the sensing of a crash with the associated magnetic sensor 10 responsive to the influence of a deformation of the door 78 on the associated plurality of coil elements 14 as detected by the associated detection circuit 32 in the electronic control unit (ECU) 120, and the associated generation of a control signal thereby to control the actuation of the associated one or more gas generators 1158 in the associated one or more side-impact air bag inflator modules 1152. For example, the side-impact air bag inflator modules 1152 incorporated in the safety restraint system 1154 illustrated in FIG. 103 comprise a first side-impact air bag inflator module 1152.1 adapted for thorax protection, and a second side-impact air bag inflator module 1152.2 adapted for head protection.

Figure 104:
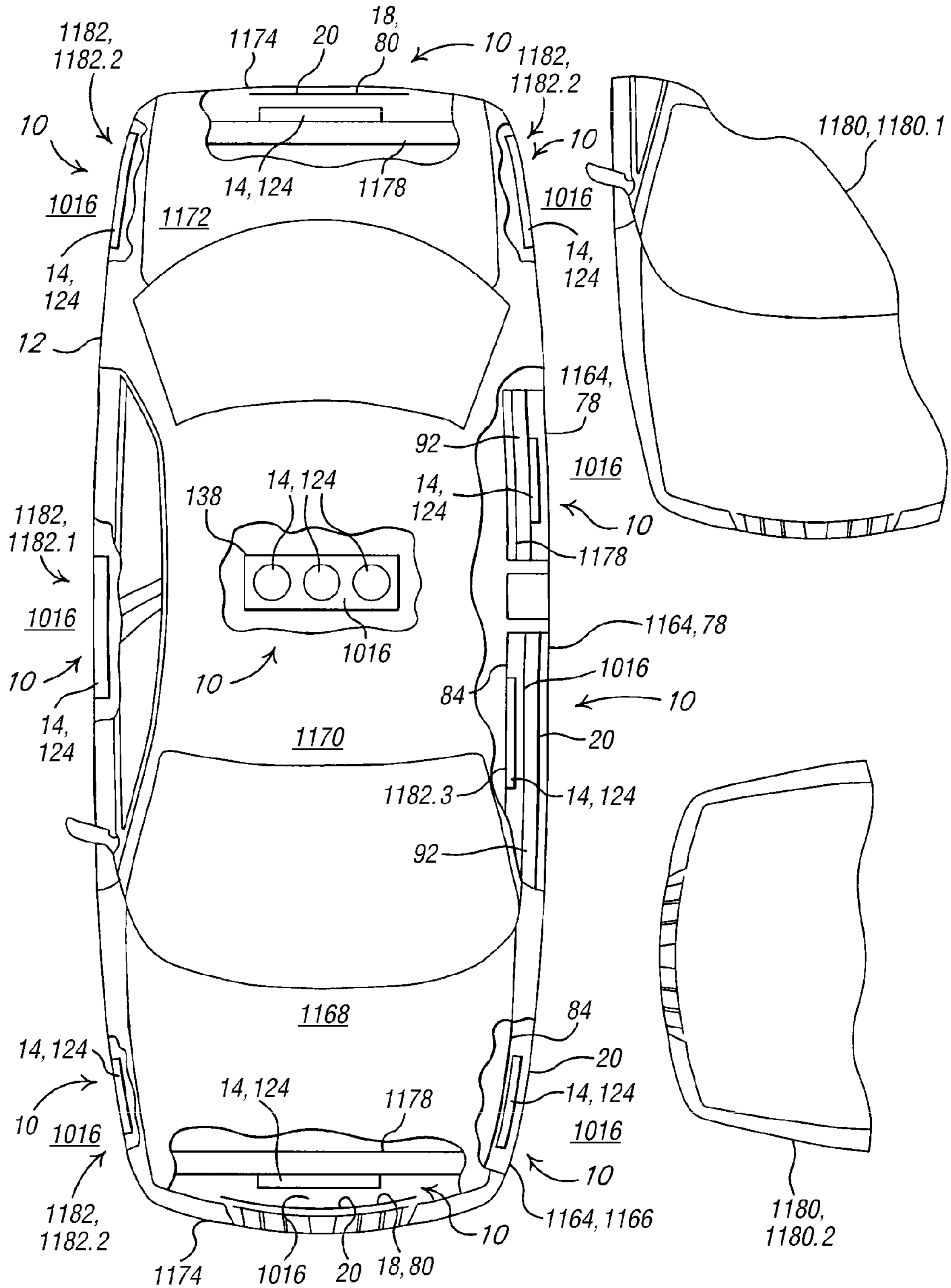
FIG. 104 illustrates various embodiments of a magnetic sensor in a vehicle.

Referring to FIG. 104, the above described magnetic sensor 10 can be adapted for various sensing applications in a vehicle 12. For example, in one set of embodiments, a plurality of coil elements 14 are adapted so as to provide for sensing a deformation of a body portion 1164 of the vehicle 12, for example, a door 78, a quarter-panel 1166, a hood 1168, a roof 1170, a trunk 1172, or a bumper 1174 of the vehicle 12, wherein, for example, the associated plurality of coil elements 14, e.g. distributed coil 124, would be operatively coupled to either a proximate inner panel 84 or structural member 1178 so as to be relatively fixed with respect to the associated deforming body portion 1164 during the early phase of an associated event causing the associated deformation, e.g. an associated crash or roll-over event. In accordance with another set of embodiments, the plurality of coil elements 14, e.g. distributed coil 124, may be mounted inside the door 78 of the vehicle 12 and adapted to provide for detecting a deformation of an associated door beam 92. In accordance with yet another set of embodiments, the plurality of coil elements 14 are adapted so as to provide for detecting a proximity of a second vehicle 1180 relative to the vehicle 12, for example, the proximity of a second vehicle 1180.1 traveling in or from an adjacent lane near or towards the vehicle 12, or a second vehicle 1180.2 traveling along a path intersecting that of the vehicle 12 towards an impending side impact therewith. For example, the associated plurality of coil elements 14, e.g. distributed coil 124, of the magnetic sensor 10 may be integrated into a trim or gasket portion 1182 of the vehicle 12, for example either a door trim portion 1182.1, a body trim portion 1182.2, or an interior trim portion 1182.3. In each of these applications, the associated assembly of the associated plurality of coil elements 14, e.g. distributed coil 124, may be integrated with, into, or on an existing component of the vehicle 12 having a different primary function. The plurality of coil elements 14, e.g. distributed coil 124, can provide for a relatively broad sensing region 1016 using a single associated distributed coil 124 assembly.

It should be appreciated that in any of the above magnetic crash sensor embodiments, that the circuitry and processes associated with FIGS. 35-86 may be used with the associated coil, coils or coil elements 14 so a to provide for generating the associated magnetic field or fields and for detecting the associated signal or signals responsive thereto, as appropriate in accordance with the teachings of FIGS. 35-86 and the associated disclosure hereinabove.

While specific embodiments have been described in detail, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of any claims that are supported by the disclosure or drawings, and any and all equivalents thereof.

What is claimed is:

1. A method of processing a signal responsive to a self-impedance of a circuit element, comprising:

a. generating first and second complementary voltage signals, wherein said first and second complementary voltage signals comprise respective first and second oscillatory voltage signals having a nominal peak amplitude, and said second oscillatory voltage signal comprises a waveform of said first oscillatory voltage signal shifted in phase by substantially 180 degrees;

b. operatively coupling said first complementary voltage signal to a first node of a series circuit;

c. operatively coupling said second complementary voltage signal to a fourth node of said series circuit, wherein said series circuit comprises:

i) a first sense resistor between said first node and a second node; and ii) a second sense resistor between a third node and said fourth node, wherein said series circuit is completed by connecting said second and third nodes to the circuit element;

d. regulating a voltage across said second and third nodes in reference to a predetermined level; and e. generating an output signal responsive to at least one of a voltage across said first sense resistor and a voltage across said second sense resistor, wherein said output signal is responsive to the self-impedance of said circuit element when said circuit element is connected to said second and third nodes of said series circuit.

2. A method of processing a signal responsive to a self-impedance of a circuit element as recited in claim 1, wherein the operations of regulating said voltage across said second and third nodes, and operatively coupling said first and second complementary voltage signals to said first and fourth nodes of said series circuit comprise:

a. applying said first complementary voltage signal to an input of a first amplifier;

b. operatively coupling said second node of said series circuit to said input of said first amplifier;

c. applying said second complementary voltage signal to an input of a second amplifier;

d. operatively coupling said third node of said series circuit to said input of said second amplifier; and e. operatively coupling an output of said second amplifier to said fourth node of said series circuit.

3. A method of processing a signal responsive to a self-impedance of a circuit element as recited in claim 2, wherein said first amplifier comprises a first operational amplifier and said second amplifier comprises a second operational amplifier, further comprising:

f. operatively coupling said first complementary voltage signal through a first input resistor to an inverting input of said first operational amplifier;

g. operatively coupling said second node of said series circuit through a first feedback resistor to said inverting input of said first operational amplifier;

h. operatively coupling said second complementary voltage signal through a second input resistor to an inverting input of said second operational amplifier; and i. operatively coupling said third node of said series circuit through a second feedback resistor to said inverting input of said second operational amplifier.

4. A method of processing a signal responsive to a self-impedance of a circuit element as recited in claim 3, wherein said first complementary voltage signal comprises a first bias voltage signal, said second complementary voltage signal comprises a second bias voltage signal, said first and second bias voltage signals are substantially equal in value, and said first and second bias voltage signals are at least as great in value as said nominal peak amplitude of said first and second oscillatory voltage signals, further comprising: operatively coupling said first bias voltage signal to a non-inverting input of said first operational amplifier, and operatively coupling said second bias voltage signal to a non-inverting input of said second operational amplifier.

5. A method of processing a signal responsive to a self-impedance of a circuit element as recited in claim 3, further comprising buffering a second node signal at said second node so as to form a buffered second node signal, wherein the operation of operatively coupling said second node through said first feedback resistor to said inverting input of said first operational amplifier comprises operatively coupling said buffered second node signal to a first terminal of said first feedback resistor, and operatively coupling a second terminal of said first feedback resistor to said inverting input of said first operational amplifier; and buffering a third node signal at said third node so as to form a buffered third node signal, wherein the operation of operatively coupling said third node through said second feedback resistor to said inverting input of said second operational amplifier comprises operatively coupling said buffered third node signal to a first terminal of said second feedback resistor, and operatively coupling a second terminal of said second feedback resistor to said inverting input of said second operational amplifier.

6. A method of processing a signal responsive to a self-impedance of a circuit element as recited in claim 5, wherein the operation of buffering said second node signal at said second node comprises operatively coupling said second node of said series circuit to a non-inverting input of a third operational amplifier; and operatively coupling an inverting input of said third operational amplifier to an output of said third operational amplifier, wherein said buffered second node signal is generated at said output of said third operational amplifier; and the operation of buffering said third node signal at said third node comprises operatively coupling said third node of said series circuit to a non-inverting input of a fourth operational amplifier; and operatively coupling an inverting input of said fourth operational amplifier to an output of said fourth operational amplifier, wherein said buffered third node signal is generated at said output of said fourth operational amplifier.

7. A method of processing a signal responsive to a self-impedance of a circuit element as recited in claim 2, wherein a gain of said first amplifier is substantially unity, and a gain of said second amplifier is substantially unity.

8. A method of processing a signal responsive to a self-impedance of a circuit element as recited in claim 1, wherein said first complementary voltage signal comprises a first bias voltage signal, said second complementary voltage signal comprises a second bias voltage signal, said first and second bias voltage signals are substantially equal in value, and said first and second bias voltage signals are at least as great in value as said nominal peak amplitude of said first and second oscillatory voltage signals.

9. A method of processing a signal responsive to a self-impedance of a circuit element as recited in claim 8, wherein said first and second bias voltage signals are each substantially constant.

10. A method of processing a signal responsive to a self-impedance of a circuit element as recited in claim 1, further comprising at least one of selectively shunting a first signal around said first sense resistor, wherein a frequency of said first signal shunted around said first sense resistor is different from a frequency of said first or second oscillatory voltage signal, and selectively shunting a second signal around said second sense resistor, wherein a frequency of said second signal shunted around said second sense resistor is different from said frequency of said first or second oscillatory voltage signal.

11. A method of processing a signal responsive to a self-impedance of a circuit element as recited in claim 1, wherein the operation of generating said output signal further comprises generating said output signal responsive to at least one test signal, and said at least one test signal provides for simulating a condition of the circuit element.

12. A method of processing a signal responsive to a self-impedance of a circuit element as recited in claim 11, wherein said at least one test signal comprises first and second test signals, and said first and second test signals are associated with different terminals of a common signal generator.

13. A method of processing a signal responsive to a self-impedance of a circuit element as recited in claim 1, further comprising band-pass filtering said output signal, and adjusting a frequency range of a pass-band of an associated band-pass filter responsive to an operating frequency of said first and second oscillatory voltage signals.

14. A method of processing a signal responsive to a self-impedance of a circuit element as recited in claim 1, further comprising demodulating said output signal, or a signal responsive thereto, so as to generate at least one of a first in-phase signal and a first quadrature-phase signal, wherein said first in-phase signal is in-phase with said first or second oscillatory voltage signal and is responsive to an in-phase component thereof, and said first quadrature-phase signal is substantially 90 degrees out-of-phase with respect to said first or second oscillatory voltage signal and is responsive to a quadrature-phase component thereof.

15. A method of processing a signal responsive to a self-impedance of a circuit element as recited in claim 14, further comprising at least one of filtering said first in-phase signal with a first band-pass filter so as to generate a second in-phase signal, and filtering said first quadrature-phase signal with a second band-pass filter so as togenerate a second quadrature-phase signal.

16. A method of processing a signal responsive to a self-impedance of a circuit element as recited in claim 14, further comprising representing at least one of said first in-phase signal and said first quadrature-phase signal in digital form.

17. A method of processing a signal responsive to a self-impedance of a circuit element as recited in claim 16, wherein the operations of demodulating said output signal, or said signal responsive thereto, and representing at least one of said first in-phase signal and said first quadrature-phase signal in digital form comprise:

a. transforming said output signal, or said signal responsive thereto, with a sigma-delta converter, so as to generate a first intermediate signal;

b. at least one of mixing a sinusoidal signal with said first intermediate signal so as to generate a first in-phase intermediate signal, and mixing a cosinusoidal signal with said first intermediate signal so as to generate a first quadrature-phase intermediate signal, wherein said sinusoidal signal is in-phase with said first oscillatory voltage signal, and said cosinusoidal signal is substantially 90 degrees out-of-phase with respect to said first oscillatory voltage signal; and c. at least one of filtering said first in-phase intermediate signal with a first decimation filter and a first low-pass filter so as to generate said first in-phase signal; and filtering said first quadrature-phase intermediate signal with a second decimation filter and a second low-pass filter so as to generate said first quadrature-phase signal.

18. A method of processing a signal responsive to a self-impedance of a circuit element as recited in claim 17, wherein said output signal, or said signal responsive thereto, is adapted so that a magnitude thereof when input to said sigma-delta converter is less than unity under normal operating conditions.

19. A method of processing a signal responsive to a self-impedance of a circuit element as recited in claim 1, further comprising detecting if a magnitude of said output signal, or a signal responsive thereto, is greater than a threshold, and indicating an error condition if said magnitude of said output signal, or said signal responsive thereto, is greater than said threshold.

20. A method of processing a signal responsive to a self-impedance of a circuit element as recited in claim 1, wherein said circuit element comprises at least one inductance coil.

21. A method of processing a signal responsive to a self-impedance of a circuit element as recited in claim 20, further comprising operatively coupling said at least one inductance coil to a magnetic circuit of a vehicle; and detecting a perturbation of said magnetic circuit responsive to said output signal.

22. A method of processing a signal responsive to a self-impedance of a circuit element as recited in claim 21, wherein the operation of detecting said perturbation of said magnetic circuit comprises detecting a crash of said vehicle, wherein said perturbation of said magnetic circuit is responsive to said crash.

23. A method of processing a signal responsive to a self-impedance of a circuit element as recited in claim 22, further comprising controlling a safety restraint system responsive to said output signal.

24. A method of processing a signal responsive to a self-impedance of a circuit element as recited in claim 23, further comprising:

a. demodulating said output signal, or a signal responsive thereto, so as to generate at least one of a first in-phase signal and a first quadrature-phase signal, wherein said first in-phase signal is in-phase with said first or second oscillatory voltage signal and is responsive to an in-phase component thereof, and said first quadrature-phase signal is substantially 90 degrees out-of-phase with respect to said first or second oscillatory voltage signal and is responsive to a quadrature-phase component thereof; and b. controlling a safety restraint actuator of said safety restraint system responsive to at least one of said first in-phase signal, said first quadrature-phase signal.

25. A method of processing a signal responsive to a self-impedance of a circuit element as recited in claim 24, further comprising controlling said safety restraint actuator responsive to at least said first in-phase signal.

26. A method of processing a signal responsive to a self-impedance of a circuit element as recited in claim 1, further comprising:

c. detecting a signal responsive to a DC bias current in said series circuit; and d. controlling at least one of said first and second complementary voltage signals so as to substantially null said signal responsive to said DC bias current in said series circuit.

27. A method of processing a signal responsive to a self-impedance of a circuit element as recited in claim 26, wherein said first complementary voltage signal comprises a first bias voltage signal, said second complementary voltage signal comprises a second bias voltage signal, said first and second bias voltage signals are substantially equal in value, and said first and second bias voltage signals are at least as great in value as said nominal peak amplitude of said first and second oscillatory voltage signals.

28. A method of processing a signal responsive to a self-impedance of a circuit element as recited in claim 27, wherein said first and second bias voltage signals are each substantially constant.

29. A method of processing a signal responsive to a self-impedance of a circuit element as recited in claim 26, further comprising at least one of selectively shunting a first signal around said first sense resistor, wherein a frequency of said first signal shunted around said first sense resistor is different from a frequency of said first or second oscillatory voltage signal, and selectively shunting a second signal around said second sense resistor, wherein a frequency of said second signal shunted around said second sense resistor is different from said frequency of said first or second oscillatory voltage signal.

30. A method of processing a signal responsive to a self-impedance of a circuit element as recited in claim 26, wherein the operation of generating an output signal comprises:

a. operatively coupling said first node through a first resistor to a first input of an operational amplifier;
b. operatively coupling said second node through a second resistor to a second input of said operational amplifier;
c. operatively coupling said third node through a third resistor to said first input of said operational amplifier;
d. operatively coupling said fourth node through a fourth resistor to said second input of said operational amplifier;
e. operatively coupling a non-inverting input of said operational amplifier through a fifth resistor to an AC ground; and
f. operatively coupling an inverting input of said operational amplifier through a sixth resistor to an output of said operational amplifier, wherein said first input of said operational amplifier comprises one of said non-inverting input and said inverting input, said second input of said operational amplifier comprises the other of said inverting input and said non-inverting input, and said output signal is generated by said output of said differential amplifier.

31. A method of processing a signal responsive to a self-impedance of a circuit element as recited in claim 30, further comprising at least one of detecting if a magnitude of a signal across said first sense resistor is less than a threshold, and detecting if a magnitude of a signal across said second sense resistor is less than said threshold; and indicating an error condition if either said signal across said first sense resistor is less than said threshold, or if said signal across said second sense resistor is less than said threshold.

32. A method of processing a signal responsive to a self-impedance of a circuit element as recited in claim 1, wherein the operation of generating an output signal comprises:

a. operatively coupling said first node through a first resistor to a first input of an operational amplifier;
b. operatively coupling said second node through a second resistor to a second input of said operational amplifier;
c. operatively coupling said third node through a third resistor to said first input of said operational amplifier;
d. operatively coupling said fourth node through a fourth resistor to said second input of said operational amplifier;
e. operatively coupling a non-inverting input of said operational amplifier through a fifth resistor to an AC ground; and
f. operatively coupling an inverting input of said operational amplifier through a sixth resistor to an output of said operational amplifier, wherein said first input of said operational amplifier comprises one of said non-inverting input and said inverting input, said second input of said operational amplifier comprises the other of said inverting input and said non-inverting input, and said output signal is generated by said output of said differential amplifier.

33. A method of processing a signal responsive to a self-impedance of a circuit element as recited in claim 32, further comprising at least one of detecting if a magnitude of a signal across said first sense resistor is less than a threshold, and detecting if a magnitude of a signal across said second sense resistor is less than said threshold; and indicating an error condition if either said signal across said first sense resistor is less than said threshold, or if said signal across said second sense resistor is less than said threshold.

* * * * *